United States Patent
Ko et al.

(10) Patent No.: US 9,009,775 B2
(45) Date of Patent: Apr. 14, 2015

(54) BROADCASTING SIGNAL TRANSMISSION DEVICE, BROADCASTING SIGNAL RECEPTION DEVICE, AND METHOD FOR TRANSMITTING/RECEIVING BROADCASTING SIGNAL USING SAME

(75) Inventors: Woosuk Ko, Seoul (KR); Sangchul Moon, Seoul (KR); Hotaek Hong, Seoul (KR)

(73) Assignee: LG Electronics Inc., Seoul (KR)

( * ) Notice: Subject to any disclaimer, the term of this patent is extended or adjusted under 35 U.S.C. 154(b) by 95 days.

(21) Appl. No.: 13/884,786

(22) PCT Filed: Feb. 23, 2011

(86) PCT No.: PCT/KR2011/001257
§ 371 (c)(1),
(2), (4) Date: Jun. 20, 2013

(87) PCT Pub. No.: WO2011/105803
PCT Pub. Date: Sep. 1, 2011

(65) Prior Publication Data
US 2013/0291046 A1    Oct. 31, 2013

Related U.S. Application Data

(60) Provisional application No. 61/307,423, filed on Feb. 23, 2010.

(51) Int. Cl.
*H04N 7/16* (2011.01)
*H04L 1/00* (2006.01)
(Continued)

(52) U.S. Cl.
CPC ...... *H04L 1/0041* (2013.01); *H04N 21/440227* (2013.01); *H03M 13/09* (2013.01);
(Continued)

(58) Field of Classification Search
CPC .......... H04N 21/4347; H04N 21/4348; H04N 21/4358; H04N 21/440227
See application file for complete search history.

(56) References Cited

U.S. PATENT DOCUMENTS

2005/0275752 A1\* 12/2005 Li et al. ............... 348/398.1
2009/0067384 A1\* 3/2009 Himmanen et al. ......... 370/330

FOREIGN PATENT DOCUMENTS

EP    2071791 A1    6/2009
EP    2071792 A1    6/2009
(Continued)

*Primary Examiner* — Dominic D Saltarelli
(74) *Attorney, Agent, or Firm* — McKenna Long & Aldridge LLP

(57) ABSTRACT

Disclosed is a broadcasting signal transmission device, a broadcasting signal reception device, and a method for transmitting/receiving a broadcasting signal using same. The method for receiving the broadcasting signal comprises the following steps: receiving the broadcasting signal, which includes a transmission frame, wherein the transmission frame includes a plurality of PLPs, which transmit components that constitute a broadcasting service, first signaling information and second signaling information, which include the signaling information of the plurality of PLPs, a first preamble signal, which has been signaled with a preamble format, and a second preamble signal, which has been signaled with pilot pattern information, wherein one of the plurality of PLPs is a base PLP, which includes a program number that corresponds to the broadcasting service and program map table information, which has been signaled with identifying information for each of the PLPs; demodulating the broadcasting signal based on the first and the second preamble signals; FEC decoding the demodulated broadcasting signal; and identifying a PLP group that includes the plurality of PLP from the FEC decoded broadcasting signal based on the first and the second signaling information, decoding at least one PLP of the identified PLP group, and providing the broadcasting service.

14 Claims, 61 Drawing Sheets

| P1 | L1 | Common PLP (L2) | PLPs after scheduling and interleaving ||||  Auxiliary Data |
|---|---|---|---|---|---|---|---|
| | | | PLP1 | PLP2 | ... | PLPp | |

(51) Int. Cl.
*H04N 21/4402* (2011.01)
*H03M 13/25* (2006.01)
*H04H 60/11* (2008.01)
*H04L 5/00* (2006.01)
*H04L 27/26* (2006.01)
*H04N 21/262* (2011.01)
*H03M 13/27* (2006.01)
*H04B 7/04* (2006.01)
*H03M 13/09* (2006.01)

(52) U.S. Cl.
CPC ............ *H03M13/251* (2013.01); *H04H 60/11* (2013.01); *H04L 5/0048* (2013.01); *H04L 27/2613* (2013.01); *H04L 27/2647* (2013.01); *H04N 21/262* (2013.01); *H03M 13/2796* (2013.01); *H04B 7/0413* (2013.01); *H04L 5/0044* (2013.01); *H04L 5/0053* (2013.01)

(56) References Cited

FOREIGN PATENT DOCUMENTS

| | | |
|---|---|---|
| EP | 2086144 A2 | 8/2009 |
| EP | 2086155 A1 | 8/2009 |

\* cited by examiner

FIG. 2

| P1 | L1 | Common PLP (L2) | PLPs after scheduling and interleaving | | | | Auxiliary Data |
|----|----|----|----|----|----|----|----|
| | | | PLP1 | PLP2 | ... | PLPp | |

FIG. 4
(a)
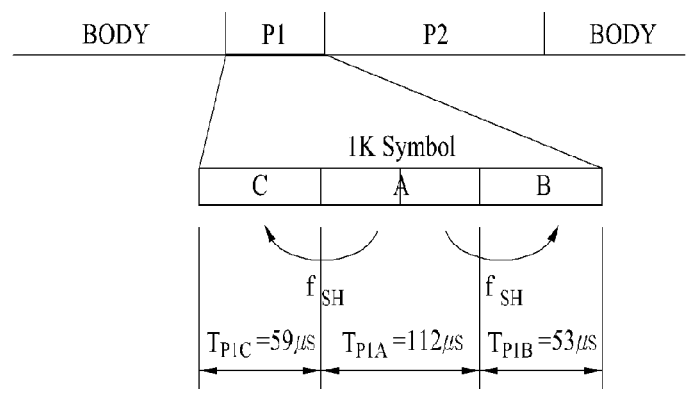
(b)
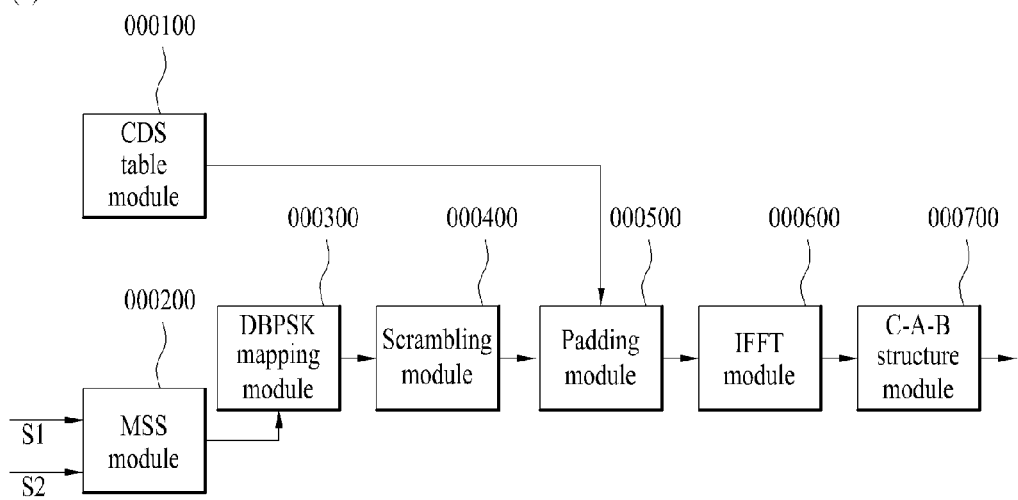

| | 256-QAM (Type 1-1) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1/4 |
| Output bit-number, e | 5 | 3 | 2 | 7 | 1 | 6 | 4 | 0 | |
| Reliability | C | B | B | D | A | D | C | A | |

(b)

| | 256-QAM (Type 1-2) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 2/5, 3/5 |
| Output bit-number, e | 5 | 1 | 0 | 7 | 3 | 6 | 4 | 2 | |
| Reliability | C | A | A | D | B | D | C | B | |

(c)

| | 256-QAM (Type 1-3) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1/2 |
| Output bit-number, e | 7 | 3 | 1 | 6 | 5 | 2 | 4 | 0 | |
| Reliability | D | B | A | D | C | B | C | A | |

(d)

| | 256-QAM (Type 1-4) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 4/5 |
| Output bit-number, e | 3 | 2 | 1 | 5 | 7 | 6 | 4 | 0 | |
| Reliability | B | B | A | C | D | D | C | A | |

(e)

| | 256-QAM (Type 1-5) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1/3, 2/3, 3/4, 5/6 |
| Output bit-number, e | 7 | 3 | 1 | 5 | 2 | 6 | 4 | 0 | |
| Reliability | D | B | A | C | B | D | C | A | |

FIG. 21

| 256-QAM (Type 1-1) | 256-QAM (Type 1-2) | 256-QAM (Type 1-3) | 256-QAM (Type 1-4) | 256-QAM (Type 1-5) |
|---|---|---|---|---|
| v0 maps to b5.0 | v0 maps to b5.0 | v0 maps to b7.0 | v0 maps to b3.0 | v0 maps to b7.0 |
| v1 maps to b3.0 | v1 maps to b1.0 | v1 maps to b3.0 | v1 maps to b2.0 | v1 maps to b3.0 |
| v2 maps to b2.0 | v2 maps to b0.0 | v2 maps to b1.0 | v2 maps to b1.0 | v2 maps to b1.0 |
| v3 maps to b7.0 | v3 maps to b7.0 | v3 maps to b6.0 | v3 maps to b5.0 | v3 maps to b5.0 |
| v4 maps to b1.0 | v4 maps to b3.0 | v4 maps to b5.0 | v4 maps to b7.0 | v4 maps to b2.0 |
| v5 maps to b6.0 | v5 maps to b6.0 | v5 maps to b2.0 | v5 maps to b6.0 | v5 maps to b6.0 |
| v6 maps to b4.0 | v6 maps to b4.0 | v6 maps to b4.0 | v6 maps to b4.0 | v6 maps to b4.0 |
| v7 maps to b0.0 | v7 maps to b2.0 | v7 maps to b0.0 | v7 maps to b0.0 | v7 maps to b0.0 |

| | 256-QAM (Type 2-1) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | (1/4, 1/3), 2/5, 3/5 |
| Output bit-number, e | 5 | 1 | 3 | 7 | 0 | 6 | 4 | 2 | |
| Reliability | C | A | B | D | A | D | C | B | |

(b)

| | 256-QAM (Type 2-2) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1,2, (2/3, 4/5) |
| Output bit-number, e | 7 | 3 | 1 | 6 | 2 | 5 | 4 | 0 | |
| Reliability | D | B | A | D | B | C | C | A | |

(c)

| | 256-QAM (Type 2-3) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | (1/4, 1/3, 2/3, 4/5), 3/4, 5/6 |
| Output bit-number, e | 7 | 3 | 1 | 5 | 2 | 6 | 4 | 0 | |
| Reliability | D | B | A | C | B | D | C | A | |

FIG. 23

| 256-QAM (Type 2-1) | 256-QAM (Type 2-2) | 256-QAM (Type 2-3) |
|---|---|---|
| v0 maps to b5.0 | v0 maps to b7.0 | v0 maps to b7.0 |
| v1 maps to b1.0 | v1 maps to b3.0 | v1 maps to b3.0 |
| v2 maps to b3.0 | v2 maps to b1.0 | v2 maps to b1.0 |
| v3 maps to b7.0 | v3 maps to b6.0 | v3 maps to b5.0 |
| v4 maps to b0.0 | v4 maps to b2.0 | v4 maps to b2.0 |
| v5 maps to b6.0 | v5 maps to b5.0 | v5 maps to b6.0 |
| v6 maps to b4.0 | v6 maps to b4.0 | v6 maps to b4.0 |
| v7 maps to b2.0 | v7 maps to b0.0 | v7 maps to b0.0 |

256-QAM (Type 3-1)

| Input bit-number, di mod Nsubstreams | 0 | 1 | 2 | 3 | 4 | 5 | 6 | 7 | Code rate(s) |
|---|---|---|---|---|---|---|---|---|---|
| Output bit-number, e | 5 | 1 | 0 | 7 | 3 | 6 | 4 | 2 | 2/5, 3/5 |
| Reliability | C | A | A | D | B | D | C | B | |

(b)

256-QAM (Type 3-2)

| Input bit-number, di mod Nsubstreams | 0 | 1 | 2 | 3 | 4 | 5 | 6 | 7 | Code rate(s) |
|---|---|---|---|---|---|---|---|---|---|
| Output bit-number, e | 7 | 3 | 1 | 6 | 5 | 2 | 4 | 0 | 1/2 |
| Reliability | D | B | A | D | C | B | C | A | |

(c)

256-QAM (Type 3-3)

| Input bit-number, di mod Nsubstreams | 0 | 1 | 2 | 3 | 4 | 5 | 6 | 7 | Code rate(s) |
|---|---|---|---|---|---|---|---|---|---|
| Output bit-number, e | 7 | 3 | 1 | 5 | 2 | 6 | 4 | 0 | 1/4, 1/3, 2/3, 4/5, 3/4, 5/6 |
| Reliability | D | B | A | C | B | D | C | A | |

| | 64-QAM (Type 2-1) | | | | | | | | | | | | Code rate(s) |
|---|---|---|---|---|---|---|---|---|---|---|---|---|---|
| Input bit-number, di mod Nsubstreams | 0 | 1 | 2 | 3 | 4 | 5 | 6 | 7 | 8 | 9 | 10 | 11 | 2/5, 3/5 |
| Output bit-number, e | 5 | 6 | 1 | 7 | 9 | 11 | 3 | 8 | 10 | 4 | 2 | 0 | |
| Reliability | C | A | A | A | B | C | B | B | C | C | B | A | |

(b)

| | 64-QAM (Type 2-1) | | | | | | | | | | | | Code rate(s) |
|---|---|---|---|---|---|---|---|---|---|---|---|---|---|
| Input bit-number, di mod Nsubstreams | 0 | 1 | 2 | 3 | 4 | 5 | 6 | 7 | 8 | 9 | 10 | 11 | 1/2 |
| Output bit-number, e | 5 | 11 | 7 | 1 | 8 | 10 | 4 | 9 | 6 | 2 | 3 | 0 | |
| Reliability | C | C | A | A | B | C | C | B | A | B | B | A | |

(c)

| | 64-QAM (Type 2-1) | | | | | | | | | | | | Code rate(s) |
|---|---|---|---|---|---|---|---|---|---|---|---|---|---|
| Input bit-number, di mod Nsubstreams | 0 | 1 | 2 | 3 | 4 | 5 | 6 | 7 | 8 | 9 | 10 | 11 | 1/4, 1/3, 2/3, 4/5, 3/4, 5/6 |
| Output bit-number, e | 11 | 7 | 3 | 10 | 6 | 2 | 9 | 5 | 1 | 8 | 4 | 0 | |
| Reliability | C | A | B | C | A | B | B | C | A | B | C | A | |

| | 16-QAM (Type 2-2) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1/2 |
| Output bit-number, e | 3 | 1 | 5 | 7 | 6 | 4 | 2 | 0 | |
| Reliability | B | A | A | B | B | A | B | A | |

(b)

| | 16-QAM (Type 2-3) | | | | | | | | Code rate(s) |
|---|---|---|---|---|---|---|---|---|---|
| Input bit-number, di mod Nsubstreams | 0 | 1 | 2 | 3 | 4 | 5 | 6 | 7 | 1/4, 1/3, 2/5, 3/5, 2/3, 4/5, 3/4, 5/6 |
| Output bit-number, e | 7 | 1 | 4 | 2 | 5 | 3 | 6 | 0 | |
| Reliability | B | A | A | B | A | B | B | A | |

FIG. 44

| Filed    | Bits |
|----------|------|
| S1       | 3    |
| S2 filed 1 | 3  |
| S2 filed 2 | 1  |

FIG. 45

| Filed              | Bits |
|--------------------|------|
| PILOT_PATTERN      | 4    |
| L1_PRE_SPREAD_LENGTH | 3  |

FIG. 46

| Filed | Bits |
|---|---|
| TYPE | 8 |
| BWT_EXT | 1 |
| S1 | 3 |
| S2 | 4 |
| L1_REPETITION_FLAG | 1 |
| GUARD_INTERVAL | 3 |
| PAPR | 4 |
| L1_MOD | 4 |
| L1_COD | 2 |
| L1_FEC | 2 |
| L1_POST_SIZE | 18 |
| L1_POST_INFO_SIZE | 18 |
| PILOT_PATTERN | 4 |
| TX_ID_AVAILABILITY | 8 |
| CELL_ID | 16 |
| NETWORK_ID | 16 |
| NGH_SYSTEM_ID | 16 |
| NUM_NGH_FRAMES | 8 |
| NUM_T2_FRAMES | 8 |
| L1_POST_SPREAD_LENGTH | 12 |
| NUM_DATA_SYMBOLS | 12 |
| NUM_MISO_SYMBOLS | 12 |
| MIMO_SYMBOL_INTERVAL | 12 |
| MIMO_SYMBOL_LENGTH | 12 |
| REGEN FLAG | 3 |
| L1_POST_EXTENSION | 1 |
| NUM_RF | 3 |
| CURRENT_RF_IDX | 3 |
| RESERVED | 10 |
| CRC_32 | 32 |

FIG. 47

| Filed | Bits |
|---|---|
| SUB_SLICES_PER_FRAME | 15 |
| NUM_PLP | 8 |
| NUM_AUX | 4 |
| AUX_CONFIG_RFU | 8 |
|  |  |
| for i = 0..NUM_RF-1 { |  |
|    RF_IDX | 3 |
|    FREQEUNCY | 32 |
| } |  |
|  |  |
| if S2 == 'xxx1' { |  |
|    FEF_TYPE | 4 |
|    FEF_LENGTH | 22 |
|    FEF_INTERVAL | 8 |
|    NEXT_NGH_SUPERFRAME | 8 |
| } |  |
|  |  |
| RESERVED_2 | 32 |
|  |  |
| for i = 0..NUM_AUX-1 { |  |
|    AUX_RFU | 32 |
| } |  |

| Filed | Bits |
|---|---|
| for i = 0..NUM_PLP-1 { |  |
|    PLP_ID | 8 |
|    PLP_TYPE | 3 |
|    PLP_PAYLOAD_TYPE | 5 |
|    PLP_PROFILE | 2 |
|    FF_FLAG | 1 |
|    FIRST_RF_IDX | 3 |
|    FIRST_FRAME_IDX | 8 |
|    PLP_GROUP_ID | 8 |
|    PLP_COD | 3 |
|    PLP_MOD | 3 |
|    PLP_MIMO_TYPE | 2 |
|    PLP_ROTATION | 1 |
|    PLP_FEC_TYPE | 2 |
|    PLP_NUM_BLOCKS_MAX | 10 |
|    FRAME_INTERVAL | 8 |
|    TIME_IL_LENGTH | 8 |
|    TIME_IL_TYPE | 1 |
|    IN_BAND_FLAG | 1 |
|    RESERVED_1 | 16 |
| } |  |

FIG. 48

| Filed | Bits |
|---|---|
| FRAME_IDX | 8 |
| SUB_SLICE_INTERVAL | 22 |
| TYPE_2_START | 22 |
| L1_CHANGE_COUNTER | 8 |
| START_RF_IDX | 3 |
| RESERVED_1 | 8 |
| | |
| if S2 == 'xxx1' { | |
|    NEXT_NGH_FRAME | 8 |
| } | |
| | |
| for i = 0..NUM_PLP-1 { | |
|    PLP_ID | 8 |
|    PLP_START | 22 |
|    PLP_NUM_BLOCKS | 10 |
|    RESERVED_2 | 8 |
| } | |
| | |
| RESERVED_3 | 8 |
| | |
| for i = 0..NUM_AUX-1 { | |
|    AUX_RFU | 48 |
| } | |

FIG. 50

| Name | No.of bits | Identifier |
|---|---|---|
| delivery_system_descriptor() { | | |
|   descriptor_tag | 8 | uimsbf |
|   descriptor_length | 8 | uimsbf |
|   system_id | 16 | uimsbf |
|   PLP_GROUP_ID | 8 | uimsbf |
|   if (descriptor_length > 3) { | | |
|     system_parameters() | | |
|     for (i=0; i<N; i++) { | | |
|       cell_parameters() | | |
|     } | | |
|   } | | |
| } | | |

FIG. 53

| Name | No.of bits | Identifier |
|---|---|---|
| component_id_descriptor() { | | |
|   descriptor_tag | 8 | uimsbf |
|   descriptor_length | 8 | uimsbf |
|   system_id | 16 | uimsbf |
|   PLP_ID | 8 | uimsbf |
|   PLP_COMPONENT_TYPE | 8 | uimsbf |
| } | | |

FIG. 56

| Name | No.of bits | Identifier |
|---|---|---|
| delivery_system_descriptor() { | | |
|   descriptor_tag | 8 | uimsbf |
|   descriptor_length | 8 | uimsbf |
|   system_id | 16 | uimsbf |
|   PLP_GROUP_ID | 8 | uimsbf |
|   BASE_PLP_ID | 8 | uimsbf |
|   if (descriptor_length > 3) { | | |
|     system_parameters() | | |
|     for (i=0; i<N; i++) { | | |
|       cell_parameters() | | |
|     } | | |
|   } | | |
| } | | |

FIG. 57

| Name | No.of bits | Identifier |
|---|---|---|
| component_id_descriptor() { | | |
|   descriptor_tag | 8 | uimsbf |
|   descriptor_length | 8 | uimsbf |
|   system_id | 16 | uimsbf |
|   PLP_ID | 8 | uimsbf |
|   PLP_PROFILE | 8 | uimsbf |
| } | | |

FIG. 61

| Name | No.of bits | Identifier |
|---|---|---|
| IP/MAC_location_descriptor() { | | |
|   descriptor_tag | 8 | uimsbf |
|   descriptor_length | 8 | uimsbf |
|   system_id | 16 | uimsbf |
|   PLP_GROUP_ID | 8 | uimsbf |
|   PLP_ID | 8 | uimsbf |
| } | | |

BROADCASTING SIGNAL TRANSMISSION DEVICE, BROADCASTING SIGNAL RECEPTION DEVICE, AND METHOD FOR TRANSMITTING/RECEIVING BROADCASTING SIGNAL USING SAME

This application is a 35 USC §371 National Stage entry of International Application No. PCT/KR2011/001257 filed on Feb. 23, 2011, and claims priority of U.S. Provisional Application No. 61/307,423 filed on Feb. 23, 2010, all of which are incorporated by reference in their entirety herein.

FIELD OF THE INVENTION

The present invention relates to a broadcast signal transmitting apparatus for transmitting a broadcast signal, a broadcast receiving apparatus for receiving a broadcast signal, and a method of transmitting and receiving a broadcast signal and, most particularly, to an apparatus and method for transmitting and receiving a mobile broadcast signal.

BACKGROUND ART

As the time has neared to end (or terminate) the transmission of analog broadcast signals, diverse technologies for transmitting and receiving digital broadcast signals are being researched and developed. Herein, a digital broadcast signal may include high capacity video/audio data as compared to an analog broadcast signal, and, in addition to the video/audio data, the digital broadcast signal may also include diverse additional data.

More specifically, a digital broadcasting system for digital broadcasting may provide HD (High Definition) level images, multiple-channel sound (or audio), and a wide range of additional services. However, a data transmission efficiency for transmitting high capacity data, a robustness of transmitting and receiving network, and flexibility in a network considering mobile receiving equipments are still required to be enhanced.

DETAILED DESCRIPTION OF THE INVENTION

Technical Objects

Accordingly, an object of the present invention is to provide a broadcast signal transmitting apparatus and a broadcast receiving apparatus that can transmit and receive additional broadcast signals, a method for transmitting and receiving additional broadcast signals, by using an RF signal of a conventional broadcasting system without having to ensure any additional frequency.

Another object is to provide a broadcast signal transmitting apparatus and a broadcast receiving apparatus that can transmit and receive mobile broadcast signals, a method for transmitting and receiving mobile broadcast signals, by using an RF signal of a conventional broadcasting system without having to ensure any additional frequency.

Yet another object of the present invention is to provide a broadcasting signal transmission device, a broadcasting signal reception device, and a method for transmitting/receiving a broadcasting signal using the same that can distinguish data corresponding to a service for each component, and transmit the corresponding data to each component through separate PLPs, so that the transmitted data can be received and processed.

Yet another object of the present invention is to provide a broadcasting signal transmission device, a broadcasting signal reception device, and a method for transmitting/receiving a broadcasting signal using the same that can signal signaling information required for servicing a broadcasting signal.

A further object of the present invention is to provide a broadcasting signal transmission device, a broadcasting signal reception device, and a method for transmitting/receiving a broadcasting signal using the same that can signal signaling information, so that a broadcasting signal can be received in accordance with a receiver characteristic.

Technical Solutions

In order to achieve the above-described technical objects of the present invention, according to an aspect of the present invention, a broadcasting signal receiving method includes a step of receiving a broadcasting signal. Herein, the received broadcasting signal may include a transmission frame, and the transmission frame may include a plurality of PLPs transmitting components that configure a broadcast service, first and second signaling information having signaling information of the plurality of PLPs signaled thereto, a first preamble signal having a preamble format signaled thereto, and a second preamble signal having pilot pattern information signaled thereto. Additionally, one of the plurality of PLPs may correspond to a base PLP, wherein the base PLP includes a program number corresponding to the broadcast service and program map table information having identification information of each PLP signaled thereto. The broadcasting signal receiving method according to the present invention further includes a step of demodulating the broadcasting signal based upon the first and second preamble signals, a step of performing FEC decoding on the demodulated broadcasting signal, and a step of identifying a PLP group including a plurality of PLPs from the FEC-decoded broadcasting signal based upon the first and second signaling information, and decoding at least one PLP of the identified PLP group, thereby providing a broadcast service. Herein, the PLP decoding step may identify the PLP group including the plurality of PLPs by using PLP group identification information and identification information of each PLP, which are included in the first signaling information, may identify each PLP included in the identified PLP group, and may identify the base PLP and the broadcast service by using base PLP identification information and service identification information, which are both included in the second signaling information.

Effects of the Invention

According to the present invention, a transmitter may perform transmission by generating a PLP for each component configuring a service, and a receiver may identify and decode the PLP, which is received for each component. Thus, the present invention may respond to the mobile broadcast communication environment with more flexibility.

The transmitter of the present invention may distinguish one component as a component of a base layer and as a component of at least one enhancement layer, and may transmit the distinguished component. And, the receiver may decode only the component of the base layer so as to provide an image with basic picture quality, or the receiver may decode the component of the base layer along with the component of at least one enhancement layer so as to provide an image with higher picture quality. Thus, the present invention may provide images having diverse picture qualities in accordance with the receiver characteristic.

In the present invention, a transmitting end demuxes (or demultiplexes) data and a receiving end muxes (or multiplexes), so that optimal performance can be gained when applying an LDPC codeword having a lower code rate to the broadcasting/communication system. Thus, an optimal error correction performance of the LDPC may be gained even at a lower code rate for a mobile service or a service in a location having a weaker signal, such as an indoor location.

Most particularly, the present invention may gain more enhanced robustness while ensuring commonality with the conventional broadcasting/communication system.

By using a MIMO system, the present invention may increase data transmission efficiency and may enhance robustness in broadcasting signal transmission/reception.

Therefore, according to the present invention, the present invention may provide a method and device for transmitting/receiving a broadcasting signal that can receive a digital broadcasting signal without any error even in a mobile receiving equipment or an indoor environment.

BRIEF DESCRIPTION OF THE DRAWINGS

FIG. 2 illustrates an exemplary structure of a signal frame according to an embodiment of the present invention, FIG. 21 illustrates exemplary mapping correlation between the input bits and the output bits of the bit-cell demux according demux type of FIG. 20, (a) to (c) of FIG. 22 illustrate other exemplary output orders of the bit-cell demux in accordance to each code rate, when an LDPC block length is equal to 16800, and when the modulation format that is to be used for symbol mapping correspond to 256QAM, FIG. 23 illustrates exemplary mapping correlation between the input bits and the output bits of the bit-cell demux according demux type of FIG. 22, (a) to (c) of FIG. 24 illustrate other exemplary output orders of the bit-cell demux in accordance to each code rate, when an LDPC block length is equal to 16800, and when the modulation format that is to be used for symbol mapping correspond to 256QAM, (a) to (c) of FIG. 25 illustrate exemplary output orders of the bit-cell demux in accordance to each code rate, when an LDPC block length is equal to 16800, and when the modulation format that is to be used for symbol mapping correspond to 64QAM, (a) and (b) of FIG. 26 illustrate exemplary output orders of the bit-cell demux in accordance to each code rate, when an LDPC block length is equal to 16800, and when the modulation format that is to be used for symbol mapping correspond to 16QAM, FIG. 44 illustrates an exemplary syntax structure of P1 signaling information according to an embodiment of the present invention, FIG. 45 illustrates an exemplary syntax structure of AP1 signaling information according to an embodiment of the present invention, FIG. 46 illustrates an exemplary syntax structure of L1-pre signaling information according to an embodiment of the present invention, FIG. 47 illustrates an exemplary syntax structure of configurable L1-post signaling information according to an embodiment of the present invention, FIG. 48 illustrates an exemplary syntax structure of dynamic L1-post signaling information according to an embodiment of the present invention, FIG. 50 illustrates an exemplary syntax structure of a delivery system descriptor according to the first embodiment of the present invention, FIG. 53 illustrates an exemplary syntax structure of a component ID descriptor according to the second embodiment of the present invention, FIG. 56 illustrates an exemplary syntax structure of a delivery system descriptor according to the third embodiment of the present invention, FIG. 57 illustrates an exemplary syntax structure of a component ID descriptor according to the third embodiment of the present invention, FIG. 61 illustrates an exemplary syntax structure of an IP/MAC_location_descriptor according to the fourth embodiment of the present invention.

BEST MODE FOR CARRYING OUT THE PRESENT INVENTION

Reference will now be made in detail to the preferred embodiments of the present invention, examples of which are illustrated in the accompanying drawings. Wherever possible, the same reference numbers will be used throughout the drawings to refer to the same or like parts. And, the scope and spirit of the present invention will not be limited only to the exemplary embodiments presented herein.

Although the terms used in the present invention are selected from generally known and used terms, the detailed meanings of which are described in relevant parts of the description herein. It should be noted that the terms used herein may vary depending upon the intentions or general practice of anyone skilled in the art and also depending upon the advent of a novel technology. Some of the terms mentioned in the description of the present invention have been selected by the applicant at his or her discretion, terms used herein. Furthermore, it is required that the present invention is understood, not simply by the actual terms used but by the meaning of each term lying within.

The present invention relates to an apparatus and method for transmitting and receiving an additional broadcast signal, while sharing an RF frequency band with related art broadcasting system, such as a conventional terrestrial broadcast system (or also referred to as a T2 system), e.g., DVB-T2. In the present invention, the additional broadcast signal may correspond to an extension (or enhanced) broadcast signal and/or a mobile broadcast signal.

In the description of the present invention, an additional broadcast signal refers to as signal that is processed and transmitted in accordance with a non-MIMO (Multi Input Multi Output) method or a MIMO method. Herein, a MISO (Multi Input Single Output) method, a SISO (Single Input Single Output) method, and so on, may correspond to the non-MIMO method.

Hereinafter, 2 antennae may be given as an example of the multi antennae of the MISO method or the MIMO for simplicity of the description of the present invention. And, such description of the present invention may be applied to all types of systems using 2 or more antennae.

Figure 1:
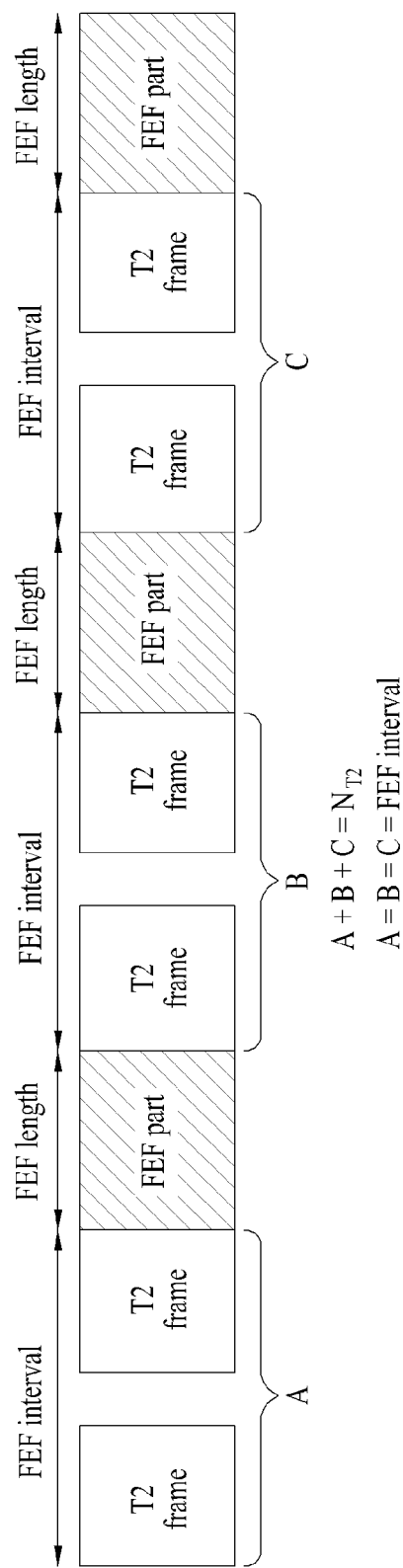
FIG. 1 illustrates an exemplary super frame structure according to the present invention.

FIG. 1 illustrates an exemplary super frame structure including an additional broadcast signal (e.g., mobile broadcast signal) according to the present invention. A super frame may be configured of a plurality of frames, and the frames belonging to one super frame may be transmitted by using the same transmission method. The super frame according to the embodiment of the present invention may be configured of multiple T2 frames (also referred to as a terrestrial broadcast frame) and additional non-T2 frames for the additional broadcast signal. Herein, a non-T2 frame may include an FEF (Future Extension Frame) part being provided by the related art T2 system. The FEF part may not be contiguous and may be inserted in-between the T2 frames. The additional broadcast signal may be included in the T2 frame or FEF part, so as to be transmitted.

When a mobile broadcast signal is transmitted through FET part, the FEF part will be referred to as an NGH (Next Generation Handheld) frame.

At this point, 1 NGH frame may be transmitted for each N number of T2 frames (i.e., NGH-T2 frame ratio=1/N or N:1), and the T2 frame and the NGH frame may be alternately transmitted (i.e., NGH-T2 frame ratio=1/2 or 1:1). If the NGH-T2 frame ratio is equal to 1/N, the time consumed by the receiver in order to receive an NGH frame after receiving a previous NGH frame is equivalent to the time corresponding to N number of T2 frames.

Meanwhile, among the components configuring a broadcast service, the present invention may divide a video component to multiple video components and may transmit the divided video components. For example, a video component may be divided into a basic video component and an extension video component, and may then be transmitted accordingly.

According to an embodiment of the present invention, in order to enhance transmission stability, the basic video component may be transmitted in a non-MIMO method, and the extension video component may be transmitted in an MIMO method in order to provide an enhanced throughput.

In the present invention, the basic video component will hereinafter be referred to as a video component of a base layer, and the extension video component will hereinafter be referred to as a video component of an enhancement layer. Additionally, for simplicity of the description, in the present invention, the video component of the base layer will be used in combination with video data of the base layer (or data of the base layer), and the video component of the enhancement layer will be used in combination with video data of the enhancement layer (or data of the enhancement layer).

According to an embodiment of the present invention, the present invention may encode video data by using an SVC (Scalable Video Coding) method, thereby dividing the encoded video data into video data of the base layer (or base layer video data) and video data of the enhancement layer (or enhancement layer video data). Herein, the SVC method is merely exemplary. And, therefore, other arbitrary video coding methods having scalability may also be used herein.

The data of the base layer (or the base layer data) correspond to data for images having basic picture quality. Herein, although the base layer data are robust against the communication environment, the base layer data have low picture quality. And, the data of the enhancement layer (or the enhancement layer data) correspond to additional data for images of higher picture quality and may, therefore, provide images having high picture quality. However, the enhancement layer data are weak against the communication environment.

In the present invention, video data for terrestrial broadcasting may be divided into base layer data and enhancement layer data, and video data for mobile broadcasting may be divided into base layer data and enhancement layer data in order to flexibly respond to the mobile broadcasting communication environment.

The receiver may decode only video layer of the base data (or base layer video data), so as to provide an image having basic picture quality, or the receiver may decode both the base layer video data and the video layer of the enhancement data (or enhancement layer video data), so as to provide an image having a higher picture quality.

According to an embodiment of the present invention the enhancement layer video data may be transmitted through an FEF, and the base layer data may be transmitted through the T2 frame and/or FEF.

In the present invention, an audio component may include an audio component of a base layer (or base layer audio component) for providing basic sound quality, such as 2 channel or 2.1 channel, and an audio component of an enhancement layer (or enhancement layer audio component) for providing additional sound quality, such as 5.1 channel or MPEG-Surround.

According to an embodiment of the present invention, a signal frame may refer to any one of a T2 frame, an FEF transmitting a mobile broadcasting signal (i.e., NGH frame), a T2 frame transmitting base layer video data, and an FEF transmitting enhancement layer video data. In the description of the present invention, the signal frame and the transmission frame will be used to have the same meaning.

In the present invention, a PLP (physical layer pipe) corresponding to an identifiable data (or stream) unit. Also, the PLP may be considered as a physical layer TDM (Time Division Multiplex) channel, which transmits (or delivers) one or more services. More specifically, each service may be transmitted and received through multiple RF channels. Herein, the PLP may represent a path through which such service is being transmitted or may represent a stream being transmitted through such path. The PLP may also be located in slots being distributed to multiple RF channels at predetermined time intervals, and the PLP may also be distributed in a single RF channel at predetermined time intervals. Therefore, signal frame may transmit a PLP, which is distributed to a single RF channel based upon a time reference. In other words, one PLP may be distributed to a single RF channel or multiple RF channels based upon a time reference.

In the present invention, one service may be transmitted to one PLP, and components configuring a service may be divided (or differentiated), so that each of the differentiated components can be transmitted to a different PLP. If service components configuring a single service are differentiated from one another so as to be respectively transmitted to a different PLP, the receiver may gather (or collect) the multiple components, so as to combine the collected components to a single service. In the present invention, the service component and the component will be used to have the same meaning.

FIG. 2 illustrates an exemplary structure of a signal frame over a physical layer according to an embodiment of the present invention. The signal frame includes a P1 signaling information region (or part), an L1 signaling information region, and a PLP region. More specifically, the P1 signaling information region may be allocated to a foremost portion of the corresponding signal frame, and, then, the L1 signaling information region and the PLP region may be sequentially allocated after the P1 signaling information region. In the description of the present invention, only the information being included in the L1 signaling information region may be referred to as L1 signaling information, or signaling information being included in the P1 signaling information region and signaling information being included in the L1 signaling information region may be collectively referred to as the L1 signaling information.

As shown in FIG. 2, P1 signaling information that is being transmitted to the P1 signaling information region may be used for detecting a signal frame and may include information for identifying preamble itself.

Based upon the P1 signaling information, the subsequent L1 signaling information region is decoded, so as to acquire information on the PLP structure and the signal frame configuration. More specifically, the L1 signaling information includes L1-pre-signaling information and L1-post-signaling information. Herein, the L1-pre-signaling information includes information required by the receiver to receive and decode L1-post-signaling information. And, the L1-post-signaling information includes parameters required by the receiver for accessing the PLP. The L1-post-signaling information may then include Configurable L1-post-signaling information, Dynamic L1-post-signaling information, Extension L1-post-signaling information, and CRC information, and the L1-post-signaling information may further include L1 padding data. In the present invention, configurable L1-post signaling information has the same meaning as the L1-post configurable signaling information. Moreover, dynamic L1-post signaling information has the same meaning as the L1-post dynamic signaling information Meanwhile, in the signal frame, the PLP region is configured of at least one common PLP and at least one data PLP.

A common PLP includes PSI/SI (Program and System Information/Signaling Information).

Specifically, when a broadcast signal is a TS format, the common PLP may include network information, such as an NIT (Network Information Table), or PLP information, and service information, such as an SDT (Service Description Table), an EIT (Event Information Table) and a PMT (Program Map Table)/a PAT (Program Association Table). Based upon the intentions of the system designer, service information, such as SDT and PMT/PAT, may be included in data PLP and may then be transmitted. The PAT corresponds to special information being transmitted by a packet having a PID of '0', and the PAT includes PID information of the PMT and PID information of the NIT. The PMT includes a program identification number, PID information of a TS packet to which individual bit streams, such as video, audio, and so on, are being transmitted, wherein the individual bit streams configure a program or (service), and PID information through which a PCR is being delivered. The NIT includes information of an actual transmission network (i.e., physical network). The EIT includes information on an event (or program or service) (e.g., title, start time, and so on). The SDT includes information describing a service, such as a service name or service provider.

When a broadcasting signal corresponds to an IP format, the common PLP may include an IP information table, such as n INT (IP/MAC notification table). In the description of the present invention information being included in the common PLP may be referred to as L2 signaling information.

More specifically, L1 signaling information includes information required by the broadcasting signal receiver for processing a PLP within a signal frame, and the L2 signaling information includes information that can be commonly applied to multiple PLPs. Accordingly, the broadcasting signal receiver may use P1 signaling information included in a P1 signaling information region, so as to decode an L1 signaling information region, thereby acquiring information on the structure of PLP included in the signal frame and information a frame structure. Most particularly, the broadcasting signal receiver may be capable of knowing through which PLP each of the service components being included in the corresponding service is being transmitted by referring to the L1 signaling information and/or the L2 signaling information. Additionally, the BICM module of the broadcasting signal transmitter may encode signaling information associated with a broadcast service and may transmit L1/L2 signaling information, so that the broadcasting signal receiver can perform decoding. Moreover, the MICM decoder of the broadcasting signal receiver may decode the L1/L2 signaling information.

At this point, when the L1 signaling information includes information on the service components, the broadcasting signal receiver may recognize the information on the service components at the same time the broadcasting signal receiver receives the signal frame, and the broadcasting signal receiver may then apply the corresponding information. However, since the size of the L1 signaling information is limited, the size (or amount) of the information on the service components that can be transmitted from the broadcasting signal transmitter may also be limited. Accordingly, the L1 signaling information region is most adequate for recognizing the information on the service components at the same time the broadcasting signal receiver receives the signal frame and for transmitting information that can be applied to the broadcasting signal receiver.

If the L2 signaling information includes information on the service components, the broadcasting signal receiver may acquire information on the service components after the decoding of the L2 signaling information is completed. Therefore, the broadcasting signal receiver may not be capable of recognizing the information on the service components at the same time the broadcasting signal receiver receives the signal frame and may not be capable of modifying the corresponding information. However, since the size of the region transmitting the L2 signaling information is larger than the L1 signaling information region, the L2 signaling information region may transmit a larger amount (or size) of service component data. Accordingly, the L2 signaling information is adequate for transmitting general information on service components.

According to an embodiment of the present invention the L1 signaling information may be used along with the L2 signaling information. More specifically, the L1 signaling information may include information that can be modified (or changed) at the same time the broadcasting signal receiver receives the signal frame in a PLP level, such as a high mobile performance and a high-speed data communication characteristic, or may include information of service components that can be modified (or changed) at any time during the broadcasting signal transmission. Additionally, the L2 signaling information may include information on the service components and general information on channel reception, which are included in a service.

Meanwhile, a data PLP, which is included in the signal frame, may include audio, video, and data TS streams and PSI/SI information, such as a PAT (Program Association Table), a PMT (Program Map Table). The data PLP may include a Type1 data PLP, which is transmitted by one sub-slice for each signal frame, and a Type2 data PLP, which is transmitted by multiple sub-slices. In the description of the present invention, for simplicity of the description, P number of data PLPs will hereinafter be indicated as PLP1~PLPp. More specifically, audio, video, and data TS streams and PSI/SI information, such as PAT/PMT, are transmitted through PLP1~PLPp. The data PLPs of FIG. 2 correspond to examples after scheduling and interleaving.

In the present invention the common PLP may be decoded along with a data PLP, and the data PLP may be selectively (or optionally) decoded. More specifically, a common PLP+data PLP may always be decoded. However, in some cases data PLP1+data PLP2 may not be decoded. Information being included in the common PLP may include the PSI/SI information. Additionally, Auxiliary Data may be added to the signal frame.

Figure 3:
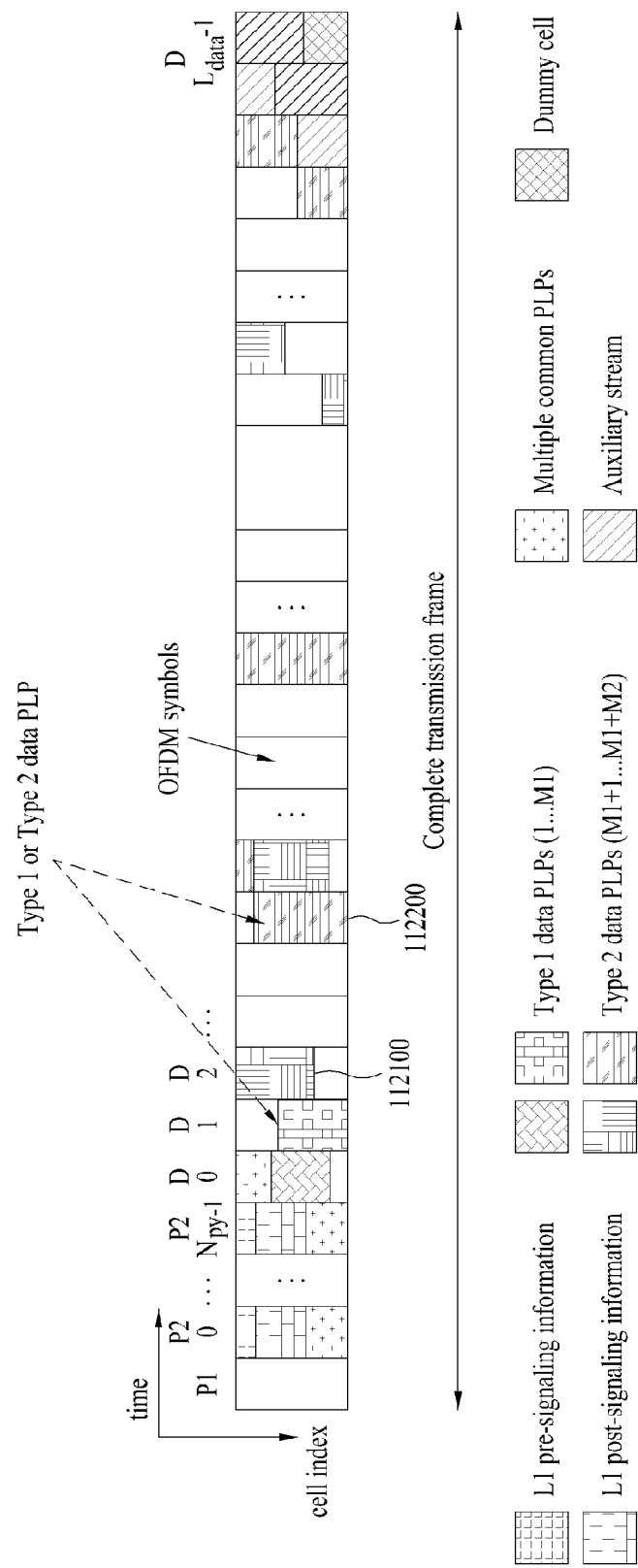
FIG. 3 illustrates a PLP-based signal frame structure according to an embodiment of the present invention, (a) of FIG. 4 illustrates a P1 symbol structure according to the present invention, (b) of FIG. 4 illustrates a block diagram showing an exemplary structure of a P1 symbol generator according to the present invention.

FIG. 3 illustrates a signal frame structure at a symbol level according to an embodiment of the present invention.

In light of the symbol level, the signal frame according to the present invention is divided intro a preamble region and a data region. The preamble region is configured of a P1 symbol and at least one or more P2 symbols, and the data region is configured of a plurality of data symbols.

Herein, the P1 symbol transmits P1 signaling information. The at least one or more P2 symbols transmit L1-pre-signaling information, L1-post-signaling information, and signaling information being included in the common PLP (i.e., L2 signaling information). The signaling information being included in the common PLP may be transmitted through a data symbol. Therefore, in light of the signal frame over a physical layer, the preamble region includes a P1 signaling information region, an L1 signaling information region, and a portion or an entire portion of the common PLP region. In the description of the present invention a PLP transmitting PSI/SI and, more particularly, PAT/PMT will hereinafter be referred to a base PLP.

Data PLPs being transmitted through multiple data symbols may include a Type1 data PLP being transmitted, which is transmitted by one sub-slice for each signal frame, and a Type2 data PLP, which is transmitted by multiple sub-slices. According to an embodiment of the present invention, when both the Type1 data PLP and the Type2 data PLP exist in a signal frame, the Type1 data PLP is first allocated, and the Type2 data PLP is allocated afterwards.

The Type1 data PLP refers to having one sub-slice within a signal frame, i.e., one PLP being continuously transmitted within a signal frame. For example, when it is assumed that 2 type1 data PLPs (PLP1, PLP2) are being transmitted, when all of the data of PLP1 are first allocated to the corresponding signal frame, then all of the data of PLP2 are allocated afterwards, and, thereafter, the data are transmitted.

The Type2 data PLP refers to a PLP having two or more sub-slices within the signal frame. More specifically, the data of each PLP are divided into as many sections as the number of sub-slices. And, then, the divided data are distributed and transmitted to each sub-slice. For example, when it is assumed that 2 Type2 data PLP (PLP3, PLP4) exist in a single signal frame, and when it is assumed that each Type2 data PLP has 2 sub-slices, the data of PLP3 and the data of PLP4 are each divided into 2 equal sections, and the divided data are sequentially allocated to the 2 sub-slices of the corresponding PLP. At this point, according to the embodiment of the present invention, the sub-slice for PLP3 and the sub-slice for PLP4 are alternately positioned so as to be transmitted accordingly. In order to gain higher time diversity, the present invention uses the Type2 data PLP.

In the description of the present invention, one data PLP may correspond to one service, and one data PLP may also correspond to any one of the service components configuring a service, such as a video component (or also referred to as a base layer video component), an extension video component (or also referred to as an enhancement layer video component), and audio component, and a data component other than the video and audio components.

Meanwhile, the present invention may transmit separate signaling information from the transmitter, so that the receiver can identify additional broadcast signal frame, such as an NGH frame, and process the identified frame. The present invention transmits separate signaling information through a P1 symbol. And, herein, the P1 symbol will be referred to as a new_system_P1 symbol.

The new_system_P1 symbol may be different from the P1 symbol, and a plurality of new_system_P1 symbols may be used herein. At this point, according to the embodiment of the present invention, the new_system_P1 symbol is located at the beginning of the signal frame, i.e., located at a front portion of a first P2 symbol within a preamble region. In this case, the preamble region may be configured of at least one or more new_system_P1 symbols and at least one or more P2 symbols.

(a) of FIG. 4 illustrates a P1 symbol structure according to the present invention. In (a) of FIG. 4, the P1 symbol and P2 symbol portion will be referred to as a preamble region, and a body region will be referred to as a data region. The data region may be configured of a plurality of data symbols (also referred to as data OFDM symbols).

In (a) of FIG. 4, P1 symbol is generated by having each of a front portion and an end portion of an effective (or valid) symbol copied, by having a frequency shift performed as much as $+f_{sh}$, and by having the frequency-shifted copies respectively positioned at a front portion (C) and an end portion (B) of the effective symbol (A). In the present invention, the C portion will be referred to as a prefix, and the B portion will be referred to as a postfix. More specifically, P1 symbol is configured of a prefix portion, an effective symbol portion, and a postfix portion. In the description of the present invention, such P1 symbol structure will also be referred to as a C-A-B structure. At this point, according to the present invention, the P1 symbol corresponds to 1K OFDM symbol. And, according to the embodiment of the present invention, the A portion ($T_{P1A}$) may have the length of 112 us, the C portion ($T_{P1C}$) may have the length of 59 us, and the B portion ($T_{P1B}$) may have the length of 53 us.

(b) of FIG. 4 illustrates a block diagram showing an exemplary structure of a P1 symbol generator according to the present invention. Herein, (b) of FIG. 4 includes a CDS (Carrier Distribution Sequence) table module (000100), an MSS (Modulation Signaling Sequence) module (000200), a DBPSK (Differential Binary Phase Shift Keying) mapping module (000300), a scrambling module (000400), a padding module (000500), an IFFT module (000600), and a C-A-B structure module (000700). After being processed with the operations of each block included in the P1 symbol generator shown in (b) of FIG. 4, the P1 symbols shown in (a) of FIG. 4 is finally outputted from the C-A-B structure module (000700).

According to the embodiment of the present invention, the structure of the P1 symbol, shown in (a) of FIG. 4, may be modified, or the P1 symbol generator, shown in (b) of FIG. 4 may be modified, so as to generate a new_system_P1 symbol.

If the new_system_P1 symbol is generated by modifying the P1 symbol shown in (a) of FIG. 4, the new_system_P1 symbol may be generated by using at least one of the following methods. For example, the new_system_P1 symbol may be generated by modifying a frequency shift (or displacement) value ($f_{sH}$) for a prefix and a postfix. In another example, the new_system_P1 symbol may be generated by modifying (or changing) the length of the P1 symbol (e.g., $T_{P1C}$ and $T_{P1B}$ lengths). In yet another example, the new_system_P1 symbol may be generated by replacing the length of the P1 symbol from 1K to 512,256,128, and so on. In this case, the parameters (e.g., $f_{SH}$, $T_{P1C}$, $T_{P1B}$) that are used in the P1 symbol structure should be adequately corrected.

If the new_system_P1 symbol is generated by modifying the P1 symbol generator shown in (b) of FIG. 4, the new_system_P1 symbol may be generated by using at least one of the following methods. For example, the new_system_P1 symbol may be generated by using a method of changing the distribution of active carriers (e.g., a method of having the CDS table module (000100) use another CSS (Complementary Set of Sequence)), which are used for the P1 symbol, through the CDS table module (000100), the MSS module (000200), and the C-A-B structure module (000700). In another example, the new_system_P1 symbol may be generated by using a method of changing a pattern for transmitting information to the P1 symbol (e.g., a method of having the MSS module (000200) use another CSS), and so on.

Meanwhile, the present invention may additionally allocate a preamble symbol to the preamble region within a signal frame, particularly an NGH frame. Hereinafter, the additional preamble signal will be referred to as an AP1 symbol (Additional Preamble symbol) for simplicity in the description of the present invention. In order to enhance the detection performance for detecting a mobile broadcast (i.e., NGH) signal, in a considerably low SNR condition or a time-selective fading condition, at least one or more AP1 symbol is added to the signal frame.

At this point, according to the embodiment of the present invention, the AP1 symbol is located between a P1 symbol and a first P2 symbol within the preamble region of a signal frame. More specifically, the P1 symbol and the AP1 symbol are consecutively transmitted. According to the embodiment of the present invention, if the P2 symbol is not transmitted to the signal frame, the AP1 symbol may be located between the P1 symbol and the first data symbol within the preamble region of the signal frame. According to another embodiment of the present invention, the P1 symbol and the AP1 symbol may be allocated to non-consecutive positions within a single signal frame, so as to be transmitted.

For example, when a signal frame includes an AP1 symbol, the preamble region of the signal frame is configured of a P1 symbol, at least one or more AP1 symbols, and at least one or more P2 symbols. And, the data region may be configured of a plurality of data symbols (or data OFDM symbols).

As described in the embodiments for generating the new_system_P1 symbol, according to the embodiment of the present invention, the AP1 symbol may be generated by modifying the structure of the P1 symbol, shown in (*a*) of FIG. 4, or by modifying the P1 symbol generator, shown in (*b*) of FIG. 4. According to the embodiment of the present invention, the AP1 symbol may be generated by modifying both the structure of the P1 symbol, shown in (*a*) of FIG. 4, and the P1 symbol generator, shown in (*b*) of FIG. 4.

As described in the embodiment of the present invention, when at least 2 or more preamble symbols are used, the present invention is advantageous in that the present invention can be more robust against a burst fading effect, which may occur in a mobile fading environment, and that a signal detection performance can be enhanced.

Figure 5:
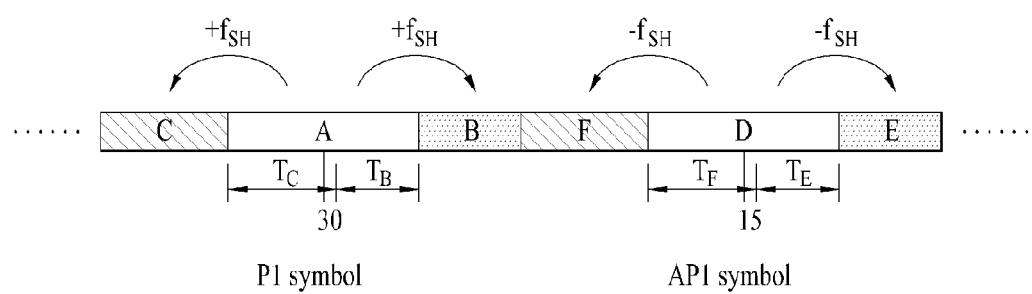
FIG. 5 illustrates an exemplary structure of a P1 symbol and an exemplary structure of an AP1 symbol according to an embodiment of the present invention.

FIG. 5 illustrates an exemplary structure of a P1 symbol and an exemplary structure of an AP1 symbol according to an embodiment of the present invention. FIG. 5 shows an example of generating an AP1 symbol by modifying the P1 symbol.

In FIG. 5, P1 symbol, which is shown on the left side, is generated by having each of a front portion and an end portion of an effective (or valid) symbol copied, by having a frequency shift performed as much as +$f_{sh}$, and by having the frequency-shifted copies respectively positioned at a front portion (C) and an end portion (B) of the effective symbol (A). In the present invention, the C portion will be referred to as a prefix, and the B portion will be referred to as a postfix. More specifically, P1 symbol is configured of a prefix portion, an effective symbol portion, and a postfix portion.

In FIG. 5, AP1 symbol, which is shown on the right side, is generated by having each of a front portion and an end portion of an effective (or valid) symbol copied, by having a frequency shift performed as much as −$f_{sh}$, and by having the frequency-shifted copies respectively positioned at a front portion (F) and an end portion (E) of the effective symbol (D). In the present invention, the F portion will be referred to as a prefix, and the E portion will be referred to as a postfix. More specifically, AP1 symbol is configured of a prefix portion, an effective symbol portion, and a postfix portion.

Herein, the two frequency-shift values +$f_{sh}$, −$f_{sh}$, which are used in the P1 symbol and the AP1 symbol, may have the same absolute value yet be given opposite signs. More specifically, the frequency-shift is performed in opposite directions. And, the lengths C and F, which are copied to the front portion of the effective symbol, may be set to have different values. And, the lengths B and E, which are copied to the end portion of the effective symbol, may be set to have different values. Alternatively, the lengths C and F may be set to have different values, and the lengths B and E may be set to have the same value, or vice versa. According to another embodiment of the present invention, an effective symbol length of the P1 symbol and an effective symbol length of the AP1 symbol may be differently determined. And, according to yet another embodiment of the present invention, a CSS (Complementary Set Sequence) may be used for tone selection and data scrambling within the AP1 may be scrambled by AP1.

According to the embodiment of the present invention, the lengths of C and F, which are copied to the front portion of the effective (or valid) symbol, may be set to have different values, and the lengths of B and E, which are copied to the end portion of the effective (or valid) symbol, may also be set to have different values.

The C, B, F, E lengths according to the present invention may be obtained by using Equation 1 shown below.

Length of $C(T_C)$={Length of $A(T_A)/2+30$}

Length of $B(T_B)$={Length of $A(T_A)/2-30$}

Length of $E(T_F)$={Length of $D(T_D)/2+15$}

Length of $E(T_E)$={Length of $D(T_D)/2-15$}  Equation 1

As shown in Equation 1, P1 symbol and AP1 symbol have the same frequency shift value. However, each of the P1 symbol and the AP1 symbol are given opposite signs. Additionally, in order to determine the lengths of C and B, the present invention determines an offset value being added to or subtracted from a value corresponding to the length of A ($T_A$)/2. And, in order to determine the lengths of F and E, the present invention determines an offset value being added to or subtracted from a value corresponding to the length of D ($T_D$)/2. Herein, each of the offset values is set up differently. According to the embodiment of the present invention, the offset value of P1 symbol is set to 30, and the offset value of AP1 symbol is set to 15. However, the values given in the above-described examples are merely exemplary. And, therefore, it will be apparent that the corresponding values may easily be varied or changed by anyone skilled in the art. Thus, the present invention will not be limited only to the values presented herein.

According to the present invention, by generating AP1 symbol and an AP1 symbol to configure the structure shown in FIG. 5, and by inserting the generated symbols to each signal frame, the P1 symbol does not degrade the detection performance of the AP1 symbol, and, conversely, the AP1 symbol does not degrade the detection performance of the P1 symbol. Additionally, the detection performance of the P1 symbol is almost identical to the detection performance of the AP1 symbol. Furthermore, by configuring the symbols so that the P1 symbol and the AP1 symbol have similar symbol structures, the complexity level of the receiver may be reduced.

At this point, the P1 symbol and the AP1 symbol may be transmitted consecutively, or each of the symbols may be allocated to different positions within the signal frame and may then be transmitted. And, in case the P1 symbol and AP1 symbol are each allocated to a different position within the signal frame, so as to be transmitted, a high time diversity effect may be gained with respect to the preamble symbol. According to the embodiment of the present invention, the P1 symbol and the AP1 symbol are consecutively transmitted.

Figure 6:
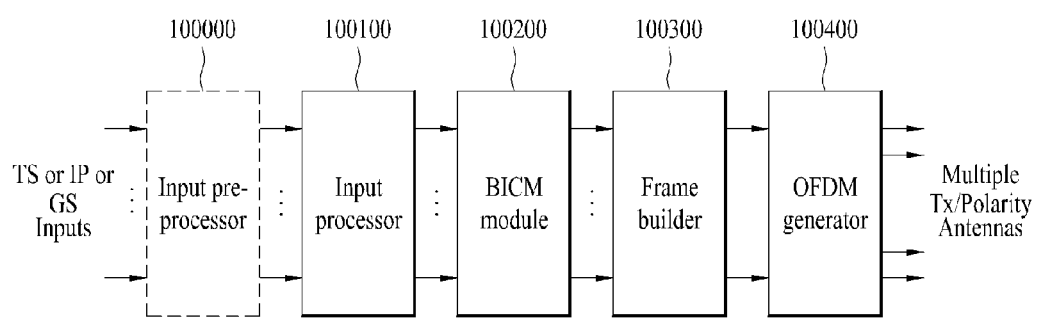
FIG. 6 illustrates a block diagram showing a broadcasting signal transmitting apparatus according to an embodiment of the present invention.

FIG. 6 illustrates a block diagram showing a broadcasting signal transmitting device (or also referred to as a broadcasting signal transmitter or a transmitter) according to an embodiment of the present invention.

As shown in FIG. 6, the broadcasting signal transmitting device may include an input pre-processor (100000), an input processor (100100), a BICM module (100200), a frame builder (100300), and an OFDM generator (100400). Herein, the BICM module (100200) is also referred to as a BICM encoder.

The input stream may include at least one of a TS stream, an internet protocol (IP) stream, and a GSE (General Sream Encapsulation) stream (or also referred to as a GS stream).

The input pre-processor (100000) may receive at least one the TS stream, the IP stream, and the GS stream, so as to generate at least one or more PLPs in service units (or service component units) in order to provide robustness.

The input processor (100100) generates a BB frame including at least one or more of the PLPs generated from the input pre-processor (100000). In case the input processor (100100) receives a PLP corresponding to a service, the input processor (100100) may categorize the received PLP as PLPs corresponding to the service components and may, then, generate the BB frame.

The BICM module (100200) adds redundancy to the output of the input processor (100100), so that any error occurring over the transmission channel can be corrected, and then the BICM module (100200) performs interleaving.

The frame builder (100300) maps the plurality of PLPs to the transmission frame is cell units, so as to complete the transmission frame (or signal frame) structure.

The OFDM generator (100400) performs OFDM modulation on the input data, so as to generate a baseband signal that can be transmitted to the antenna.

As described above, according to an embodiment of the present invention, the input pre-processor (100000) may categorize the data corresponding to the service to each component, and, then, the input pre-processor (100000) may perform data processing, so that the data corresponding to each component can be transmitted to a separate PLP.

The broadcasting signal transmitting device according to the present invention may be transmitted to one or more services in PLP units. However, the components being included in one service may be separated and transmitted in PLP units. In this case, the broadcasting signal receiving device may identify and process the PLPs including each component, so as to be capable of providing a single service. In order to do so, the input pre-processor (100000) according to the present invention processes data in component units.

In the following description of the present invention, an example of generating a PLP by receiving a stream having a TS format and an example of generating a PLP by receiving a stream having an IP format will be separately described.

Figure 7:
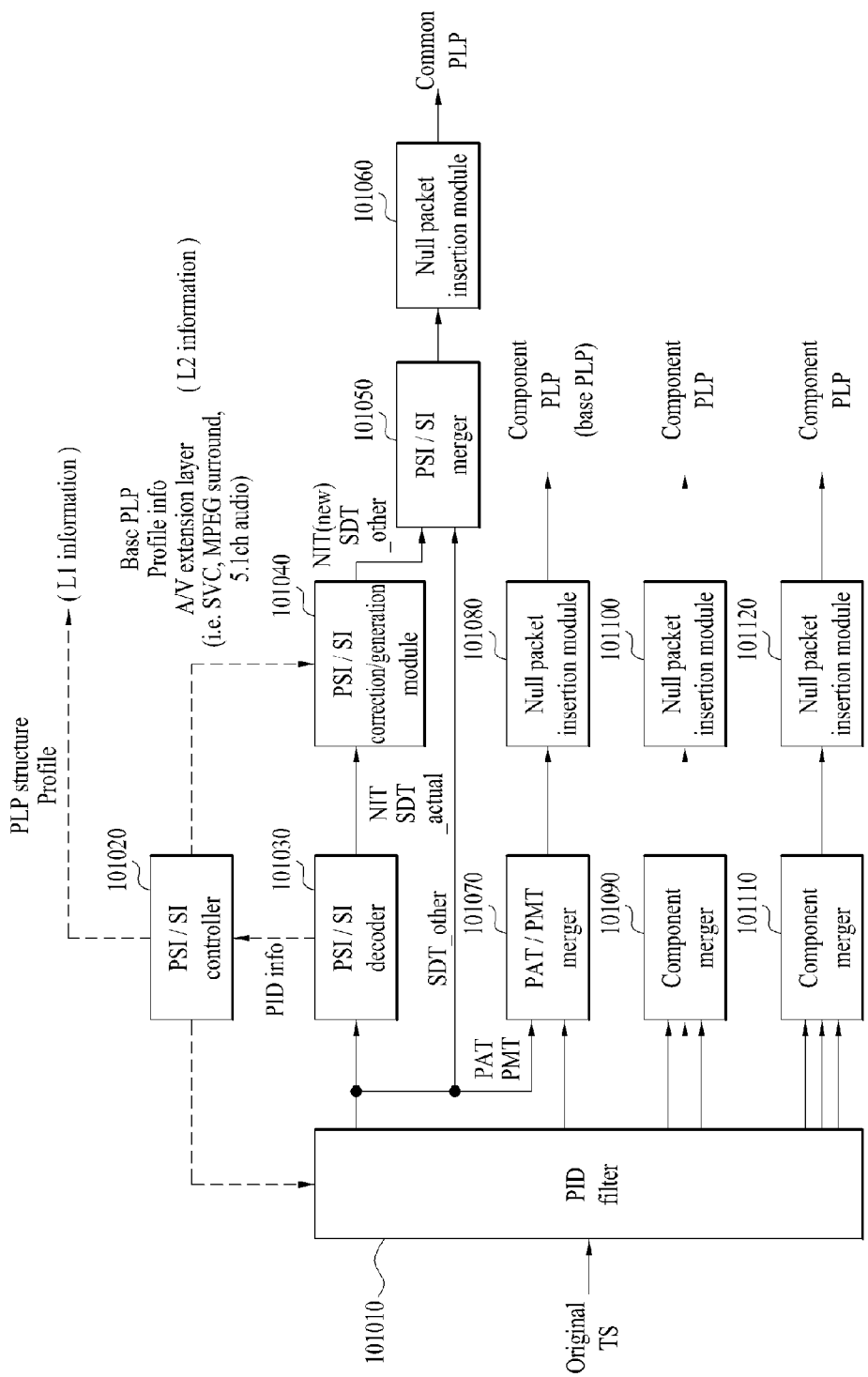
FIG. 7 illustrates a block diagram showing an input pre-processor according to an embodiment of the present invention, (a) and (b) of FIG. 8 illustrate an example of configuring a PLP in component units in an input pre-processor according to the present invention, (a) and (b) of FIG. 9 illustrate another example of configuring a PLP in component units in an input pre-processor according to the present invention.

FIG. 7 illustrates a block diagram of the present invention showing a structure of the input pre-processor receiving a stream having a TS format according to an embodiment of the present invention.

The input pre-processor of FIG. 7 includes a PID filter (101010), a PSI/SI controller (101020), a PSI/SI decoder (101030), a PSI/SI modifying/generating module (101040), a PSI/SI merger (101050), a PAT/PMT merger (101070), component mergers (101090, 101110), and null packet inserting modules (101060, 101080, 101100, 101120).

The input pre-processor differentiates the TS packets included in the TS for each component, and outputs each of the differentiated TS packets to a different PLP. Herein, each TS packet is configured of a header and a payload, and the header includes a Packet Identifier (PID) indicating the data to which the header data correspond. The payload may include any one of a video Elementary Stream (ES), an audio ES, a data ES, and a PSI/SI ES, which are to be transmitted. Additionally, information included in the common PLP may also be referred to as L2 signaling information or L2 information/data, and L1 signaling information may also be referred to as L1 information.

According to an embodiment of the present invention, when the video component is divided into a base layer video component and an enhancement layer video component, the PID of a TS packet including the base layer video component and the PID of a TS packet including the enhancement layer video component are different from one another.

More specifically, the PID filter (101010) filters the TS packets included in the TS by using the PID and then outputs the filtered TS packets through a corresponding PLP path. Since each TS packet is assigned with a PID, which can identify each TS packet, the PID filter (101010) may identify the TS packets corresponding to each component by using the PID and may then output the identified TS packets through a separate PLP path. However, since the PID information should be known in order to perform filtering as described above, the PID filter (101010) first filters the PSI/SI, which is included in the TS packet. The PSI/SI decoder (101030) decodes the PSI/SI information, which is filtered by the PID filter (101010), so as to acquire PID information. For example, a PAT having the PID fixed to '0' includes PID information of the PMT and PID information of the NIT, and the PMT includes PID information, such as video, audio, data ES, and so on, corresponding to each component.

Additionally, the PSI/SI controller (101020) may use the acquired PID information so as to control the PID filter (101010), thereby filtering the data corresponding to the wanted (or desired) component for each PID and outputting the filtered data. Since the PSI/SI included in the TS are transmitted by using a predetermined PID, the filtering and data processing procedures may be performed without setting up a separate PID filter (101010).

As described above, the PID filter (101010) filters the TS packet for each component and outputs each of the filtered TS packets through its respective PLP path. For example, a TS corresponding to the video component, a TS corresponding to the audio component, and a TS corresponding to the data component are each outputted to the respective component merger (101090, 101110). And, the component mergers (101090, 101110) merge the inputted TS packets so as to configure each component PLP. For example, the component merger (101090) may receive only the TS packets corresponding to a base layer video component, or may receive both the TS packets corresponding to a base layer video component and the TS packets corresponding to an enhancement layer video component. Then, the component merger (101090) may merge the received TS packets, so as to configure a single component PLP. Furthermore, TS packets including the PAT/PMT being filtered by and outputted from the PID filter (101010) are outputted to the PAT/PMT merger (101070), so as to be merged.

Thus, when configuring the PLP for each component as described above, even if the receiver scans a channel, the receiver may not be capable of searching all of the data corresponding to a single service. More specifically, unlike the method of configuring a PLP for each service and identifying the configured PLP by using the PSI/SI, since the PLP is configured for each component configuring a service in the present invention, a component PLP that does not include PSI/SI may exist. Accordingly, in the present invention, in order to locate component PLPs configuring a service, PSI/SI, such as a PAT/PMT is added to an arbitrary PLP among the component PLPs configuring the corresponding service, and a component PLP having service configuration information, such as the above-mentioned PAT/PMT will hereinafter be referred to as a base PLP. When the receiver scans and decodes the base PLP, since information on the remaining component PLPs for providing a service may be known, the above-described problem may be resolved.

The PSI/SI modifying/generating module (101040) modifies or generates PSI/SI that is to be modified or added, such as NIT, SDT, and so on, and then outputs the modified or generated PSI/SI. For example, in the above-described component PLP structure, since the base PLP includes information on the service configuration, such information on the service configuration or information on the base PLP is required to be signaled. The input pre-processor may signal the information on the base PLP to at least any one of L1 signaling information and L2 signaling information (common PLP). When signaling the information on the base PLP to the L2 signaling information, the PSI/SI modifying/generating module (101040) may signal the information on the base PLP to an NIT/SDT_other or a PAT/PMT. The information on the base PLP may include information for searching the base PLP, information required for extracting the base PLP and decoding the extracted base PLP, information on a PAT/PMT respective to the service configuration included in the base PLP. Additionally, according to the embodiment of the present invention, information on components for a service having high picture quality/high sound quality, such as SVC, MPEG surround, and so on, is signaled to the L1 signaling information.

The SDT may be indicated as SDT_actual and SDT_other, and the EIT may be indicated as EIT_actual and EIT_other. Herein, the SDT_actual/EIT_actual may each indicate that the service/event indicated by the respective information corresponds to service/event included in the current frame or TS, and the SDT_other/EIT_other may each indicate that the service/event corresponds to service/event included in another frame or TS. In case the PSI/SI extracted from the TS includes a common PLP, the PSI/SI modifying/generating module (101040) may also modify the SDT_actual to an SDT_other or may modify the EIT_actual to an EIT_other.

The PSI/SI merger (101050) merges the signaling information being outputted from the PSI/SI modifying/generating module (101040) and the signaling information being outputted from the PID filter (101010).

The null packet inserting modules (101060, 101080, 101100, 101120) respectively insert a null packet to a place (or positions) where another component has been located, so that each component can maintain synchronization within the TS. Accordingly, a common PLP is outputted from null packet inserting module (101060), and a base PLP is outputted from null packet inserting module (101080). Additionally, the corresponding component PLPs are outputted from null packet inserting modules (101100, 101120). Herein, the respective component may correspond to a video component, an audio component, a data component, and so on.

As shown in FIG. 7, the input pre-processor may receive a TS and may output data including the PSI/SI through a common PLP path, may output data corresponding to a component PLP, which includes service configuration information, through a base PLP path, and may output data corresponding each of the other components through a corresponding component PLP path, and the data corresponding to each of the above-mentioned PLP path may also be referred to as PLP data or PLP.

The input pre-processor may signal the information on the components, which are configured as described above, to the L1 signaling information, so that components can be extracted in PLP units in accordance with the receiver type. In other words, when a service type is selected in accordance with the receiver, the receiver shall process the components corresponding to the selected service. In the present invention, since the PLP is configured for each component, information on such PLP structure should be included in the L1 signaling information, so that the receiver can extract and process the components corresponding to the service. Therefore, the input pre-processor may perform control operations enabling information on the component PLP structure to be signaled to the L1 signaling information.

Figure 8:
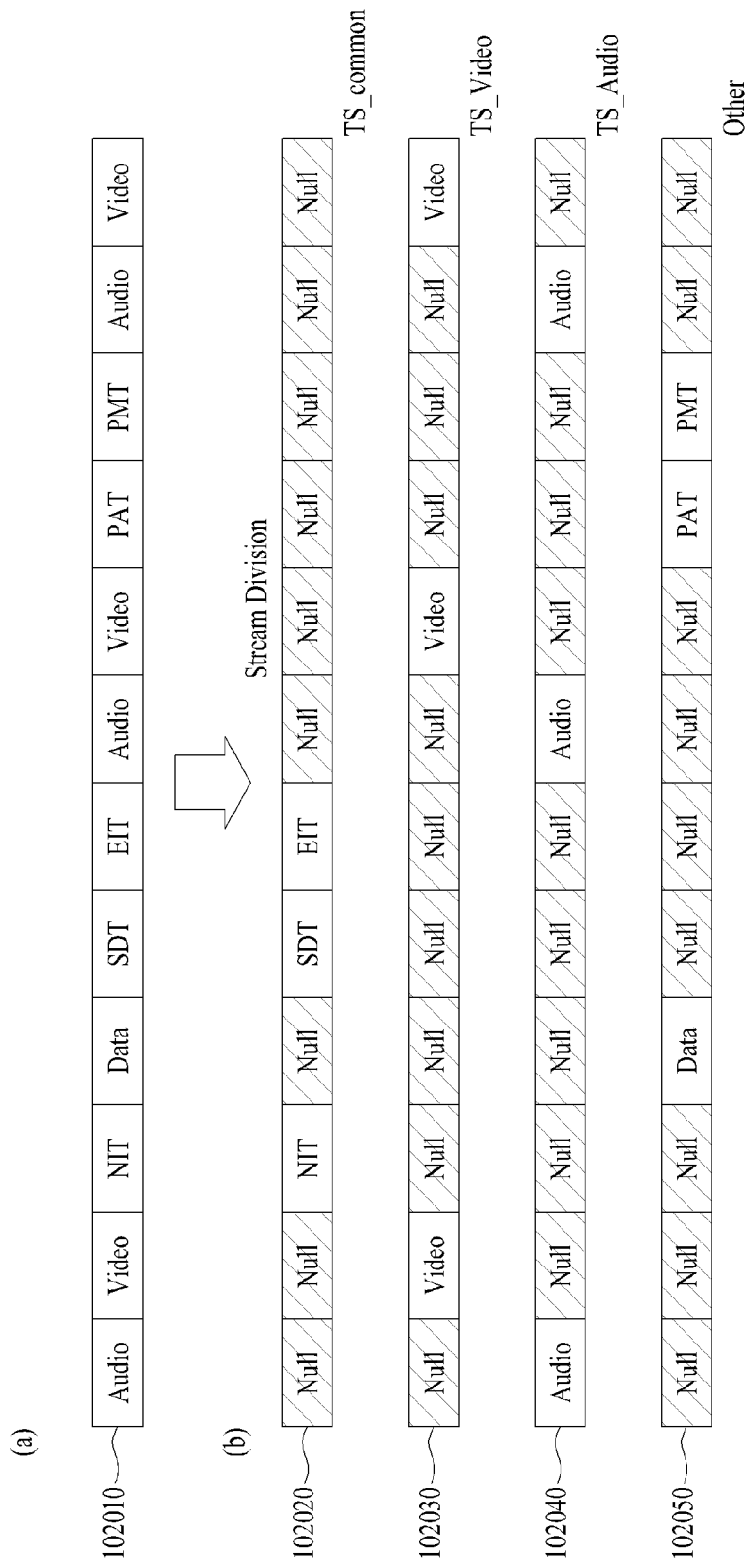

(*a*) and (*b*) of FIG. 8 illustrate a example of configuring a PLP in component units in an input pre-processor according to the present invention.

In (*a*) of FIG. 8, the TS (102010) being configured of TS packets indicate a TS being inputted to the input-pre-processor of FIG. 7. And, each TS packet includes one of data corresponding to an audio component, data corresponding to a video component, data corresponding to a data component, and data corresponding to a PSI/SI component.

The input pre-processor of FIG. 7 performs the above-described pre-processing procedure on the TS packets included in the TS stream (102010), so as to differentiate the TS packets for each component, thereby outputting each of the differentiated TS packets to a different PLP path.

For example, as shown in (*b*) of FIG. 8, TS packets including NIT, SDT, EIT are outputted through a common PLP path, thereby configuring a common TS (102020), and TS packets including data of the video component are outputted through a video component PLP path, thereby configuring a video component TS (102030). Additionally, the TS packets including data of the audio component are outputted through an audio component PLP path, thereby configuring an audio component TS (102040), and the TS packets including data of the data component and PAT/PMT information are outputted through a data component PLP path, thereby configuring a data component TS (102050). In another example, TS packets including data of 2 or more components may be outputted through a single PLP path, so as to configure a single TS. In yet another example, TS packets including data of a specific component respective to multiple services may be outputted through a single PLP path, so as to configure a single TS.

Also, when the input pre-processor separates TS packets, each being configured a different component, such as audio, video, data, and so on, to each component, in order to maintain synchronization among each component, the input pre-processor may insert a null packet in the position of another component in each component TS.

For example, the common TS (102020) inserts a null packet in a position of a TS packet (or TS packet position) including audio, video, Data, PAT, PMT, and the video component TS (102030) inserts a null packet in a position of a TS packet (or TS packet position) including audio, NIT, SDT, EIT, Data, PAT, PMT. Moreover, the audio component TS (102040) inserts a null packet in a position of a TS packet (or TS packet position) including video, NIT, SDT, EIT, Data, PAT, PMT, and the data component TS (102050) inserts a null packet in a position of a TS packet (or TS packet position) including audio, video, NIT, SDT, EIT. The insertion of the null packet is performed by the null packet inserting modules (101060, 101080, 101100, 101120) of FIG. 7. Each of the TSs of each component, having a null packet included therein, is outputted to the input processor (100100).

For simplicity in the description of the present invention, the common TS (102020) having a null packet inserted therein may also be referred to as a common PLP (or PLP data), and the video component TS (102030) having a null packet inserted therein may also be referred to as a video component PLP (or PLP data). Additionally, the audio component TS (102040) having a null packet inserted therein may also be referred to as an audio PLP (or PLP data), and the data component TS (102050) having a null packet inserted therein may also be referred to as a data component PLP (or PLP data).

Figure 9:
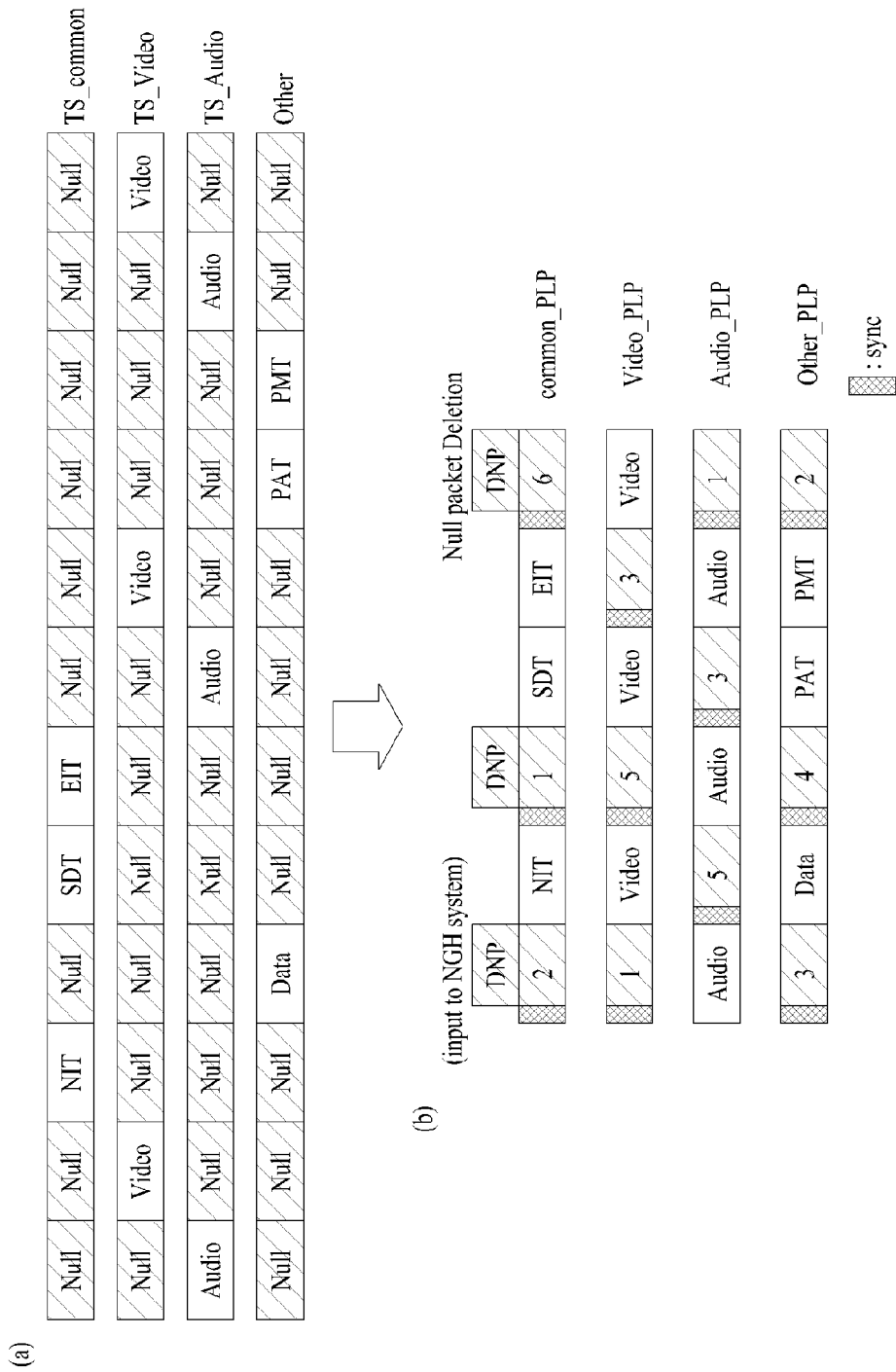

(*a*) and (*b*) of FIG. 9 illustrate another example of configuring a PLP in component units in an input pre-processor according to the present invention.

(*a*) of FIG. 9 shows an example of TSs being outputted for each component from the input pre-processor (100000), and (*b*) of FIG. 9 shows an example of TSs being outputted for each component from the input processor (100100).

The input processor (100100) deletes null packets other than the valid packets from each TS being outputted from the input pre-processor (100000). And, then, the input processor (100100) inserts information on a number of Deleted null packet (DNP) in accordance with the deleted positions. More specifically, the null packets other than the valid packets are reduced to DNP bytes in each TS.

Referring to each component PLP in (*b*) of FIG. 9, it will be apparent that a null packet is deleted from each TS, and that a DNP byte indicating the number of deleted null packets are inserted instead. Additionally, it will also be apparent that a synchronization byte for matching the synchronization in the receiving end is inserted before each DNP byte.

For simplicity in the description of the present invention, as shown in (*b*) of FIG. 9, a common TS having a null packet deleted therefrom and having a DNP byte inserted therein may also be referred to as a common PLP (or PLP data), and a video component TS having a null packet deleted therefrom and having a DNP byte inserted therein may also be referred to as a video component PLP (or PLP data). Additionally, an audio component TS having a null packet deleted therefrom and having a DNP byte inserted therein may also be referred to as an audio component PLP (or PLP data), and a data component TS having a null packet deleted therefrom and having a DNP byte inserted therein may also be referred to as a data component PLP (or PLP data).

Figure 10:
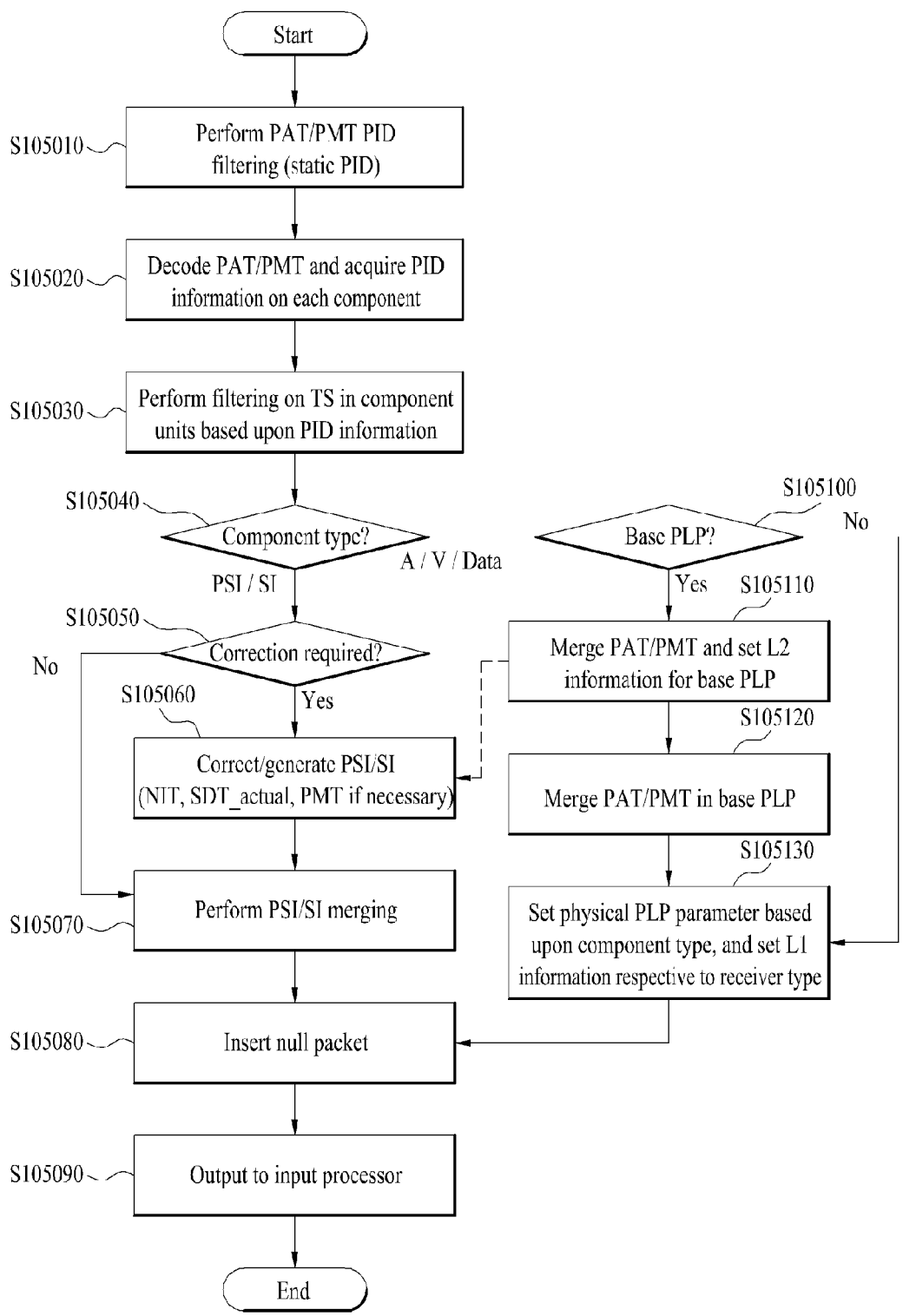
FIG. 10 illustrates a flow chart showing a pre-processing method of a broadcasting signal according to an embodiment of the present invention.

FIG. 10 illustrates a flow chart showing a pre-processing method of a broadcasting signal according to an embodiment of the present invention.

FIG. 10 shows an exemplary method of having the input pre-processor (100000) of FIG. 7 separate (or divide) the TS in component units and having the input pre-processor (100000) output data of the separated component unit to each separate PLP path.

The input pre-processor (100000) uses the PID filter (101010), so as to filter the TS packets including PAT/PMT from an input TS (S105010). Since the PAT/PMT is transmitted as a static PID from the corresponding TS packet, filtering may be performed without any separate PID filter settings. Also, the PID of the PMT may be acquired from the PAT.

The input pre-processor (100000) uses the PSI/SI decoder (101030), so as to decode the filtered PAT/PMT, thereby acquiring PID information on each component (S105020). Moreover, the PSI/SI controller (101020) sets up the PID filter (101010) by using the decoded PID information, so as to filter the TS packets for each component, thereby outputting the filtered TS packets (S105030).

The input pre-processor (100000) may perform other operations in accordance with the component type (S105040).

When the component type corresponds to the PSI/SI, i.e., when the component type corresponds to common PLP data, the input pre-processor (100000) determines whether or not the PSI/SI requires to be modified (S105050). And, when modification is required, the corresponding PSI/SI is generated or modified (S105050). Additionally, the input pre-processor (100000) may use the PSI/SI modifying/generating module (101040), so as to signal information on a base PLP to the NIT/SDT_other or PAT/PMT as described above in the description of FIG. 7, and to modify NIT, SDT, EIT information. Moreover, the input pre-processor (100000) may use the PSI/SI merger (101050), so as to merge signaling information that should be included in the PSI/SI component (S105070).

When the component type does not correspond to the PSI/SI, i.e., when the component type corresponds to component PLP data, the input pre-processor (100000) determines whether or not the data corresponds to a base PLP among the component PLPs (S105100). In case of the data respective to the base PLP, the input pre-processor (100000) merges the PAT/PMT with the data included in the base PLP, and such information on the base PLP is signaled to the L2 signaling information. In this step, the L2 signaling information may be determined to signal information on the base PLP to the NIT/SDT_other or PAT/PMT, and the PAT/PMT may be determined to signal service configuration information respective to the component structure. And, this may be performed along with the above-described step (S105060).

The input pre-processor (100000) uses the PAT/PMT merger (101070), so as to merge the PAT/PMT including the service configuration information to the base PLP data (S105120). Additionally, the input pre-processor (100000) may determine a physical PLP parameter based upon the component type, so that the physical PLP parameter can be signaled to the L1 signaling information (S105130). In other words, the input pre-processor (100000) may signal information on the component PLP structure to the L1 signaling information, so that the receiver can process the component PLP corresponding to the service.

The input pre-processor (100000) inserts a null packet in PLP data, which are processed in accordance with the component type (S105080). The null packet insertion procedure is identical to the procedure described with reference to FIG. 7 and FIG. 8. Each set of component PLP data having the null packet inserted therein is outputted to a respective PLP path (S105090).

Hereinafter, the input pre-processor processing data having an IP stream format will hereinafter be described in detail.

In case of an IP stream, unlike the description presented above, the data corresponding to the component may be divided in IP packet units. And, the PSI/SI included in the TS may correspond to service information, and the IP service information may include ESG (Electronic Service Guide; ESG) information, provider information, bootstrap information, and so on. The ESG information may include IP address information, port number information, and so on of the service component. According to the embodiment of the present invention, the IP stream may be inputted/outputted in GSE (Generic Stream Encapsulation) stream units.

Figure 11:
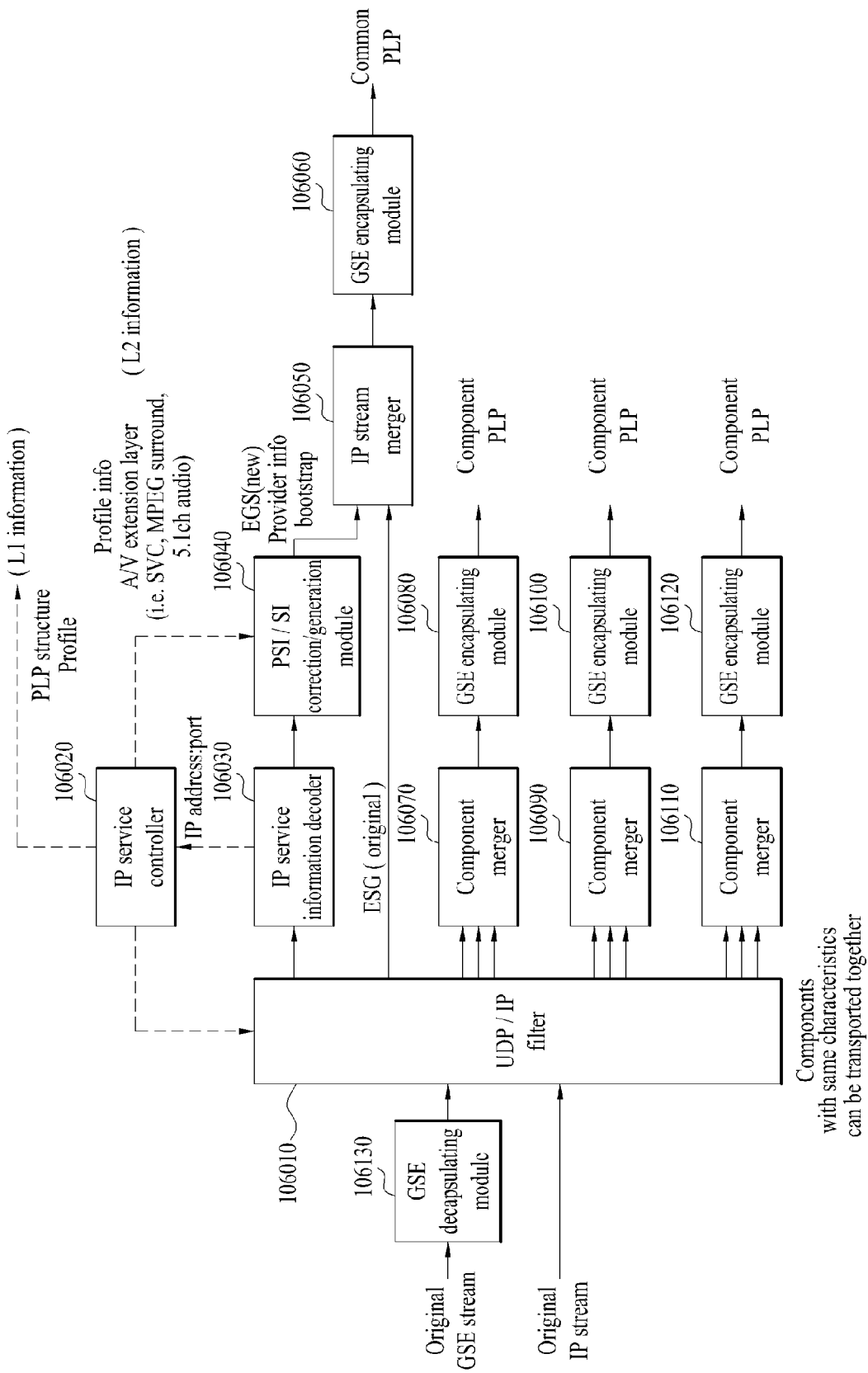
FIG. 11 illustrates a block diagram showing an input pre-processor according to another embodiment of the present invention, (a) and (b) of FIG. 12 illustrate another example of configuring a PLP in component units in an input pre-processor according to the present invention.

FIG. 11 illustrates a block diagram showing the structure of an input pre-processor receiving a stream having an IP format according to an embodiment of the present invention.

The input pre-processor (100000) of FIG. 11 includes a UDP/IP filter (106010), an IP service controller (106020), an IP service information decoder (106030), an IP service information modifying/generating module (106040), an IP stream merger (106050), GSE encapsulating modules (106060, 106080, 106100, 106120), component mergers (106070, 106090, 106110), and a GSE decapsulating module (106130).

The input pre-processor (100000) of FIG. 11 receives a GSE stream or IP stream and differentiates the data included in the received stream for each component, thereby outputting the differentiated data to a different PLP. At this point, a PLP including IP service information may be referred to as a common PLP, and the common PLP may also be referred to as L2 signaling information or L2 information/data. The L1 signaling information may also be referred to as L1 information.

In the present invention, the GSE stream is inputted to the GSE decapsulation module (106130), and the IP stream is inputted to the UDP/IP filter (106010). The GSE decapsulation module (106130) performs GSE decapsulation on the GSE stream, so as to extract an IP stream, thereby outputting the extracted IP stream to the UDP/IP filter (106010).

The UDP/IP filter (106010) may use a UDP port number and an IP address, and so on, so as to perform filtering on the IP packets, which are included in the IP stream, for each component, thereby outputting the filtered IP packets. Since a UDP port number and an IP address are assigned (or allocated) to each of the IP packets for each component, which are included in the IP stream, the UDP/IP filter (106010) may use the UDP port number and IP address so as to identify the IP packet corresponding to each component, thereby outputting each of the identified IP packets to a separate PLP path. Hereinafter, such UDP port number and IP address may also be collectively referred to as an address or address information.

However, since a UDP port number and an IP address should be known in order to perform such filtering process, the UDP/IP filter (106010) first filters the IP service information included in the IP stream. Then, the IP service information decoder (106030) decodes the IP service information, which is filtered by the UDP/IP filter (106010), so as to acquire address information. At this point, the address information may be acquired from the ESG information among the IP service information. Additionally, the IP service controller (106020) may use the address information, which is acquired from the IP service information decoder (106030), so as to control the UDP/IP filter (106010) and to filter the IP packet corresponding to a desired component for each address, thereby outputting the filtered IP packet. Since the IP service information, which is included in the IP stream, is transmitted to a predetermined address, an immediate filtering process may be performed without any separate settings of the UDP/IP filter (106010).

The UDP/IP filter (106010) first filters the IP packets included in the IP stream for each component and then outputs the filters IP packets to a respective component merger through each PLP path. For example, IP packets corresponding to the video component are outputted to the component merger (106070), IP packets corresponding to the audio component are outputted to the component merger (106090), and IP packets corresponding to the data component are outputted to the component merger (106110). The component mergers (106070, 106090, 106110) merge the IP packets of the corresponding component. If the stream being inputted to the input pre-processor corresponds to a stream having a GSE format, the output of the component mergers (106070, 106090, 106110) is outputted as a GSE stream, after being GSE encapsulated by each GSE encapsulating module. And, if the corresponding stream has an IP format, the GSE encapsulating process may be omitted.

When configuring the PLP for each component as described above, the receiver may not be capable of searching all of the data corresponding to a single service, even when the channel is scanned. More specifically, unlike the method of configuring a PLP for each service and identifying the configured PLP as IP service information, since the PLP is configured for each component configuring a service, a component PLP that does not include any IP service information may exist in the present invention. Therefore, in the present invention, service configuration information is added to the IP service information so that the component PLPs corresponding to a service can be located and found.

The IP service information modifying/generating module (106040) may modify or generate IP service information that should be modified or added, such as ESG information, service provider information, bootstrap information, and so on and may, then, output the modified or generated IP service information. For example, service configuration information configuring a PLP for each component may be signaled to the ESG information.

The IP stream merger (106050) merges IP service information modified/generated by the IP service information modifying/generating module (106040) and IP service information, such as supplemental information, which does not require any modification, thereby outputting the merged IP service information to a common PLP path.

According to the embodiment of the present invention, since an IP address and a UDP port number are each assigned (or allocated) in IP packet units to the IP stream, the null packet inserting modules shown in FIG. 7 may be omitted.

As shown in FIG. 11, the input pre-processor may receive an IP stream (or GSE stream) and may output data including IP service information to a common PLP path and may output data corresponding to each component to a component PLP path. Accordingly, as described above, the data corresponding to each PLP path may also be referred to as PLP data or PLP.

The input pre-processor may signal information on the components, which are configured as described above, to the L1 signaling information, so that components can be extracted in PLP units in accordance with the receiver type. More specifically, when a service type is selected in accordance with the receiver, the receiver shall process the components corresponding to the selected service. In the present invention, since a PLP is configured for each component, the information on such PLP configuration is signaled to the L1 signaling information, thereby allowing the receiver to extract the components corresponding to the selected service and to process the extracted components. Accordingly, the input pre-processor may generate information on the PLP configuration, so as to perform control operations enabling the generated information to be included in the L1 signaling information.

Figure 12:
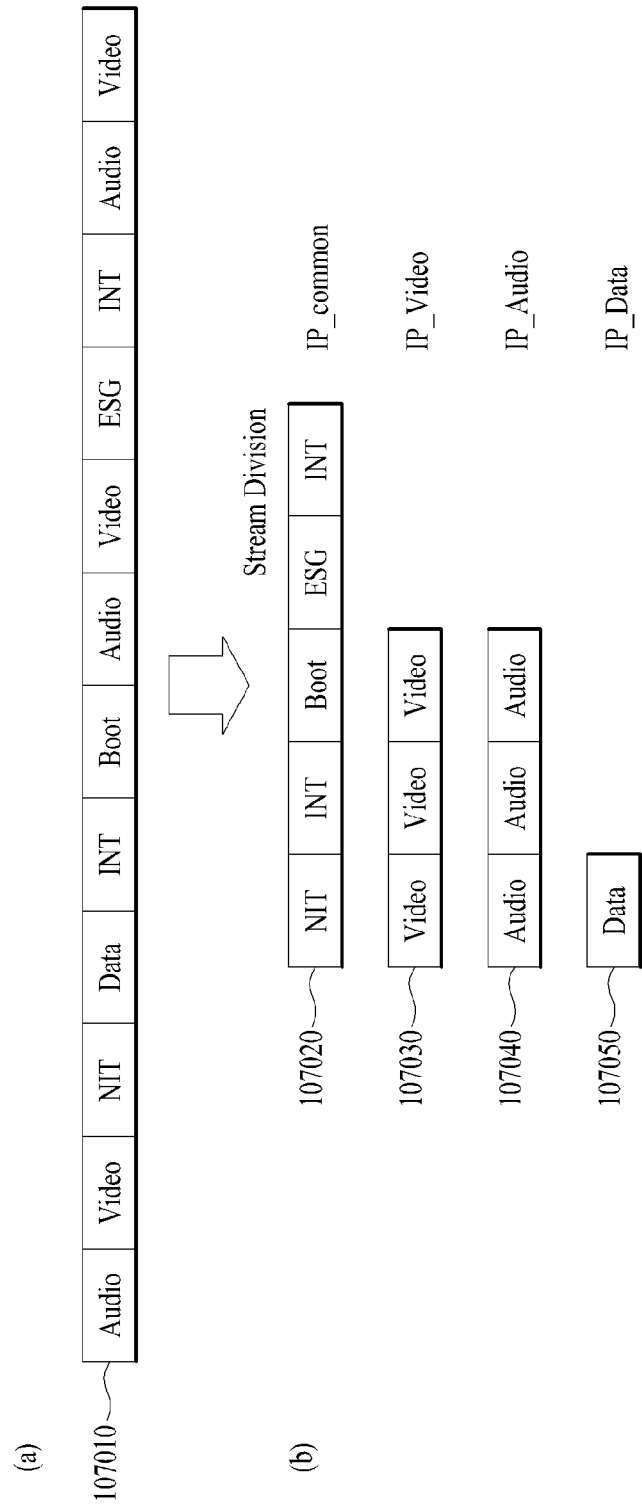

FIG. 12 illustrates an example of configuring a PLP in component units in an input pre-processor according to another embodiment of the present invention.

In FIG. 12, an IP stream (107010) being configured of IP packets indicates an IP stream being inputted to the UDP/IP filter (106010) of the input pre-processor shown in FIG. 11. And, each IP packet includes one of audio component data, video component data, data component data, and IP service information component data.

The input pre-processor of FIG. 12 performs the above-described pre-processing procedure on the IP packets included in the IP stream (107010), so as to differentiate the pre-processed IP packets for each component, thereby outputting each of the differentiated IP packets through a different PLP path.

For example, IP packets including NIT, INT, bootstrap, ESG information are outputted through a common PLP path, thereby configuring a common IP (107020), and IP packets including data of the video component are outputted through a video component PLP path, thereby configuring a video component IP (107030). Additionally, the IP packets including data of the audio component are outputted through an audio component PLP path, thereby configuring an audio component IP (107040), and the IP packets including data of the data component are outputted through a data component PLP path, thereby configuring a data component IP (107050). In another example, IP packets including data of 2 or more components may be outputted through a single PLP path, so as to configure a single IP. In yet another example, IP packets including data of a specific component respective to multiple services may be outputted through a single PLP path, so as to configure a single IP.

For simplicity in the description of the present invention, a common IP stream (107020) may be referred to as a common PLP (or PLP data), and a video component IP stream (107030) may be referred to as a video component PLP (or PLP data). Additionally, an audio component IP stream (107040) may be referred to as an audio component PLP (or PLP data), and a data component IP stream (107050) may be referred to as a data component PLP (or PLP data).

Based upon the characteristics of the IP streams, the IP streams of each PLP path of FIG. 12 are not required to maintain the same synchronization or order.

Figure 13:
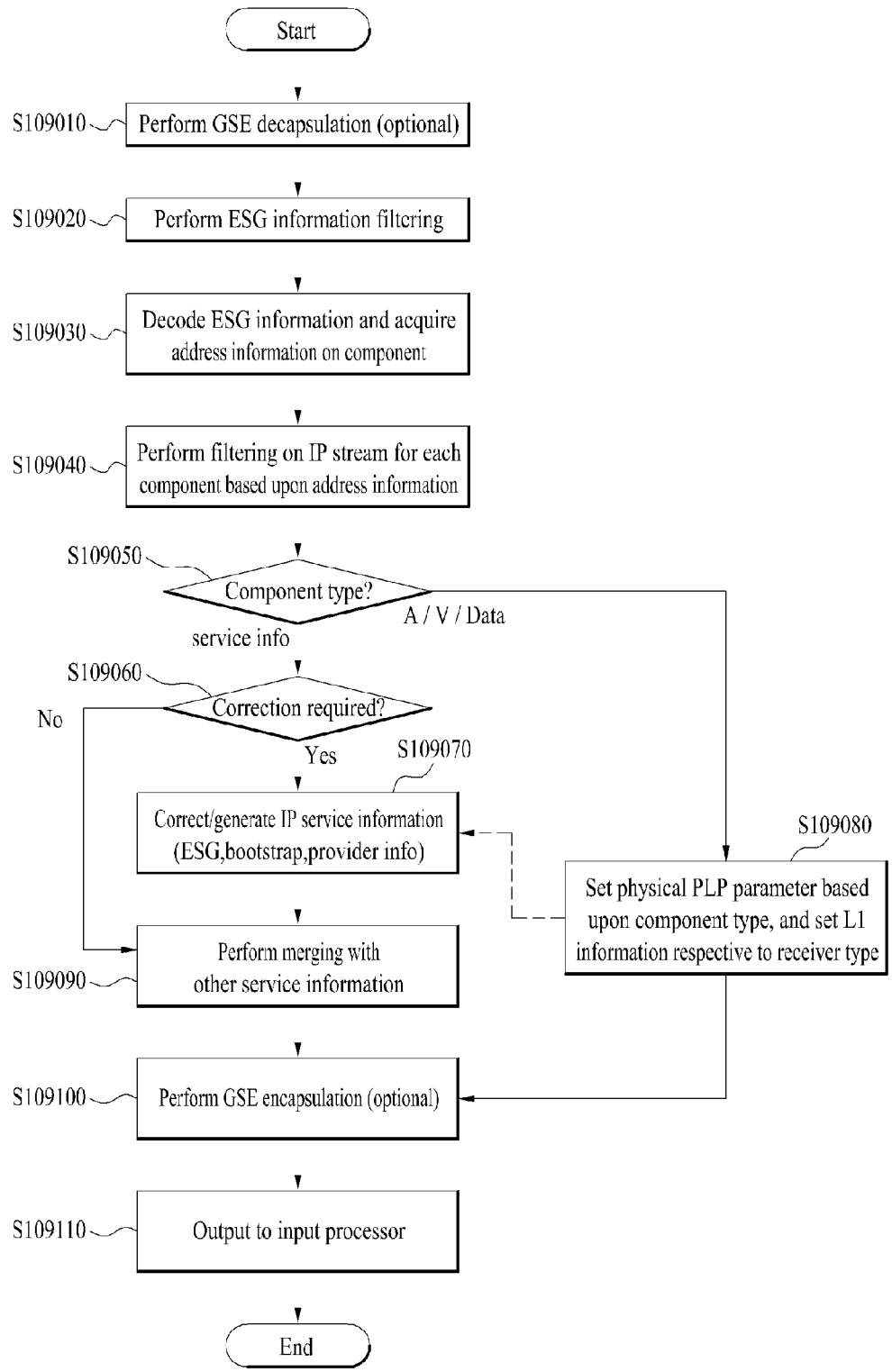
FIG. 13 illustrates a flow chart showing a pre-processing method of a broadcasting signal according to another embodiment of the present invention.

FIG. 13 illustrates a flow chart showing a pre-processing method of a broadcasting signal according to another embodiment of the present invention.

FIG. 13 shows a processing method of the above-described input pre-processor (100000) of FIG. 11, so that an IP stream can be divided in component units, and so that each set of component unit data can be outputted to a different PLP path.

In case the input stream corresponds to a GSE stream, the input pre-processor (100000) may use the GSE decapsulating module (106130), so as to decapsulate the GSE stream to an IP stream (S109010). In case the input stream corresponds to an IP stream, this process step (S109010) may be omitted.

The input pre-processor (100000) may use the UDP/IP filter (106010), so as to filter the ESG information of the input IP stream (S109020). Since the ESG information is transmitted from an IP stream to a predetermined address, a filtering procedure may be performed without any separate filter set-up.

The input pre-processor (100000) may use the IP service information decoder (106030), so as to decode the ESG information, which is filtered by the UDP/IP filter (106010) and to acquire address information respective to each component included in the IP stream (S109030). Thereafter, the IP service controller (106020) may set up the UDP/IP filter (106010) by using the address information, which is acquired in step (S109030), so as to filter data for each component and to output the filtered data (S109040).

The input pre-processor (100000) performs another operation in accordance with the component type of the corresponding data (S109050).

In case the component type corresponds to IP service information, i.e., when the component type corresponds to common PLP data, the input pre-processor (100000) may determine whether or not the IP service information requires modification (S109060). Thereafter, when modification is required, the corresponding IP service information (ESG information, bootstrap information, provider information, and so on) may be generated or modified (S109070). Then, by using the IP stream merger (106050), IP service information that are to be included in the data, which are transmitted to the common PLP, are merged (S109090).

In case the component type does not correspond to IP service information, i.e., in case the component type corresponds to component PLP data, the input pre-processor (100000) sets up a physical parameter based upon the component type, thereby enabling the physical parameter to be signaled to the L1 signaling information (S109080). In other words, the input pre-processor (100000) may signal information on a component PLP structure to the L1 signaling information, so that the receiver can process the component PLP corresponding to the service in accordance with the component structure of the present invention.

In case the output data format corresponds to a GSE stream, the input pre-processor (100000) performs GSE encapsulation on the processed PLP data in accordance with the component type (S109100). In case the output data format corresponds to an IP GSE stream, this step may also be omitted. Each set of the component PLP data may be outputted to a different PLP path (S109110).

The output of the input pre-processor (100000) is outputted to the input processor (100100).

In the description of the present invention, TS or IP or GSE streams may be converted to n+1 number of streams that can be independently processed through the input pre-processor (100000) or the input processor (100100). At this point, the stream that is to be independently processed may correspond to a complete (or whole) TS stream including a plurality of service components, and may also correspond to a TS stream of a minimum unit including only one service component (e.g., video or audio, and so on). Similarly, the stream that is to be independently processed may correspond to a complete (or whole) GSE stream including a plurality of service components or a GSE stream including only one service component. Furthermore, the stream that is to be independently processed may also correspond to a complete (or whole) IP stream including a plurality of service components or an IP stream including only one service component.

Figure 14:
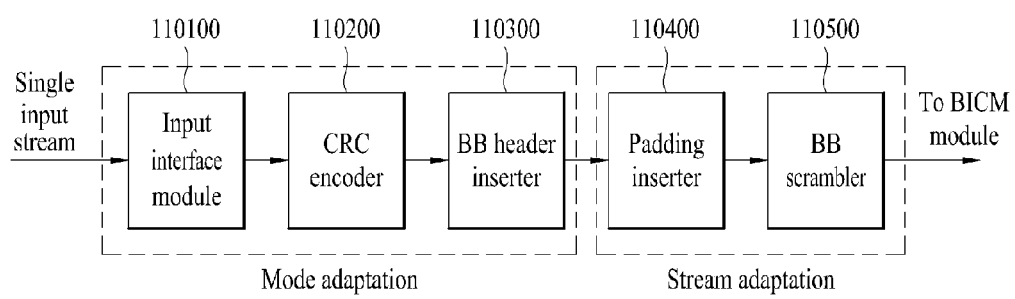
FIG. 14 illustrates a block diagram showing an input processor according to an embodiment of the present invention.

FIG. 14 illustrates a block diagram showing an exemplary structure of an input processor (100100) according to an embodiment of the present invention.

Herein, FIG. 14 shows an exemplary embodiment of an input processor (100100), wherein the number of input streams is equal to 1. When the number of input streams is equal to 1, the input processor (100100) may include an input interface module (110100), a CRC-8 encoder (110200), a BB header inserter (110400), a padding inserter (110400), and a BB scrambler (110500). In the description of FIG. 14, the input interface module (110100), the CRC-8 encoder (110200), and the BB header inserter (110400) will be collectively referred to as a mode adaptation module, and the padding inserter (110400) and the BB scrambler (110500) will be collectively referred to as a stream adaptation module.

The input interface module (110100) maps an input stream in internal logical-bit format for performing FEC (BCH/LDPC) encoding in a BICM module (100200). More specifically, the interface module (110100) slices the input stream to bit units corresponding to a number of bits required for generating a BB (Base Band) frame, so as to map into a BB frame payload. The CRC-8 encoder (110200) performs CRC encoding on the BB frame payload outputted from the interface module (110100), and the BB header inserter (110300) inserts a header having a fixed size to a fore-end portion of the BB frame payload, which is processed with CRC encoding, to generate a BB frame.

In case a data size of the inputted bit stream is smaller than a BB frame designated to FEC, the padding inserter (110400) may insert a padding bit to the BB frame, in order to configure the BB frame. The BB scrambler (110500) may perform a bitwise XOR (Exclusive OR) operation on a bit stream of the BB frame by using a PRBS (Pseudo Random Binary Sequence), so as to perform randomization. The operations of the BB scrambler (110500) may reduce PAPR (Peak-to-Average Power Ratio) of an OFDM modulation signal transmitted finally.

Figure 15:
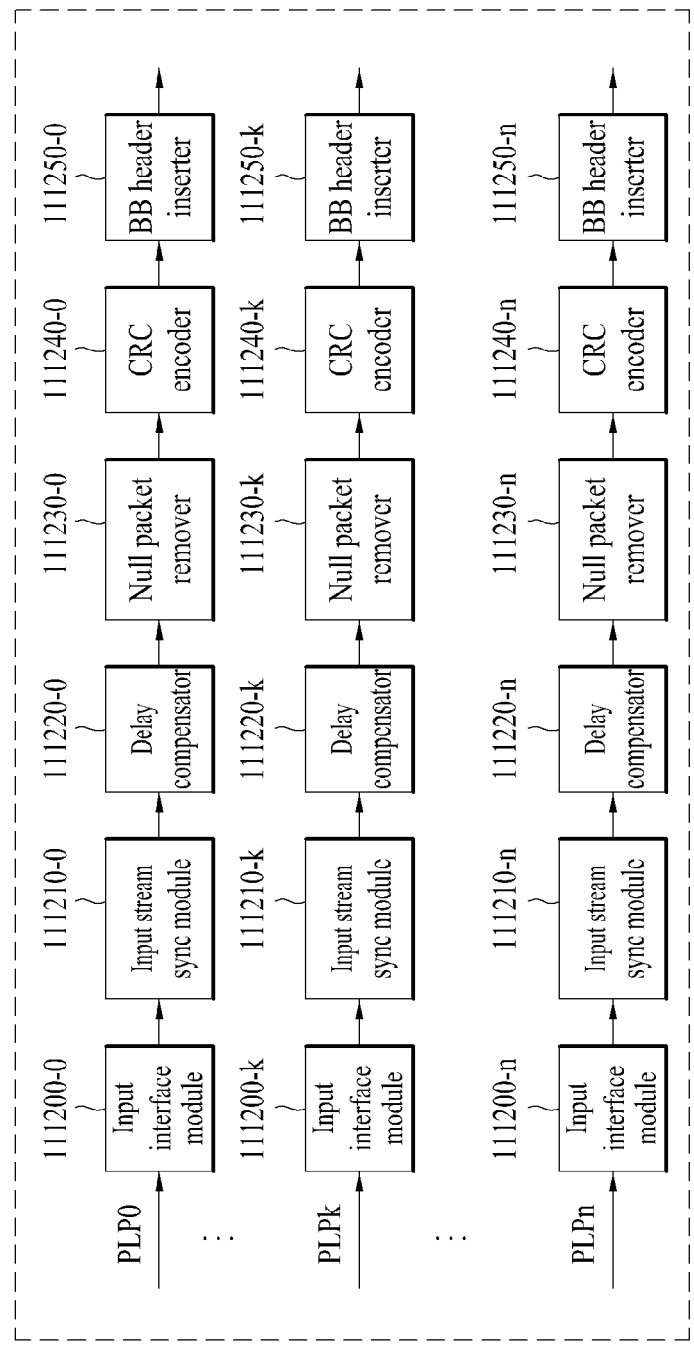
FIG. 15 illustrates a block diagram showing a mode adaptation module of an input processor according to an embodiment of the present invention.

FIG. 15 illustrates a block diagram showing an exemplary structure of a mode adaptation module of an input processor (100100) respective to a multi PLP input according to another embodiment of the present invention. More specifically, FIG. 15 shows an embodiment of a mode adaptation module of the input processor (100100) processing a plurality of PLPs when a type of input stream is a TS format.

The mode adaptation module may include n+1 number of input interface modules (111200-0~n), n+1 number of input stream sync modules (111210-0~n), n+1 number of delay compensators (111220-0~n), n+1 number of null packet deleters (111230-0~n), n+1 number of CRC (Cyclic Redundancy Check) encoders (111240-0~n), and n+1 number of BB header inserters (111250-0·n) operating in parallel to perform mode adaptation on each PLP of the plurality of PLPs.

According to the broadcast signal transmitting apparatus of the present invention, by including signaling information that can be commonly applied to multiple PLPs, such as a transport layer signal of an MPEG-TS, in a single PLP, and by transmitting the processed PLP, the transmission efficiency may be increased. As shown in FIG. 15, the PLP0 performs such function, and, in the description of the present invention, such PLP is referred to as a common PLP. The remaining P number of PLPs excluding the PLP-0, shown in FIG. 15, may be used for performing data transmission. And, in the description of the present invention, such PLP is referred to as a data PLP. Herein, the example given in FIG. 15 is merely exemplary, and, therefore, a plurality of common PLPs, such as PLP0 of FIG. 15, may be used in the present invention.

The input interface modules (111200-0~n) may slice the input stream of the corresponding PLP to a number of bits required for generating the BB frame (Base Band frame), so as to map into a BB frame payload.

The input stream sync modules (111210-0~n) generate sync timing information required to recovery TS or GS streams in a receiver and insert the sync timing information into a BB frame payload. Furthermore, when the receiver performs service recovery, the input stream sync modules (11210-0~n) may generate sync timing information based upon all delays that may occur in the respective channels and transmission processed, so that the corresponding service can be recovered to the initial timing. Herein, the sync timing information may correspond to an ISCR (Input Stream Clock Reference) information. Moreover, the input stream sync modules (111210-0~n) synchronize in the receiver by adding a sync byte.

When multiple PLPs exist, the delay compensators (111220-0~n) may compensate the delay difference between each PLP, so that the frame can be efficiently configured. More specifically, based upon the sync timing information inserted by the input stream sync modules (111210-0~n), the delay compensators (111220-0~n) may delay data on PLPs of group units so as to synchronize the PLPs.

In case of a VBR (variable bit rate) service, the null packet deleters (111230-0~n) may delete the inserted null packets, so as to increase the transmission efficiency. At this point, a number of deleted null packets (DNPs) may be inserted in the deleted positions, so as to be transmitted.

The CRC encoders (111240-0~n) performs CRC encoding on the corresponding frame, in order to enhance the transmission reliability of the BB frame payload, thereby adding CRC data.

The BB header inserters (111250-0~n) inserts a header having a fixed size on a fore-end portion of the corresponding BB frame payload, so that the format of the data field can be identified. Herein, the header may include diverse information, such as Mode Adaptation Type information indicating whether the stream type the of corresponding stream corresponds to a TS, an IP, or a GS, User Packet Length information, Data Field Length information, User Packet Sync Byte information, start address information of a User Packet Sync Byte included in the data field, a high efficiency mode indicator, an input stream sync field, and so on.

FIG. 15 shows an exemplary case when the input stream type corresponds to a TS, and if the input stream type corresponds to an IP stream or a GSE stream, the delay compensators (111220-0~n) and the null packet removers (111230-0~n) may be omitted. For example, since the IP packet is buffered and reproduced in the receiver in accordance with a time stamp, the data are not required to be delayed, and the null packet is not required to be added/deleted. Additionally, since the IP packet itself has a CRC, the CRC byte is not required to be added. Accordingly, in the operations of the input processor of FIG. 15, the delay compensators (111220-0~n) and the null packet removers (111230-0~n) may be omitted, or, in case of the IP stream or GSE stream, the blocks may be bypassed.

Figure 16:
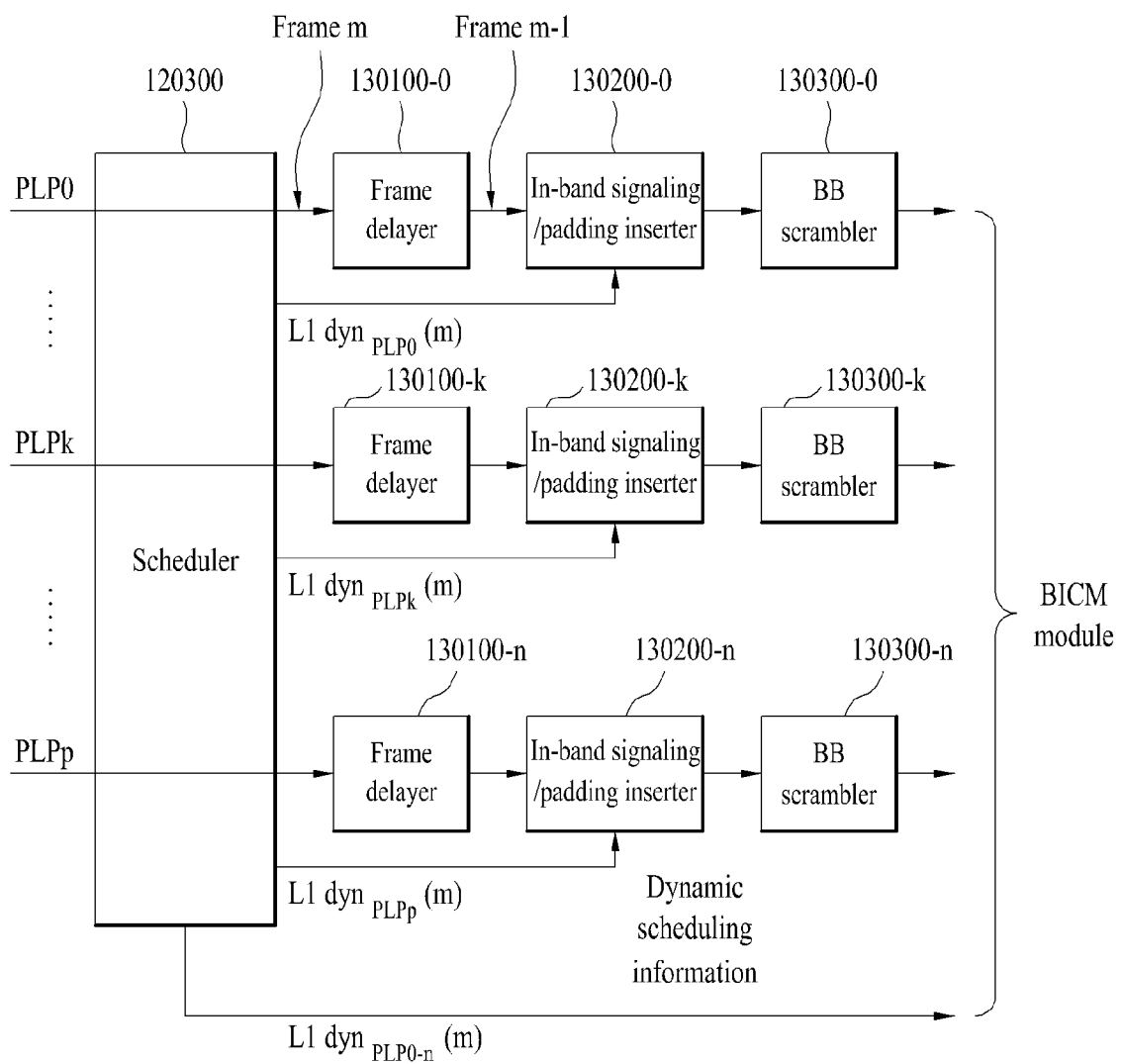
FIG. 16 illustrates a block diagram showing a stream adaptation module of an input processor according to an embodiment of the present invention.

FIG. 16 illustrates an exemplary structure of a stream adaptation module of an input processor (100100) respective to a multi PLP input according to another embodiment of the present invention.

The stream adaptation module may include a scheduler (120300), n+1 number of frame delayers (130100-0~n), n+1 number of in-band signaling/padding inserters (130200-0~n), and n+1 number of BB scramblers (130300-0~n).

The scheduler (120300) may perform scheduling in order to allocate multiple PLPs to each slot of a transmission frame. In case the system uses a MIMO method, the scheduler (120300) may include a scheduler for dual polarity MIMO. More specifically, the scheduler (120300) may generate parameters that can be used by a DEMUX, a cell interleaver, a time interleaver of the BICM module (100200). Herein, examples of such parameters may include parameters related to a polarity path, such as an H-path and a V-path. Furthermore, the scheduler (120300) enables a cell mapper to map input cells according to scheduling by outputting L1-dynamic signaling information on a current frame, apart from in-band signaling.

The frame delayers (130100-0~n) may delay input data by one transmission frame, so that scheduling information respective to a next frame can be transmitted through a current frame, in order to perform in-band signaling.

The in-band signaling/padding inserters (130200-0~n) insert the non-delayed L1-dynamic signaling information to the data being delayed by one transmission frame. In this case, if surplus space exists within the input data, a padding bit may be inserted in the surplus space, or in-band signaling information may be inserted in the surplus space.

In order to minimize the correlation between transmission bit sequences, the BB scramblers (130300-0~n) perform XOR operation on the input bit stream and PRBS, which are outputted from the in-band signaling/padding inserters (130200-0~n), so as to randomize the input bit stream. After performing the scrambling procedure, the PAPR of the OFDM modulation signal, which is finally transmitted, may be reduced.

Additionally, in addition to in-band signaling, the scheduler (120300) may transmit L1-dynamic signaling information of the current frame to the cell mapper of the frame builder. The cell mapper uses the inputted information, so as to map the input cells to the transmission frame.

The difference between a stream adaptation module respective to a multi PLP input of FIG. 16 and a stream adaptation respective to a single PLP input of FIG. 14 is that a scheduler (120300), n+1 number of frame delayers (130100-0~n), n+1 number of in-band signaling/padding inserters (130200-0~n), and so on, are added in the stream adaptation module.

Meanwhile, the stream adaptation module of FIG. 16 may further include an L1 signaling generator. In addition to the in-band signaling information, the L1 signaling generator generate L1 signaling information, which is transmitted through a preamble symbol of the transmission frame or a data symbol, which is being spread. Such L1 signaling information includes L1-pre-signaling information and L1-post-signaling information. The L1 signaling generator outputs each of the L1-pre-signaling information and the L1 -post-signaling information.

Additionally, the present invention may further include a first BB scrambler scrambling the L1-pre-signaling information and a second BB scrambler scrambling the L1-post-signaling information at the outputting end of the L1 signaling generator. In this case, the L1-pre-signaling information may be scrambled by the first BB scrambler, and the L1-post-signaling information may be scrambled by the second BB scrambler, both by performing XOR operation with the PRBS. According to another embodiment of the present invention, the L1 signaling generator may output the L1 signaling information, which includes the L1-pre-signaling information and the L1-post-signaling information, and one BB scrambler may also scramble the outputted L1 signaling information.

Meanwhile, in the present invention, the MISO method may be independently applied for each set of PLP data, and the MIMO method may also be applied.

According to an embodiment of the present invention, the BICM module may perform MIMO encoding on the MIMO PLP data that are to be transmitted by using the MIMO method, and the OFDM generator may perform MISO encoding on the MISO PLP data that are to be transmitted by using the MISO method.

According to another embodiment of the present invention, the BICM module may perform MIMO encoding on the MIMO PLP data that are to be transmitted by using the MIMO method, and the BICM module may also perform MISO encoding on the MISO PLP data that are to be transmitted by using the MISO method. In this case, the MISO encoding process may be omitted in the OFDM generator.

Figure 17:
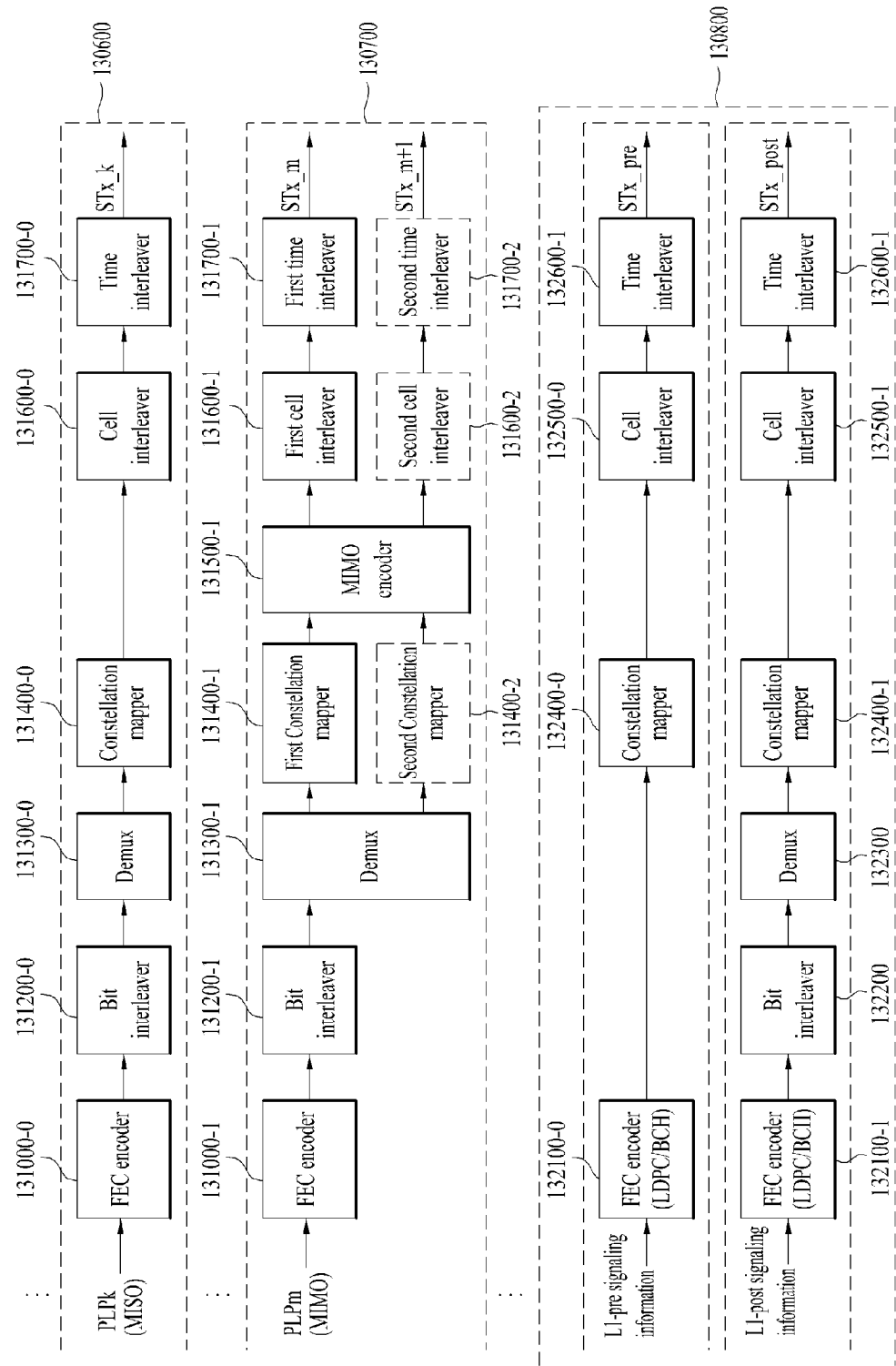
FIG. 17 illustrates a block diagram showing a BICM module according to an embodiment of the present invention.

FIG. 17 illustrates a block diagram showing the structure of a BICM module (100200) according to an embodiment of the present invention. Herein, the BICM module performs bit interleaving on the multiple sets input-processed PLP data, the L1-pre-signaling information, and the L1-post-signaling information and performs encoding for error correction.

For this, according to the embodiment of the present invention, the BICM module of FIG. 17 includes a first BICM encoding block (130600) processing MISO PLP data, a second BICM encoding block (130700) processing MIMO PLP data, and a third BICM encoding block (130800) processing signaling information. The third BICM encoding block (130800) then includes a first encoding block for processing L1-pre-signaling information and a second encoding block for processing L1-post-signaling information.

The signaling information may be processed with MISO or MIMO processing by the OFDM generator. However, since the signaling information includes information that are required by the receiver in order to recover the PLP data included in the transmission frame, a greater robustness between the transmission and the reception as compared to that of the PLP data is required. Therefore, according to the embodiment of the present invention, the OFDM generator may process the signaling information by using the MISO method.

Hereinafter, the data processing method of each block will be described.

The first BICM encoding block (130600) includes an FEC (Forward Error Correction) encoder (131100-0), a bit interleaver (131200-0), a demux (131300-0), a constellation mapper (131400-0), a cell interleaver (131600-0), and a time interleaver (131700-0).

The FEC encoder (131100-0) adds a redundancy to an input bit stream, so that the receiver can perform correction on an error occurring on the transmission channel with respect to input processed PLP data and may, then, perform bit stream encoding at a coding rate, such as 1/4, 1/3, 2/5. For example, the FEC encoder (131100-0) may use a BCH (Bose-Chaudhuri-Hocquengham)/LDPC (Low Density Parity Check) code, so as to add redundancy for error correction and to perform encoding.

The bit interleaver (131200-0) may perform bit interleaving in a single FEC block unit on the PLP data, which are processed with FEC encoding, so that the error can have robustness against a burst error, which may occur during transmission. In this case, the bit interleaver (131200-0) may perform bit interleaving by using two FEC block units. And, as described above, when bit interleaving is performed by using two FEC block units, cells forming a pair in the frame builder, which will be described later on, may each be generated from a different FEC block. Therefore, the broadcasting signal receiver may ensure diversity so as to enhance the receiving performance.

The demux (131300-0) performs demultiplexing in a single FEC block unit. According to an embodiment of the present invention, the demux (131300-0) may adjust the order of the bits configuring a cell, so as to control the robustness of the bit, thereby outputting the cell including the bits. More specifically, the demux (131300-0) adjusts the bit output order in order to perform dispersed positioning on the distribution of the data reliability, which is generated during the LDPC encoding process, when the constellation mapper (131400-0) performs symbol mapping in a later process. The demux (131300-0) may perform demultiplexing by using two FEC blocks. As described above, when demultiplexing is performed by using two FEC blocks, the cells configuring a pair in the frame builder, which will be described in detail later on, may each be generated from a different FEC block. Therefore, the receiver may ensure diversity, so as to gain a more enhanced receiving performance.

The constellation mapper (131400-0) maps the demultiplexed bit unit PLP data to the constellation. In this case, the constellation mapper (131400-0) may rotate the constellation by a predetermined angle in accordance with the modulation type. The rotated constellations may be expressed as an I-phase (In-phase) element and a Q-phase (Quadrature-phase) element, and the constellation mapper (131400-0) may delay only the Q-phase element by an arbitrary value. Thereafter, the constellation mapper (131400-0) may use the In-phase element and the delayed Q-phase element, so as to remap the demultiplexed PLP data to a new constellation.

The cell interleaver (131600-0) may perform interleaving in cell units on the PLP data mapped or remapped to the constellation, and the time interleaver (131700-0) may perform interleaving on the cell-interleaved PLP data in time units, so as to output the time-interleaved PLP data to the frame builder. In this case, the time interleaver (131700-0) may perform interleaving by using 2 FEC blocks. By performing this procedure, since the cells configuring a pair in the frame builder, which will be described later on, may each be generated from a different FEC block, the receiver may ensure diversity so as to enhance the receiving performance.

The second BICM encoding block (130700) includes an FEC encoder (131100-1), a bit interleaver (131200-1), a demux (131300-1), a first constellation mapper (131400-1) and a second constellation mapper (131400-2), an MIMO encoder (131500-1), a first cell interleaver (131600-1), a second cell interleaver (131600-2), a first time interleaver (131700-1) and a second time interleaver (131700-2). The FEC encoder (131100-1) and the bit interleaver (132100-1) perform the same functions as the FEC encoder (131100-0) and the bit interleaver (131200-0) of the first BICM encoding block (130600).

The demux (131300-1) may perform the same functions as the demux (131300-0) of the first BICM encoding block (130600) and may additionally perform demultiplexing on the PLP data, so as to output the demultiplexed PLP data through 2 input paths, which are required for the MIMO transmission. In this case, the transmission characteristics of the data being transmitted through each input path may be identical to one another or may be different from one another.

For example, in case the transmission characteristics of the data being transmitted through each of the 2 input paths are different from one another, the demux (131300-1) may randomly allocate (or assign) bit words of the PLP data corresponding to the cell, which is included in one FEC block, to each input path.

In another example, in case the transmission characteristics of the data being transmitted through each of the 2 input paths are identical to one another, the second constellation mapper (131400-2), the second cell interleaver (131600-2), and the second time interleaver (131700-2), which are marked in dotted lines may not be used.

The first constellation mapper (131400-1) and the second constellation mapper (131400-2) perform the same functions as the constellation mapper (131400-0) of the first BICM encoding block (130600).

The MIMO encoder (131500-1) may apply a MIMO encoding matrix on the PLP data, which are mapped to the first constellation mapper (131400-1) and the second constellation mapper (131400-2), so as to perform MIMO encoding on the processed data, thereby outputting the MIMO encoded data to 2 paths. The MIMO encoding method will be described in more detail later on.

According to an embodiment of the present invention, the first cell interleaver (131400-1) and the second cell interleaver (131400-2) may perform cell interleaving only on the PLP data corresponding to half the size of an FEC block, among the PLP data being MIMO encoded and inputted through each path. Accordingly, the cell interleaving process performed by the first cell interleaver (131400-1) and the second cell interleaver (131400-2) may have the same effect as the interleaving procedure performed by the cell interleaver (131400-0) of the MISO method included in the first BICM encoding block (130600). Additionally, the first cell interleaver (131400-1) and the second cell interleaver (131400-2) are advantageous in that additional memory are not assigned (or allocated) to the first cell interleaver (131400-1) and the second cell interleaver (131400-2), in order to process the data of multiple paths, and that cell interleaving may be performed by using the memory settings of the cell interleaver (131400-0).

The first time interleaver (131700-1) and the second time interleaver (131700-1) perform the same functions as the time interleaver (131700-0) of the first BICM encoding block (130600). Also, the first time interleaver (131700-1) and the second time interleaver (131700-2) may perform time interleaving on the PLP data being inputted through each path by using the same method, or may perform time interleaving by using different methods.

The third BICM encoding block (130800) includes a first encoding block processing L1-pre-signaling information and a second encoding block processing L1-post-signaling information.

The first encoding block may include an FEC encoder (132100-0), a constellation mapper (132400-0), a cell interleaver (132500-0), and a time interleaver (132600-0). The second encoding block may include an FEC encoder (132100-1), a bit interleaver (132200), a demux (132300), a constellation mapper (132400-1), a cell interleaver (132500-1), and a time interleaver (132600-1).

In order to decode the L1 signaling information and data, the receiver is required to accurately and swiftly decode the L1-pre-signaling information. Therefore, according to an embodiment of the present invention, in order to allow the receiver to accurately and swiftly decode the L1 -pre-signaling information, the present invention will not perform bit interleaving and demultiplexing on the L1-pre-signaling information.

For the description on the operations of each block included in the first encoding block and the second encoding block, reference may be made to the description on the operations of the same blocks included in the first BICM encoding block (130600). And, therefore, detailed description of the same will be omitted. However, 2 FEC encoders (132100-0~1) perform FEC encoding including shortening and puncturing on each of the inputted L1-pre-signaling information and L1 -post-signaling information. The FEC encoding process may include BCH encoding and LDPC encoding.

Meanwhile, in the present invention, instead of the input processor, an L1 signaling generator may be located in front of the 2 FEC encoders (132100-0~1) of the first BICM encoding module. Moreover, a first BB scrambler and a second BB scrambler may be further included at the outputting end of the L1 signaling generator. The description on the operations of the L1 signaling generator and the first and second BB scramblers is identical to the description on the operations of the corresponding blocks within the input processor. According to another embodiment of the present invention, the L1 signaling information including the L1-pre-signaling information and the L1-post-signaling may be scrambled by using one BB scrambler.

The demuxes (131300-0, 131300-1, 132300) within the first to third BICM encoding blocks of FIG. 17 may also be referred to as bit-cell demuxes.

At this point, the first BICM encoding block (130600) outputs PLP data, which are to be outputted by using the MISO method, through 1 path (STX_k), and the second BICM encoding block (130700) outputs PLP data, which are to be outputted by using the MIMO method, through 2 paths (STX_m, STX_m+1). Additionally, the third BICM encoding block (130800) outputs each of the L1-pre-signaling information and the L2-post-signaling information through one path (STX_pre, STX_post). For simplicity of the description of the present invention the path corresponding to the STX_k, STX_m, STX_pre, STX_post will be referred to as a first path, and the path corresponding to the STX_m+1 will be referred to as a second path.

In the structure shown in FIG. 17, the PLP data or signaling data are processed in symbol units after being mapped to the constellation. Accordingly, the second BICM encoding block (130700) performs MIMO encoding, cell interleaving, time interleaving on the MIMO PLP data in OFDM units. In this case, the time deinterleaver, the cell deinterleaver, and the MIMO decoder of the broadcasting signal receiver process the reception data in symbol units.

According to another embodiment of the BICM module shown in FIG. 17, the MIMO encoder may be provided at the outputting ends of the first time interleaver and the second time interleaver.

In this case, the BICM decoder of the broadcast signaling receiver should first perform MIMO decoding on the MIMO PLP data before performing any other operations. And, the MIMO decoded data are outputted in bit units. Thereafter, the BICM decoder of the broadcasting signal receiver may perform time deinterleaving and cell deinterleaving on the MIMO decoded data. However, since the data outputted in bit units are being inputted, information on the symbol units of the inputted data is required. More specifically, since the broadcasting signal receiver should to store information on symbol mapping of the input bits, which are required in the deinterleaving process, the complexity in the memory of the receiver may be increased.

Conversely, if the MIMO encoder is located between the constellation mapper and the cell interleaver, as shown in FIG. 17, the respective BICM decoder of the broadcasting signal receiver may perform MIMO decoding on the symbol unit data, after performing both time deinterleaving and cell deinterleaving in symbol units. In this case, since the bit unit data being processed with MIM decoding are processed with the constellation demapping procedure, additional (or separate) information on symbol mapping is not required. Accordingly, if the MIMO encoder is located after the constellation mapper, the complexity in the memory of the receiver may be reduced, as compared to when the MIMO encoder is located after the time interleaver.

Figure 18:
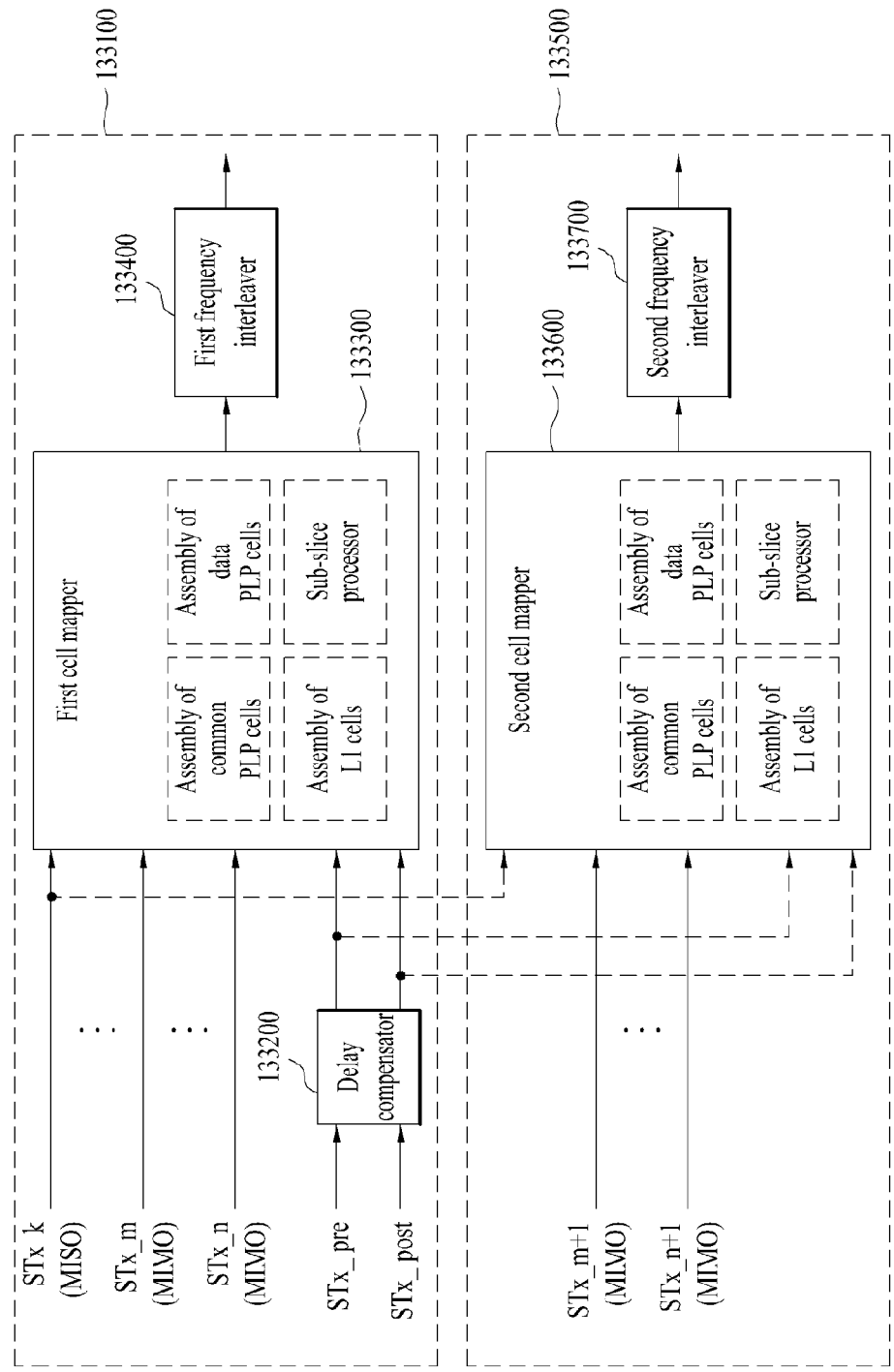
FIG. 18 illustrates a block diagram showing a frame builder according to an embodiment of the present invention.

FIG. 18 illustrates a block diagram showing the structure of a frame builder according to an embodiment of the present invention. Herein, the frame builder is adequate for processing the output of the BICM module shown in FIG. 17. In the present invention, the frame builder will also be referred to as a frame mapper.

The frame builder of FIG. 18 includes a first frame building block (133100) receiving MISO PLP data, MIMO PLP data, L1-pre-signaling data, and L1-post-signaling data of the first path, and a second frame building block (133500) receiving MIMO PLP data of the second path. The data of the first path are processed with a modulation procedure in the OFDM generator, so as to be transmitted through the first antenna (Tx_1), and after being processed with the modulation procedure in the OFDM generator, the data of the second path are transmitted through the second antenna (Tx_2).

According to an embodiment of the present invention, the first frame building block (133100) includes a delay compensator (133200), a first cell mapper (133200), and a first frequency interleaver (133400), and the second frame building block (133500) includes a second cell mapper (133600) for processing data being inputted through the second path and a second frequency interleaver (133700).

The first cell mapper (133300) and the first frequency interleaver (133400) and the second cell mapper (133600) and the second frequency interleaver (133700) may operate identically with respect to the first path and the second path or may operate independently from one another with respect to the first path and the second path.

Hereinafter, the data processing method of the blocks included in the first frame building block (133100) and the second frame building block (133500) will be described.

In order to perform cell mapping, the delay compensator (133200) compensates for the delay generated in the signaling information and matches the time synchronization with the inputted PLPs. More specifically, a delay corresponding to one transmission frame in the L1-pre-signaling data or the L1-post-signaling data and a delay occurring due to the encoding process of the third BICM encoding block (130800) are both compensated. Since the L1 signaling information may include not only the information on the current information frame but also the information on the next transmission frame, during the input processing procedure, the L1 signaling information is delayed by one frame than the PLP data that are currently being inputted. By performing such procedure, one transmission frame may transmit L1 signaling information including both information on the current transmission frame and information on the next transmission frame.

The first cell mapper (133300) and the second cell mapper (133600) map the symbol unit PLP data and the L1 signaling data being inputted through each path to subcarriers of the OFDM symbol, which is included in the transmission frame, in cell units in accordance with the scheduling information included in the signaling information.

Additionally, the first cell mapper (133300) and the second cell mapper (133600) respectively map the MISO PLP data and the MIMO PLP data to subcarriers of one OFDM symbol in cell units.

The PLP data, which are being inputted to the first cell mapper (133300) and the second cell mapper (133600) through the first path and the second path may include common PLP data, MISO, MIMO PLP data, and each sub-slice processor may perform sub-slicing on the PLP data cells, in order to gain a diversity effect, so as to map the processed PLP data cell within the transmission frame.

Additionally, although the MISO PLP data and the L1-pre-signaling and post-signaling data are inputted only through the first path, since the MIMO PLP data are inputted through both the first path and the second path, the operation of the cell mapper may vary depending upon which data are being inputted.

Hereinafter, the detailed operations will be described.

First of all, the first cell mapper (133300) and the second cell mapper (133600) may each receive the same MISO PLP data that are inputted through the first path, and the first cell mapper (133300) and the second cell mapper (133600) may also receive the same L1-pre and post signaling information, which are outputted from the delay compensator (133200). In this case, the first cell mapper (133300) and the second cell mapper (133600) may map each set of input data, so that the corresponding data can be allocated to the subcarrier of the OFDM symbol with the transmission frame.

Secondly, among the first cell mapper (133300) and the second cell mapper (133600), only the first cell mapper (133300) may receive the MISO PLP data and the delay-compensated L1-pre and post signaling data. In this case, the second cell mapper (133600) may perform mapping only on the MIMO PLP.

The first frequency interleaver (133400) and the second frequency interleaver (133700) may perform frequency interleaving on the data being inputted through each path in cell units, and may output the frequency interleaved data to the OFDM generator through each path.

In this case, the first frequency interleaver (133400) and the second frequency interleaver (133700) perform interleaving on the cells positioned in the transmission frame within the frequency domain based upon the OFDM symbol. Additionally, when the second cell mapper (133600) receives only the MIMO PLP data, the second frequency interleaver (133700) may also perform interleaving only on the MIMO PLP data.

Figure 19:
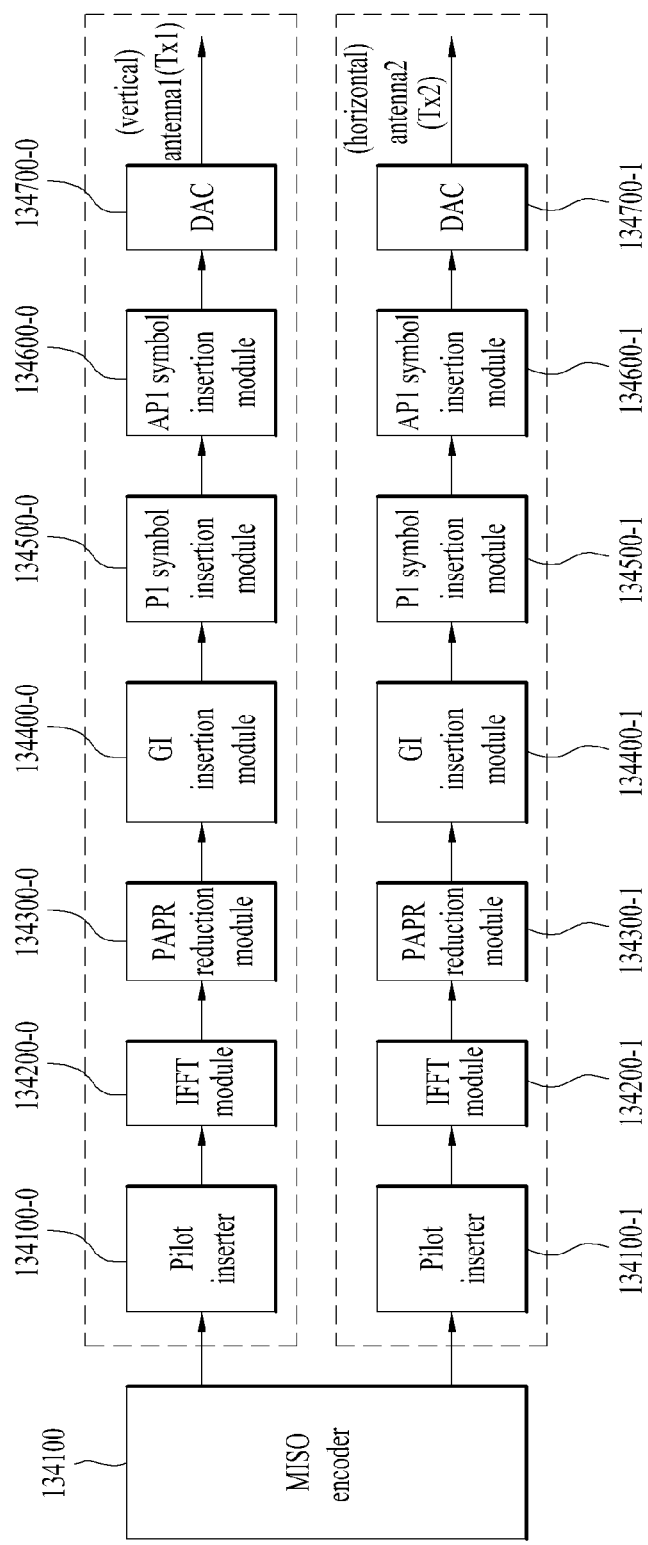
FIG. 19 illustrates a block diagram showing an OFDM generator according to an embodiment of the present invention, (a) to (e) of FIG. 20 illustrate exemplary output orders of the bit-cell demux in accordance to each code rate, when an LDPC block length is equal to 16800, and when the modulation format that is to be used for symbol mapping correspond to 256QAM.

FIG. 19 illustrates a block diagram showing the structure of an OFDM generator according to an embodiment of the present invention, which is adequate for processing the output of the frame builder shown in FIG. 18. Most particularly, FIG. 19 shows an example of transmitting a broadcasting signal through 2 transmission antennae by using the MISO or MIMO method. According to the embodiment of the present invention, a polarity multiplexing MIMO method is used in the present invention.

The OFDM generator of FIG. 19 is configured of an MISO encoder (134100), 2 pilot inserters (134100-0, 134100-1), 2 IFFT modules (134200-0, 134200-1), 2 PAPR reduction modules (134300-0, 134300-1), 2개 GI inserting modules (134400-0, 134400-1), 2 P1 symbol inserting modules (134500-0, 134500-1), 2 AP1 symbol inserting modules (134600-0, 134600-1), and 2 DACs (134700-0, 134700-1). In the present invention, a block modulating a broadcasting signal that is to be transmitted through a first transmission antenna (Tx1) will be referred to as a first transmitting unit, and a block modulating a broadcasting signal that is to be transmitted through a second transmission antenna (Tx2) will be referred to as a second transmitting unit. The first transmitting unit includes a pilot inserter (134100-0), an IFFT module (134200-0), a PAPR reduction module (134300-0), a GI inserting module (134400-0), a P1 symbol inserting module (134500-0), an AP1 symbol inserting module (134600-0), and a DAC (134700-0). The second transmitting unit includes a pilot inserter (134100-1), an IFFT module (134200-1), a PAPR reduction module (134300-1), a GI inserting module (134400-1), a P1 symbol inserting module (134500-1), an AP1 symbol inserting module (134600-1), and a DAC (134700-1).

In order to perform transmission through 2 transmission antennae, the MISO encoder (134100) performs MISO encoding, so that transmission diversity can be gained for signals being inputted through the first and second paths. Then, the MISO encoder may output the processed signals to each pilot inserter (134100-0, 134100-1). If data MIMO-encoded by the BICM module are inputted, the MISO encoder (134100) may bypass the input data to the pilot inserters (134100-0, 134100-1).

More specifically, if the data being inputted through the first path and the second path correspond to MISO PLP data or L1-pre and post signaling data, the MISO encoder (134100) may use an MISO encoding matrix so as to perform MISO encoding in OFDM symbol units, thereby outputting the processed data to the pilot inserters (134100-0, 134100-1). In this case, the data may also be inputted to the MISO encoder (134100) only through any one of the first path and the second path. According to the embodiment of the present invention, examples of the MISO encoding matrix may include OSTBC (Orthogonal Space-Time Block Code)/OS-FBC (Orthogonal Space Frequency Block Code or Alamouti code).

The pilot inserters (134100-0, 134100-1) may insert a pilot signal having a specific pilot pattern in a respective position within the signal frame, so that the receiver can perform transmission channel estimation and time/frequency synchronization, thereby outputting the processed data to the IFFT modules (134200-0, 134200-1). At this point, the pilot pattern information may be signaled to the AP1 signaling information and may also be signaled to the L1 signaling information. Alternatively, the pilot pattern information may be signaled to both the AP1 signaling information and the L1 signaling information.

By performing inverse fast fourier transform, the IFFT modules (134200-0, 134200-1) convert each signal having a pilot inserted therein to time domain signals, thereby outputting the processed signals to the PAPR reduction modules (134300-0, 134300-1).

The PAPR reduction module (134300-0, 134300-1) may reduce the PAPR of the time domain signals, thereby outputting the processed signals to the GI inserting modules (134400-0, 134400-1). The PAPR reduction modules (134300-0, 134300-1) may use at least one of an ACE (Active Constellation Extension) method or a Tone Reservation method, so as to reduce the PAPR from the modulated OFDM symbol. Additionally, necessary (or required) information may be fed-back to the pilot inserters (134100-0, 134100-1) in accordance with a PAPR reduction algorithm.

By copying the last portion of an effective OFDM symbol to a front portion of the corresponding OFDM symbol, the GI inserting modules (134400-0, 134400-1) may insert a guard interval in a cyclic prefix format, thereby outputting the processed symbol (or data) to the P1 symbol inserting modules (134500-0, 134500-1). The GI information is signaled to the L1 pre signaling information. And, a portion of the GI information is signaled to the P1 signaling information.

The P1 symbol inserting modules (134500-0, 134500-1) may insert a P1 symbol in a starting portion of each signal frame, thereby outputting the processed data (or signal) to the AP1 symbol inserting modules (134600-0, 134600-1).

The AP1 symbol inserting modules (134600-0, 134600-1) insert an AP1 symbol after each P1 symbol, thereby outputting the processed data to the DACs (134700-0, 134700-1). Herein, the insertion of the P1 symbols and the AP1 symbols may be performed by the P1 symbol inserting modules (134500-0, 134500-1), and, in this case, the AP1 symbol inserting modules (134600-0, 134600-1) may be omitted.

The DACs (134700-0, 134700-1) may first convert the each signal frame having the AP1 symbol inserted therein to ananlog signals, thereby transmitting the converted signal through the corresponding transmission antenna (Tx1, Tx2).

Meanwhile, according to the embodiment of the present invention, the MIMO encoder (131500-1) within the BICM module of FIG. 17 may perform MIMO encoding by using an MIMO encoding matrix. Hereinafter, the MIMO encoder indicates the MIMO encoder (131500-1) within the BICM module of FIG. 17. The MIMO encoding matrix according to the present invention may include spatial multiplexing, a GC (Golden code), a Full-rate full diversity code, a Linear dispersion code, and so on. Alternatively, the present invention may use encoding matrices according to a first embodiment to a third embodiment of the present invention, which are described below, so as to perform MIMO encoding.

More specifically, in order to ensure low system complexity, high data transmission efficiency, and high signal recovery performance in various channel environments, multiple input signals may be processed with MIMO processing, in accordance with a MIMO matrix and a parameter value of the MIMO matrix, thereby being capable of outputting multiple transmission signals. According to the embodiment of the present invention, the broadcasting signal transmitting device may use the MIMO encoder, so as to perform MIMO encoding on a broadcasting signal and to transmit the processed signal through a plurality of transmission antennae, and the broadcasting signal receiving device may use the MIMO decoder, so as to perform MIMO decoding on the broadcasting signal, which is received through a plurality of reception antennae. In the present invention, the MIMO encoder may also be referred to as an MIMO processor, and the MIMO decoder may also be referred to as an ML (Maximum Likelihood) detector (or ML decoder).

At this point, the modulation method may be expressed as M-QAM (Quadrature Amplitude Modulation) or N-QAM. More specifically, when M (or N) is equal to 2, the modulation method may be expressed as 2-QAM, which indicates a BPSK (Binary Phase Shift Keying) method, and when M (or N) is equal to 4, the modulation method may be expressed as 4-QAM, which indicates QPSK (Quadrature Phase Shift Keying). Moreover, when M (or N) is equal to 16, the modulation method may be expressed as 16-QAM, when M (or N) is equal to 64, the modulation method may be expressed as 64-QAM, and when M (or N) is equal to 256, the modulation method may be expressed as 256-QAM. Herein, M, N each indicates a number of symbols being used for modulation.

For example, M+M QAM MIMO indicates that QAM symbols, which are used for MIMO encoding and MIMO decoding, use the same M-QAM. In another example, M+N QAM MIMO indicates that QAM symbols, which are used for MIMO encoding and MIMO decoding, use different M-QAM and N-QAM.

In the present invention, a channel environment having transmission/reception paths that are independent from one another may be referred to as un-correlated channels, and a channel environment, such as an LOS (Line Of Sight) environment, having high correlation between the channels of the transmission/reception paths may be referred to as fully correlated channels.

In the present invention, in order to overcome the case when the correlation between the MIMO channels is equal to 1, i.e., when the MIMO channel corresponds to a fully correlated channel, the MIMO system according to the present invention may be designed so that a signal, which is received after passing through a channel, can satisfy the following conditions (or requirements).

1) A received signal should be capable of expressing both original signals.

2) A minimum Euclidean distance of the received signal should be increased, so that a symbol error rate can be reduced. Herein, a Euclidean distance refers to a distance between coordinates over a constellation.

3) A hamming distance characteristic of the received signal should be advantageous, so that the bit error rate can be reduced. Herein, when a bit value corresponding to binary codes each having the same number of bits do not match, the Hamming distance indicates a number of binary codes having non-matching bit values.

In order to meet with the above-described requirements, the present invention proposes a MIMO encoding method using an MIMO encoding matrix, which includes an encoding parameter (also referred to as an encoding coefficient) a, as shown below in Equation 2.

$$\begin{bmatrix} 1 & a \\ a & -1 \end{bmatrix}$$ Equation 2

When an MIMO encoder performs encoding on input signals S1 and S2 by using an MIMO encoding matrix, as shown in Equation 2, the reception signal 1 (Rx1) and the reception signal 2 (Rx2), which are received by reception antenna 1 and reception antenna 2, may be calculated by using Equation 3 shown below. And, most particularly, in case the MIMO channel corresponds to a fully correlated channel, the signals are calculated by using the last line shown in Equation 3.

$$Rx_1 = h_{11}(S1+aS2) + h_{21}(aS1-S2)$$

$$Rx_2 = h_{12}(S1+aS2) + h_{22}(aS1-S2)$$

$$R = Rx_1 = Rx_2 = h\{(a+1)S1 + (a-1)S2\}$$ Equation 3

First of all, in case the MIMO channel corresponds to an un-correlated channel, the reception signal (Rx1) may be calculated as Rx1=$h_{11}$(S1+a*S1)+$h_{21}$(a*S1−S21), and the reception signal 2 (Rx2) may be calculated as Rx2=$h_{12}$(S1+a*S21)+$h_{22}$(a*S1−S21), so that S1 and S2 can have the same power. Accordingly, all of the gain of the MIMO system may be used as in the SM method.

Meanwhile, when the MIMO channel corresponds to a fully correlated channel, the reception signals (R=Rx1=Rx2) may be acquired as R=h{(a+1)S1+(a−1)S2}. Thus, S1 and S2 may be separately acquired. Herein, S1 and S2 may also be designed to have different power levels, and by using such different power levels robustness may be ensured.

In other words, the MIMO encoder may encoder input signals, so that input signals S1 and S2 can have different power levels, in accordance with an encoding parameter (also referred to as an encoding coefficient) a, and so that S1 and S2 can also be received in different distribution formats in a fully correlated channel. For example, by performing an encoding process on S1 and S2, so that S1 and S2 can have different power levels, and by transmitting the encoded S1 and S2 to a constellation having different Euclidean distances due to a normalization process, even when signals go through a fully correlated channel, the receiver may separate (or divide) the input signals and recover the separated signals accordingly.

Based upon a normalization factor, the MIMO encoding matrix of Equation 3 may be expressed as shown below in Equation 4.

$$\frac{1}{\sqrt{1+a^2}}\begin{bmatrix} 1 & a \\ a & -1 \end{bmatrix} = \begin{bmatrix} \frac{1}{\sqrt{1+a^2}} & \frac{a}{\sqrt{1+a^2}} \\ \frac{a}{\sqrt{1+a^2}} & \frac{-1}{\sqrt{1+a^2}} \end{bmatrix} \quad \text{Equation 4}$$

$$= \begin{bmatrix} \cos\theta & \sin\theta \\ \sin\theta & -\cos\theta \end{bmatrix}$$

A MIMO encoding method of the MIMO encoder, which uses the MIMO encoding matrix shown in Equation 4, may be considered as a method of rotating input signals by an arbitrary angle (Theta), which can be expresses as an encoding parameter a, so as to divide the signal into a cosine element of the rotated signal and a sine element (or real number element and imaginary (or false) number element) and to assign +/- signs to each of the divided elements, thereby transmitting the processed signal to another antenna. For example, the MIMO encoder may perform encoding so that a cosine element of input signal S1 and a sine element of input signal S2 can be transmitted to one transmission antenna, and that a sine element of input signal S1 and a cosine element, having a - sign added thereto, of input signal S2 can be transmitted to another transmission antenna. A rotation angle may vary depending upon a change in an encoding parameter value a, and power distribution between input signals S1 and S2 may vary depending upon a value and angle of the corresponding parameter. Since the varied power distribution may be expressed as a distance (i.e., Euclidean distance) between symbol coordinates in a constellation. Even if the input signals pass through a fully correlated channel from the receiving end, such encoded input signals may be expressed in the form of a different constellation, so that the input signals can be identified, divided, and recovered.

In other words, since a Euclidean distance between transmission signals varies to a level corresponding to the distribution of the varied power, the transmission signals received by the receiving end may be expressed in the form of distinguishable constellations each having a different Euclidean distance. More specifically, the MIMO encoder may encode input signal S1 and input signal S2 as a signal having another Euclidean distance in accordance with the value a. And, such encoded transmission signals may be received by the receiving end in distinguishable (or identifiable) constellations and may be recovered accordingly.

The MIMO encoding of the input signal, which is performed by using the above-described MIMO encoding matrix, may be expressed as shown below in Equation 5.

$$\begin{bmatrix} X1 \\ X2 \end{bmatrix} = \frac{1}{\sqrt{1+a^2}} \begin{bmatrix} 1 & a \\ a & -1 \end{bmatrix} \begin{bmatrix} S1 \\ S2 \end{bmatrix} \quad \text{Equation 5}$$

In Equation 5, S1 and S2 represent normalized QAM symbols of a constellation, to which input signal S1 and input signal S2 are mapped by a constellation mapper of a MIMO path. And, each of X1 and X2 respectively represents a MIMO-encoded symbol. In other words, the MIMO encoder may apply the matrix, which is shown in Equation 5, to a $1^{st}$ input signal including symbols corresponding to S1 and to a $2^{nd}$ input signal including symbols corresponding to S2, so as to transmit a $1^{st}$ transmission signal including symbols corresponding to X1 and symbols of a transmission signal X2 including symbols corresponding to X2.

The MIMO encoder may perform MIMO encoding on input signals by suing the above-described MIMO encoding matrix, and may also perform encoding by additionally adjusting an encoding parameter value a. More specifically, the consideration and adjustment of an additional data recovery performance of the MIMO transmitting and receiving system may be optimized by adjusting the encoding parameter value a. And, this will hereinafter be described in more detail.

1. First Embodiment: MIMO Encoding Method of Optimizing an Encoding Parameter Value a based upon a Euclidean Distance (Fully Correlated MIMO Channel)

The value a, which corresponds to an encoding parameter, may be calculated by using the above-described MIMO encoding matrix while considering the Euclidean distance. According to the first embodiment of the present invention, a signal that is combined in the receiving end, after passing through a fully correlated MIMO channel, may be given a Euclidean distance, such as a QAM signal.

The first embodiment of the present invention proposes a method of optimizing the value a, so that each symbol included in a symbol constellation of reception signals, which have passed through the fully correlated channel, can have the same Euclidean distance. More specifically, when the MIMO encoder uses the above-described MIMO matrix so as to encode the input signals, the MIMO encoder may calculate or determine the value of the encoding parameter a, so that the Euclidean distance between the reception symbols can be consistent (or equal) in the constellation of the reception signals (i.e., a combined signal of the $1^{st}$ transmission signal St1 and the $2^{nd}$ transmission signal St2), which have passed through the fully correlated channel. And, accordingly, the MIMO encoder may perform an encoding process. Such value a may be expressed as Equation 6 shown below, in accordance with a combination of the modulation methods.

$$A = \begin{cases} 3, & \text{for } QPSK + QPSK \\ (4+\sqrt{5})/(4-\sqrt{5}), & \text{for } QPSK + 16QAM \\ 0.6, & \text{for } 16QAM + 16QAM \end{cases} \quad \text{Equation 6}$$

In other words, since the distribution and constellation of a transmission and reception symbol vary depending upon the modulation method of reception signals and the combination of the reception signals, the value a may also be varied in order to optimize the Euclidean distance.

In other words, in case of the first embodiment of the present invention, for example, in a signal wherein a $1^{st}$ input signal of 4-QAM and a $2^{nd}$ input signal of 4-QAM are MIMO-encoded and combined with outputted $1^{st}$ transmission signal and $2^{nd}$ transmission signals, the value a may be determined so that the constellation of the combined signal is identical to the constellation of a 16-QAM signal. The MIMO encoding method according to the first embodiment of the present invention shows a more excellent SNR performance as compared to when using the GC method or the SM method in the fully correlated MIMO channel. Most particularly, the SNR gain according to the first embodiment of the present invention becomes higher as the coding rate of the outer code increases. Conversely, in case of the SM method, in a coding rate of 2/5 or higher, decoding cannot be performed at all in the fully correlated channel, and, regardless of the SNR, even the service reception cannot be performed. Additionally, the MIMO encoding method according to the first embodiment of the present invention shows the same performance in an un-correlated channel as the SM method, and the performance is more excellent as compared to the other methods. Therefore, the MIMO encoding method according to the first embodiment of the present invention may provide a better performance by using a system having a lower complexity level as compared to the GC method. And, the MIMO encoding method according to the first embodiment of the present invention may provide a more excellent performance in the fully correlated channel, as compared to when using the SM method having a similar complexity level.

According to another embodiment of the present invention, when performing MIMO encoding, a GC subset may be used as the MIMO encoding matrix. And, in this case, the MIMO encoding matrix may be expressed as shown below in Equation 7.

$$\begin{bmatrix} \alpha & \alpha\theta \\ i\overline{\alpha} & i\overline{\alpha}\overline{\theta} \end{bmatrix} \begin{bmatrix} S1 \\ S2 \end{bmatrix}, \quad \text{Equation 7}$$

$$\alpha = 1 + (1-\theta)i,$$
$$\overline{\alpha} = 1 + (1-\overline{\theta})i,$$
$$\theta = \frac{1+\sqrt{5}}{2},$$
$$\overline{\theta} = \frac{1-\sqrt{5}}{2}$$

In case of using an encoding matrix of Equation 7, the performance is shown to be better than the first embodiment of the present invention.

When the MIMO encoding process using the GC subset performed in the fully correlated MIMO channel is compared with the MIMO encoding process performed according to the first embodiment of the present invention (SM OPT1) in the fully correlated MIMO channel, in case of using the first embodiment of the present invention (SM OPT1), a minimum Euclidean distance within the constellation of the reception signal may be greater than the case of using the GC subset. However, the SNR performance respective to the case of using the GC subset (SM OLDP Golden) is shown to be better than the case of using the first embodiment of the present invention.

2. Second Embodiment: MIMO Encoding Method Considering Gray Mapping in addition to a Euclidean Distance The second embodiment of the present invention proposes a MIMO encoding method enabling a reception signal, which has passed through the fully correlated channel in a state when the value a is determined to have a value that can optimize the Euclidean distance, as in the first embodiment of the present invention, to have gray mapping applied thereto.

In the MIMO encoding method according to the second embodiment of the present invention, among the input signals S1 and S2, signs of the real number part and the imaginary number part of input signal S2 may be changed in accordance with the S1 value, so that gray mapping can be performed in the receiving end. The change in the data value included in S2 may be performed by using the method shown below in Equation 8.

More specifically, the MIMO encoder may use the MIMO encoding matrix used in the first embodiment of the present invention and may perform MIMO encoding by changing the sign of the input signal S2 in accordance with the value of S1. In other words, as shown in Equation 8, after deciding the sign of input signal S2 in accordance with the sign of input signal S1, MIMO encoding matrix may be applied to the decided input signal S1 and input signal S2, as described above, so that $1^{st}$ transmission signal St1 and $2^{nd}$ transmission signal St2 can be outputted.

$S1 = b_0 b_1 \ldots b_{N-1}$, $N = \log_2 M$, $M$=QAM size of $S1$ $\text{real}(S1) = b_0 b_2 \ldots b_{N-2}$ $\text{imag}(S1) = b_1 b_3 \ldots b_{N-1}$ for $i = 1 \ldots N-1$ $si = sq = 1$ if $i$=index of real($S1$) and $b_1$=1

$si = -si$ if $i$=index of imag($S1$) and $b_1$=1

$sq = -sq$ end for $$S2 = si \cdot \text{real}(S1) + i \cdot sq \cdot \text{imag}(S2) \quad \text{Equation 8}$$

As shown in Equation 8, an XOR operation is performed on each of the bit values allocated to the real number part and the imaginary number part of S1 among the input signal S1 and the input signal S2. Then, based upon the result of the XOR operation, the signs respective to the real number part and the imaginary number part of S2 may be decided. Additionally, when transmission signal 1 and transmission 2, which respectively correspond to input signal S1 and input signal S2 having the MIMO encoding matrix applied thereto, as described above, are transmitted from transmission antenna 1 and transmission antenna 2, the reception symbols of the reception signal, having passed through the fully correlated channel and being received by the receiver, may have gray mapping. Therefore, the hamming distance between neighboring symbols within the constellation may not exceed the value of 2.

Since the (M*N)-QAM signal (or (M*M)-QAM signal) received by the receiving end has a minimum (or uniform) Euclidean distance and gray mapping, in case of the second embodiment of the present invention, the same performance of the SIMO method may also be expected in the fully correlated MIMO channel. However, when the ML decoder decodes the reception signal and acquired S1 and S2, since the S2 value depends upon S1, the complexity level may be increased. And, in an un-correlated MIMO channel, the performance is likely to be degraded due to a correlation between the input signals.

3. Third Embodiment: MIMO Encoding Method Determining an MIMO Encoding Parameter while Considering a Hamming Distance in addition to a Euclidean Distance The third embodiment of the present invention proposes a method of performing MIMO encoding by determining a value a, so that the overall constellation of the reception signal does not have a minimum Euclidean distance, as in the first embodiment of the present invention, and so that the Euclidean distance can be optimized based upon a hamming distance of the reception signal.

That is, in the third embodiment, the Euclidean distance is being adjusted in order to compensate a difference in the recovery performance respective to a difference in the hamming distance with a difference in the power level. More specifically, with respect to neighboring symbols, wherein a difference in the number of bits of one symbol is 2 times that of another symbol, a performance degradation respective to a difference in the hamming distance, which may occur during the reception signal recovery, may be compensated by adjusting (i.e., increasing) the Euclidean distance, so that the section having 2 times the hamming distance can be provided with greater power level. First of all, a relative Euclidean distance is determined with respect to a reception signal, which corresponds to a combination of the 2 transmission signals (St1, St2) both being received by the receiving end. Referring to the above-described Equation 3, it will be apparent that the minimum Euclidean distance of a 16-QAM symbol having a decreasing power level is equal to 2(a-1), and that the minimum Euclidean distance of a 16-QAM symbol having an increasing power level is equal to 2(a+1) (this is because one reception signal is expressed as R=h{(a+1)S1+(a-1)S2}).

In the third embodiment, the MIMO encoder uses the above-described MIMO matrix in order to perform MIMO encoding, so that each input signal can be assigned with a different power level, and so that each input signal can have a different Euclidean distance. That is, according to the third embodiment of the present invention, the MIMO encoder may calculate and determine the value of an encoding parameter a, so that input signals being assigned with different power levels can each have a Euclidean distance, which can compensate for the difference in the hamming distance. Thus, the MIMO encoding process may be performed. Moreover, such value of a may be represented as Equation 9 shown below, according to a combination of the modulation methods.

$$a = \begin{cases} \sqrt{2}+1, & \text{for } QPSK+QPSK \\ (\sqrt{2}+3+\sqrt{5})/(\sqrt{2}+3-\sqrt{5}), & \text{for } QPSK+16QAM \\ (\sqrt{2}+4)/(\sqrt{2}+2), & \text{for } 16QAM+16QAM \end{cases} \quad \text{Equation 9}$$

In case of QPSK+16QAM MIMO, it will be assumed that the value proposed above corresponds to when the constellation mapper has performed normalization of the power level to 1, after performing QAM modulation on input signal S1 and input signal S2 by respectively using QPSK and 16QAM. In case the normalization process is not performed, the value a may be corrected accordingly.

Additionally, in addition to the value proposed in the case of QPSK+16QAM MIMO, a value of 4.0 may be used as the value a. In case of QPSK+16QAM MIMO, this is due to the characteristic enabling the combined signal to express both S1 and S2, even in a case of using the SM method in the fully correlated channel. In this case, in order to compensate for the performance in a high coding rate of an outer code, a value proximate to 4.0 may be used instead of the value calculated by using Equation 9.

Based upon the description presented above, when comparing the second embodiment of the present invention with the third embodiment of the present invention, in the fully correlated MIMO channel, the second embodiment of the present invention shows a performance identical to that of the SIMO, thereby causing no loss in the performance. Accordingly, the disadvantages of the MIMO method of the fully correlated MIMO channel may be enhanced. However, according to the second embodiment of the present invention, due to the MIMO encoding process, since the input data S1 and S2 are not independent from one another, the input data S2 may vary in accordance with the input data S1, thereby causing degradation in the performance in an un-related channel. Therefore, the reception of S1 and any decoding error occurring during the reception of S1 may be reflected to S2, thereby causing additional decoding error in S2. In order to resolve such problem, the present invention may use an iterative ML detection process.

The iterative ML detection includes an outer code in an iterative loop. Then, the iterative ML detection process uses a soft posteriori probability value of S1, which is outputted from the outer code, as a priori probability value of the ML detector. Accordingly, by reducing any detection error, any possible application of the detection error of S1 to the S2 detection may be reduced. By using this method, when using the MIMO encoding method according to the second embodiment of the present invention, the fully correlated MIMO channel may show the performance of an SIMO system, and the un-correlated MIMO channel may show the performance of the SM method.

The MIMO encoding process according to the third embodiment of the present invention is devised and designed so that the reception signal being received through the fully correlated MIMO channel can consider both the hamming distance and the Euclidean distance. Accordingly, the third embodiment of the present invention shows an excellent performance in the fully correlated MIMO channel. And, in comparison with the SM method, since the MIMO encoding process according to the third embodiment of the present invention shows no loss in performance in the un-correlated MIMO channel, it is verified that the gain in both the MIMO transmission and the MIMO reception can be used. In this case, since the complexity level of the receiver is similar to the complexity level corresponding to the SM method, the MIMO encoding process according to the third embodiment of the present invention is also advantageous in implementing the receiver of the present invention.

Additionally, the demuxes (131300-0, 131300-1, 132300) within the BICM module of FIG. 17 may position the data, so that a difference in robustness, which occurs after a symbol mapping process, can be reduced, and may decide a number of bits being transmitted for each carrier. For simplicity in the description of the present invention, the demuxes (131300-0, 131300-1, 132300) will be referred to as bit-cell demuxes. The bit-cell demuxes of the present invention are used for adequately positioning different reliability levels, which are generated when performing QAM modulation, in an LDPC codeword, so as to optimize the error correction capability of the LDPC.

As an error correcting coding method for transmitting information by reducing the likelihood of information loss to a minimum level, the LDPC coding corresponds to a linear error correcting code. An LDPC block may be expressed as parameters being expressed as N and K. Herein, N represents a block length (# bit), and K indicates a number of encoded information bits included in an LDPC block. A data size (or data amount) that can be transmitted by an LDPC block may be decided in accordance with the size of an LDPC parity region and a code rate.

The code rate that can be applied in the present invention may correspond to any one of 1/4, 2/5, 3/5, 1/2, 4/5, 1/3, 2/3, 3/4, 5/6. And, the length of an LDPC block may correspond to any one of 16200 bits (or also referred to as 16K) and 64800 bits (or also referred to as 64K).

More specifically, an LDPC codeword bit being outputted from the FEC encoder may be inputted to the bit interleaver, and the bit interleaver may perform bit-unit interleaving on the inputted LDPC codeword bit within the LDPC block, thereby outputting the interleaved LDPC codeword bit to the bit-cell demux. The bit-cell demux divides the bit-interleaved and inputted LDPC codeword bit stream into a plurality of bit streams. For example, when the LDPC block length is equal to 16800, the LDPC codeword bit stream may be divided into 2 bit streams when the modulation format that is to be used for the symbol mapping process corresponds to QPSK, 8 bit streams when the modulation format corresponds to 16QAM, 12 bit streams when the modulation format corresponds to 64QAM, and 8 bit streams when the modulation format corresponds to 256QAM. More specifically, when the LDPC block length is equal to 16800, and when the modulation format that is to be used for the symbol mapping process corresponds to QPSK, the number of sub-streams is equal to 2, when the modulation format corresponds to 16QAM, the number of sub-streams is equal to 8, when the modulation format corresponds to 64QAM, the number of sub-streams is equal to 12, and when the modulation format corresponds to 256QAM, the number of sub-streams is equal to 8. When the modulation format corresponds to 256QAM, the 8 bits may become one bit group.

At this point, an order of output from the bit-cell demux may vary depending upon a predetermined condition or a reliability positioning method. More specifically, the output order of the bits being outputted from the bit-cell demux may vary in accordance with reliability positioning, a code rate, and a modulation method, which are indicated when the corresponding bit group is mapped to a QAM symbol.

In other words, demultiplexing refers to mapping a bit-interleaved input bit $v_{di}$ to an output bit $b_{e,do}$.

Herein, do represents di div Nsubstreams, e signifies a number of a demultiplexed bit stream ($0 \leq e \leq N_{substreams}$), and variations may occur in accordance with a di value.

$v_{di}$ represents an input of the bit-cell demux, and di corresponds to an input bit number. $b_{e,do}$ represents an output of the bit-cell demux, and do corresponds to a bit number of a given stream in an output of the bit-cell demux.

(a) to (e) of FIG. 20 illustrate exemplary output orders of the bit-cell demux in accordance to each code rate, when an LDPC block length is equal to 16800, and when the modulation format that is to be used for symbol mapping correspond to 256QAM. When the modulation format corresponds to 256QAM, an 8-bit unit may be mapped to one symbol.

(a) of FIG. 20 shows an output order of the bit-cell demux, when the code rate is 1/4, and the demux method shown in (a) of FIG. 20 will be referred to as 256QAM Type 1-1. More specifically, in case of Type 1-1, when the bit-interleaved input bits are inputted to the bit-cell demux by the order of 0, 1, 2, 3, 4, 5, 6, 7, the bits being outputted from the bit-cell demux may be outputted by the output order of 5, 3, 2, 7, 1, 6, 4, 0. Then, the constellation mapper may perform symbol mapping by the order of output outputted from the bit-cell demux. In this case, a reliability alignment of C, B, B, D, A, D, C, A starting from the first bit to the last bit of the LDPC codeword may be obtained. A, B, C, D collectively indicate the reliability when bits of the corresponding bit group are mapped to a QAM symbol. Herein, the order of high reliability is ranked by the order of A>B>C>D.

(b) of FIG. 20 shows an output order of the bit-cell demux, when the code rate is 2/5 and 3/5, and the demux method shown in (b) of FIG. 20 will be referred to as 256QAM Type 1-2. More specifically, in case of Type 1-2, when the bit-interleaved input bits are inputted to the bit-cell demux by the order of 0, 1, 2, 3, 4, 5, 6, 7, the bits being outputted from the bit-cell demux may be outputted by the output order of 5, 1, 0, 7, 3, 6, 4, 2. Then, the constellation mapper may perform symbol mapping by the order of output outputted from the bit-cell demux. In this case, a reliability alignment of C, A, A, D, B, D, C, B starting from the first bit to the last bit of the LDPC codeword may be obtained.

(c) of FIG. 20 shows an output order of the bit-cell demux, when the code rate is 1/2, and the demux method shown in (c) of FIG. 20 will be referred to as 256QAM Type 1-3. More specifically, in case of Type 1-3, when the bit-interleaved input bits are inputted to the bit-cell demux by the order of 0, 1, 2, 3, 4, 5, 6, 7, the bits being outputted from the bit-cell demux may be outputted by the output order of 7, 3, 1, 6, 5, 2, 4, 0. Then, the constellation mapper may perform symbol mapping by the order of output outputted from the bit-cell demux. In this case, a reliability alignment of D, B, A, D, C, B, C, A starting from the first bit to the last bit of the LDPC codeword may be obtained.

(d) of FIG. 20 shows an output order of the bit-cell demux, when the code rate is 4/5, and the demux method shown in (d) of FIG. 20 will be referred to as 256QAM Type 1-4. More specifically, in case of Type 1-4, when the bit-interleaved input bits are inputted to the bit-cell demux by the order of 0, 1, 2, 3, 4, 5, 6, 7, the bits being outputted from the bit-cell demux may be outputted by the output order of 3, 2, 1, 5, 7, 6, 4, 0. Then, the constellation mapper may perform symbol mapping by the order of output outputted from the bit-cell demux. In this case, a reliability alignment of B, B, A, C, D, D, C, A starting from the first bit to the last bit of the LDPC codeword may be obtained.

(e) of FIG. 20 shows an output order of the bit-cell demux, when the code rate is 1/3.2/3, 3/4, 5/6, and the demux method shown in (e) of FIG. 20 will be referred to as 256QAM Type 1-5. More specifically, in case of Type 1-5, when the bit-interleaved input bits are inputted to the bit-cell demux by the order of 0, 1, 2, 3, 4, 5, 6, 7, the bits being outputted from the bit-cell demux may be outputted by the output order of 7, 3, 1, 5, 2, 6, 4, 0. Then, the constellation mapper may perform symbol mapping by the order of output outputted from the bit-cell demux. In this case, a reliability alignment of D, B, A, C, B, D, C, A starting from the first bit to the last bit of the LDPC codeword may be obtained.

FIG. 21 illustrates exemplary mapping correlation between the input bits and the output bits of the bit-cell demux according demux type of FIG. 20.

In case of 256QAM, 8 bits are mapped to one QAM symbol. At this point, among (b0, b1, b2, b3, b4, b5, b6, b7), which correspond to the QAM symbol bits, bits b0, b2, b4, b6 may decide the code and size of the real number part, and bits b1, b3, b5, b7 may decide the code and size of the imaginary number part. More specifically, bits b0 and b1 may respectively decide the code of the real number part and the imaginary number part, and bits b2, b3, b4, b5, b6, b7 may respectively decide the size of the real number part and the imaginary number part. Since it is easier to determine the code than to determine the size of the modulated symbol, bits b0 and b1, which correspond to the 2 bits located in the MSB, have the highest reliability, and bits b6 and b7, which correspond to the 2 bits located in the LSB, have the lowest reliability.

If the bit-cell demux operates as 256QAM Type 1-1, by using the bit realignment of the bit-cell demux, in the constellation mapper, the last bit (v7) within a sub-stream may be allocated to a code bit (b0,0) of the real number part, and the $5^{th}$ bit (v4) may be allocated to a code bit (b1,0) of the imaginary number part. Additionally, the $3^{rd}$, 7th, and $6^{th}$ bits (v2, v6, v5) are sequentially allocated to the size bits (b2,0, b4,0, b6,0) of the real number part, and the $2^{nd}$, $1^{st}$, and $4^{th}$ bits (v1, v0, v3) are sequentially allocated to the size bits (b3,0, b5,0, b7,0) of the imaginary number part.

For the remaining types, i.e., Type 1-2 to Type 1-5, since reference may be made to the description of Type 1-1, detailed description of the same will be omitted herein.

(a) to (c) of FIG. 22 illustrate other exemplary output orders of the bit-cell demux in accordance to each code rate, when an LDPC block length is equal to 16800, and when the modulation format that is to be used for symbol mapping correspond to 256QAM.

(a) of FIG. 22 shows an output order of the bit-cell demux, when the code rate is 1/4, 1/3, 2/5, 3/5, and the demux method shown in (a) of FIG. 22 will be referred to as 256QAM Type 2-1. More specifically, in case of Type 2-1, when the bit-interleaved input bits are inputted to the bit-cell demux by the order of 0, 1, 2, 3, 4, 5, 6, 7, the bits being outputted from the bit-cell demux may be outputted by the output order of 5, 1, 3, 7, 0, 6, 4, 2. Then, the constellation mapper may perform symbol mapping by the order of output outputted from the bit-cell demux. In this case, a reliability alignment of C, A, B, D, A, D, C, B starting from the first bit to the last bit of the LDPC codeword may be obtained.

(b) of FIG. 22 shows an output order of the bit-cell demux, when the code rate is 1/2, 2/3, 4/5, and the demux method shown in (b) of FIG. 22 will be referred to as 256QAM Type 2-2. More specifically, in case of Type 2-2, when the bit-interleaved input bits are inputted to the bit-cell demux by the order of 0, 1, 2, 3, 4, 5, 6, 7, the bits being outputted from the bit-cell demux may be outputted by the output order of 7, 3, 1, 6, 2, 5, 4, 0. Then, the constellation mapper may perform symbol mapping by the order of output outputted from the bit-cell demux. In this case, a reliability alignment of D, B, A, D, B, C, C, A starting from the first bit to the last bit of the LDPC codeword may be obtained.

(c) of FIG. 22 shows an output order of the bit-cell demux, when the code rate is 1/4, 1/3, 2/3, 4/5, 3/4, 5/6, and the demux method shown in (c) of FIG. 22 will be referred to as 256QAM Type 2-3. More specifically, in case of Type 2-3, when the bit-interleaved input bits are inputted to the bit-cell demux by the order of 0, 1, 2, 3, 4, 5, 6, 7, the bits being outputted from the bit-cell demux may be outputted by the output order of 7, 3, 1, 5, 2, 6, 4, 0. Then, the constellation mapper may perform symbol mapping by the order of output outputted from the bit-cell demux. In this case, a reliability alignment of D, B, A, C, B, D, C, A starting from the first bit to the last bit of the LDPC codeword may be obtained.

In FIG. 22, when the code rate is 1/4, 1/3, the bit-cell demux of Type 2-1 or Type 2-3 may both be used. Similarly, when the code rate is 2/3, 4/5, the bit-cell demux of Type 2-2 or Type 2-3 may both be used.

Additionally, when performing reliability alignment as shown in FIG. 22, since the number of bit-cell demuxes may be reduced to a smaller number as compared to FIG. 20, the system complexity may be reduced.

FIG. 23 illustrates exemplary mapping correlation between the input bits and the output bits of the bit-cell demux according demux type of FIG. 22.

If the bit-cell demux operates as 256QAM Type 2-1, by using the bit realignment of the bit-cell demux, in the constellation mapper, the $5^{th}$ bit (v4) within a sub-stream may be allocated to a code bit (b0,0) of the real number part, and the $2^{nd}$ bit (v1) may be allocated to a code bit (b1,0) of the imaginary number part. Additionally, the $8^{th}$, $7^{th}$, and $6^{th}$ bits (v7, v6, v5) are sequentially allocated to the size bits (b2,0, b4,0, b6,0) of the real number part, and the $3^{rd}$, $1^{st}$, and $4^{th}$ bits (v2, v0, v3) are sequentially allocated to the size bits (b3,0, b5,0, b7,0) of the imaginary number part.

For the remaining types, i.e., Type 2-2 and Type 2-3, since reference may be made to the description of Type 2-1, detailed description of the same will be omitted herein.

(a) to (c) of FIG. 24 illustrate other exemplary output orders of the bit-cell demux in accordance to each code rate, when an LDPC block length is equal to 16800, and when the modulation format that is to be used for symbol mapping correspond to 256QAM.

(a) of FIG. 24 shows an output order of the bit-cell demux, when the code rate is 2/5, 3/5, and the demux method shown in (a) of FIG. 24 will be referred to as 256QAM Type 3-1. More specifically, in case of Type 3-1, when the bit-interleaved input bits are inputted to the bit-cell demux by the order of 0, 1, 2, 3, 4, 5, 6, 7, the bits being outputted from the bit-cell demux may be outputted by the output order of 5, 1, 0, 7, 3, 6, 4, 2. Then, the constellation mapper may perform symbol mapping by the order of output outputted from the bit-cell demux. In this case, a reliability alignment of C, A, A, D, B, D, C, B starting from the first bit to the last bit of the LDPC codeword may be obtained.

(b) of FIG. 24 shows an output order of the bit-cell demux, when the code rate is 1/2, and the demux method shown in (b) of FIG. 24 will be referred to as 256QAM Type 3-2. More specifically, in case of Type 3-2, when the bit-interleaved input bits are inputted to the bit-cell demux by the order of 0, 1, 2, 3, 4, 5, 6, 7, the bits being outputted from the bit-cell demux may be outputted by the output order of 7, 3, 1, 6, 5, 2, 4, 0. Then, the constellation mapper may perform symbol mapping by the order of output outputted from the bit-cell demux. In this case, a reliability alignment of D, B, A, D, C, B, C, A starting from the first bit to the last bit of the LDPC codeword may be obtained.

(c) of FIG. 24 shows an output order of the bit-cell demux, when the code rate is 1/4, 1/3, 2/3, 4/5, 3/4, 5/6, and the demux method shown in (c) of FIG. 24 will be referred to as 256QAM Type 3-3. Herein, Type 3-3 performs demultiplexing by using the same method as Type 2-3. Therefore, Type 3-3 may also be referred to as Type 2-3.

Additionally, when performing reliability alignment as shown in FIG. 24, since the number of bit-cell demuxes may be reduced to a smaller number as compared to FIG. 20, the system complexity may be reduced.

(a) to (c) of FIG. 25 illustrate exemplary output orders of the bit-cell demux in accordance to each code rate, when an LDPC block length is equal to 16800, and when the modulation format that is to be used for symbol mapping correspond to 64QAM. When the modulation format corresponds to 64QAM, a 6-bit unit may be mapped to one symbol.

(a) of FIG. 25 shows an output order of the bit-cell demux, when the code rate is 2/5, 3/5, and the demux method shown in (a) of FIG. 25 will be referred to as 64QAM Type 2-1. More specifically, in case of 64QAM Type 2-1, when the bit-interleaved input bits are inputted to the bit-cell demux by the order of 0, 1, 2, 3, 4, 5, 6, 7, 8, 9, 10, 11, the bits being outputted from the bit-cell demux may be outputted by the output order of 5, 6, 1, 7, 9, 11, 3, 8, 10, 4, 2, 0. Then, the constellation mapper may perform symbol mapping by the order of output outputted from the bit-cell demux. In this case, a reliability alignment of C, A, A, A, B, C, B, B, C, C, B, A starting from the first bit to the last bit of the LDPC codeword may be obtained. Herein, the order of high reliability is ranked by the order of A>B>C>D.

(b) of FIG. 25 shows an output order of the bit-cell demux, when the code rate is 1/2, and the demux method shown in (b) of FIG. 25 will be referred to as 64QAM Type 2-2. More specifically, in case of 64QAM Type 2-2, when the bit-interleaved input bits are inputted to the bit-cell demux by the order of 0, 1, 2, 3, 4, 5, 6, 7, 8, 9, 10, 11, the bits being outputted from the bit-cell demux may be outputted by the output order of 5, 11, 7, 1, 8, 10, 4, 9, 6, 2, 3, 0. Then, the constellation mapper may perform symbol mapping by the order of output outputted from the bit-cell demux. In this case, a reliability alignment of C, C, A, A, B, C, C, B, A, B, B, A starting from the first bit to the last bit of the LDPC codeword may be obtained.

(c) of FIG. 25 shows an output order of the bit-cell demux, when the code rate is 1/4, 1/3, 2/3, 4/5, 3/4, 5/6, and the demux method shown in (c) of FIG. 25 will be referred to as 64QAM Type 2-3. More specifically, in case of 64QAM Type 2-3, when the bit-interleaved input bits are inputted to the bit-cell demux by the order of 0, 1, 2, 3, 4, 5, 6, 7, 8, 9, 10, 11, the bits being outputted from the bit-cell demux may be outputted by the output order of 11, 7, 3, 10, 6, 2, 9, 5, 1, 8, 4, 0. Then, the constellation mapper may perform symbol mapping by the order of output outputted from the bit-cell demux. In this case, a reliability alignment of C, A, B, C, A, B, B, C, A, B, C, A starting from the first bit to the last bit of the LDPC codeword may be obtained.

(a), (b) of FIG. 26 illustrate exemplary output orders of the bit-cell demux in accordance to each code rate, when an LDPC block length is equal to 16800, and when the modulation format that is to be used for symbol mapping correspond to 16QAM.

(a) of FIG. 26 shows an output order of the bit-cell demux, when the code rate is 1/2, and the demux method shown in (a) of FIG. 26 will be referred to as 16QAM Type 2-2. More specifically, in case of 16QAM Type 2-2, when the bit-interleaved input bits are inputted to the bit-cell demux by the order of 0, 1, 2, 3, 4, 5, 6, 7, the bits being outputted from the bit-cell demux may be outputted by the output order of 3, 1, 5, 7, 6, 4, 2, 0. Then, the constellation mapper may perform symbol mapping by the order of output outputted from the bit-cell demux. In this case, a reliability alignment of B, A, A, B, B, A, B, A starting from the first bit to the last bit of the LDPC codeword may be obtained.

(b) of FIG. 26 shows an output order of the bit-cell demux, when the code rate is 1/4, 1/3, 2/5, 3/5, 2/3, 4/5, 3/4, 5/6, and the demux method shown in (b) of FIG. 26 will be referred to as 16QAM Type 2-3. More specifically, in case of 16QAM Type 2-3, when the bit-interleaved input bits are inputted to the bit-cell demux by the order of 0, 1, 2, 3, 4, 5, 6, 7, the bits being outputted from the bit-cell demux may be outputted by the output order of 7, 1, 4, 2, 5, 3, 6, 0. Then, the constellation mapper may perform symbol mapping by the order of output outputted from the bit-cell demux. In this case, a reliability alignment of B, A, A, B, A, B, B, A starting from the first bit to the last bit of the LDPC codeword may be obtained.

As described above, the demux type may vary depending upon, for example, a symbol mapping method or a code rate of error correction encoding. In other words, another demux type may be used in accordance with the different symbol mapping methods, code rates, and reliability alignment.

Moreover, for bit positions having the same reliability, even if the order of the bit positions is changed, the same effect may be gained. Accordingly, any bit alignment may be included in the structure of the bit-cell demux according to the present invention, as long as the bit alignment satisfies the conditions of the reliability alignment shown in FIG. 20 to FIG. 26.

As described above, when bit re-alignment is performed in the bit-cell demux in accordance with the modulation format and the code rate, and when symbol mapping is performed in the constellation mapper in accordance with the modulation formation, a transmitted signal may acquire the initial alignment of the LDPC codeword from the receiver of the cell-bit mux, thereby being transmitted to the FRC decoder.

Thus, an optimal error correction performance of the LDPC may be gained even at a lower code rate for a mobile service or a service in a location having a weaker signal, such as an indoor location. More specifically, by performing bit re-alignment and symbol mapping of the LDPC codeword through the reliability alignment as shown in FIG. 20 to FIG. 26, the present invention may gain more enhanced robustness while ensuring commonality with the conventional broadcasting/communication system.

Figure 27:
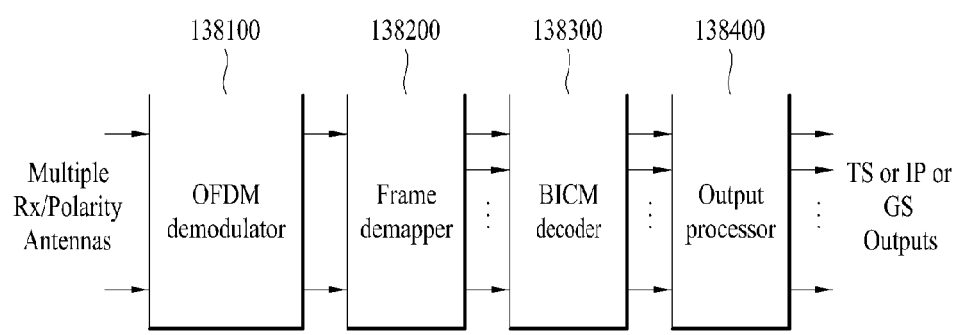
FIG. 27 illustrates a block diagram showing a broadcasting signal receiving apparatus according to an embodiment of the present invention.

FIG. 27 illustrates a block diagram showing an exemplary structure of a broadcast signal receiving apparatus according to an embodiment of the present invention.

The broadcast signal receiving apparatus according to the present invention may include an OFDM demodulator (138100), a frame demapper (138200), a BICM decoder (138300), and an output processor (138400).

The frame demapper (138200) may also be referred to as a frame parser.

The OFDM demodulator (138100) converts time domain signals to frequency domain signals. Herein, the time domain signals correspond to signals being received through multiple reception antennae and then being converted to digital signals. Among the signals being converted to frequency domain signals, the frame demapper (138200) outputs the PLPs designated to required services. The BICM decider (138300) corrects errors that occur due to the transmission channel, and the output processor (138300) performs procedures required for generating an output TS or IP or GS stream.

Figure 28:
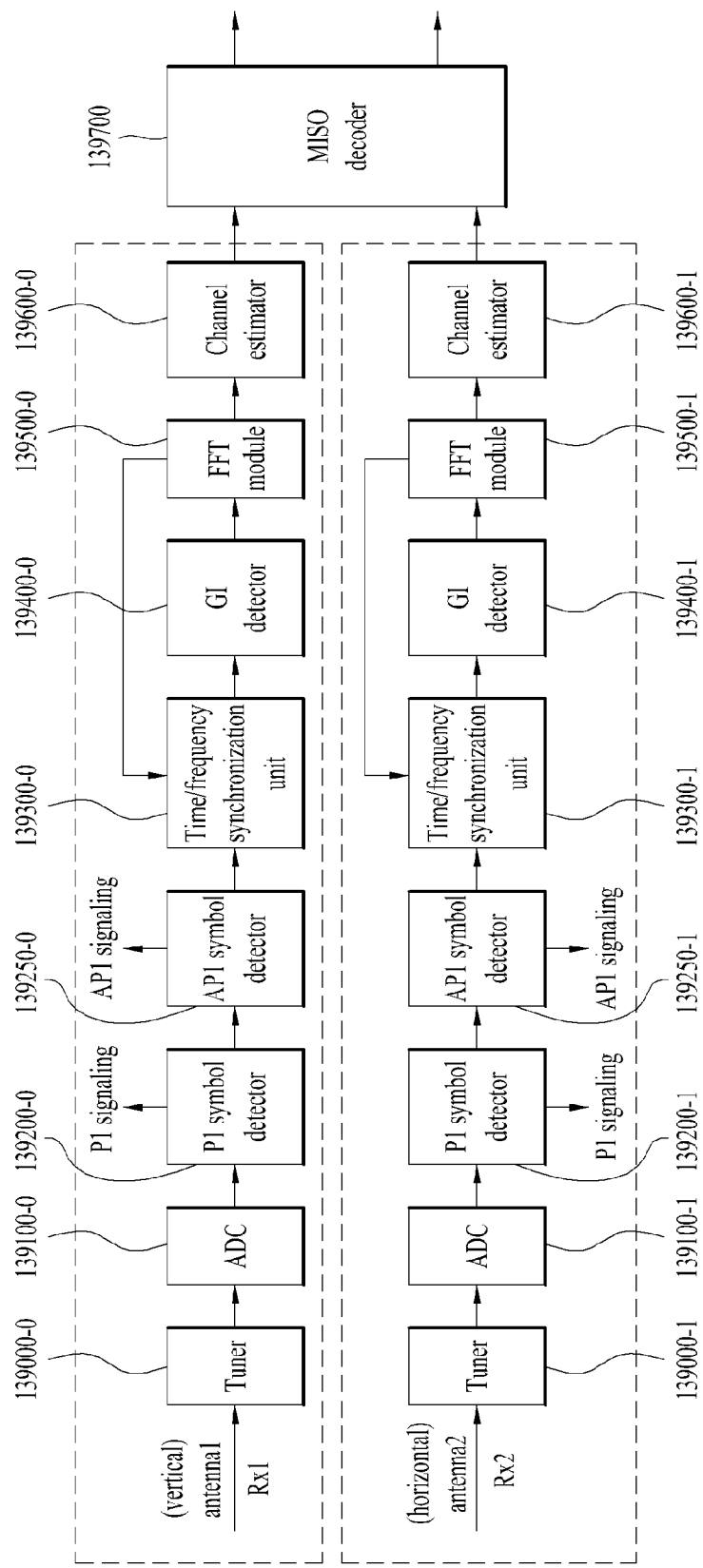
FIG. 28 illustrates a block diagram showing an OFDM demodulator according to an embodiment of the present invention.

FIG. 28 illustrates a block diagram showing an exemplary structure of an OFDM demodulator (131800) of the broadcast signal receiving apparatus. More specifically, the OFDM demodulator of FIG. 28 performs an inverse process of the OFDM generator of FIG. 19. According to the embodiment of the present invention, in order to receive a broadcast signal, which is transmitted by using a MIMO or MISO, two reception antennae (Rx1, Rx2) are used. An embodiment according to the present invention according uses a polarity multiplexing MIMO method.

The OFDM demodulator (138100) of FIG. 28 includes a first receiving unit configured to perform OFDM demodulation on a signal, which is received through the first reception antenna (Rx1), and a second receiving unit configured to perform OFDM demodulation on a signal, which is received through the second reception antenna (Rx2). The first receiving unit may include a tuner (139000-0), an ADC (139100-0), a P1 symbol detector (139200-0), an AP1 symbol detector (139250-0), a time/frequency synchronization unit (139300-0), a GI remover (139400-0), an FFT module (139500-0), and a channel estimator (139600-0). And, the second receiving unit may include a tuner (139000-1), an ADC (139100-1), a P1 symbol detector (139200-1), an AP1 symbol detector (139250-1), a time/frequency synchronization unit (139300-1), a GI remover (139400-1), an FFT module (139500-1), and a channel estimator (139600-1). The OFDM demodulator further includes an MISO decoder (139700) at a output terminal of the first and second receiving unit. The MISO (139700) will be referred to as an MISO processor. The description of the present invention will be mostly made based upon the blocks included in the first receiving unit. And, since the operations of the blocks included in the second receiving unit are identical to those of the blocks included in the first receiving unit, the detailed description of the same will be omitted for simplicity.

The tuner (139000-0) of the first receiving unit may select only a signal of a desired (or wanted) frequency band. Also, according to the embodiment of the present invention, in order to be applied to the TFS system, the tuner (139000-0) may have an FH (Frequency Hopping) function. The ADC (139100-0) converts the analog broadcasting signal, which is inputted through a first path (e.g., V-path), to a digital broadcasting signal.

The P1 symbol detector (139200-0) detects a P1 symbol from the digital broadcast signal, and the P1 symbol detector (139200-0) then uses P1 signaling information, which is carried by the P1 symbol, so as to determine the frame structure of the currently received signal. The AP1 symbol detector (139250-0) may detect and decode an AP1 symbol, which transmits the AP1 signaling information included in the digital broadcasting signal, so as to gain pilot pattern information of the current signal frame. Herein, the detection and decoding of the P1 symbol and the AP1 symbol may be performed by the P1 symbol detector (139200-0), and, in this case, the AP1 symbol detector (139250-0) may be omitted.

The time/frequency synchronization unit (139300-0) uses at least one of the P1 signaling information and the AP1 signaling information so as to perform GI extraction and time synchronization and carrier frequency synchronization.

The GI remover (139400-0) removes the GI from the synchronized signal, and the FFT module (139500-0) converts the GI-removed signal to a frequency domain signal.

The channel estimator (139600-0) uses a pilot signal being inserted in the frequency domain signal, so as to estimate a transmission channel starting from a transmission antenna to a reception antenna. The channel estimator (139600-0) performs channel equalization compensating for a distortion in a transmission channel based on the estimated transmission channel. The channel equalization is optional. The MISO decoder (139700) performs MISO decoding on data outputted from the channel estimator (139600-0).

When MISO decoding is performed on MISO PLP data and L1 signaling data, the MISO decoder (139700) of the present invention may perform 4 different operations. Each operation will hereinafter be described.

First of all, when the channel estimators (139600-0, 139600-1) included in the first receiving unit and the second receiving unit do not perform channel equalization on the MISO PLP, the MISO decoder (139700) may apply a channel estimation effect on all reference points that can be transmitted, thereby being capable of calculating the LLR value. Accordingly, the same effect as channel equalization may be gained.

Secondly, the MISO decoder (139700) may perform the following operations in accordance with the operations of the constellation mapper, which is included in the BICM module of the broadcasting signal transmitter. For example, when the constellation of the constellation map is rotated by a predetermined angle, and when only the Q-phase element of the constellation is delayed by an arbitrary value, the MISO decoder (139700) may delay only the I-phase element of the constellation by an arbitrary value and may calculate the 2D-LLR value based upon the constellation rotation angle.

According to another embodiment of the present invention, when the constellation mapper does not rotate the constellation, and when only the Q-phase element of the constellation is not delayed by the arbitrary value, the MISO decoder (139700) may be capable of calculating the 2D-LLR value based upon a normal QAM.

Thirdly, the MISO decoder (139700) may select a MISO decoding matrix, so that an inverse process of the MISO encoder, which is included in the OFDM generator described in FIG. 19, can be performed in accordance with the MISO encoding matrix used by the MISO encoder. And, then, the MISO decoder (139700) may perform MISO decoding.

Finally, the MISO decoder (139700) may merge the MISO PLP data, which are received through 2 reception antennae. The signal merging method according to the present invention may include maximum ratio combining, equal gain combining, selective combining, and so on. In this case, the MISO decoder (139700) may maximize the SNR of the merged signal, so as to gain a diversity effect.

Additionally, the MISO decoder (139700) may perform MISO decoding on a signal, which is processed with signal merging. Then, after performing MISO decoding on the input of the two antennae, the MISO decoder (139700) may merge the MISO decoded signals.

The MISO decoder (139700) may perform MIMO decoding on the MIMO PLP data, which are being inputted through the first path and the second path. In this case, the MISO decoder (139700) may perform the same operations as the above-described MISO decoding process. However, among the 4 operation steps, the last operation, i.e., the signal merging operation may not be performed.

Figure 29:
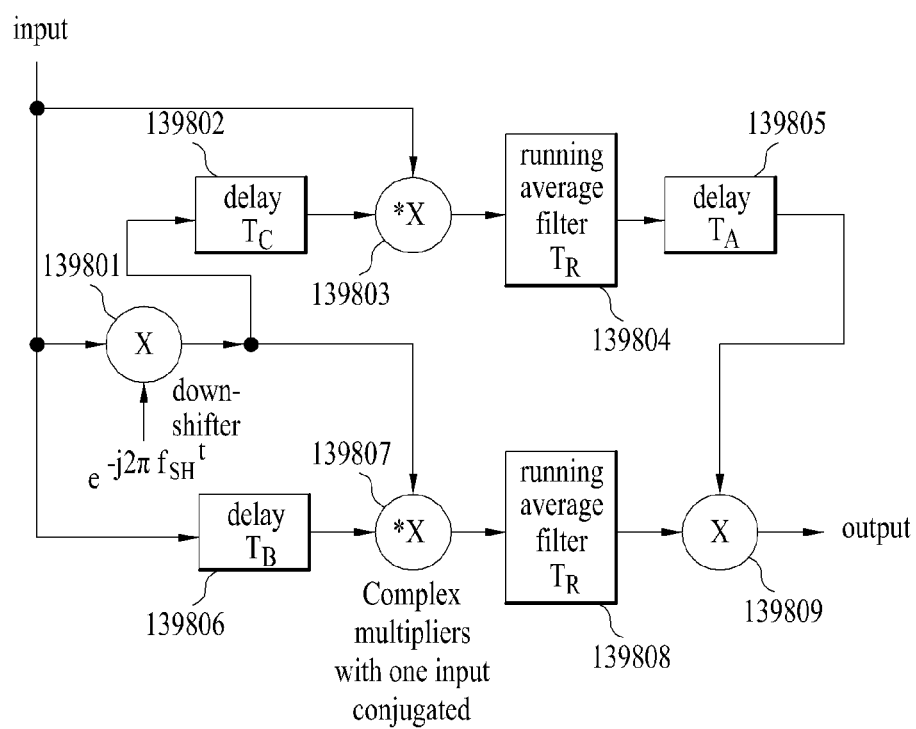
FIG. 29 illustrates a block diagram showing a P1 symbol detector according to an embodiment of the present invention.

FIG. 29 illustrates an exemplary structure of any one of the P1 symbol detectors (139200-0, 139200-1) according to an embodiment of the present invention. Herein, the P1 symbol detectors (139200-0, 139200-1) may also be referred to as a C-A-B preamble detector.

The present invention will describe the P1 symbol detector (139200-0) of the first receiving unit. An operation description of the P1 symbol detector (139200-1) of the second receiving unit refers to that of the P1 symbol detector (139200-0) of the first receiving unit.

More specifically, the signal that is converted to a digital signal from the ADC (139100-0) may be inputted to a down shifter (139801), a $1^{st}$ conjugator (139803), and a $2^{nd}$ delayer (139806) of the P1 symbol detector (139200).

The down shifter (139801) performs inverse modulation by multiplying $$e^{-j2\pi f_{SH}T'}$$

by the input signal. When inverse modulation is performed by the down shifter (139801), the signal being frequency-shifted and inputted is recovered to the original signal. The inverse modulated signal may be outputted to a $1^{st}$ delayer (139802) and a $2^{nd}$ conjugator (139807).

The $1^{st}$ delayer (139802) delays the inverse-modulated signal by a length of part C ($T_C$) and then outputs the delayed signal to the $1^{st}$ conjugator (139803). The $1^{st}$ conjugator (139803) performs complex-conjugation on the signal, which is delayed by a length of part C ($T_C$). Then, the $1^{st}$ conjugator (139803) multiplies the input signal by the complex-conjugated signal, thereby outputting the processed signal to a $1^{st}$ filter (139804). The $1^{st}$ filter (139804) uses a running average filter having the length of $T_B = T_A$, so as to remove (or eliminate) any excessively and unnecessarily remaining modulation elements, thereby outputting the processed signal to a $3^{rd}$ delayer (139805). The $3^{rd}$ delayer (139805) delays the filtered signal by a length of part A (i.e., effective (or valid) symbol) ($T_A$), so as to output the delayed signal to a multiplier (139809).

The $2^{nd}$ delayer (139806) delays the input signal by a length of part B ($T_B$) and then outputs the delayed signal to the $2^{nd}$ conjugator (139807). The $2^{nd}$ conjugator (139807) performs complex-conjugation on the signal, which is delayed by a length of part B ($T_B$). Then, the $2^{nd}$ conjugator (139807) multiplies the complex-conjugated signal by an inverse-modulated signal, thereby outputting the processed signal to a $2^{nd}$ filter (139808). The $2^{nd}$ filter (139808) uses a running average filter having the length of $T_R=T_A$, so as to remove (or eliminate) any excessively and unnecessarily remaining modulation elements, thereby outputting the processed signal to the multiplier (139809).

The multiplier (139809) multiplies the output of the $2^{nd}$ filter (139809) by a signal, which is delayed by a length of part A ($T_A$). Thus, a P1 symbol may be detected from each signal frame of the received broadcast signal.

Herein, the length of part C ($T_a$) and the length of part B ($T_B$) may be obtained by applying Equation 11 shown above.

Figure 30:
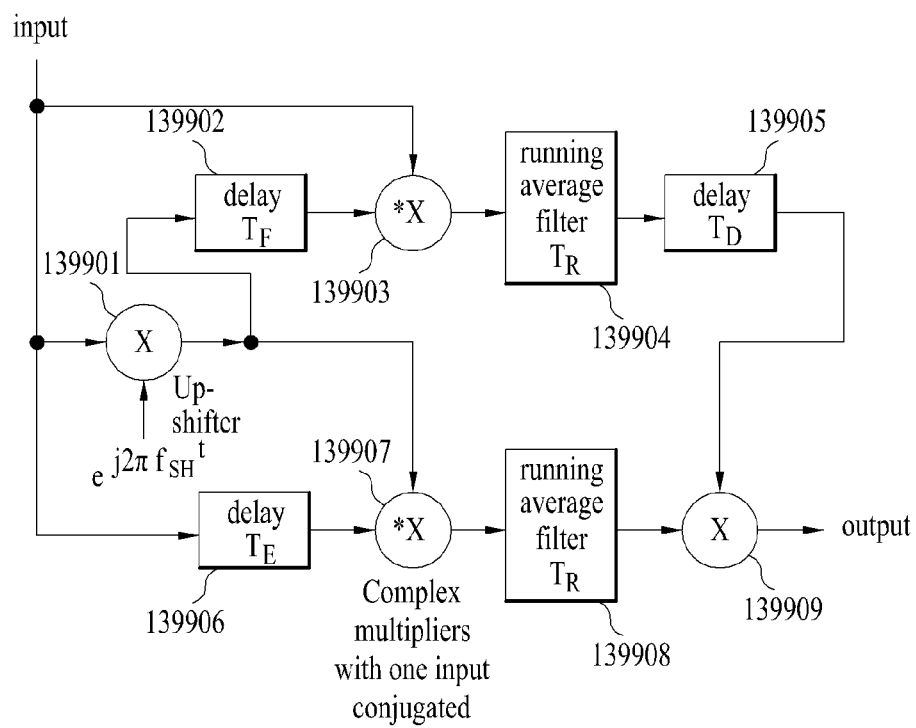
FIG. 30 illustrates a block diagram showing an AP1 symbol detector according to an embodiment of the present invention.

FIG. 30 illustrates an exemplary structure of any one of the AP1 symbol detectors (139250-0, 139250-1) according to an embodiment of the present invention. Herein, the AP1 symbol detectors (139250-0, 139250-1) may also be referred to as an F-D-E preamble detector.

The present invention will describe the AP1 symbol detector (139250-0) of the first receiving unit. An operation description of the AP1 symbol detector (139250-1) of the second receiving unit refers to that of the AP1 symbol detector (139250-0) of the first receiving unit.

More specifically, the signal that is converted to a digital signal from the ADC (139100-0) or a signal that is outputted from the P1 symbol detector (139200) may be inputted to an up-shifter (139901), a $1^{st}$ conjugator (139903), and a $2^{nd}$ delayer (139906) of the AP1 symbol detector (139250-0).

The up-shifter (139901) performs inverse modulation by multiplying $$e^{j2\pi f_S H'}$$

by the input signal. When inverse modulation is performed by the up-shifter (139901), the signal being frequency-shifted and inputted is recovered to the original signal. More specifically, the up-shifter (139901) of FIG. 30 has the same structure as the down-shifter (139801) of the P1 symbol detector (139200). However, the frequency direction of each inverse modulation process is completely opposite to one another. The signal that is inverse modulated by the up-shifter (139901) may be outputted to a $1^{st}$ delayer (139902) and a $2^{nd}$ conjugator (139907).

The $1^{st}$ delayer (139902) delays the inverse-modulated signal by a length of part F ($T_F$) and then outputs the delayed signal to the $1^{st}$ conjugator (139903). The $1^{st}$ conjugator (139903) performs complex-conjugation on the signal, which is delayed by a length of part F ($T_F$). Then, the $1^{st}$ conjugator (139903) multiplies the input signal by the complex-conjugated signal, thereby outputting the processed signal to a $1^{st}$ filter (139904). The $1^{st}$ filter (139904) uses a running average filter having the length of $T_R=T_D$, so as to remove (or eliminate) any excessively and unnecessarily remaining modulation elements, thereby outputting the processed signal to a $3^{rd}$ delayer (139905). The $3^{rd}$ delayer (139905) delays the filtered signal by a length of part D (i.e., effective (or valid) symbol) ($T_D$), so as to output the delayed signal to a multiplier (139909).

The $2^{nd}$ delayer (139906) delays the input signal by a length of part E ($T_E$) and then outputs the delayed signal to the $2^{nd}$ conjugator (139907). The $2^{nd}$ conjugator (139907) performs complex-conjugation on the signal, which is delayed by a length of part E ($T_E$). Then, the $2^{nd}$ conjugator (139907) multiplies the complex-conjugated signal by an inverse-modulated signal, thereby outputting the processed signal to a $2^{nd}$ filter (139908). The $2^{nd}$ filter (139908) uses a running average filter having the length of $T_R=T_D$, so as to remove (or eliminate) any excessively and unnecessarily remaining modulation elements, thereby outputting the processed signal to the multiplier (139909).

The multiplier (139909) multiplies the output of the $2^{nd}$ filter (139909) by a signal, which is delayed by a length of part D ($T_D$). Thus, an AP1 symbol may be detected from each signal frame of the received broadcast signal. Herein, the length of part F ($T_F$) and the length of part E ($T_E$) may be obtained by applying Equation 11 shown above.

Figure 31:
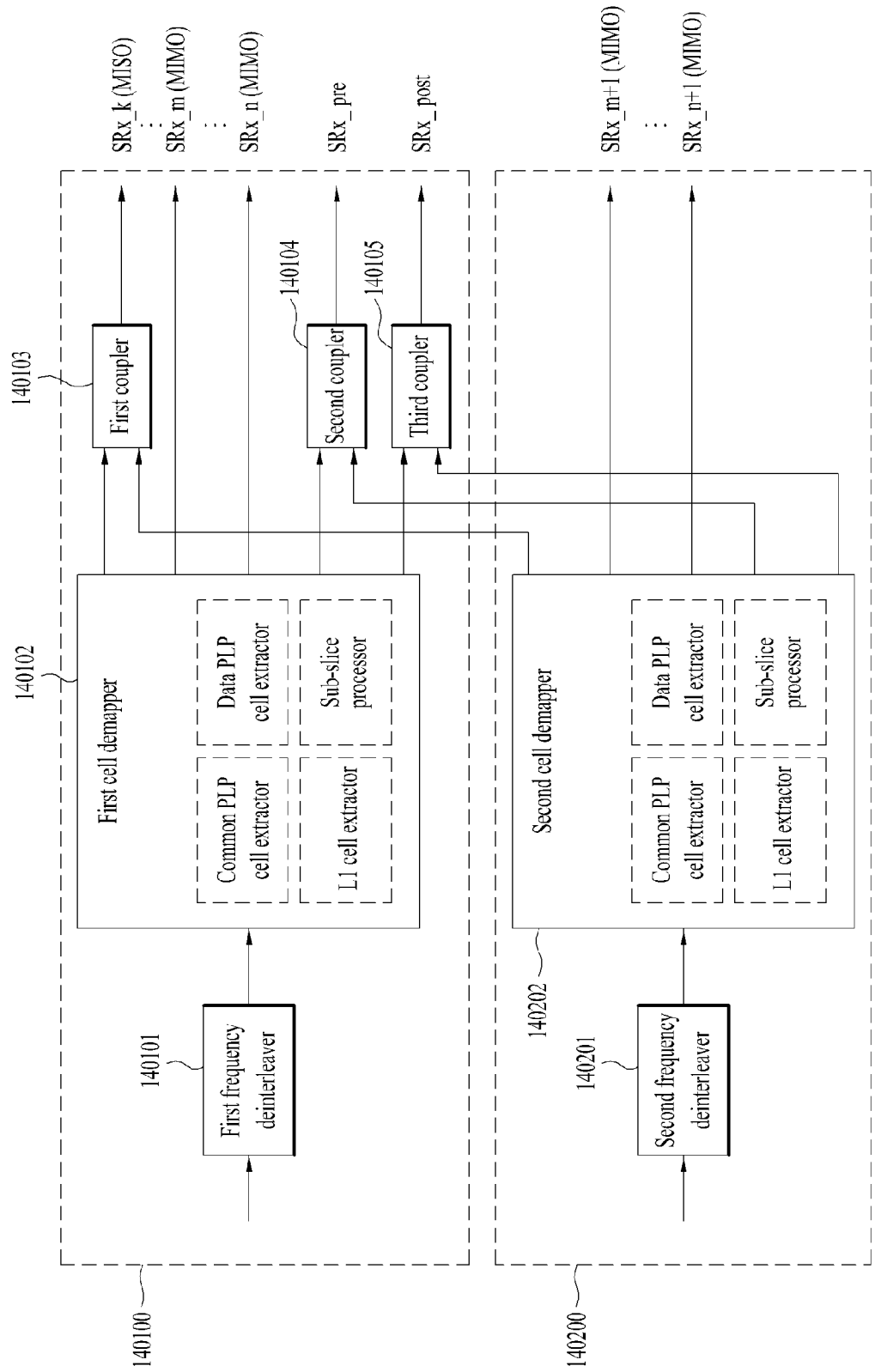
FIG. 31 illustrates a block diagram showing a frame demapper according to an embodiment of the present invention.

FIG. 31 illustrates an exemplary frame demapper (138200) of the broadcasting signal receiving device according to an embodiment of the present invention, which is adequate for processing an output of the OFDM demodulator shown in FIG. 28.

According to the embodiment of the present invention, the frame demapper (138200) performs an inverse process of the frame builder (100300) of the broadcasting signal transmitting device shown in FIG. 18.

The frame demapper of FIG. 31 may include a first frame demapping block (140100) for processing data being inputted through a first path and a second frame demapping block (140200) for processing data being inputted through a second path.

The first frame demapping block (140100) may include a first frequency deinterleaver (140101), a first cell demapper (140102), a first coupler (140103), a second coupler (140104), and a third coupler (140105), and the second frame demapping block (140200) may include a second frequency deinterleaver (140201) and a second cell demapper (140202).

Also, the first frequency deinterleaver (140101) and the first cell demapper (140102) and the second frequency deinterleaver (140201) and the second cell demapper (140202) may perform the same operations with respect to the first path and the second path or may perform independent operations.

Hereinafter, a data processing method of the blocks included in a first frame builder demapping block (140100) and a second frame builder demapping block (140200) will 이 be described in detail.

The first frequency deinterleaver (140101) and the second frequency deinterleaver (140201) may each perform cell unit deinterleaving in a frequency domain on data being inputted through the first path and the second path.

The first cell demapper (140102) and the second cell demapper (140202) may extract common PLP data, PLP data, and L1 signaling data from the deinterleaved data in cell units. The extracted PLP data may include MISO-decoded MISO PLP data and MIMO-decoded MIMO PLP data, and the extracted L1 signaling data may include information on the current transmission frame and the next transmission frame. Furthermore, when sub-slicing has been performed on the PLP data by the transmitter, a sub-slicing processor of the first cell demapper (140102) and the second cell demapper (140202) may merge the sliced PLP data, thereby merging the sliced data so as to generate a single stream.

When the MISO decoder of the OFDM modulator does not perform signal coupling of the MISO-decoded MISO PLP data, the first coupler (140103) may perform signal coupling of the MISO-decoded MISO PLP data.

The second coupler (140104) and the third coupler (140105) perform the same functions as the first coupler (140103). However, the difference herein is that the operations are respectively performed on the L1-pre-signaling data and the L1-post-signaling data.

As shown in FIG. 31, data being processed with frame demapping, i.e., data being outputted through the first path, such as the MISO PLP data, the MIMO PLP data, and the signaling data may be inputted to the BICM decoder through a path starting from SRx_k to SRx_post, and the MIMO PLP data being outputted through the second path may be inputted to the BICM decoder through a path starting from SRx_m+1 to SRx_n+1.

Figure 32:
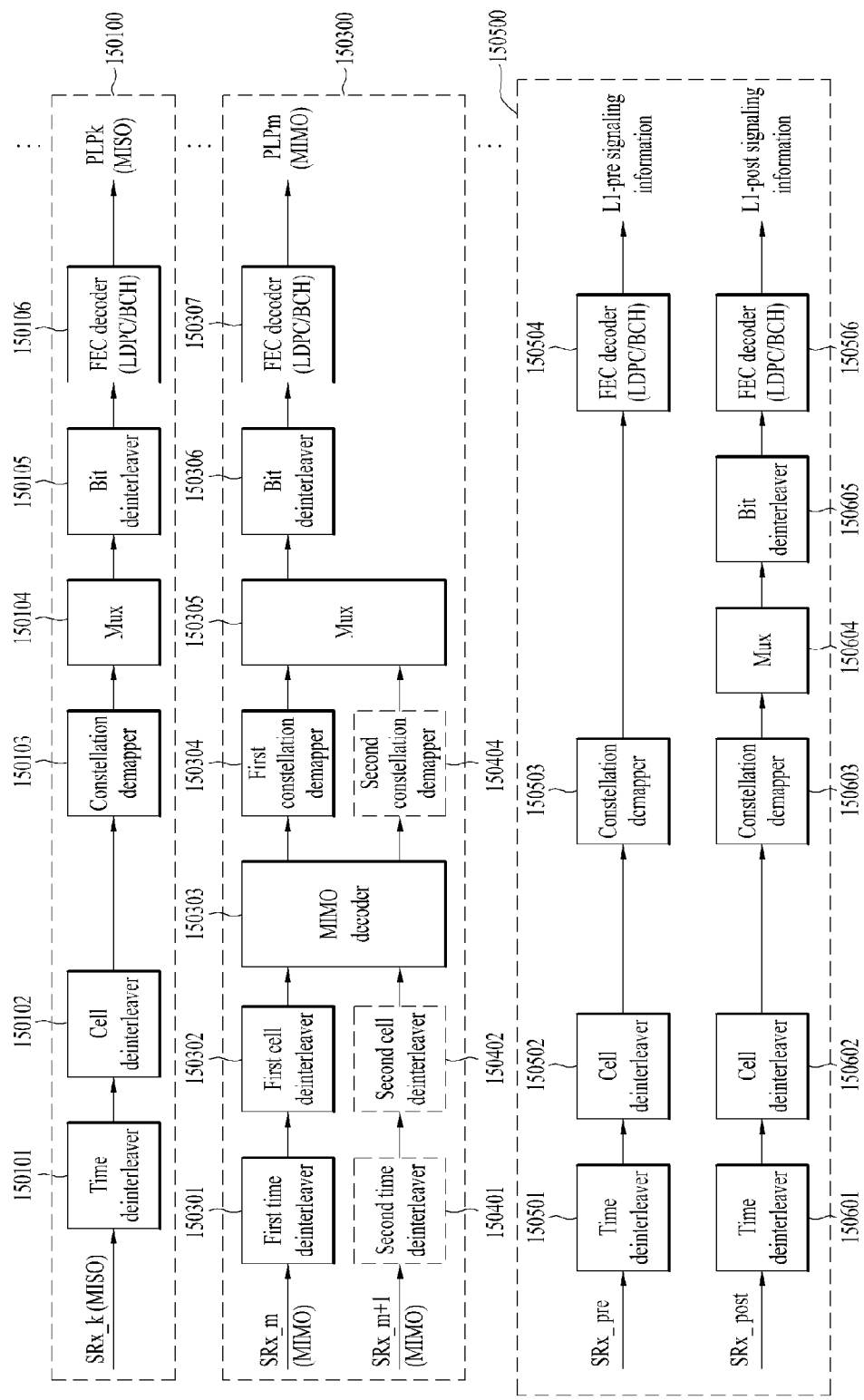
FIG. 32 illustrates a block diagram showing a BICM decoder according to an embodiment of the present invention.

FIG. 32 illustrates an exemplary BICM decoder of the broadcasting signal receiving device according to an embodiment of the present invention, which is adequate for processing the output of the frame demapper shown in FIG. 31. Most particularly, according to the embodiment of the present invention, the BICM decoder performs an inverse process of the MICM module of the broadcasting signal transmitting device shown in FIG. 17.

The BICM decoder of FIG. 32 includes a first BICM decoding block (150100) receiving MISO PLP data through one path (SRx_k) and processing the received data, a second BICM decoding block (150300) receiving MIMO PLP data through two paths (SRx_m, SRx_m+1) and processing the received data, and a third BICM decoding block (150500) receiving L1 signaling data through two paths (SRx_pre, SRx_post) and processing the received data. Also, the third BICM decoding block (150500) includes a first decoding block for processing L1-pre-signaling data and a second decoding block for processing L1-post-signaling data Herein, according to the embodiment of the present invention, the MISO PLP data and the L1 signaling data may be inputted after being MISO-decoded by the OFDM demodulator of FIG. 31, and the MIMO PLP data may be MIMO-decoded by the BICM decoder of FIG. 32.

More specifically, the BICM decoder of the present invention may independently apply the MISO method on the data being inputted from each path, and may also apply the MIMO method.

Hereinafter, the data processing method of each block will be described.

First of all, a first BICM decoding block (150100) may include a time deinterleaver (150101), a cell deinterleaver (150102), a constellation demapper (150103), a mux (150104), a bit deinterleaver (150105), and an FEC decoder (150106).

The time deinterleaver (150101) performs deinterleaving in a time domain on the inputted data, which MISO-decoded by the OFDM modulator, so as to recover the data to the initial position, and the cell deinterleaver (150102) may perform cell unit deinterleaving on the time-deinterleaved data.

The constellation demapper (150103) may perform the following functions in accordance with the operations of the MISO decoder (139700) of the OFDM demodulator.

First of all, in case the MISO decoder (139700) performs only MISO-decoding without directly outputting the LLR value, the constellation demapper (150103) may calculate the LLR value. More specifically, a detailed description will hereinafter be made. When constellation rotation and Q-phase element delay are performed by the constellation demapper, which is included in the BICM module of the broadcasting signal transmitting device shown in FIG. 17, the constellation demapper (150103) may first delay an I-phase element and may then calculate the LLR value. If the constellation demapper, which is included in the BICM module of the broadcasting signal transmitting device, does not perform constellation rotation and Q-phase element delay, the constellation demapper (150103) may calculate an LLR value based upon a normal QAM standard.

The method for calculating the LLR value may include a method for calculating a 2-D LLR and a method for calculating a 1-D LLR value. In case of calculating the 1-D LLR value, any one of the input to the first path and the input to the second path is performed, so as to reduce the complexity in the LLR calculation.

The mux (150104) may recover the demapped data to a bit stream format. More specifically, when the output order of the bits are adjusted (or controlled) and transmitted from the demux of the transmitting end, the mux (150104) recovers the initial output order.

The bit deinterleaver (150105) performs deinterleaving on the inputted bit stream in bit units, and the FEC decoder (150106) performs FEC-decoding on the data processed with bit-deinterleaving, so as to perform error correction over the transmission channel, thereby outputting the MISO PLP data. In this case, according to the embodiment of the present invention, LDPC decoding and/or BCH decoding method(s) may be used as the decoding method.

The second BICM decoding block (150300) may include a first time deinterleaver (150301) and a second time deinterleaver (150401), a first cell deinterleaver (150302) and a second cell deinterleaver (150402), a first constellation demapper (150303) and a second constellation demapper (150403), a mux (150305), a bit deinterleaver (150306), and an FEC decoder (150307).

The first time deinterleaver (150301) and the second time deinterleaver (150401) may perform deinterleaving in a time domain on the inputted data in cell units, so as to recover data by the initial (or original) data order. In this case, the first cell deinterleaver (150302) and the second cell deinterleaver (150402) may perform cell deinterleaving only on the data corresponding to half the size of a cell included in an FEC block, among the data being inputted through each path. Eventually, the cell deinterleaving performed by the first cell deinterleaver (150302) and the second cell deinterleaver (150402) may have the same effect as the deinterleaving performed by the MISO type cell deinterleaver (150102) by using one FEC block.

The MIMO decoder (150303) performs MIMO decoding on the data being outputted from the first and second cell deinterleavers (150302, 150402). Among the 4 different operations of the MISO decoder (139700), which is included in the ODFM demodulator shown in FIG. 28, the MIMO decoder (150303) may identically perform the 3 remaining operations of the MISO decoder (139700) excluding the fourth operation, i.e., the signal coupling operation. At this point, the MIMO decoder (150303) may also perform decoding by using the MIMO encoding matrix according to the first to third embodiments of the present invention.

For the description of the first constellation demapper (150304), the second constellation demapper (150404), the mux (150305), the bit deinterleaver (150306), and the FEC decoder (150307), reference may be made to the operations of the same blocks included in the first BICM decoding block (150100).

The third BICM decoding block (150500) includes a first decoding block for processing L1-pre-signaling data and a second decoding block for processing L1-post-siganling data.

At this point, the L1-pre-siganling data and the L1-post-signaling data are MISO decoded by the MISO decoder (139700) of the OFDM demodulator shown in FIG. 28.

The first decoding block may include a time deinterleaver (150501), a cell deinterleaver (150502), a constellation demapper (150503), and an FEC decoder (150504), and the second decoding block may include a time deinterleaver (150601), a cell deinterleaver (150602), a constellation demapper (150603), a mux (150604), a bit deinterleaver (150605), and an FEC decoder (150606).

Hereinafter, since the functions of each block included in the first decoding block and the second decoding block are identical to the respective blocks included in the first BICM decoding block (150100), a detailed description of the same will be omitted. However, according to an embodiment of the present invention, each of the FEC decoders (150504, 150606) shall perform FEC decoding, after performing de-shortening and de-puncturing on the input data.

Eventually, the first BICM decoding block (150100) may output the BICM-decoded MISO PLP data to the output processor, and the second BICM decoding block (150300) may output the BICM-decoded MIMO PLP data to the output processor. Also, the first decoding block of the third BICM decoding block (150500) may also output the BICM-decoded L1-pre-signaling data to the output processor, and the second decoding block of the third BICM decoding block (150500) may also output the BICM-decoded L1-post-signaling data to the output processor.

Since the BICM decoder of FIG. 32 is positioned between the first and second cell deinterleavers (150302, 150402) and the first and second constellation demappers (150304, 150404), by performing MIMO decoding after performing both the time deinterleaving and cell deinterelaving processes is symbol units, the complexity in the memory of the broadcasting signal recover may be reduced.

According to another embodiment of the present invention, the MIMO decoder of the second BICM decoding block (150300) may also be positioned before the first and second time deinterleavers (150301, 150401).

Figure 33:
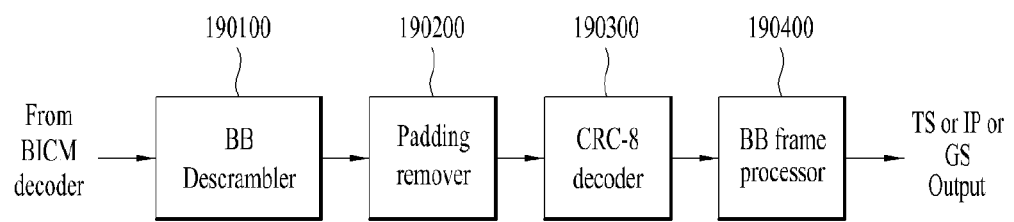
FIG. 33 illustrates a block diagram showing an output processor according to an embodiment of the present invention.

FIG. 33 illustrates an exemplary output processor (138300) of the broadcasting signal receiving device according to an embodiment of the present invention.

FIG. 33 shows an exemplary embodiment of the output processor (138300) corresponding to a case when 1 output stream is used (or when 1 PLP input is used), wherein the output processor (138300) performs the inverse processes of the input processor (100100) and the input pre-processor (100000).

When 1 output stream is used, the output processor may include a BB descrambler (190100), a padding remover (190200), a CRC-8 decoder (190300), and a BB frame processor (190400).

The BB descramble (190100) descrambles the inputted bit stream. More specifically, the BB descrambler (190100) performs an XOR operation of the bit stream, which is identically generated as the PRBS processed by the BB scrambler (110500) shown in FIG. 14, and an input bit stream, thereby performing descrambling. When required, the padding remover (190200) removes the padding bit, which is inserted by the broadcasting signal transmitting device. The CRC-8 decoder (190300) performs CRC decoding on the inputted bit stream, and the BB frame processor may first decode the information included in the BB frame header. Then, the CRC-8 decoder (190300) may use the decoded information, so as to recover the TS/IP/GS stream and output the recovered stream.

Figure 34:
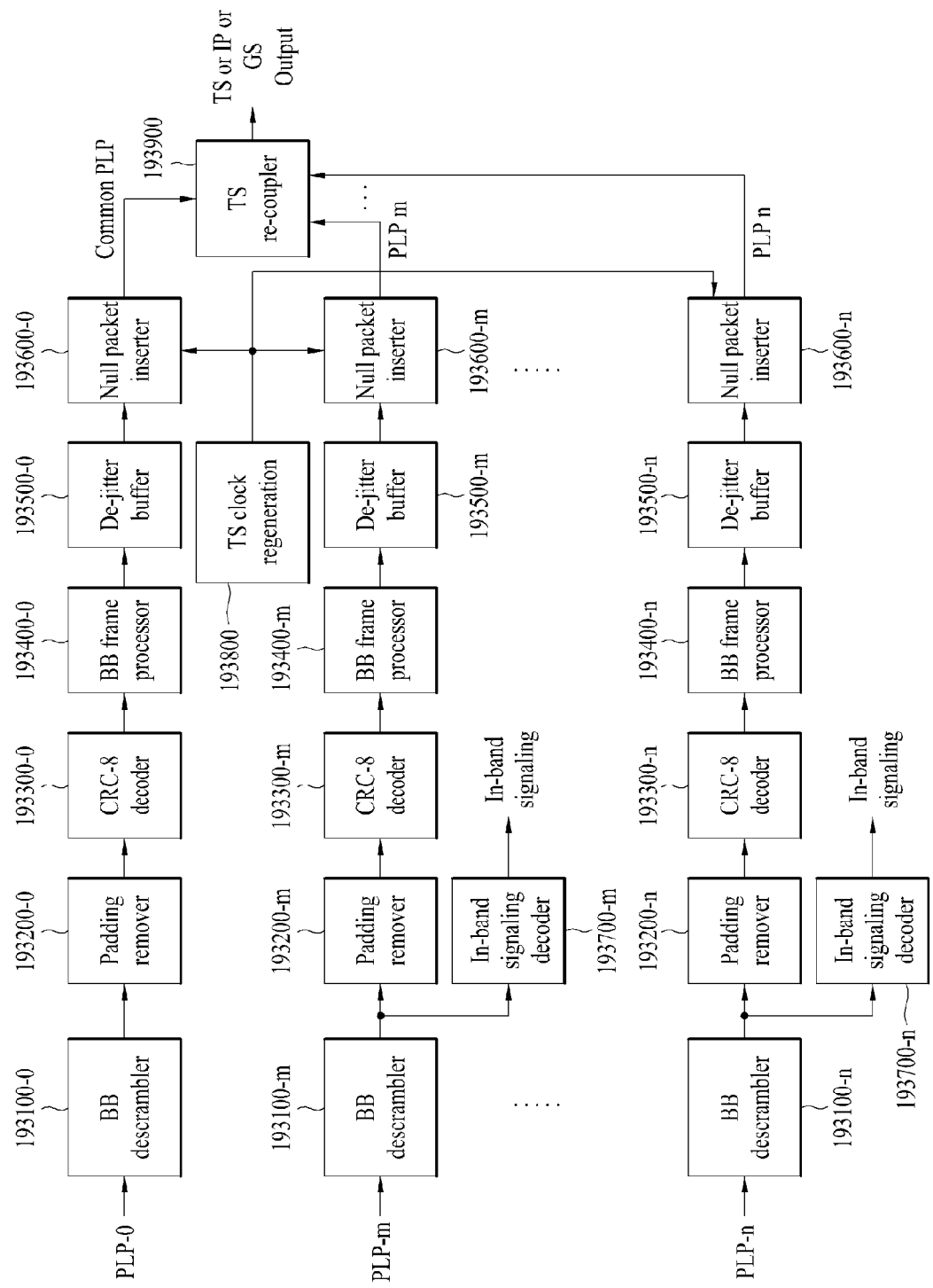
FIG. 34 illustrates a block diagram showing an output processor according to another embodiment of the present invention.

FIG. 34 illustrates an exemplary output processor (138300) of the broadcasting signal receiving device according to another embodiment of the present invention.

FIG. 34 illustrates an example of an output processor (138300) according to an embodiment of the present invention corresponding to a case when multiple output streams are used, i.e., when multiple PLPs are received. Herein, the output processor shown herein is similar to the inverse process of the input processor (100100) of FIG. 15 and FIG. 16 and the input pre-processor (100000) of FIG. 7. When components configuring a service are each received by a different PLP, the output processor (138300) of FIG. 34 is adequate for configuring a single service by extracting the components from each PLP.

The output processor of FIG. 34 may include n+1 number of BB descramblers (193100-0~n) for processing n number of PLPs, n+1 number of padding removers (193200-0~n), n+1 number of CRC-8 decoders (193300-0~n), n+1 number of BB frame processors (193400-0~n), n+1 number of De-jitter buffers (193500-0~n), n+1 number of null packet inserters (193600-0·n), n−m+1 number of in-band signaling decoders (193700-m~n), a TS clock regenerator (193800), and a TS re-coupler (193900).

If the output stream corresponds to an IP stream or a GSE stream, the CRC-8 decoders (193300-0~n) and the n+1 number of null packet inserters (193600-0~n) may be omitted from the block view of FIG. 34, or the corresponding blocks may be bypassed. For example, since the IP packet is buffered to best-fit a time stamp, so as to be reproduced by the receiver, the transmitter is not required to delay the corresponding data, and a null packet is not required to be added/deleted.

Since the operations of each of the BB descramblers (193100-0~n), the padding removers (193200-0~n), the CRC-8 decoders decoders (193300-0~n), and the BB frame processors (193400-0~n) are identical to the operations of the respective blocks shown in FIG. 33, reference may be made to FIG. 33 for the detailed description of the corresponding blocks and, therefore, detailed description of the same will be omitted herein. In the description of FIG. 34, only the portions that are different from the structure shown in FIG. 33 will be described herein.

The de-jitter buffers (193500-0~n) compensates for the delays, which are arbitrarily inserted by the transmitting end for the synchronization between the multiple PLPs, in accordance with an TTO (time to output parameter).

The null packet inserters (193600-0~n) may refer to DNP (deleted null packet) information, which indicate information on the number of deleted null packets, so as to insert the null packets, which are removed by the transmitting end, in the respective positions of the corresponding TS. At this point, the TS clock regenerator (193800) may recover detailed time synchronization of the output packet based upon the ISCR (Input Stream Time Reference).

The TS coupler (193900) may also be referred to as a TS merger and, as described above, the TS coupler (193900) may recover the common PLP, and data PLPs, which are recovered as described above, to the initial TS or IP or GSE stream, and may then output the recovered stream. According to the present invention, TTO, DNP, ISCR information are all included in the BB frame header and transmitted. The in-band signaling decoders (193700-m~n) may recover the in-band signaling information, which is being transmitted through the data PLP, and may then output the recovered information.

For example, it will be assumed herein that a service is configured of a common PLP, a video component PLP, an audio component PLP, and data component PLP, as shown in (b) of FIG. 9, through the input pre-processor (100000) the input processor (100100) of the transmitter. Accordingly, the de-jitter buffers (193500-0~n) of FIG. 34 may output multiple PLPs to the null packet inserters (193600-0~n), as shown in (b) of FIG. 9, and the null packet inserters (193600-0~n) may refer to DNP information, so as to insert the null packets, which are removed by the transmitting end, in the respective positions of the corresponding TS. Accordingly, a common TS, a video component TS, an audio component TS, and a data component TS, each having the null packets inserted therein, as shown in (a) of FIG. 9 ((b) of FIG. 8), may be outputted to the TS coupler (193900). When the TS coupler (193900) merges the valid packets of the common TS, the video component TS, the audio component TS, and the data component TS, a TS configuring a singled service may be outputted, as shown in (a) of FIG. 8.

Meanwhile, the output processor of the present invention may further include an L1 signaling decoder. Additionally, first and second BB descramblers may further be included in front of the L1 signaling decoder.

In this case, the first BB descrambler may descramble L1-pre-signaling information, which is outputted from the FEC decoder (150504) of the third BICM decoding module (150500), and the second BB descrambler may descramble L1-post-signaling information, which is outputted from the FEC decoder (150606) of the third BICM decoding module (150500), thereby outputting the descrambled information to the L1 signaling decoder. More specifically, the first and second BB descramblers may perform XOR operation on a bit stream, which is identically generated as the PRBS being processed by the first and second BB scramblers of the transmitter, and an input bit stream, so as to perform descrambling.

The L1 signaling decoder decodes the descrambled L1-pre-signaling information and L1-post-signaling information, so as to recover the L1 signaling information. The recovered L1 signaling information includes L1-pre-signaling information and L1-post-signaling information. Additionally, the L1-post-signaling information includes configurable L1-post-signaling information and dynamic L1-post-signaling information.

The L1 signaling information, which is recovered by the L1 signaling decoder may be delivered to the system controller, so as to provide parameters, which are required by the broadcasting signal receiver for performing operations, such as BICM (Bit Interleaved Coding and Modulation) decoding, frame demapping, OFDM (Orthogonal Frequency Division Multiplex) demodulation, and so on.

According to another embodiment of the present invention, instead of the output processor, an L1 signaling decoder may also be located at the outputting end of the FEC decoders (150504,150606) of the third BICM decoding module (150500), which is included in the BICM decoder 138300). Additionally, a first BB descrambler may be further included between the L1 signaling decoder and the FEC decoder (150504), and a second BB descrambler may be further included between the L1 signaling decoder and the FEC decoder (150606). The description on the operations of the first and second BB descramblers and the L1 signaling decoder is identical to the description of the corresponding blocks included in the output processor.

Figure 35:
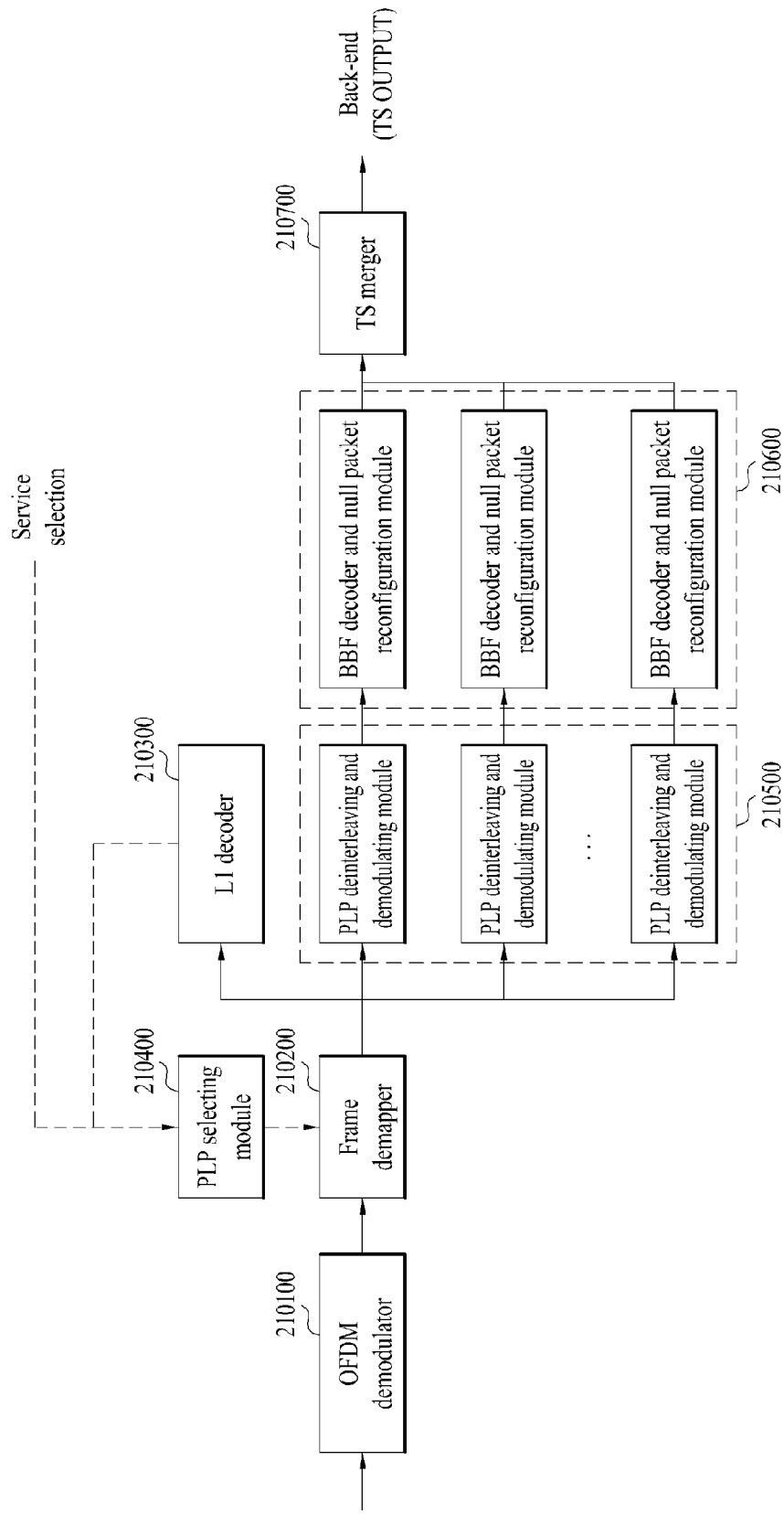
FIG. 35 illustrates a block diagram showing a broadcasting signal receiving apparatus according to another embodiment of the present invention.

FIG. 35 illustrates a block view showing a structure of a broadcasting signal receiving device according to yet another embodiment of the present invention. Herein, FIG. 35 corresponds to a block view showing the structure of the broadcasting signal receiving device, when the stream type being inputted to the input pre-processor of the transmitter corresponds to the TS format. In case of receiving each of the components configuring a single service through a different PLP, the broadcasting signal receiving device of FIG. 23 is adequate for extracting the components from each PLP, thereby configuring a single service.

In FIG. 35, for the detailed description on the operations of the OFDM demodulator (210100) and the frame demapper (210200), reference may be made to the detailed description on the operations of the above-described OFDM demodulator (138100) and frame demapper (138200), and, therefore, detailed description of the same will be omitted herein.

In FIG. 35, the multiple PLP deinterleaving and demodulator modules (210500), which perform deinterleaving and demodulation on each of the multiple PLPs, perform similar operations as the above-described BICM decoder (138300). And, multiple BBF decoders and null packet reconstruction modules (210600), which output TS by performing BBF (BaseBand Frame) decoding and null packet reconstruction operations, and the TS merger (210700) perform operations that are similar to the operations of the above-described output processor (138400). The L1 decoder (210300) corresponds to the above-described L1 signaling decoder.

In FIG. 35, when a service is selected, the PLP selecting module (210400) controls the frame demapper (210200), so that only the PLP of the components configuring the selected service can be outputted from the frame demapper (210200). Herein, the service selection may be realized by a user's request, or may be automatically realized in the system.

More specifically, the OFDM demodulator (210100) decodes the P1/AP1 signaling information, and the L1 decoder (210600) decodes L1/L2 signaling information, so as to acquire information on a transmission frame structure and information on PLP configuration. According to an embodiment of the present invention, the components configuring a service are received by multiple PLPs. In this case, since PLP information or service information on the component structure is included in the L1 signaling information, the broadcasting receiver may be capable of knowing to which PLPs the components, which configure a service, are included.

Accordingly, when a service is selected, the PLP selecting module (210400) controls the frame demapper (210200), and the frame demapper (210200) outputs multiple sets of PLP data including the corresponding components to the selected service. The multiple sets of PLP data are processed with deinterleaving/demodulation processes by the corresponding deinterleaving and demodulator module. And, after the BBF decoding/null packet reconstruction processes are processed by the BBF decoder and null packet reconstruction module, the TS merger (210700) merges the processed data to configure a TS respective to the selected service.

For example, it will be assumed herein that a service is configured of a common PLP, a video component PLP, an audio component PLP, and data component PLP, as shown in (b) of FIG. 9, through the input pre-processor (100000) the input processor (100100) of the transmitter. Accordingly, the BBF decoders of FIG. 23 may output multiple PLPs to the null packet reconstruction modules, as shown in (b) of FIG. 9, and the null packet reconstruction modules may refer to DNP information, so as to insert the null packets, which are removed by the transmitting end, in the respective positions of the corresponding TS. Accordingly, a common TS, a video component TS, an audio component TS, and a data component TS, each having the null packets inserted therein, as shown in (a) of FIG. 9 ((b) of FIG. 8), may be outputted to the TS merger (210700). When the TS merger (210700) merges the valid packets of the common TS, the video component TS, the audio component TS, and the data component TS, a TS configuring a singled service may be outputted, as shown in (a) of FIG. 8.

Figure 36:
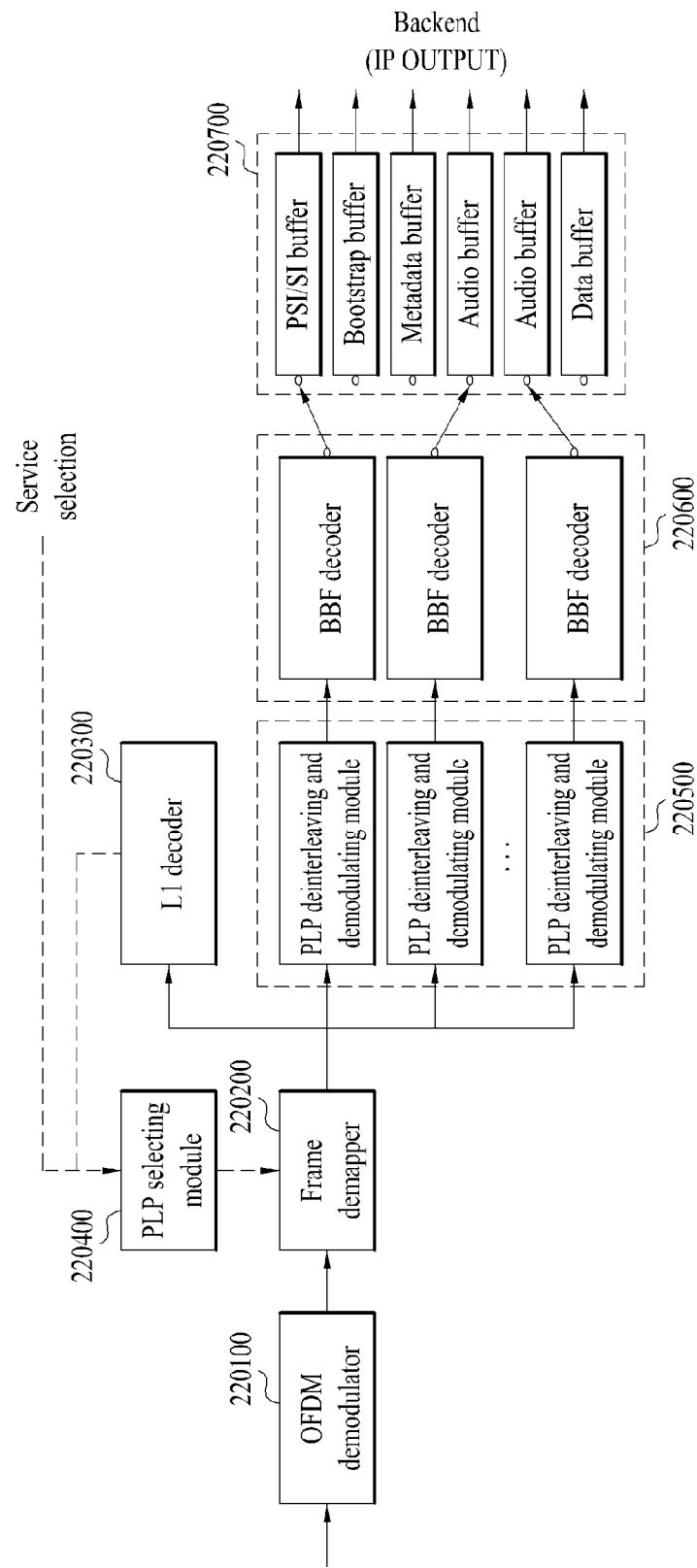
FIG. 36 illustrates a block diagram showing a broadcasting signal receiving apparatus according to another embodiment of the present invention.

FIG. 36 illustrates a block view showing a structure of the broadcasting signal receiving device according to yet another embodiment of the present invention. Herein, FIG. 36 corresponds to a block view showing the structure of the broadcasting signal receiving device, when a stream type inputted to the input pre-processor of the transmitter correspond to an IP stream format or a GSE stream format. The broadcasting signal receiving device of FIG. 36 is adequate for configuring a service, by extracting components from each PLP, when the components configuring a service are included in each PLP.

The broadcasting signal receiving device of FIG. 36 may include an OFDM demodulator (220100), a frame demapper (220200), an L1 decoder (220300), a PLP selecting module (220400), multiple PLP deinterleaving and demodulator module (220500), multiple BBF decoder (220600), and a buffer unit (220700). The buffer unit (220700) may include a PSI/SI (IP service information) buffer, a bootstrap buffer, a metadata buffer, an audio buffer, a video buffer, and a data buffer depending upon the data type.

For the detailed description on the operations of the OFDM demodulator (220100) and the frame demapper (220200) shown in FIG. 36, reference may be made to the detailed description on the operations of the above-described OFDM demodulator (138100) and frame demapper (138200), and, therefore, detailed description of the same will be omitted herein.

The multiple PLP deinterleaving and demodulator module (220500) performing deinterleaving and demodulation on each of the multiple PLPs in FIG. 36 performs operations that are similar to the operations of the above-described BICM decoder (138300), and the multiple BBF decoders (220600), which perform BBF decoding on each of the multiple PLPs, so as to output an IP stream, also perform operations that are similar to the operations of the above-described output processor (138400). The L1 decoder (220300) corresponds to the above-described L1 signaling decoder.

In FIG. 36, when a service is selected, the PLP selecting module (220400) controls the frame demapper (220200) so that only the PLPs of the components configuring the selected service can be outputted from the frame demapper (220200). Herein, the service selection may be realized by a user's request, or may be automatically realized in the system.

More specifically, the OFDM demodulator (220100) decodes the P1/AP1 signaling information, and the L1 decoder (220600) decodes L1/L2 signaling information, so as to acquire information on a transmission frame structure and information on PLP configuration. According to an embodiment of the present invention, the components configuring a service are received by multiple PLPs. In this case, since PLP information or service information on the component structure is included in the L1 signaling information, the broadcasting receiver may be capable of knowing to which PLPs the components, which configure a service, are included.

Accordingly, when a service is selected, the PLP selecting module (220400) controls the frame demapper (220200), and the frame demapper (220200) outputs multiple sets of PLP data including the corresponding components to the selected service. The multiple sets of PLP data are processed with deinterleaving/demodulation processes by the corresponding deinterleaving and demodulator module. And, after the BBF decoding process is processed by the BBF decoder, the processed data are outputted to the corresponding buffer, among a PSI/SI (IP service information) buffer, a bootstrap buffer, a metadata buffer, an audio buffer, a video buffer, and a data buffer of the buffer unit (220700) by a switching process. Then, the PSI/SI (IP service information) buffer, the bootstrap buffer, the metadata buffer, the audio buffer, the video buffer, and the data buffer may temporarily store PLP data, which are inputted from any one of the multiple BBF decoders (220600), thereby outputting the stored PLP data. The present invention may further include a stream merger and a component splitter between the multiple BBF decoders (220600) and the buffer unit (220700).

More specifically, an IP stream of the multiple sets of PLP data, which are BBF decoded and outputted from the multiple BBF decoders (220600) corresponding to the components of the selected service, after being processed with BBF decoding by the multiple BBF decoders (220600), may be merged by the stream merger, so as to be outputted as a single IP stream corresponding to the selected service. At this point, the stream merger may refer to an IP address and a UDP port number, so as to merge the multiple IP streams to a single IP stream corresponding to a single service.

The component splitter may divide (or separate) the data included in the IP stream, which is merged to a service and outputted by the stream merger, for each component, and may then output the data for each component to the buffer unit (220700). The component splitter may use address information, such as the IP address and the UDP port number, so as to switch to a buffer corresponding to each component included in the buffer unit, thereby outputting the data corresponding to each component. The buffer unit (220700) may buffer the data corresponding to each component in accordance with the output order of the IP stream.

Meanwhile, according to the embodiment of the present invention, at least one of the components configuring a service may be divided into a base layer and an enhancement layer and then may be transmitted.

According to the embodiment of the present invention, by encoding video component by using the SVC method, the component may be divided into base layer data and enhancement layer data. The base layer data correspond to data for images having basic picture quality. Herein, although the base layer data are robust against the communication environment, the picture quality of the base layer data is relatively low. And, the enhancement layer data correspond to additional data for images having higher picture quality. And, although the enhancement layer data can provide high picture quality images, the enhancement layer data are more or less resilient to the communication environment.

In the present invention, video data for terrestrial broadcasting may be divided into base layer data and enhancement layer data. And, in order to allow the video data for mobile broadcasting to flexibly respond to the mobile broadcasting communication environment, the video data for mobile broadcasting may be divided into base layer data and enhancement layer data. The receiver may receive and decode only the base layer video data, so as to acquire images having basic image quality. And, the receiver may also receive and decode both the base layer video data and the enhancement layer video data, so as to acquire images having a higher picture quality. For example, the mobile receiver, such as a mobile phone, a movable TV, and so on, may decode only the base layer data, so as to provide images having basic picture quality, and a fixed-type receiver, such as a general household TV, may decode both the base layer data and the enhancement layer data, so as to provide images having high picture quality.

At this point, the base layer data and the enhancement layer data may be transmitted through a single PLP, or may be transmitted through different PLPs.

Figure 37:
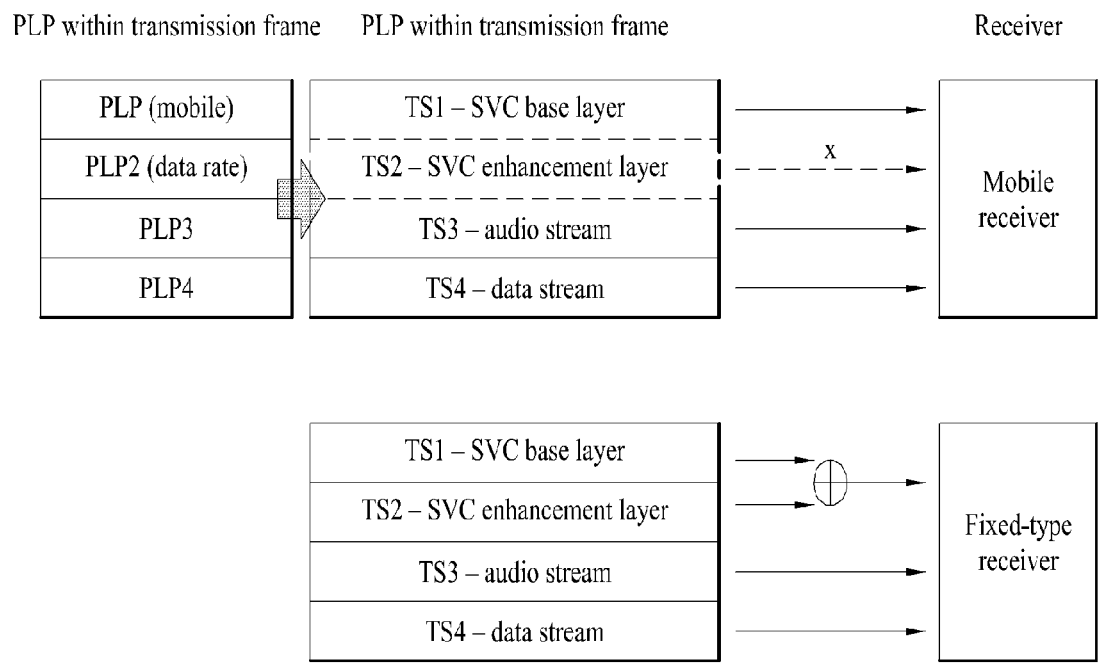
FIG. 37 illustrates a block diagram showing the process of the broadcasting signal receiver for receiving a PLP best fitting its purpose according to an embodiment of the present invention.

FIG. 37 illustrates a block view showing the process of the broadcasting signal receiver for receiving a PLP best fitting its purpose according to an embodiment of the present invention.

FIG. 37 shows an example of receiving a transmission frame, which includes a service configured of multiple PLPs, i.e., PLP1 to PLP4.

Herein, it will be assumed that PLP1 transmits SVC encoded base layer data, that PLP2 transmits SVC encoded enhancement layer data, that PLP3 transmits an audio stream, and that PLP4 transmits a data stream.

In the present invention, by adjusting and controlling the physical parameters in accordance with the characteristics of the data included in each PLP, the mobile reception performance or data communication performance may be differently set up, so that the receiver can selectively receive the required PLPs based upon the characteristics of receiver. Hereinafter, a detailed example will be described.

As shown in FIG. 37, since the PLP1 transmitting the base layer data should be capable of being received by a general fixed-type receiver as well as a mobile receiver, the broadcasting signal transmitting device may set up physical parameters for ensuring high reception performance respective to PLP1 and may then transmit the set up parameters.

Additionally, the PLP2 transmitting the enhancement layer data have a lower reception performance as compared to the PLP1. Accordingly, even if the mobile receiver is incapable of receiving PLP2, in order to allow a fixed-type receiver, which is required to receive high picture quality broadcasting programs having high resolution, the broadcasting signal transmitting device may set up and transmit physical parameters of PLP2.

Accordingly, as shown in FIG. 37, the mobile receiver may decode PLP1 transmitting a video stream of the base layer, and may decode PLP3 and PLP4 transmitting audio and data streams, so as to provide a service having general (or standard) resolution.

Alternatively, the fixed-type receiver may decode all of PLP1 transmitting a video stream of the base layer, PLP2 transmitting a video stream of the enhancement layer, and PLP3 and PLP4 transmitting audio and data streams, so as to provide a service having high picture quality.

However, this is merely exemplary, and, therefore, the mobile receiver may also decode all of PLP1 transmitting a video stream of the base layer, PLP2 transmitting a video stream of the enhancement layer, PLP3 transmitting an audio stream, and PLP4 transmitting a data stream, so as to provide a service having high picture quality.

Meanwhile, according to an embodiment of the present invention, after performing SVC decoding on the video data, the broadcasting signal transmitting device according to the present invention may transmit base layer data by using a non-MIMO method, and the broadcasting signal transmitting device may transmit enhancement layer data by using a MIMO method. In the present invention, a broadcasting signal transmitting system supporting the MIMO method will be referred to as a MIMO transmitting system.

Hereinafter, diverse embodiments of the MIMO transmitting system using SVC will be described in detail.

Figure 38:
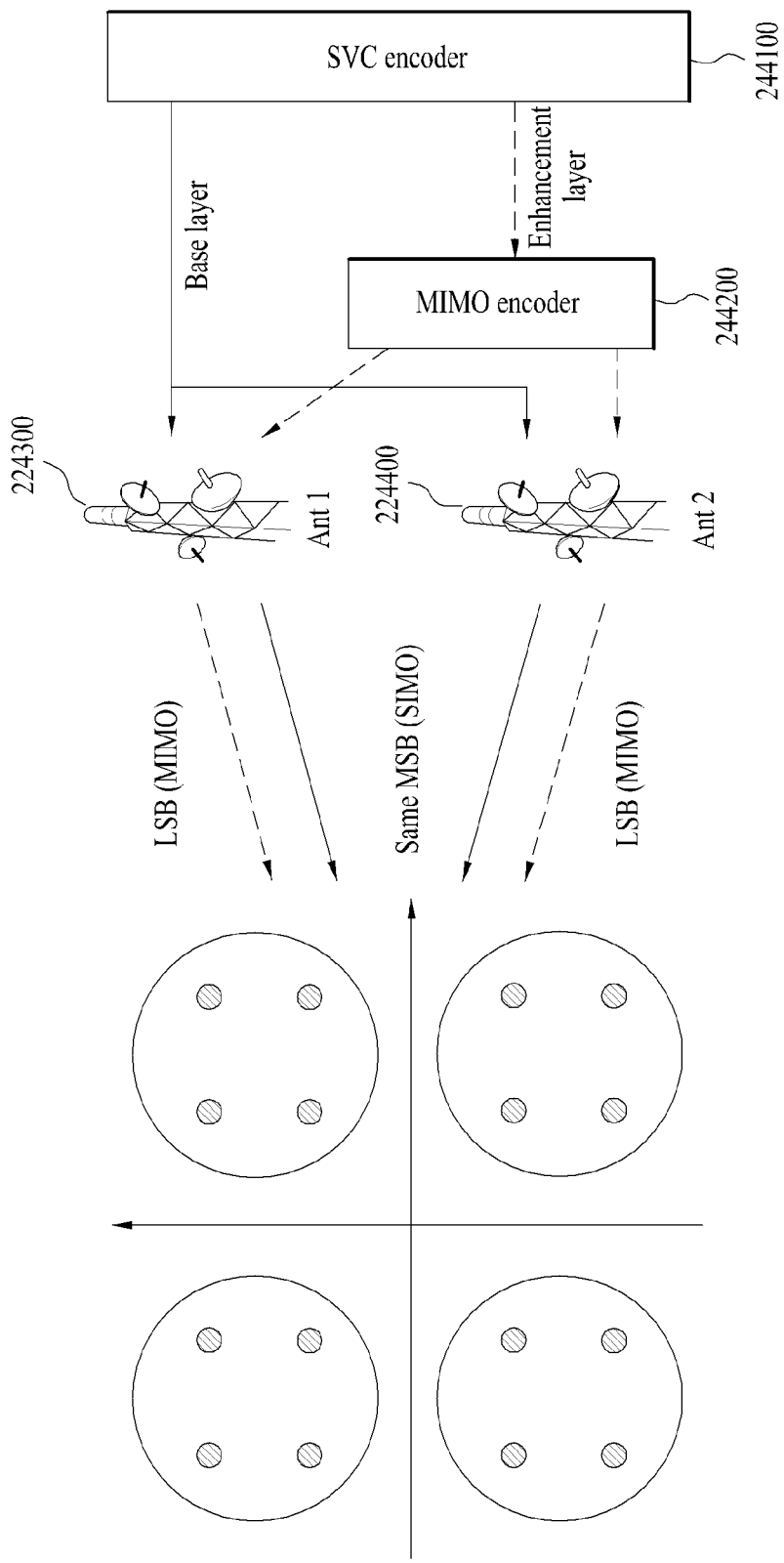
FIG. 38 illustrates a MIMO transmission system and a broadcast signal transmitting method using an SVC according to an embodiment of the present invention.

FIG. 38 illustrates a MIMO transmission system using an SVC and a broadcast signal transmission method according to an embodiment of the present invention.

As shown in FIG. 38, the MIMO transmitting system may include an SVC encoder (244100), which encodes broadcasting data by using the SVC method, and a MIMO encoder (244200), which distributes data by using a spatial diversity or spatial multiplexing method, so that the data can be transmitted to multiple antennae. Hereinafter, the MIMO encoder may also be referred to as a MIMO processor.

FIG. 38 shows an exemplary broadcast signal transmitting apparatus, which uses a Hierarchical modulation method.

The SVC encoder (244100) performs SVC encoding on the broadcast data and outputs the SVC-encoded data as the base layer data and the enhancement layer data. The base layer data are equally transmitted from a $1^{st}$ transmission antenna (Tx1; 244300) and a $2^{nd}$ transmission antenna (Tx2; 244400). And, the enhancement layer data are processed with MIMO encoding by the MIMO encoder (244200), thereby being respectively outputted through the $1^{st}$ transmission antenna (244300) and the $2^{nd}$ transmission antenna (244400) as identical data or as different data. In this case, the constellation mapper of the transmitting system perform symbol mapping on the corresponding symbol in accordance with the modulation type, as shown on the left-side drawing. For example, the constellation mapper may perform layer modulation, so as to map bits corresponding to the base layer to an MSB (Most Significant Bit) portion of the corresponding symbol, and to map bits corresponds to the enhancement layer to an LSB (Least Significant Bit) portion of the corresponding symbol.

The receiving system may use a constellation demapper, so as to separate the base layer data and the enhancement layer data from the demodulated bit information and to acquire the separated data. The enhancement layer data may be processed with MIMO decoding, so as to be acquired by using bit information of a final SVC. In case the bit information corresponding to the MIMO cannot be separated, the receiver may use only the bit information corresponding to the SISO or the MISO, so as to acquire the base layer data and to provide the respective service.

Figure 39:
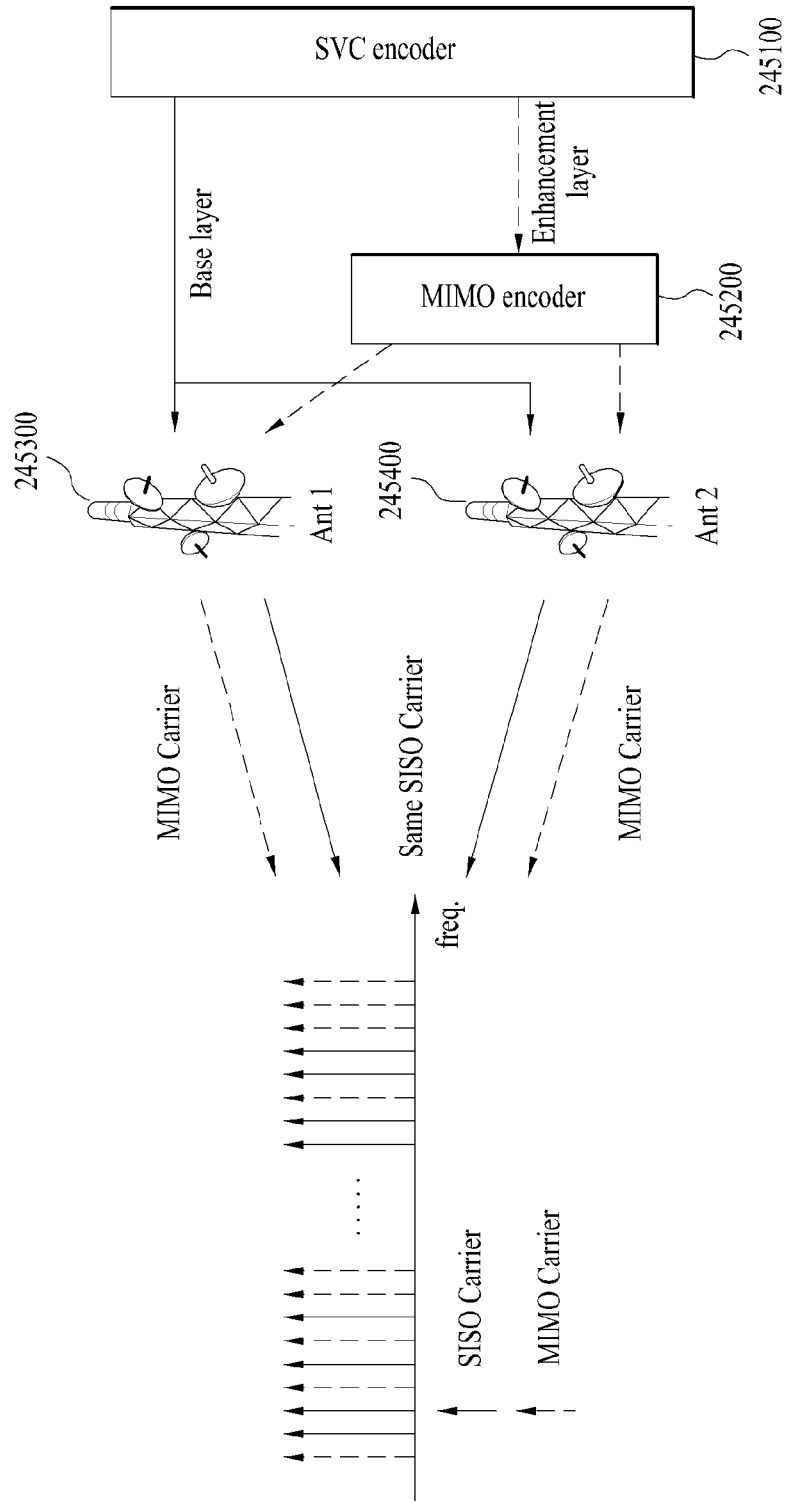
FIG. 39 illustrates a MIMO transmission system and a broadcast signal transmitting method using an SVC according to other embodiment of the present invention.

FIG. 39 illustrates a MIMO transmission system using an SVC and a broadcast signal transmitting method according to another embodiment of the present invention.

As shown in FIG. 39, the MIMO transmitting system may include an SVC encoder (245100), which encodes broadcasting data by using the SVC method, and a MIMO encoder (245200), which distributes data by using a spatial diversity or spatial multiplexing method, so that the data can be transmitted to multiple antennae. FIG. 39 illustrates an exemplary transmitting system using a hybrid modulation method or an FDM (Frequency Division Multiplexing) method.

The SVC encoder (245100) performs SVC encoding on the broadcast data and outputs the SVC-encoded data as the base layer data and the enhancement layer data. The base layer data are equally transmitted from a $1^{st}$ transmission antenna (Tx1; 245300) and a $2^{nd}$ transmission antenna (Tx2; 245400). And, the enhancement layer data are processed with MIMO encoding by the MIMO encoder (245200), thereby being respectively outputted through the $1^{st}$ transmission antenna (245300) and the $2^{nd}$ transmission antenna (245400) as identical data or as different data.

At this point, in order to enhance data transmission efficiency, the MIMO transmitting system of FIG. 39 may process data by using the FDM method. Most particularly, by using the OFDM method, the MIMO transmitting system may transmit data through multiple subcarriers. As described above, the transmitting system using the OFDM method may allocate subcarriers as a subcarrier used for transmitting SISO/MISO signals and as a subcarrier used for transmitting an MIMO signal, thereby being capable transmitting each signal. The base layer data being outputted from the SVC encoder (245100) may be equally transmitted from multiple antennae through the SISO/MISO carrier, and the enhancement layer data being processed with MIMO encoding may be transmitted from multiple antennae through the MIMO carrier.

The receiving system receives an OFDM symbol.

Then, the receiving system performs SISO/MISO decoding on the data corresponding to the SISO/MISO carrier, so as to acquire the base layer data. And, the receiving system performs MIMO decoding on the data corresponding to the MIMO carrier, so as to acquire the enhancement layer data. Thereafter, based upon the channel status and the receiving system, when the MIMO decoding process cannot be performed, the decoding process may be performed by using only the base layer data. Alternatively, when the MIMO decoding process can be performed, the decoding process may be performed by using both the base layer data and the enhancement layer data. Thus, a corresponding service may be provided. In case of the second embodiment of the present invention, since the MIMO processing may be performed after mapping the bit information of the service to a symbol, the MIMO encoder (245200) may be positioned after the constellation mapper. Accordingly, the structure of the receiving system may be more simplified as compared to the structure of the receiving system shown in FIG. 38.

Figure 40:
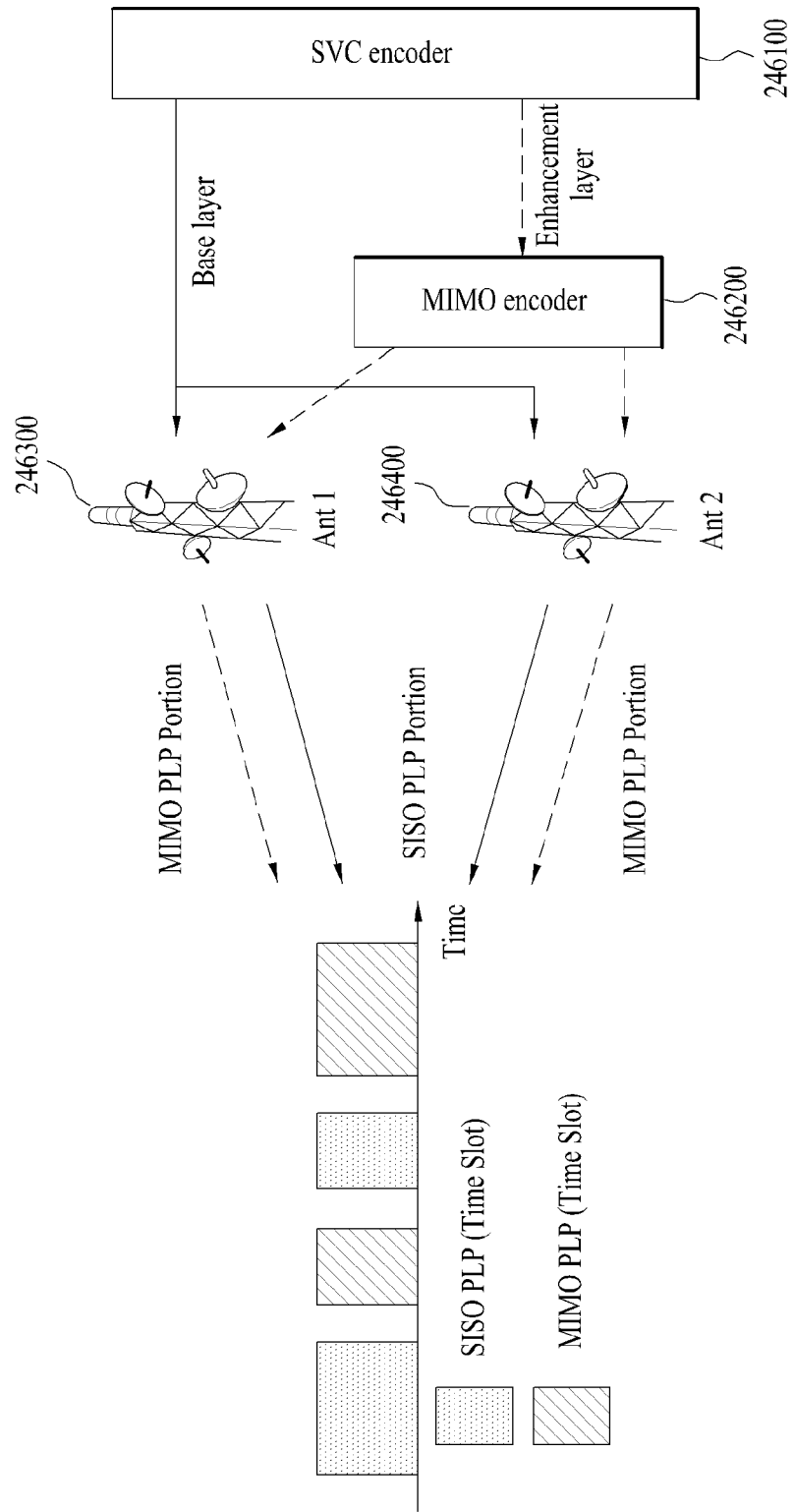
FIG. 40 illustrates a MIMO transmission system and a broadcast signal transmitting method using an SVC according to another embodiment of the present invention, (a) to (c) of FIG. 41 illustrate a signal frame for transmitting data of a base layer and an enhancement layer according to embodiments of the present invention.

FIG. 40 illustrates a MIMO transmission system using an SVC and a broadcast signal transmitting method according to yet another embodiment of the present invention.

As shown in FIG. 40, the MIMO transmitting system may include an SVC encoder (246100), which encodes broadcasting data by using the SVC method, and a MIMO encoder (246200), which distributes data by using a spatial diversity or spatial multiplexing method, so that the data can be transmitted to multiple antennae. FIG. 40 illustrates an exemplary transmitting system using a layer PLP method or a TDM method.

In the embodiment shown in FIG. 40, the transmitting system may respectively transmit SVC-encoded base layer data and SVC-encoded enhancement layer data through an SISO/MISO slot and a MIMO slot. This slot may correspond to a time unit slot or a frequency unit slot of the transmission signal. And, in the embodiment shown in FIG. 40, the slot is illustrated as a time unit slot. Furthermore, this slot may also correspond to a PLP.

The receiving system may determine the slot type of the slot that is being received. And, the receiving system may receive base layer data from the SISO/MISO slot, and the receiving system may receive enhancement layer data from the MIMO slot. And, as described above, based upon the channel and the receiving system, when the MIMO decoding process cannot be performed, the decoding process may be performed by using only the base layer data. Alternatively, when the MIMO decoding process can be performed, the decoding process may be performed by using both the base layer data and the enhancement layer data. Thus, a corresponding service may be provided.

According to the embodiment of the present invention, the MIMO encoder (244200, 245200, 246200) of FIG. 38 to FIG. 40 may use at least one of the MIMO encoding methods proposed in the first embodiment to the third embodiment. This is merely exemplary, and, therefore, the MIMO encoding process may also be performed by using the SM method or the GC method.

In the present invention, the base layer data and the enhancement layer data may be transmitted by using one PLP. And, each of the base layer data and the enhancement layer data may be respectively transmitted by using different PLPs.

According to an embodiment of the present invention, the base layer data may be transmitted through a T2 frame (i.e., a terrestrial broadcasting frame), and the enhancement layer data may be transmitted through an FEF part.

According to another embodiment of the present invention, the base layer data and the enhancement layer data may only be transmitted through the FEF part.

In the description of the present invention, the FEF part, which transmits the base layer data and the enhancement layer data, will be referred to as a MIMO broadcasting frame for simplicity. Herein, the MIMO broadcasting frame will be used in combination with a signal frame or a transmission frame.

Also, in the description of the present invention, the base layer data and the enhancement layer data will be collectively referred to as MIMO broadcasting data for simplicity.

Hereinafter, in the following description of the present invention, the MIMO broadcasting data may be generated by any one of the 1$^{st}$ method to 3$^{rd}$ method, which will be described as presented below, thereby being transmitted.

Alternatively, the MIMO broadcasting data may also be generated and transmitted by a combination of at least one or more of the 1$^{st}$ method to 3$^{rd}$ method described below.

(1) Method for Transmitting MIMO Broadcasting Data to a Specific PLP

In the present invention, a method for including MIMO broadcasting data to a specific PLP and transmitting the specific PLP, after differentiating the specific PLP from a PLP including the terrestrial broadcasting (e.g., T2 broadcasting) data may be used. In this case, the specific PLP may be used in order to transmit the MMO broadcasting data. And, at this point, additional information on the specific PLP may be signaled, so as to prevent any malfunction in the conventional receiving system from occurring. Hereinafter, the specific PLP including the MMO broadcasting data may be referred to as a MIMO broadcasting PLP, and the PLP including the terrestrial broadcasting data may be referred to as a terrestrial broadcasting PLP.

Since the conventional terrestrial broadcasting signal receiving apparatus may not be capable of processing the MIMO broadcasting data, additional information for identifying the terrestrial broadcasting PLP and the MIMO broadcasting PLP is required to be signaled. At this point, the signaling of the information for identifying the PLP type may use a reserved field included in the L1 signaling information. For example, in order to identify the PLP type, a PLP TYPE field of the L1-post-signaling information may be used. At this point, the MIMO broadcasting PLP may be indicated by using any one of the values ranging from 011~111 as the PLP_TYPE field value.

When transmitting the PLP, in order to acquire a more enhanced robustness, a new modulation method and a new coding rate of the error correction code may be used. In this case, in order to identify such modulation method and coding rate of the error correction code, the L1-post-signaling information may be used. According to an embodiment of the present invention, the present invention may use a PLP_COD field of the L1-post-signaling information in order to indicate the coding rate of the MIMO broadcasting PLP. For example, in order to identify the coding rate of the MIMO broadcasting PLP, any one of 110 or 111 may be used as the PLP_COD field value.

Furthermore, according to an embodiment of the present invention, the present invention may use a PLP_MOD field of the L1-post-signaling information in order to indicate a modulation method of the MIMO broadcasting PLP. For example, in order to identify the modulation method of the MIMO broadcasting PLP, any one of values 100 to 111 may be used as the PLP_MOD field value.

At this point, the base layer data and the enhancement layer data configuring the MIMO broadcasting data may be collectively transmitted to a single PLP, or may be separately transmitted to each PLP. For example, when the base layer data are transmitted to the PLP of the base layer, and when the enhancement layer data are transmitted to the PLP of the enhancement layer, the receiving apparatus may use a PLP_PROFILE field, so as to indicate whether the current PLP corresponds to the base layer PLP or to the enhancement layer PLP.

(2) Method for Transmitting MIMO Broadcasting Data to a Specific Frames

In the present invention, a method for including MIMO broadcasting data to a specific frame and transmitting the specific frame, after differentiating the specific frame from a frame including the conventional terrestrial broadcasting data may be used. In this case, the specific frame may be used in order to transmit the MMO broadcasting data. And, at this point, additional information on the specific frame may be signaled, so as to prevent any malfunction in the conventional receiving system from occurring. Hereinafter, the specific frame including the MMO broadcasting data may be referred to as a MIMO broadcasting frame, and the frame including the terrestrial broadcasting data may be referred to as a terrestrial broadcasting frame. Additionally, in case the specific frame including the MIMO broadcasting frame corresponds to an FEF, the FEF may be referred to as an MIMO broadcasting frame.

The present invention may differentiate the terrestrial broadcasting data from the MIMO broadcasting data in frame units and may transmit the differentiated data accordingly. And, at this point, by identifying a frame by using the L1 signaling information, and by ignoring (or disregarding) the MIMO broadcasting frame, the convention terrestrial broadcasting receiving apparatus may be prevented from malfunctioning.

(3) Method for Transmitting a MIMO Broadcasting PLP to a Terrestrial Broadcasting Frame and a MIMO Broadcasting Frame The present invention may transmit a PLP including the MIMO broadcasting data through a terrestrial broadcasting frame and a MIMO broadcasting frame. For example, the base layer data may be transmitted through the terrestrial broadcasting frame, and the enhancement layer data may be transmitted through the MIMO broadcasting frame. In this case, unlike the above-described embodiments of the present invention, since a MIMO broadcasting PLP also exists in the terrestrial broadcasting frame, a relation between interconnected PLPs existing in the terrestrial broadcasting frame and in the MIMO broadcasting frame, is required to be signaled. In order to do so, the L1 signaling information should also be included in the MIMO broadcasting frame, and the information on the MIMO broadcasting PLP, which exists within the frame, may be transmitted along with the L1 signaling information of the terrestrial broadcasting frame.

Fields respective to the PLP being included in the L1-post-signaling information of each frame may be used for the connection between the MIMO broadcasting PLPs existing in different frames. For example, the receiving system may use at least one of a PLP_ID field, a PLP_TYPE field, a PLP_PAYLOAD_TYPE field, and a PLP_GROUP_ID field, which are included in the L1-post-signaling information, so as to verify the interconnection relation of the MIMO broadcasting PLPs included in different frames. Then, desired MIMO broadcasting PLPs may be consecutively decoded, so as to acquire a service.

The terrestrial broadcasting PLP existing in the conventional terrestrial broadcasting frame (i.e., T2 frame) may be pre-defined by the terrestrial broadcasting system, so as to be transmitted to a supported transmission mode. Also, as described above, the terrestrial broadcasting PLP may be transmitted in a new transmission mode supporting the MIMO system. For example, as described above, a MIMO broadcasting PLP being included in the terrestrial broadcasting frame may be transmitted in a transmission mode of terrestrial broadcasting as a base layer by using the MISO or SISO method, and a MIMO broadcasting PLP being included in the MIMO broadcasting frame may be transmitted as an enhancement layer by using the MIMO method.

Figure 41:
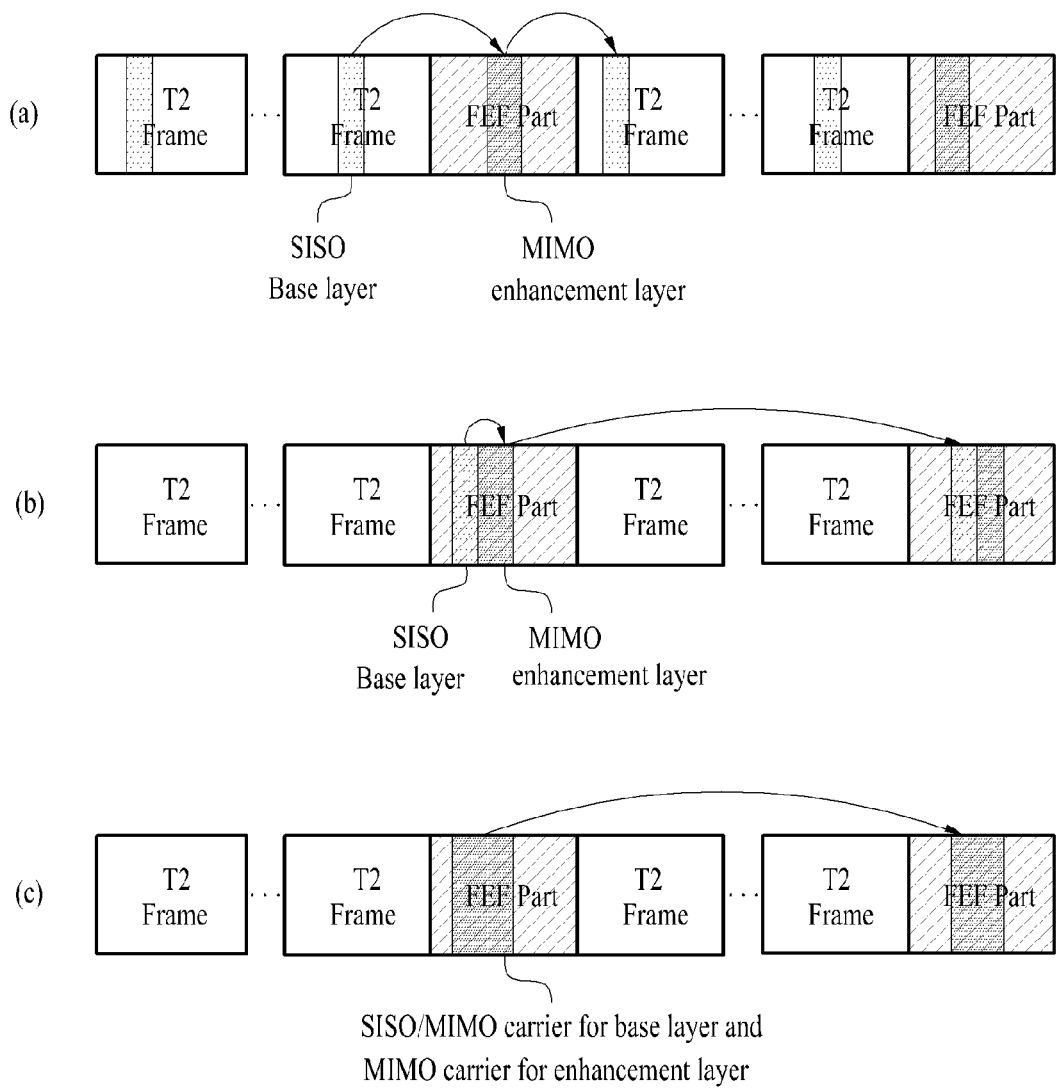

FIG. 41(*a*) illustrates an exemplary super frame structure according to another embodiment of the present invention. Herein, FIG. 41(*a*) shows an example of transmitting a base layer PLP through a terrestrial broadcasting frame and transmitting an enhancement layer PLP through a MIMO broadcasting frame (i.e., FEF part). At this point, a PLP including base layer data may be transmitted by using an SISO method or a MISO method. And, a PLP including enhancement layer data may be transmitted by using an SISO method, a MISO method, or a MIMO method.

FIG. 41(*b*) illustrates an exemplary super frame structure according to yet another embodiment of the present invention. Herein, FIG. 41(*b*) shows an example of transmitting both a base layer PLP and an enhancement layer PLP through a MIMO broadcasting frame (i.e., FEF part).

At this point, a base layer PLP including base layer data may be transmitted by using an SISO method or a MISO method. And, an enhancement layer PLP including enhancement layer data may be transmitted by using an SISO method, a MISO method, or a MIMO method. As described above, the ratio between the base layer PLP and the enhancement layer PLP within the MIMO broadcasting frame may vary within a range of 0-100%.

FIG. 41(*c*) illustrates an exemplary super frame structure according to yet another embodiment of the present invention. Herein, FIG. 41(*c*) shows an example of transmitting both base layer data and enhancement layer data through a MIMO broadcasting frame (i.e., FEF part). However, unlike in the example shown in FIG. 41(*b*), in the example shown in FIG. 41(*c*), the base layer and the enhancement layer are transmitted by being differentiated as carriers, instead of being differentiated as PLPs. More specifically, the data corresponding to the base layer and the data corresponding to the enhancement layer may respectively be allocated to each separate subcarrier, so as to be processed with OFDM modulation, thereby being transmitted.

Figure 42:
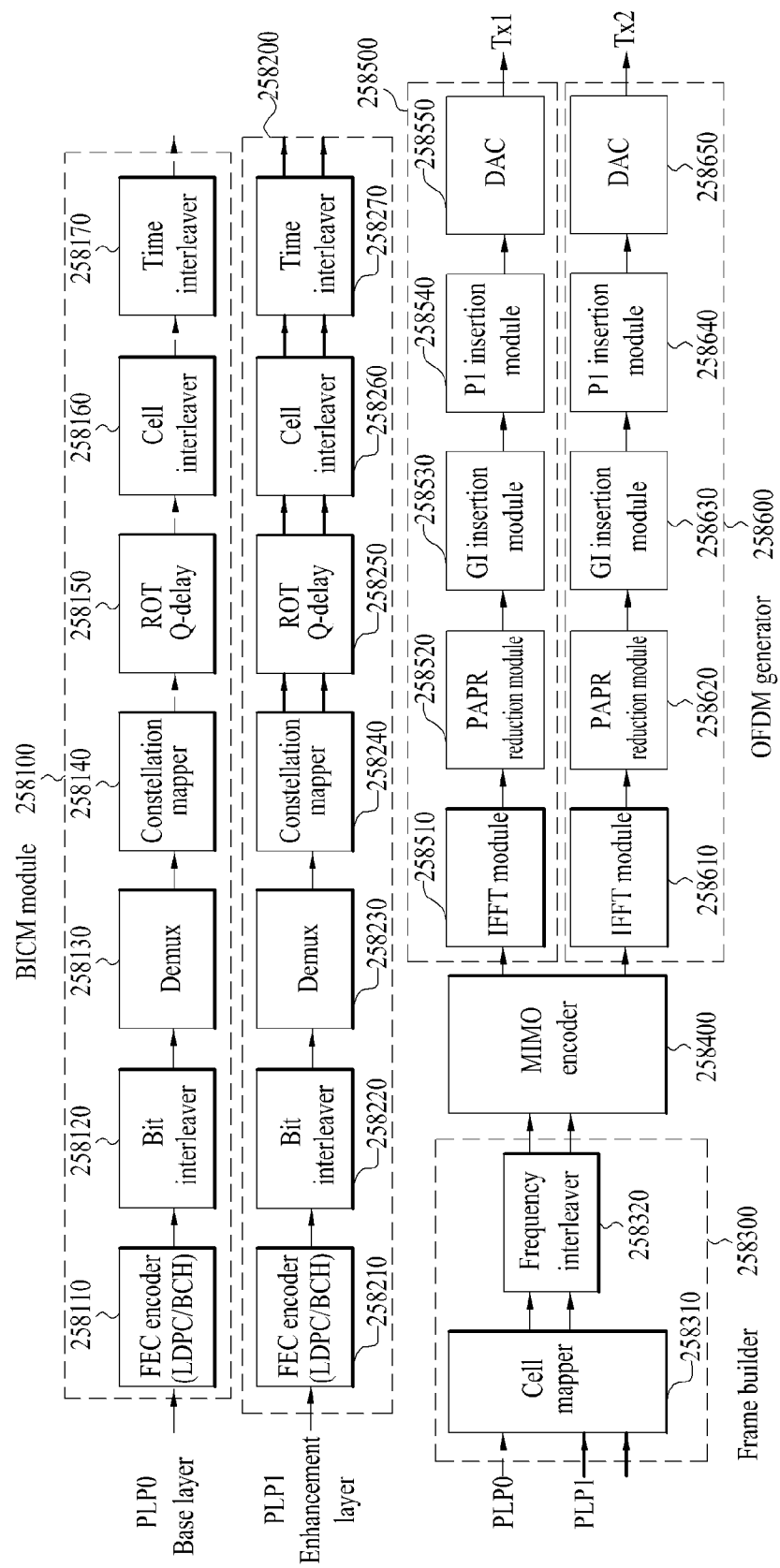
FIG. 42 illustrates a block diagram showing a broadcasting signal transmitting apparatus according to another embodiment of the present invention.

FIG. 42 illustrates a broadcasting signal transmitting device according to another embodiment of the present invention.

The broadcasting signal transmitting device of FIG. 42 corresponds to an exemplary embodiment, which identifies the base layer data as the base layer PLP, and which the enhancement layer data as the enhancement layer PLP, thereby transmitting the identified (or differentiated) PLPs. Although it is not shown in FIG. 42, the broadcasting signal transmitting device includes an SVC encoder, which performs SVC encoding on data, so as to transmit the SVC encoded data as base layer data and enhancement layer data. At this point, according to the embodiment of the present invention, it is described herein that the base layer data are included in PLP1, and that the enhancement layer data are included in PLP2.

The broadcasting signal transmitting device of FIG. 42 includes a first BICM module (258100) for performing BICM processing on a base layer PLP (PLP1), a second BICM module (258200) for performing BICM processing on an enhancement layer PLP (PLP2), a frame builder (258300) receiving PLPs that are processed in the first and second BICM modules (258200), thereby building a frame, a MIMO encoder (258400) performing MIMO, MISO, or SISO processing on the output data of the frame builder (258300), a first OFDM generator (258500) performing OFDM modulation on a first transmission signal, which is outputted from the MIMO encoder (258400), and a second OFDM generator (258600) performing OFDM modulation on a second transmission signal, which is outputted from the MIMO encoder (258400).

Reference may be made on the description of the operations of the blocks included in the above-described broadcasting signal transmitting device having the same names as the first BICM module (258100), the second BICM module (258200), the frame builder (258300), the MIMO encoder (258400), the first OFDM generator (258500), and the second OFDM generator (258600), and, therefore, a detailed description of the same will be omitted herein.

In the broadcasting signal transmitting device of FIG. 42, the MIMO encoder (258400) may be positioned between a constellation mapper and a time interleaver within the second BICM module (258200).

Figure 43:
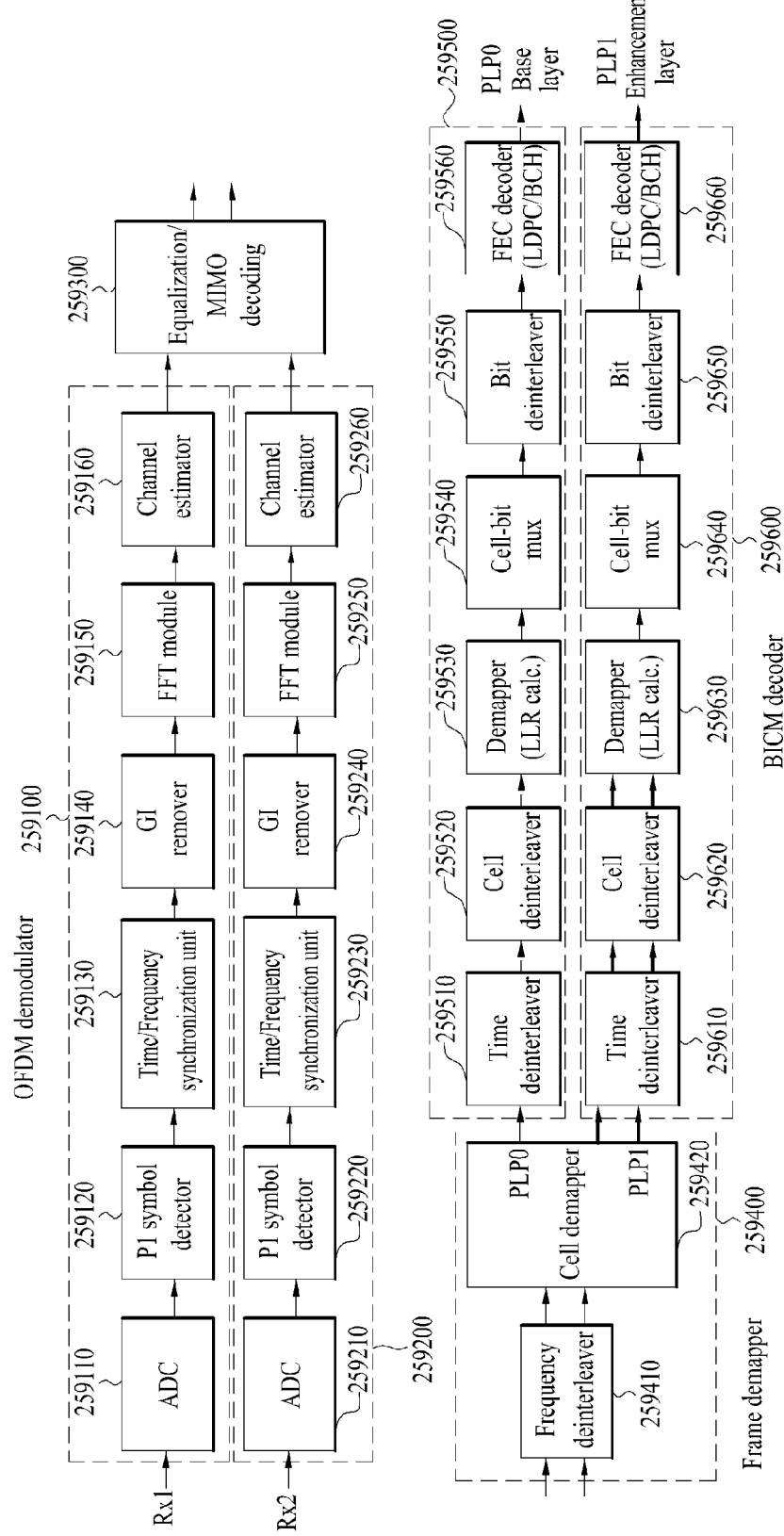
FIG. 43 illustrates a block diagram showing a broadcasting signal receiving apparatus according to another embodiment of the present invention.

FIG. 43 illustrates a broadcasting signal receiving device according to yet another embodiment of the present invention.

When the base layer and the enhancement layer are identified and transmitted as PLPs, as shown in FIG. 42, the broadcasting signal receiving device of FIG. 43 corresponds to an exemplary embodiment of a broadcasting signal receiving device receiving and processing such PLPs. Although it is not shown in FIG. 43, the broadcasting signal receiving device includes an SVC decoder, which performs SVC decoding on base layer and enhancement data, so as to recover the data. At this point, according to the embodiment of the present invention, the base layer data are included in PLP1, and the enhancement layer data are included in PLP2, thereby being received.

The broadcasting signal receiving device of FIG. 43 includes OFDM demodulators (259100, 259200) performing OFDM demodulation on signals received through multiple antennae, an MIMO decoder (259300) performing MIMO decoding on the signals OFDM-demodulated from the OFDM demodulators (259100, 259200) in accordance with the channel characteristics, a frame demapper (259400) outputting base layer PLP and enhancement layer PLP from the signal frame including the MIMO-decoded signal, and BICM decoder (259500, 259600) each performing an inverse process of the BICM module for each PLP and correcting errors occurring due to the transmission channel.

For the detailed description on the operations of each of the OFDM demodulators (259100, 259200), the MIMO decoder (259300), the frame demapper (259400), and the BICM decoders (259500, 259600) of the broadcasting signal receiving device shown in FIG. 43, reference may be made to the description on the operations of the same blocks included in the above-described broadcasting signal receiving device. And, therefore, detailed description of the same will be omitted.

The broadcasting signal receiving device of FIG. 43 may first acquire base layer data from the PLP (PLP1), which is outputted from the first BICM decoder (259500), and enhancement layer data from the PLP (PLP2), which is outputted from the second BICM decoder (259600), and may then perform SVC decoding on the acquired data, so as to provide a respective service. In case the broadcasting signal receiving device acquires only the base layer data, the broadcasting signal receiving device may decode the base layer data, so as to provide a basic service. And, in case the broadcasting signal receiving device acquires the base layer data along with the enhancement layer data, the broadcasting signal receiving device may provide a service having higher picture quality/sound quality.

Meanwhile, according to the embodiment of the present invention, in case both the base layer data and the enhancement layer data are transmitted by using a single PLP, a mux may be further included in from of the BICM module of the broadcasting signal receiving device shown in FIG. 42.

More specifically, the base layer data and the enhancement layer data being outputted from the SVC encoder may be included in a single PLP (PLP1), so as to be inputted to the mux. In this case, the mux may identify the base layer data and the enhancement layer data, which are included in the PLP (PLP1), thereby outputting the identified data to the respective BICM module (258100, 258200). In this case, the broadcasting signal receiving device may be equipped with a time interleaver, and the base layer and the enhancement layer may be coupled (or combined) by the time interleaver, thereby being processed with interleaving while the two layers are intermixed with one another. Thus, diversity of the time domain may be gained. At this point, according to the embodiment of the present invention, the data corresponding to the base layer within the PLP may be SISO or MIMO-processed, and the data corresponding to the enhancement layer may be MIMO-processed.

Additionally, in case both the base layer data and the enhancement layer data are both transmitted from the transmitting end by using a single PLP, the frame demapper of the broadcasting signal receiving device shown in FIG. 43 extracts a PLP (PLP1), which includes the data of the base layer and the data of the enhancement layer, and outputs the extracted PLP. In this case, the broadcasting signal receiving device may be equipped with a time deinterleaver, and the time deinterleaver may perform time deinterleaving on the PLP (PLP2), so as to divide the PLP into base layer data and enhancement layer data and to reposition each data type within the time domain, thereby outputting the repositioned data type to each stream. Each of the BICM decoders (259500, 259600) processes a base layer stream and an enhancement layer stream.

At this point, the base layer data and the enhancement layer data, which are error-corrected and outputted from the BICM decoders (259500, 259600), may be SVC-decoded, so as to provide a service. In the case when only the base layer data are acquired, the base layer data may be decoded, so as to provide the basic (or essential) service. And, when both the base layer data and the enhancement layer data are acquired, a service having higher picture quality/sound quality may be provided.

In the broadcasting signal receiving device of FIG. 43, the MIMO decoder (259300) may also be located between the frame demapper (259400) and the BICM decoders (259500, 259600).

Hereinafter, a signaling method of the signaling method according to the present invention will be described in detail. The signal frame according to the present invention may be divided into a preamble region and a data region, and the preamble region may be configured of a P1 symbol and one or more P2 symbols, and the data region may be configured of multiple data symbols. At this point, the preamble region may further include an AP1 symbol after the P1 symbol. And, in this case, the P1 symbol and the AP1 symbol may be consecutively transmitted.

Herein, the P1 symbol transmits P1 signaling information, the AP1 symbol transmits AP1 signaling information, and the one or more P2 symbol each transmits L1 signaling information and signaling information included in the common PLP (i.e., L2 signaling information). The signaling information being included in the common PLP may be transmitted through a data symbol. Therefore, in light of a signal frame over a physical layer, the preamble region may include a P1 signaling information region to which the P1 signaling information is signaled, an L1 signaling information region to which the L1 signaling information is signaled, and an entire portion or a partial portion of a common PLP region to which the L2 signaling information is signaled. Herein, the common PLP region may also be referred to as an L2 signaling information region. If a signal frame includes an AP1 symbol, the preamble region includes the P1 signaling information region, the AP1 signaling information region, the L1 signaling information region, and an entire portion or a partial portion of the common PLP region.

The L1 signaling information includes L1-pre-signaling information and L1-post-signaling information. The L1-post-signaling information then includes Configurable L1-post-signaling information, Dynamic L1-post-signaling information, Extension L1-post-signaling information, and CRC information, and may further include L1 padding data.

FIG. 44 illustrates an exemplary syntax structure of P1 signaling information according to an embodiment of the present invention.

According to the embodiment of the present invention, in FIG. 44, the P1 signaling information is assigned with 7 bits and includes a 3-bit S1 field and a 4-bit S2 field. In the S2 field, among the 4 bits, the first 3 bits are described as S2 field1 and the 1 bit is described as S2 field2.

The S1 field signals a preamble format. For example, when the S1 field value is equal to 000, this indicates that the preamble corresponds to a T2 preamble, and that data are transmitted in an SISO format (T2_SISO). When the S1 field value is equal to 001, this indicates that the preamble corresponds to a T2 preamble, and that data are transmitted in an MISO format (T2_MISO). When the S1 field value is equal to 010, this indicates that the preamble corresponds to a non-T2 preamble.

The S2 field signals FFT size information. According to the embodiment of the present invention, the FFT size may correspond to 1 k, 2 k, 4 k, 8 k, 16 k, and the GI size may correspond to $1/128$, $1/32$, $1/16$, $19/256$, $1/8$, $19/128$, $1/4$. The FFT size signifies a number of subcarriers configuring a single OFDM symbol. When the S2 filed2 value is equal to 0, this indicates that, in the current transmission, all preambles are being transmitted as the same type, and when the field value is equal to 1, this indicates that the preambles are each transmitted as different types.

FIG. 45 illustrates an exemplary syntax structure of AP1 signaling information according to an embodiment of the present invention.

According to the embodiment of the present invention, in FIG. 45, the AP1 signaling information is assigned with 7 bits and includes a 4-bit PILOT_PATTERN field and a 3-bit L1_PRE_SPREAD_LENGTH field.

The PILOT_PATTERN field indicates a pilot pattern of the corresponding signal frame. In the present invention, by transmitting pilot pattern information through the AP1 symbol, even when the P2 symbol is not transmitted, and even when the L1 signaling information is spread to data symbols of the data region, the receiver may be aware of the pilot pattern prior to decoding the L1 signaling information of the data region.

The L1_PRE_SPREAD_LENGTH field indicates a length of a section within the data region in which the L1-pre-signaling information is spread. More specifically, among the data symbols of the signal frame, this field indicates a number of data symbols included in a section to which the L1-pre-signaling information is being spread. In the present invention, the section to which the L1-pre-signaling information is being spread will be referred to as an L1 pre spread section. If the L1_PRE_SPREAD_LENGTH field value is equal to '000', this indicates that the L1 signaling information is not spread in the data region of the corresponding signal frame.

In FIG. 45, since the fields included in the AP1 signaling information and significance of the values of each field are merely examples given to facilitate the understanding of the present invention, and since the fields that can be included in the AP1 signaling information and the significance of the respective field values may be easily modified by anyone skilled in the art, the present invention will not be limited only to the examples given herein.

FIG. 46 illustrates an exemplary syntax structure of L1-pre-signaling information according to an embodiment of the present invention. The L1-pre-signaling information includes information required for decoding the L1-post-signaling information.

The fields being included in the L1-pre-signaling information of FIG. 46 will hereinafter be described in detail.

A TYPE field may be assigned with 8 bits and may indicate the type of an input stream being transmitted in a super frame. More specifically, the input stream may correspond to TS, GS, TS+GS, IP, and so on, and such identification may use the TYPE field.

A BWT_EXT field is assigned with 1 bit and may indicate whether or not a bandwidth extension of an OFDM symbol is to be performed.

An S1 field is assigned with 3 bits and performs the same role as the S1 field included in the P1 signaling information of FIG. 44. An S2 field is assigned with 4 bits and performs the same role as the S2 field included in the P1 signaling information of FIG. 44. According to the embodiment of the present invention, an L1_REPETITION_FLAG field is assigned with 1 bit and may indicate whether or not L1-post-signaling information related to the current frame is signaled to the P2 symbol. If the L1 signaling information of the next signal frame is configured to have a structure to which the data symbols of the current signal frame are spread, the L1_REPETITION_FLAG field may also be used in order to indicate whether or not the L1 signaling information of the next signal frame has been spread to the current signal frame. For example, when the L1_REPETITION_FLAG field is equal to 1, this indicates that the L1 signaling information has been spread to the current signal frame, and when the corresponding field is equal to 0, this indicates that the L1 signaling information has not been spread to the current signal frame.

A GUARD_INTERVAL field is assigned with 3 bits and indicates a GI size of the current transmission frame. The GI size indicates an occupation ratio of the GI within a single OFDM symbol. Accordingly, the OFDM symbol length may vary depending upon the FFT size and the GI size.

A PAPR field is assigned with 4 bits and indicates a PAPR reduction method. The PAPR method used in the present invention may correspond to an ACE method or a TR method.

An L1_MOD field is assigned with 4 bits and may indicate a QAM modulation type of the L1-post-signaling information.

An L1_COD field is assigned with 2 bits and may indicate a code rate of the L1-post-signaling information.

An L1_FEC_TYPE field is assigned with 2 bits and may indicate an FEC type of the L1-post-signaling information.

An L1_POST_SIZE field is assigned with 18 bits and may indicate the size of the coded and modulated L1-post-signaling information.

An L1_POST_INFO_SIZE field is assigned with 18 bits and may indicate the size of the L1-post-signaling information in bit units.

A PILOT_PATTERN field is assigned with 4 bits and may indicate a distributed pilot pattern that is inserted in the current signal frame.

A TX_ID_AVAILABILITY field is assigned with 8 bits and may indicate a transmitting device identification capability within the current geographical cell range.

A CELL_ID field is assigned with 16 bits and may indicate an identifier identifying a geographical cell within a network for mobile broadcasting (NGH).

A NETWORK_ID field is assigned with 16 bits and may indicate an identifier identifying the current network.

A SYSTEM_ID field is assigned with 16 bits and may indicate an identifier identifying the system.

A NUM_NGH_FRAMES field is assigned with 8 bits and may indicate a number of NGH frame within the current super frame.

A NUM_T2_FRAMES field is assigned with 8 bits and may indicate a number of T2 frame within the current super frame. This field is useful for determining the super frame structure and may be used for calculating the information for directly hopping to the next NGH frame.

A L1_POST_SPREAD_LENGTH field is assigned with 12 bits and may indicate the length of a section within the data region to which the L1-post-signaling information is being spread. More specifically, among the data symbols of the signal frame, this field may indicate the number of data symbols being included in the section to which the L1-post-signaling information is being spread. In the present invention, the section to which the L1-post-signaling information is being spread will be referred to as an L1 post spread section. If all of the L1_POST_SPREAD_LENGTH field value is equal to 0, this signifies that the L1-post-signaling information is not spread to the data region of the corresponding signal frame.

A NUM_DATA_SYMBOLS field is assigned with 12 bits and may indicate a number of data symbols included in the current signal frame, with the exception for the P1, AP1, P2 symbols.

A NUM_MISO_SYMBOLS field is assigned with 12 bits and may indicate a number of MISO symbols among the diverse data symbols.

A MIMO_SYMBOL_INTERVAL field is assigned with 12 bits and may indicate a number of MISO symbols between two MIMO symbol parts.

A MIMO_SYMBOL_LENGTH field is assigned with 12 bits and may indicate a number of MIMO symbols in one MIMO symbol part.

A REGEN_FLAG field is assigned with 3 bits and may indicate and may indicate a number of signal regeneration performed by the repeater.

An L1_POST_EXTENSION field is assigned with 1 bit and may indicate whether or not an extension field exits in the L1-post-signaling information.

A NUM_RF field is assigned with 3 bits and may indicate a number of RFs within the current system.

A CURRENT_RF_IDX field is assigned with 3 bits and may indicate an index of the current RF channel.

A RESERVED field is assigned with 10 bits and corresponds to a field that is reserved for future usage.

A CRC-32 field is assigned with 32 bits and may indicate a CRC error extraction code of the 32 bits.

In FIG. 46, since the fields included in the L1-pre-signaling information and significance of the values of each field are merely examples given to facilitate the understanding of the present invention, and since the fields that can be included in the L1-pre-signaling information and the significance of the respective field values may be easily modified by anyone skilled in the art, the present invention will not be limited only to the examples given herein.

FIG. 47 illustrates an exemplary syntax structure of configurable L1-post-signaling information according to an embodiment of the present invention. The configurable L1-post-signaling information may include parameters required by the receiver for decoding a PLP and, more particularly, configurable L1-post-signaling information may include diverse information that can be equally applied during a signal frame.

The fields being included in the configurable L1-post-signaling information of FIG. 47 will hereinafter be described in detail.

A SUB_SLICES_PER_FRAME field is assigned with 15 bits and may indicate a number of sub-slices included in a signal frame.

A NUM_PLP field is assigned with 8 bits and may indicate a number of PLPs within the current super frame.

A NUM_AUX field is assigned with 4 bits and may indicate a number of auxiliary streams.

An AUX_CONFIG_RFU field is assigned with 8 bits and corresponds to a region reserved for a future usage.

Subsequently, a for loop (hereinafter referred to as a frequency loop), which is repeated as many times as the number of RFs within the current system, is signaled. The NUM_RF field is signaled to the L1-pre-signaling information.

Hereinafter, fields being included in the frequency loop will be described in detail.

An RF_IDX field is assigned with 3 bits and may indicate an index of each frequency within an RF channel.

A FREQUENCY field is assigned with 32 bits and may indicate a center frequency of the RF channel.

An FEF_TYPE field, an FEF_LENGTH field, and an FEF_INTERVAL field, which are shown below, correspond to fields that are used only when the LSB of the S2 field is equal to 1, i.e., when the S2 field is expressed as S2='xxx1'.

The FEF_TYPE field is assigned with 4 bits and may indicate an FEF (Future extension frame) type.

The FEF_LENGTH field is assigned with 22 bits and may indicate a number of elementary periods of a related FEF part.

The FEF_INTERVAL field is assigned with 8 bits and may indicate a number of T2 frames existing between two FRF parts.

A NEXT_NGH_SUPERFRAME field is assigned with bits and may indicate a number of super frames existing between the current super frame and the next super frame, which includes the next NGH frame.

A RESERVED_2 field is assigned with 32 bits and corresponds to a field that is reserved for a future usage.

Subsequently, a for loop (hereinafter referred to as an auxiliary stream loop), which is repeated as many times as the number of auxiliary streams (NUM_AUX field value-1), is signaled, a 32-bit AUX_RFU field, which is reserved for a future usage, is included herein.

Subsequently, a for loop (hereinafter referred to as a PLP loop), which is repeated as many times as the number of PLPs within the current super frame (NUM_PLP field value-1), is signaled.

Hereinafter, fields being included in the PLP loop will be described in detail.

A PLP_ID field is assigned with 8 bits and may indicate an identifier identifying the corresponding PLP.

A PLP_TYPE field is assigned with 3 bits and may indicate whether the corresponding PLP corresponds to a common PLP, a Type1 data PLP, or a Type2 data PLP.

Additionally, the PLP_TYPE field may indicate whether the corresponding PLP corresponds to a PLP being included in a plurality of PLP groups, or to a group PLP being included in a single PLP group.

A PLP_PAYLOAD_TYPE field is assigned with 5 bits and may indicate the type of a PLP payload. More specifically, the data included in the payload of the PLP may correspond to GFPS, GCS, GSE, TS, IP, and so on, and such identification may use the PLP_PAYLOAD_TYPE field.

The PLP_PROFILE field is assigned with 2 bits and may indicate a profile of the corresponding PLP. More specifically, this field indicates whether the corresponding field is a mandatory (or required) PLP or an optional (or selective) PLP. For example, when the PLP of the video data is identified as a PLP for transmitting a base layer and a PLP for transmitting an enhancement layer, the PLP transmitting the base layer becomes the mandatory PLP, and the PLP transmitting the enhancement layer becomes the optional PLP. Additionally, the common PLP corresponds to a mandatory PLP. More specifically, depending upon the receiver characteristic, such as a mobile receiver, a fixed-type receiver, and so on, the receiver may use the PLP_PORFILE[PLP_PROFILE] field so as to verify by which receiver the component of the broadcast service being transmitted to the current PLP may be used, and depending upon the receiver characteristic, the receiver may determine whether or not to receive the current PLP.

An FF_FLAG field is assigned with 1 bit and, when 2 or more RF channels are being used, this field may indicate a fixed frequency mode.

A FIRST_RF_IDX field is assigned with 3 bits and may indicate an RF index of a first signal frame of the corresponding PLP.

A FIRST_FRAME_IDX field is assigned with 8 bits and may indicate a frame index of the first signal frame of the corresponding PLP.

A PLP_GROUP_ID field is assigned with 8 bits and may indicate an identifier identifying a PLP group related to the corresponding PLP.

A PLP_COD field is assigned with 3 bits and may indicate the code rate of the corresponding PLP. In the present invention, any one of the code rates of 1/4, 1/3, 2/5, 1/2, 3/5, 2/3, 3/4, 4/5, 5/6 may be used in the corresponding PLP.

A PLP_MOD field is assigned with 3 bits and may indicate a constellation size (i.e., modulation format) of the corresponding PLP. In the present invention, any one of the modulation formats (or modulations types) of BPSK, QPSK, 16QAM, 64QAM, 256QAM may be used.

A PLP_MIMO_TYPE field is assigned with 2 bits and may indicate whether the corresponding PLP corresponds to a MIMO type or a MISO type.

For example, a PLP_MOD field value, i.e., the constellation size may be decided by a combination with the PLP_MIMO_TYPE field. If the PLP_MIMO_TYPE field value indicates the MISO, the PLP_MOD field may be used for symbol re-mapping. If the PLP_MIMO_TYPE field value indicates the MIMO, after performing MIMO processing, the PLP_MOD field may be interpreted as a constellation size having a spectrum effect, as a result of the MIMO processing.

A PLP_ROTATION field is assigned with 1 bit and may indicate whether or not constellation rotation and re-mapping of the PLP has been used.

A PLP_FEC_TYPE field is assigned with 2 bits and may indicate an FEC type of the corresponding PLP.

A PLP_NUM_BLOCKS_MAX field is assigned with 10 bits and may indicate a maximum number of PLPs included in the FEC blocks.

A FRAME_INTERVAL field is assigned with 8 bits and may indicate a T2 frame interval within a super frame, when inter-frame interleaving is applied.

A TIME_IL_LENGTH field is assigned with 8 bits and may indicate a time interleaver length (or depth).

A TIME_IL_TYPE field is assigned with 1 bit and may indicate the time interleaver type.

An IN_BAND_FLAG field is assigned with 1 bit and may indicate whether or not in-band signaling exists.

A RESERVED_1 field is assigned with 16 bits and corresponds to a field that is reserved in the PLP loop for a future usage.

The PLP loop may further include a PLP_COMPONENT_TYPE field. The PLP_COMPONENT_TYPE field is assigned with 8 bits and may indicate the type of data (or service component) being transmitted through the corresponding PLP. Therefore, based upon the PLP_COMPONENT_TYPE field, the receiver may be capable of determining whether the type of the component being transmitted through the corresponding PLP corresponds to base layer video component, an enhancement layer video component, an audio component, or a data component.

According to an embodiment of the present invention, the PLP group may also be referred to as an LLP (Link-Layer-Pipe), and the PLP_GROUP_ID field may also be referred to as an LLP_ID field. Most particularly, an NIT, which is to be described later on, includes a PLP_GROUP_ID field, which is identical to the PLP_GROUP_ID field included in the L1 signaling information. And, the NIT may also include a transport_stream_id field for identifying a transmission stream related to the PLP group. Therefore, by using the NIT, the receiver may be capable of knowing to which PLP group a specific stream is related. More specifically, in order to simultaneously decode streams (e.g., TSs) being transmitted through PLPs having the same PLP_GROUP_ID, the streams that are indicated by the transport_stream_id field of the NIT may be merged, thereby being capable of recovering a single service stream.

Therefore, when the broadcasting signal is being transmitted in a TS format, the receiver may merge the PLPs having the same PLP_GROUP_ID field, so as to recover the initial (or original) TS.

If the broadcasting signal is transmitted in an IP format, the receiver may use the PLP_GROUP_ID field, so as to locate and find the service components related to a single service. And, by merging such service components, a single service may be recovered. Accordingly, the receiver should be capable of simultaneously receiving PLPs having the same PLP_GROUP_ID.

In FIG. 47, since the fields included in the configurable L1-post-signaling information and significance of the values of each field are merely examples given to facilitate the understanding of the present invention, and since the fields that can be included in the configurable L1-post-signaling information and the significance of the respective field values may be easily modified by anyone skilled in the art, the present invention will not be limited only to the examples given herein.

FIG. 48 illustrates an exemplary syntax structure of dynamic L1-post-signaling information according to an embodiment of the present invention. The dynamic L1-post-signaling information may include parameters required by the receiver for decoding a PLP and, more particularly, the dynamic L1-post-signaling information may include characteristic information corresponding to a signal frame that is currently being transmitted. Additionally, the dynamic L1-post-signaling information may also be signaled to an in-band, so that that the receiver can efficiently process slicing.

The fields being included in the dynamic L1-post-signaling information of FIG. 48 will hereinafter be described in detail.

A FRAME_IDX field is assigned with 8 bits and may indicate an index of a current signal frame within the super frame. For example, an index of the first signal frame within the super frame may be set to 0.

A SUB_SLICE_INTERVAL field is assigned with bits and may indicate a number of OFDM cell existing between two sub-slices within the same PLP.

A TYPE_2_START field is assigned with 22 bits and may indicate a starting position among the OFDM cells of the Type2 data PLPs.

An L1_CHANGE_COUNTER field is assigned with 8 bits and may indicate a number of super frame that remain before the L1 configuration (e.g., contents of the fields included in the L1 pre signaling or content of a configurable part in the L1 post signaling).

A START_RF_IDX field is assigned with 3 bits and may indicate a start RF index of a next signal frame.

A RESERVED_1 field is assigned with 8 bits and corresponds to a field that is reserved for a future usage.

A NEXT_NGH_FRAME field is assigned with 8 bits and corresponds to a field that is used only when the LSB of the S2 field is equal to 1, i.e., when the S2 field is expressed as S2='xxx1'. A NEXT_NGH_SUPERFRAME field indicates a number of T2 or FEF frames existing between the first T2 frame within the next super frame, which includes an NGH frame, and the next NGH frame. The NEXT_NGH_FRAME field and the NEXT_NGH_SUPERFRAME field may be used by the receiver for calculating a hopping amount for hopping to the next NGH frame. More specifically, the NEXT_NGH_FRAME field and the NEXT_NGH_SUPERFRAME field provide an efficient hopping mechanism, when a large number of T2 frames are mixed with the FEF, and when not all of the FEFs are used only for the NGH frames. Most particularly, the receiver may perform hopping to the next NGH frame without having to detect the P1 signaling information of all signal frames existing in the super frame and to decode the detected P1 signaling information.

Subsequently, a for loop (hereinafter referred to as a PLP loop), which is repeated as many times as the number of PLPs existing within the current super frame (NUM_PLP field value-1), is signaled.

A PLP_ID field, a PLP_START field, and a PLP_NUM_BLOCKS field are included in the PLP loop. And, the corresponding field will hereinafter be described in detail.

The PLP_ID field is assigned with 8 bits and may indicate an identifier identifying a PLP.

The PLP_START field is assigned with 22 bits and may indicate a starting position of OFDM cells of the current PLP.

The PLP_NUM_BLOCKS field is assigned with 10 bits and may indicate a number of FEC blocks related to the current PLP.

A RESERVED_2 field is assigned with 8 bits and corresponds to a field included in the PLP loop that is reserved for a future usage.

A RESERVED_3 field is assigned with 8 bits and corresponds to a field that is reserved for a future usage.

Field included in an auxiliary stream loop will hereinafter be described.

Subsequently, a for loop (hereinafter referred to as an auxiliary stream loop), which is repeated as many times as the number of auxiliary streams (NUM_AUX field value-1), is signaled, and a 48-bit AUX_RFU field is included herein for a future usage.

In FIG. 48, since the fields included in the dynamic L1-post-signaling information and significance of the values of each field are merely examples given to facilitate the understanding of the present invention, and since the fields that can be included in the dynamic L1-post-signaling information and the significance of the respective field values may be easily modified by anyone skilled in the art, the present invention will not be limited only to the examples given herein.

Meanwhile, the present invention may signal a PLP or a correlation between a PLP and service components, by using at least one of the PLP_GROUP_ID field, the PLP_TYPE field, the PLP_PROFILE field, and the PLP_COMPONENT_TYPE field of the PLP loop within the configurable L1-post-signaling information. Additionally, the present invention may also know the operation characteristics, such as the mobile performance and data communication characteristics, of the PLP by using the PLP_COD field and the PLP_MOD field.

Hereinafter, a signaling method for signaling a PLP or a correlation between a PLP and service components, by using the PLP_ID field, the PLP_GROUP_ID field, the PLP_COMPONENT_TYPE field, and the PLP_PROFILE field, will be described in detail.

Hereinafter, the present invention provides a signaling method according to 4 different exemplary embodiments of the present invention. The 4 different exemplary embodiments may be divided into cases when the broadcast signal is being transmitted in a TS format and cases when the broadcast signal is being transmitted in an IP format. In the description of the present invention, the first exemplary embodiment to the third exemplary embodiment correspond to a signaling method wherein the broadcast signal is transmitted in the TS format, and the fourth exemplary embodiment corresponding to a signaling method wherein the broadcast signal is transmitted in the IP format.

Each exemplary embodiment of the present invention will be described in detail as presented below.

The first embodiment of the present invention corresponds to a signaling method enabling the receiver to merge PLPs included in the same PLP group by using the correlation between the PLP group, which is included in the L1 signaling information region, and a service, thereby enabling the receiver to recover a transport stream.

Just as in the first embodiment of the present invention, in addition to enabling the receiver to merge PLPs included in the same PLP group by using the correlation between the PLP group, which is included in the L1 signaling information region, and a service, thereby enabling the receiver to recover a transport stream, the second embodiment of the present invention corresponds to a signaling method also enabling the receiver to selectively receive desired PLPs in accordance with the receiver characteristic, by using the correlation between a component, which configures the service included in the PLP, and a service.

The third embodiment of the present invention is similar to the second embodiment of the present invention. However, the third embodiment of the present invention corresponds to a signaling method enabling information associated with the component, which configures the same service, to be transmitted through a base PLP, and enabling the receiver to selectively receive a PLP, which configures the service desired by the receiver, in the physical layer.

The fourth embodiment of the present invention corresponds to a signaling method respective to a case when the broadcast signal is being transmitted in an IP format. In the signaling method according to the fourth embodiment of the present invention, the receiver may merge the component being transmitted by the PLPs included in the same PLP group, by using a correlation between a service and a PLP, which transmits the components being included in the service, and then the receiver may recover a service.

The signaling of L1 signaling information, L2 signaling information, PAT/PMT, and so on, respective to the correlation between the PLPs, the TSs (or IP streams), the service, and the components according to first to fourth embodiments of the present invention may be performed by the input pre-processor or input processor of the broadcasting signal transmitting device (or transmitter), or may be performed by the BICM module.

According to an embodiment of the present invention, when the input stream corresponds to a TS stream, the input pre-processor of FIG. 7 may perform signaling of the L1 signaling information and L2 signaling information and may generate PLPs including PAT/PMT and component PLPs configuring a service. Herein, the L2 signaling information may include NIT, SDT, and so on.

According to another embodiment of the present invention, when the input stream corresponds to a TS stream, the input pre-processor shown in FIG. 11 may perform signaling of the L1 signaling information and L2 signaling information, and may generate PLPS including ESG, provider information, bootstrap information, and so on, and component PLPs configuring a service. Herein, the L2 signaling information may an IP information table.

According to yet another embodiment of the present invention, signaling of the L1 signaling information, shown in FIG. 46 to FIG. 48, may be performed by an L1 signaling generator included in the input processor or an L1 signaling generator included in the BICM module.

At this point, PLPs generated from the input pre-processor may be encoded by using the MISO method and then transmitted, or may be encoded by using the MIMO method and then transmitted. In the present invention, the PLP data being transmitted by using the MISO method may be referred to as MISO PLP data, and the PLP data being transmitted by using the MIMO method may be referred to as MIMO PLP data. According to the embodiment of the present invention, the MIMO PLP data may be processed with MIMO encoding by the MIMO encoder of the BICM module shown in FIG. 17, and the MISO PLP data may be processed with MISO encoding by the MISO encoder of the OFDM generator shown in FIG. 17. Additionally, according to the embodiment of the present invention, the L1 signaling information may also be processed with MISO encoding by the MISO encoder of the OFDM generator shown in FIG. 19.

Meanwhile, according to an embodiment of the present invention, in the broadcasting signal receiving device (also referred to as a receiver), decoding may be performed on PLPs including L1/L2 signaling information having the correlation between the PLP, TS (or IP stream), service, components signaled thereto, PAT/PMT or ESG, provider information, bootstrap information, and so on, and on PLPs including components by any one of a frame demapper, BICM decoder, output processor of FIG. 31 to FIG. 34.

At this point, according to the embodiment of the present invention, the MISO PLP data, which are MISO encoded and received, may be MISO decoded by the OFDM demodulator of FIG. 28, and the MIMO PLP data, which are MIMO encoded and received, may be MIMO decoded by the BICM decoder of 32. Additionally, according to the embodiment of the present invention, the L1 signaling information may be MISO decoded by the MISO decoder of the OFDM demodulator of FIG. 28. And, the process of selecting any one of the MISO PLP data and the MIMO PLP data and performing decoding on the selected PLP data may vary depending upon the first to fourth embodiments of the present invention. More specifically, according to any one of the first to fourth embodiments of the present invention, the present invention may be capable of knowing the PLPs in which the components configuring a service are included. As a result, the PLPs configuring a specific service may be selected and outputted from the frame demapper of FIG. 31, and the selected and outputted PLPs may be processed with error correction decoding by the BICM Decoder of FIG. 32, thereby being merged as a single service by the output processor of FIG. 34.

According to another embodiment of the present invention, when the input stream corresponds to a TS format, the broadcasting signal receiving device of FIG. 35 may perform the above-described process. More specifically, any one of the frame demapper (210200), the PLP deinterleaving and demodulator module (210500), the L1 decoder (210300), the BBF decoder and null packet reconstruction module (210600) may perform decoding on the PLPs including L1/L2 signaling information having the correlation between the PLP, TS, service, and components signaled thereto, and on PLPs including components. Most particularly, according to the embodiment of the present invention, in the present invention, the L1 decoder (210300) decodes the PLP including L1/L2 signaling information having the correlation between the PLP, TS, service, and components signaled thereto and also including PAT/PMT, and, based upon the decoding result of the L1 decoder (210300), the PLP selecting module (210400) control the frame demapper (210200) so that only the PLPs of the components configuring the specific service can be outputted from the frame demapper (210200). The PLPs that are selected and outputted from the frame demapper (210200) pass through the respective PLP deinterleaving and demodulator module and the respective BBF decoder and null packet reconstruction module, so as to be merged to a single service in the TS merger. In the present invention, the PLP transmitting the PSI/SI and, more particularly, the PAT/PMT will be referred to as a base PLP.

According to yet another embodiment of the present invention, when the input stream corresponds to an IP stream format, the broadcasting signal receiving device of FIG. 36 may perform the above-described process. More specifically, any one of the frame demapper (220200), the PLP deinterleaving and demodulator module (220500), the L1 decoder (220300), and the BBF decoder (220600) may perform decoding on the PLPs including L1/L2 signaling information having the correlation between the PLP, IP stream, service, and components signaled thereto, ESG, bootstrap information, provider information, and so on, and on PLPs including components. Most particularly, according to the embodiment of the present invention, in the present invention, the L1 decoder (210300) decodes the PLP including L1/L2 signaling information having the correlation between the PLP, IP stream, service, and components signaled thereto and also including ESG, bootstrap information, provider information, and so on, and, based upon the decoding result of the L1 decoder (220300), the PLP selecting module (220400) control the frame demapper (220200) so that only the PLPs of the components configuring the specific service can be outputted from the frame demapper (220200). The PLPs that are selected and outputted from the frame demapper (220200) pass through the respective PLP deinterleaving and demodulator module and the respective BBF decoder, thereby being outputted to the respective buffer. The description presented above may be applied to at least one of the first to fourth embodiments of the present invention, which are presented below.

Hereinafter, each embodiment will be described in more detail.

Figure 49:
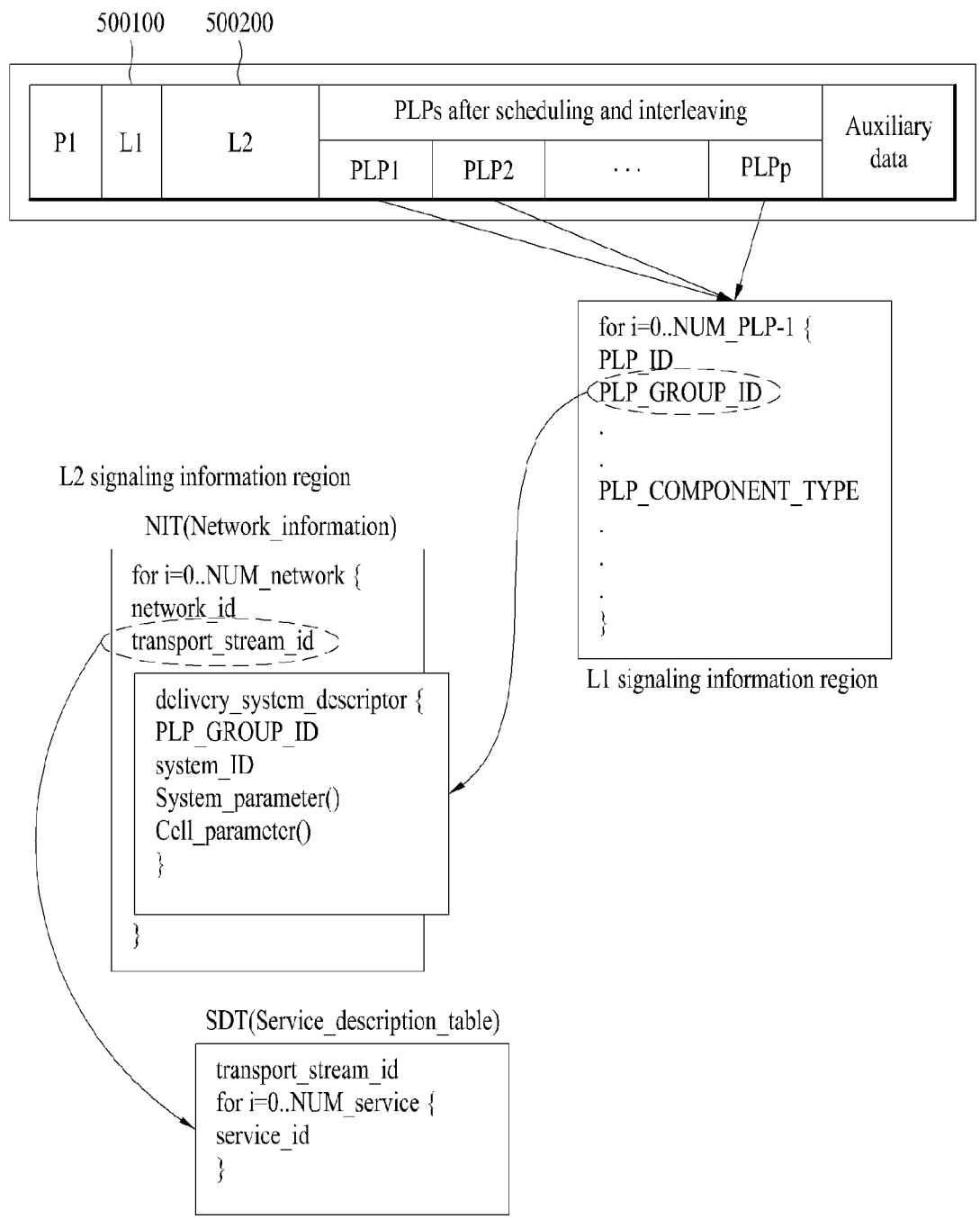
FIG. 49 illustrates a conceptual diagram of a correlation between a service and a PLP group according to a first embodiment of the present invention.
Figure 51:
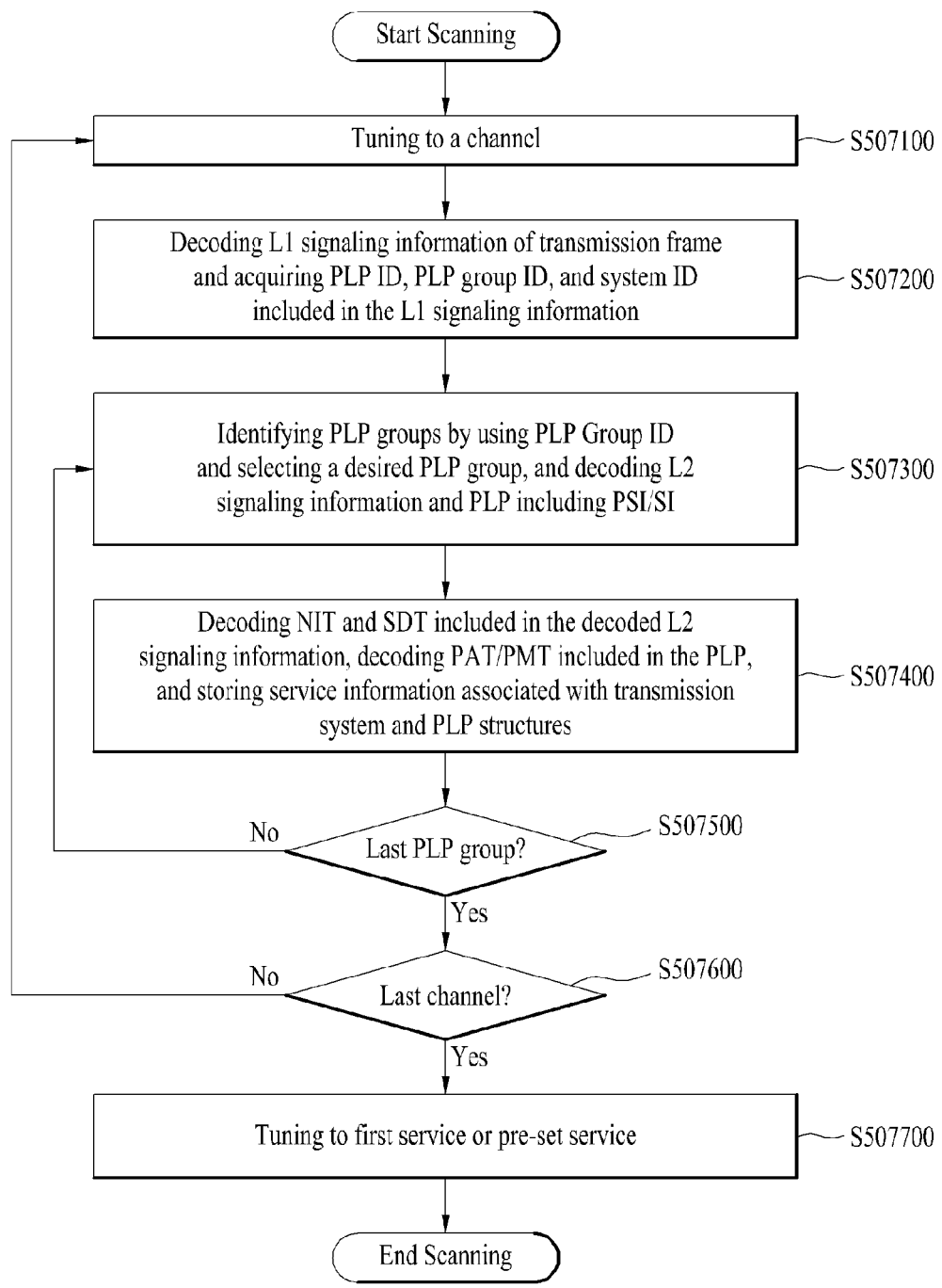
FIG. 51 illustrates a flow chart showing the process steps of a service scanning method of a receiver according to the first embodiment of the present invention.

First Embodiment (FIG. 49 to FIG. 51)

FIG. 49 illustrates a conceptual diagram of a correlation between a service according to the first embodiment of the present invention and a PLP group.

In case of transmitting a broadcast signal of a TS format, the first embodiment of the present invention corresponds to a signaling method for recovering a transport stream of a single service by acquiring a service ID from the receiver, by using a PLP group ID associated to the acquired service ID, and by merging multiple PLPs being included in the same PLP group.

As shown in FIG. 49, the L1 signaling information region (500100) according to the first embodiment of the present invention may include information related to each of the multiple PLPs, i.e., a PLP_GROUP ID field, a PLP_ID field, and so on, as shown in FIG. 46 to FIG. 48. Also, the L2 signaling information region (500200) may include an NIT and an SDT.

The NIT may include a PLP_GROUP_ID field, which is identical to the PLP_GROUP_ID field included in the L1 signaling information region (500100), and a transport_stream_id field. By using these fields, the receiver may be capable of knowing to which PLP group a specific transport stream is correlated. Also, the SDT may include a transport_stream_id field, which is identical to the transport_stream_id included in the NIT, and a service_id field. By using these fields, the receiver may be capable of differentiating (or identifying) each of the services being transmitted through a specific transport stream.

Eventually, among the many services included in a specific transport stream, the receiver may identify the desired service by using the service_id field, which is included in the SDT. And, by using the transport_stream_id field and the PLP_GROUP_ID field, which are included in the NIT, the receiver may identify a PLP group, which is related with the specific transport stream. Thereafter, the receiver may receive a PLP having the same PLP_GROUP_ID field, which is included in the L1 signaling information region (500100). More specifically, the receiver may merge multiple PLPs, which are included in a PLP group being correlated with the desired service, so as to recover a transport stream.

In other words, the receiver acquires an identifier of a service, which is selected by the user, from the service_id field of the SDT. And, by mapping the transport_stream_id field of the SDT and the transport_stream_id field of the NIT, a group identifier of the PLPs transmitting the components of the selected service may be acquired from the PLP_GROUP_ID field of the NIT. Subsequently, by mapping the PLP_GROUP_ID field of the NIT and the PLP_GROUP_ID field of the L1 signaling information, each PLP identifier included in the PLP group may be acquired from the PLP_ID field of the corresponding PLP. Thereafter, when the PLPS of the acquired PLP identifiers are merged, a TS configuring a service may be recovered.

Hereinafter, the fields, the NIT, and the SDT being included in the L1 signaling information region (500100) according to the first embodiment of the present invention will be described in detail.

Since the L1 signaling information region (500100) according to the first embodiment of the present invention includes the same fields, which are described with reference to FIG. 46 to FIG. 48, the detailed description of the same will be omitted for simplicity.

The NIT corresponds to a table transmitting information related to the physical structure of a multiplexer/transport stream being transmitted through the network, and diverse information respective to the characteristics of the network itself. The receiver may gain information on the transport stream from the NIT.

The NIT according to the first embodiment of the present invention may include a network_id field, a transport_stream_id field, and a delivery_system_descriptor loop.

Hereinafter, each field included in the NIT shown in FIG. 49 will be described in detail.

The network_id field is used for identifying a network through which the current broadcast signal is being transmitted.

The transport_stream_id field is used for identifying a transport stream that is currently being transmitted.

The delivery_system_descriptor may include fields required (or necessary) for matching the transport stream with the PLP and the transmitting system. Most particularly, the delivery_system_descriptor according to the present invention may include a PLP_GROUP_ID field that is identical to the PLP_GROUP_ID field included in the L1 signaling information.

Furthermore, the delivery_system_descriptor may include a system_id field, system_parameter( ) field and a cell_parameter( ) field.

A system_id field is used for identifying a system that is unique to the broadcast network performing transmission.

A system_parameters( ) field may include parameters indicating the transmitting system characteristics, such as whether the communication is performed in a SISO/MIMO mode, a bandwidth, a guard interval, a transmission mode, and so on.

A cell_parameters( ) field may include parameters indicating cell information, such as a center frequency, a cell identifier, and so on.

The SDT corresponds to a table including information on multiple services, which are included in a single transport stream. The SDT according to the first embodiment of the present invention may include a transport_stream_id field, and a service loop. And, the service loop may include a service_id field and is repeated as many times as the number of services included in a transmission frame.

Hereinafter, each field included in the SDT shown in FIG. 49 will be described in detail.

Since the transport_stream_id field is identical to the transport_stream_id field, which is included in the NIT, a detailed description of the same will be omitted for simplicity. The service_id field is used for identifying multiple services included in the transmission frame.

FIG. 50 shows a delivery_system_descriptor field of the NIT of FIG. 49 according to the first embodiment of the present invention. Herein, the delivery_system_descriptor field is used for connecting the PLP_GROUP_ID field of the L1 signaling information region 500100 to the transport stream.

As shown in FIG. 50, the delivery_system_descriptor may include a descriptor_tag field, a descriptor_length field, a system_id field, a PLP_GROUP_ID field, and a first loop.

The first loop is used when the descriptor_length field has a size larger than 3. And, in this case, the first loop may include a system_parameters( ) field and a second loop.

The second loop may include a cell_parameters( ) field.

Hereinafter, each field will be described in detail.

The descriptor_tag field is used for identifying each descriptor.

The descriptor_length field is used for indicating a total length of the data portion of each descriptor.

The system_id field is used for identifying a system that is unique to the broadcast network performing transmission.

The PLP_GROUP_ID field may identify a PLP group that is to be matched and merged with the transport_stream_id field. Since the essential details of the PLP_GROUP_ID field are identical to those of the PLP_GROUP_ID field shown in FIG. 34, a detailed description of the same will be omitted for simplicity.

Since the system_parameters( ) field included in the first loop and the cell_parameters( ) field included in the second loop are identical to those described in FIG. 49, a detailed description of the same will be omitted for simplicity.

FIG. 51 illustrates a flow chart showing the process steps of a service scanning method of the receiver according to the first embodiment of the present invention.

The receiver receives a TP type broadcast signal transmitted in a specific channel through tuning (S507100). In this case, in order to receive a service desired by the user, the receiver requires information on the service included in the transmission frame, which is being transmitted through the respective channel. Although this process step is not shown in the drawing, this process step may be performed by the tuner of the receiver and may be modified or varied in accordance with the intentions of the system designer.

Then, the receiver may decode the L1 signaling information included in the transmission frame, so as to acquire a PLP ID, a PLP Group ID, and a system ID, which are included in the transmission frame (S507200). Thereafter, the receiver may identify the PLP groups by using the decoded PLP Group ID, so as to select the desired PLP group, and may decode the PLP including the L2 signaling information and the PSI/SI (S507300). The receiver may decode the NIT and the SDT included in the decoded L1 signal information, and the receiver may also decode a PAT/PMT included in the PLP, thereby being capable of storing service information associated with the transmitting system and the PLP structure (S507400). The service information according to the present invention may include a service ID for identifying a service.

Subsequently, the receiver may determine whether or not the currently selected PLP group corresponds to the last PLP group (S507500).

Based upon the determined result, when it is determined that the selected PLP group does not correspond to the last PLP group, the receiver may return to the process step S507300, so as to select the next PLP group. Alternatively, when it is determined that the selected PLP group corresponds to the last PLP group, the receiver may determine whether or not the current channel corresponds to the last channel (S507600).

Then, based upon the determined result, when it is determined that the current channel does not correspond to the last channel, the receiver may return to the process step S507100, so as to tune to the next channel. And, alternatively, when it is determined that the current channel corresponds to the last channel, the receiver may use the stored service information so as to tune to a first service or a pre-set service (S507700).

If the broadcasting signal receiving device has the same structure as FIG. 27 or FIG. 47, as described above, the decoding of the PLPs including the L1 signaling information, the L2 signaling information, the PLPs transmitting the PSI/SI, and the PLPs including components may be performed by at least one of the frame demapper, the BICM decoder, and the output processor. If the broadcasting signal receiving device has the same structure as FIG. 35, the decoding of the PLPs including the L1 signaling information, the L2 signaling information, the PLPs transmitting the PSI/SI, and the PLPs transmitting components may be performed by at least one of the frame demapper, the PLP deinterleaving and demodulator module, the L1 decoder, the BBF decoder, and the null packet reconfigurating module. Also, the scanning process may be performed by a separate controller.

Figure 52:
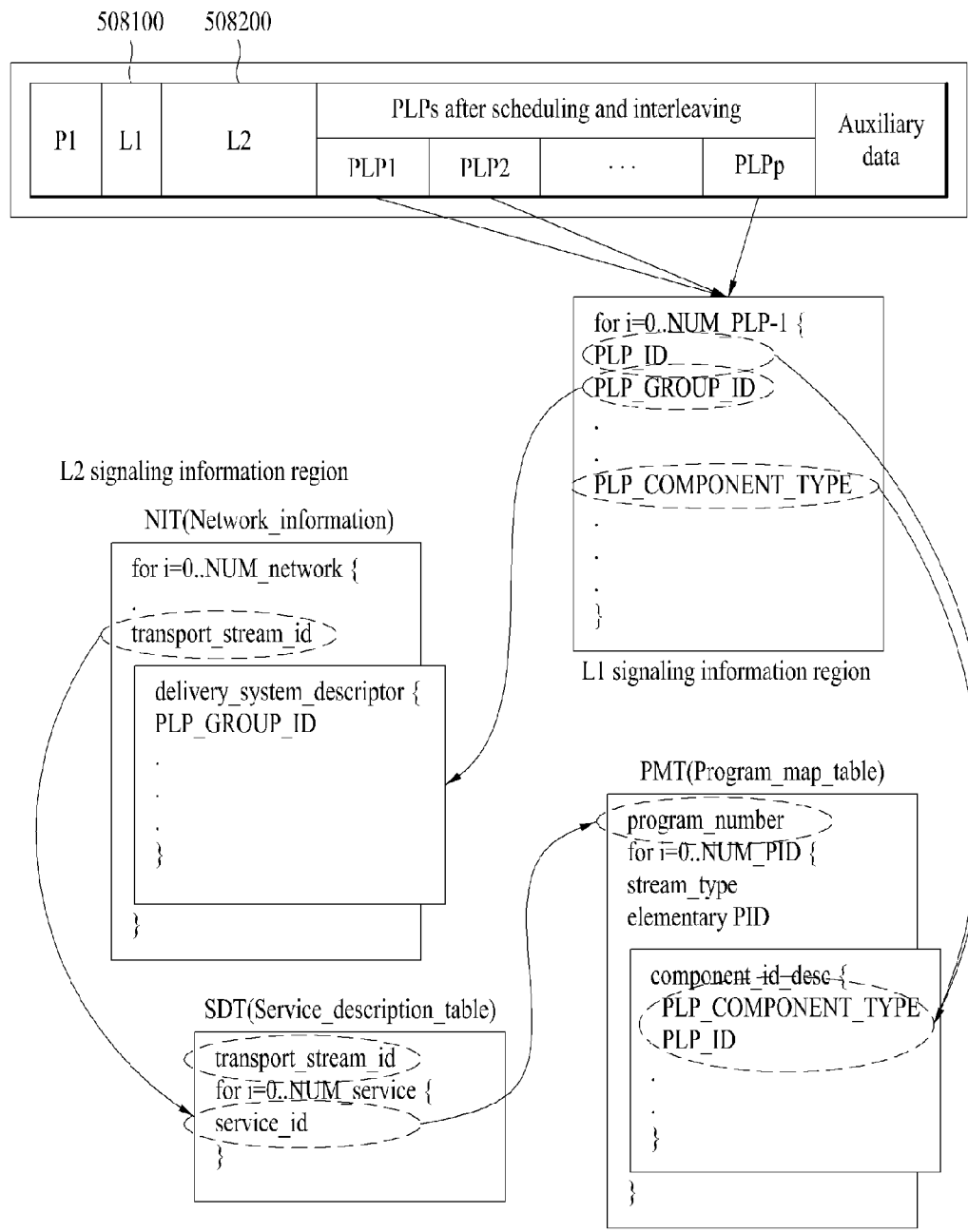
FIG. 52 illustrates a conceptual diagram of a correlation between a service and a PLP group according to a second embodiment of the present invention.
Figure 54:
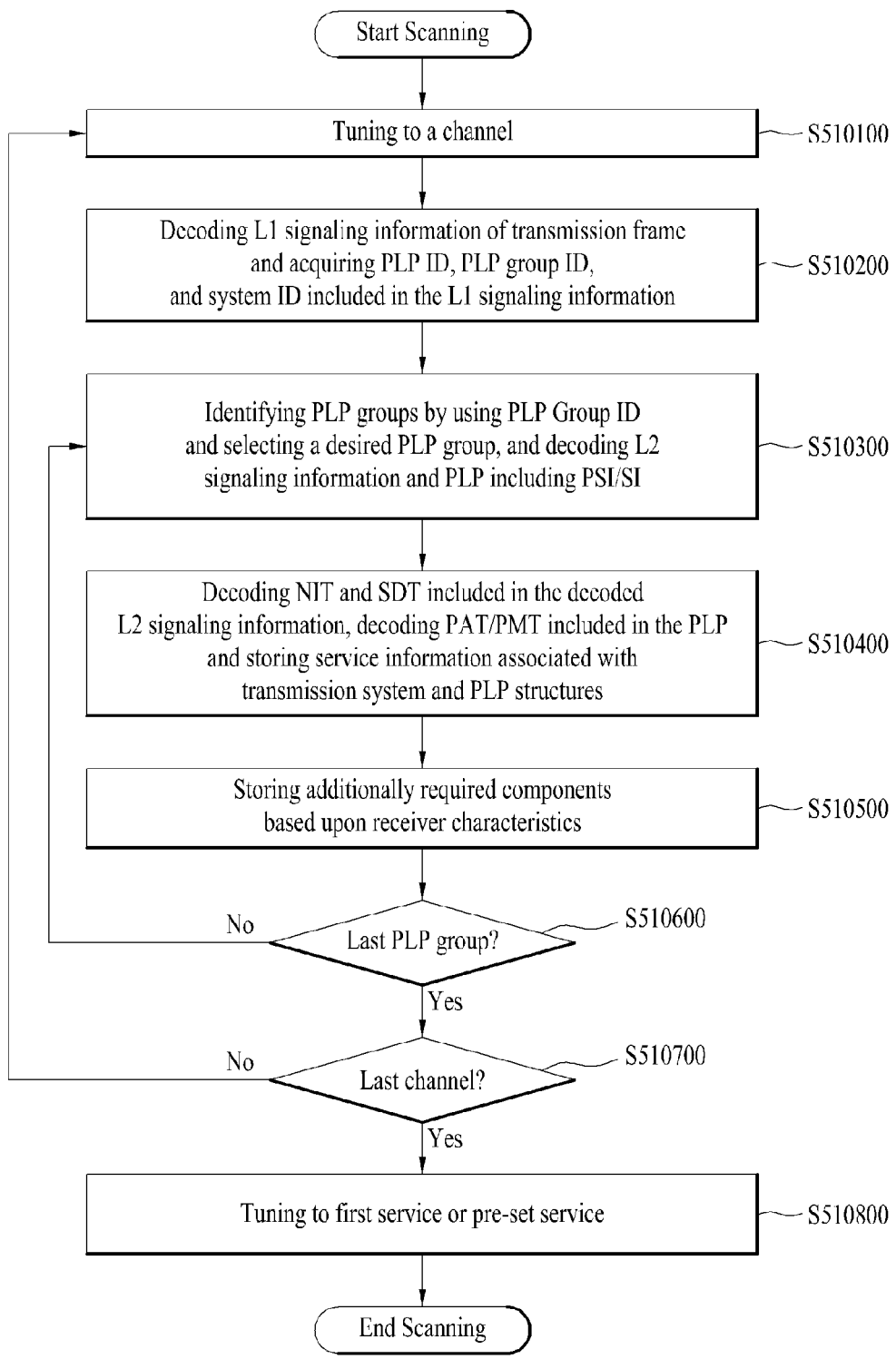
FIG. 54 illustrates a flow chart showing the process steps of a service scanning method of a receiver according to the second embodiment of the present invention.

Second Embodiment (FIG. 52 to FIG. 54)

FIG. 52 illustrates a conceptual diagram of a correlation between a service according to the second embodiment of the present invention and a PLP group.

The first embodiment of the present invention corresponds to a signaling method using a PLP Group ID and a service ID. And, in this case, the receiver may use a correlation between a service and a PLP group one a service level, so as to recover a service.

However, depending upon the characteristics of the receiver, when data of an enhancement layer is to be selectively decoded so as to provide a high picture quality image, the signaling method according to the first embodiment of the present invention is disadvantageous in that the information on a video stream, which is included in the PLP, cannot be acquired.

Therefore, according to the second embodiment of the present invention, when receiving a TS format broadcast signal, in addition to the signaling method using the correlation between a service and a PLP group, a signaling method that can determine the type of the current transport stream and that can acquire information related to the components included in each PLP, thereby being capable of selectively receiving the transport stream and the PLP based upon the acquired information.

As shown in FIG. 52, the L1 signaling information region 508100 according to the second embodiment of the present invention may include diverse information related to each of the multiple PLPs, i.e., a PLP_GROUP ID field, a PLP_ID field, a PLP_COMPONENT_TYPE field, and so on. Also, the L2 signaling information region field 508200 may include an NIT and an SDT. Herein, the NIT may include a PLP_GROUP_ID field, which is identical to the PLP_GROUP_ID field included in the L1 signaling information region 508100, and a transport_stream_id field. By using these fields, the receiver may be capable of knowing to which PLP group a specific transport stream is correlated. Also, the SDT may include a transport_stream_id field, which is identical to the transport_stream_id included in the NIT, and a service_id field. By using these fields, the receiver may be capable of differentiating (or identifying) each of the services being transmitted through a specific transport stream. Additionally, since the PMT include a program_number field, which matches with the service_id field included in the SDT, the receiver may use the program_number field so as to verify a program number included in the selected service. Moreover, since the PMT includes a stream type field, a PLP_ID field, and a PLP_COMPONENT_TYPE field, the receiver may determine the type of the current stream by using the stream type field. And, by using the PLP_COMPONENT_TYPE field, the receiver may determine the type of the component included in the current PLP, so as to selectively receive the PLP.

Eventually, as described in the first embodiment of the present invention, the receiver may acquire the service_id field from the SDT, so as to be capable of identifying a desired service, among a plurality of services included in a transmission frame. Then, by using the NIT, the receiver may identify a PLP group, which is related to a specific transport stream transmitting the service. Thereafter, the receiver may receive a PLP having a PLP_GROUP_ID field included in the L1 signaling information, thereby being capable of recovering a service stream. Additionally, the receiver may also use the component information included in the PLP, so as to selectively receive the PLP and to be capable of providing an image best-fitting the receiver characteristic.

Hereinafter, the fields, the NIT, and the SDT being included in the L1 signaling information according to the second embodiment of the present invention will be described in detail.

Since the L1 signaling information according to the second embodiment of the present invention includes the same fields, which are included in the L1 signaling information region described with reference to FIG. 46 to FIG. 48, and since the NIT and the SDT are identical to the NIT and SDT described with reference to FIG. 49, detailed description of the same will be omitted for simplicity. The PMT corresponds to a table including information indicating or identifying the types of the streams being included in each service or PID information for identifying the streams.

The PMT according to the second embodiment of the present invention may be transmitted through a PLP, and the transmitting end may process and transmit the PMT as data. Furthermore, the PMT may also include a program_number field, and a PID loop.

Hereinafter, each field included in the PMT shown in FIG. 52 will be described in detail.

A program_number field is used for identifying each program (or service) within the current transport stream. Herein, the program_number field is matched with the service_id field of the SDT. The PID loop may include PID information (elementary_PID) of a TS packet to which individual bit streams, such as video, audio, and so on, are being transmitted, wherein the individual bit streams configure a program or (service), a stream_type field, and a component_id_descriptor. Herein, the PID information is a PID of a TS packet transmitting each stream, such as video, audio, and so on, configuring a program (or service). A stream_type field represents encoding information and a type of an ES which is included in a TS packet having a PID value that is expressed in the elementary_PID field. Examples of the streams types according to the present invention may include an SVC stream, an AVC stream, and so on.

An elementary_PID field represents an identifier of an ES (Elementary Stream). That is, it is a field used for identifying a TS packet trasnmitting the ES.

A component_id_descriptor may include a PLP_ID field and a PLP_COMPONENT_TYPE field. Herein, since the PLP_ID field and the PLP_COMPONENT_TYPE field are identical to the PLP_ID field and the PLP_COMPONENT_TYPE field, which are included in the L1 signaling, a detailed description of the same will be omitted for simplicity.

Therefore, when multiple stream types exist, the receiver may identify a specific stream by using the stream_type field and may select the identified stream. Also, by using the PLP_COMPONENT_TYPE field, the receiver may also determine whether the component being transmitted by the PLP corresponds to a base layer or an enhancement layer, and the receiver may then selectively decode the PLP of the enhancement layer in accordance with the receiver characteristic.

FIG. 53 corresponds to an exemplary component_id_descriptor which is included in FIG. 52. Herein, the component_id_descriptor field is being used for connecting the PLP_COMPONENT_TYPE field of the L1 signaling information region 508100 to the transport stream.

The component_id_descriptor may include a descriptor_tag field, a descriptor_length field, a system_id field, a PLP_ID field, and a PLP_COMPONENT_TYPE field. Herein, the PLP_ID field is used for identifying a PLP that matches with a PID sub stream of the corresponding stream type.

Since the contents of each field are identical to those described in FIG. 47 and FIG. 50, detailed description of the same will be omitted for simplicity.

FIG. 54 illustrates a flow chart showing a service scanning method of the receiver according to a second embodiment of the present invention.

The receiver receives a broadcasting signal having a TS format and being transmitted to a specific channel via tuning (S510100). In this case, in order to receive a service that is wanted (or desired) by the user, diverse information that can identify the service included in the transmission frame, which is being transmitted through the channel, is required. Although this process is not shown in the drawing, the corresponding process may be performed by the tuner of the receiver and may be modified and varied in accordance with the intentions of the system designer.

Then, the receiver may decode the L1 signaling information included in the transmission frame, so as to acquire a PLP ID, a PLP Group ID, and a system ID, which are included in the transmission frame (S510200). Thereafter, the receiver may identify the PLP groups by using the decoded PLP Group ID, so as to select the desired PLP group, and may decode the PLP including the L2 signaling information and the PSI/SI (S510300). The receiver may decode the NIT and the SDT included in the decoded L1 signal information, and the receiver may also decode a PAT/PMT included in the PLP, thereby being capable of storing service information associated with information on the structures of the transmitting system and the PLP (S510400). The service information according to the present invention may include a service ID for identifying a service.

Additionally, the receiver may use the stream_type field and the PLP_COMPONENT_TYPE field included in the decoded PMT, so as to verify the type of the component being transmitted by the current PLP, and then the receiver may store the component that is to be additionally received in accordance with the receiver characteristics (S510500). More specifically, the receiver may use the above-described stream_type and PLP_component_type information, so as to additionally receiver/store a component corresponding to the service, which may be provided in accordance with the receiver characteristic.

Subsequently, the receiver may determine whether or not the currently selected PLP group corresponds to the last PLP group (S510600).

Based upon the determined result, when it is determined that the selected PLP group does not correspond to the last PLP group, the receiver may return to the process step S510300, so as to select the next PLP group. Alternatively, when it is determined that the selected PLP group corresponds to the last PLP group, the receiver may determine whether or not the current channel corresponds to the last channel (S510600).

Then, based upon the determined result, when it is determined that the current channel does not correspond to the last channel, the receiver may return to the process step S510100, so as to tune to the next channel. And, alternatively, when it is determined that the current channel corresponds to the last channel, the receiver may use the stored service information so as to tune to a first service or a pre-set service (S510700).

If the broadcasting signal receiving device has the same structure as FIG. 27 or FIG. 47, as described above, the decoding of the PLPs including the L1 signaling information, the L2 signaling information, the PLPs transmitting the PSI/SI, and the PLPs including components may be performed by at least one of the frame demapper, the BICM decoder, and the output processor. If the broadcasting signal receiving device has the same structure as FIG. 35, the decoding of the PLPs including the L1 signaling information, the L2 signaling information, the PLPs transmitting the PSI/SI, and the PLPs transmitting components may be performed by at least one of the frame demapper, the PLP deinterleaving and demodulator module, the L1 decoder, the BBF decoder, and the null packet reconfigurating module. Also, the scanning process may be performed by a separate controller.

Third Embodiment (FIG. 55 to FIG. 59)

Figure 55:
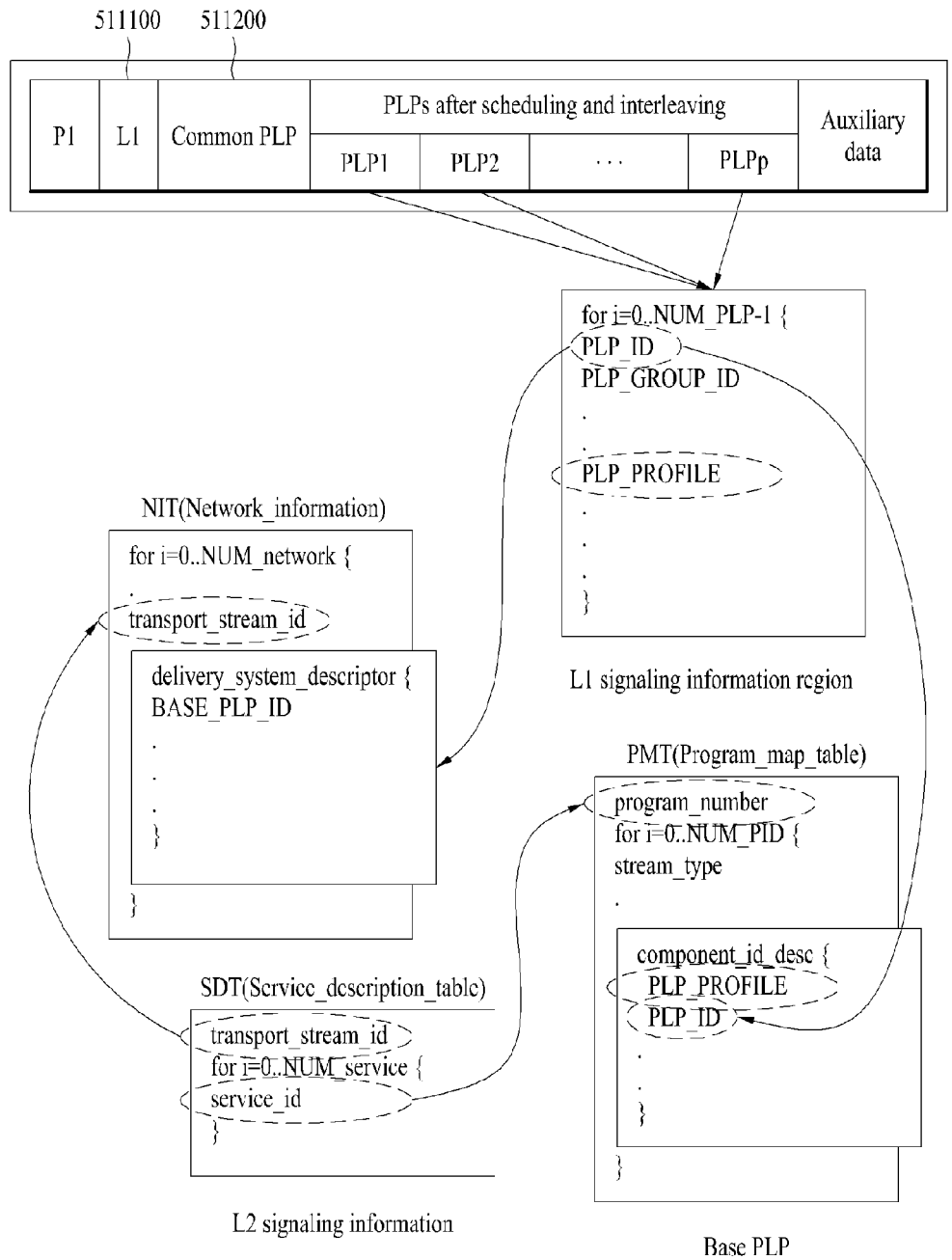
FIG. 55 illustrates a conceptual diagram of a correlation between a service and a PLP group according to a third embodiment of the present invention.

FIG. 55 illustrates a conceptual diagram of a correlation between a service according to the third embodiment of the present invention and a PLP group.

When a channel is scanned by the receiver according to the second embodiment of the present invention, the receiver may not be capable of scanning (or searching through) the entire PLP, which transmits the components included in a single service. Since the components included in each of the multiple services are transmitted through each PLP, a PLP that does not include PSI/SI may also exist.

Therefore, in the third embodiment of the present invention, PSI/SI, such as the PAT/PMT, may be transmitted to a random PLP included in the multiple PLP regions, so that the entire PLP transmitting the components included in a single service can be scanned (or searched). As described above, in the description of the present invention, the PLP transmitting service configuration information, such as the PAT/PMT, may also be referred to as a base PLP. More specifically, when the receiver decodes the base PLP, information on the remaining component PLPs included in a single service may be acquired.

Eventually, according to the third embodiment of the present invention, instead of acquiring signaling information by processing all of the TS, by processing signaling information of the physical layer and by acquiring signaling information included in the base PLP, the signaling information respective to each PLP may be acquired.

As shown in FIG. 55, the L1 signaling information region 511100 according to the third embodiment of the present invention may include information respective to each of the multiple PLPs, i.e., a PLP_GROUP ID field, a PLP_ID field, a PLP_COMPONENT_TYPE field, a PLP_PROFILE field, and so on. Additionally, the L2 signaling information region 511200 may include an NIT and an SDT. Herein, the NIT may include a BASE_PLP_ID field, which is matched with the PLP_ID field being included in the L1 signaling information region 511100. And, by using the BASE_PLP_ID field, the receiver may identify a base PLP, which transmits the PMT/PAT. Furthermore, the SDT may include a transport_stream_id field, which is identical to the transport_stream_id included in the NIT, and a service_id field. And, by using the SDT, the receiver may differentiate each of the services being transmitted through a specific transport stream.

Additionally, since the PMT being transmitted through the base PLP include a program_number field, which is matched with the service_id field included in the SDT, by using the program_number field, the receiver may verify the program number included in the selected service. In addition, the PMT may include a stream_type field, a PLP_ID field, and a PLP_PROFILE field. In this case, by referring to the stream type field included in the PMT, the receiver may recognize the type of the current stream, and by using the PLP_ID field and the PLP_PROFILE filed, the receiver may determine the correlation between the PLP and the component, thereby being capable of decoding the PLP best-fitting the PLP. More specifically, the receiver may use the PLP_PROFILE field included in the PMT, so as to perform decoding on the PLP, which transmits a distinguished service component, such as a standard picture quality service, high picture quality service, and so on, in accordance with the characteristics of the receiver. Thus, the TS best-fitting the receiver characteristics may be recovered.

Eventually, the receiver may identify and select the base PLP by using the BASE_PLP_ID field, which is included in the NIT, and the receiver may decode a PMT, which is transmitted through the base PLP. Additionally, the receiver may identify and select a wanted (or desired) service by using the service_id field, which is included in the SDT. Moreover, in addition to being capable of decoding all of the PLPs that are included in a component, which is included in a single service, by using the PLP_PROFILE field, the receiver may decode a PLP in accordance with the receiver characteristic.

Hereinafter, the L1 signaling information region (511100), the NIT, the SDT, and the PMT according to the third embodiment of the present invention will be described in detail.

Since the L1 signaling information according to the third embodiment of the present invention is identical to the L1 signaling information shown in FIG. 46 to FIG. 48, a detailed description of the same will be omitted for simplicity.

The PLP_PROFILE field may identify whether the corresponding PLP is a mandatory (or required) PLP or an optional (or selective) PLP. For example, in case the component being transmitted through the PLP is identified (or distinguished) as a base layer or an enhancement layer, the PLP transmitting the base layer becomes the mandatory PLP, and the PLP transmitting the enhancement layer becomes the optional PLP. Particularly, the base PLP becomes the mandatory PLP. More specifically, depending upon the receiver characteristic, such as a mobile receiver, a fixed-type receiver, and so on, the receiver may use the PLP_PROFILE field so as to verify by which receiver the component of the broadcast service being transmitted to the current PLP may be used, and depending upon the receiver characteristic, the receiver may determine whether or not to decode the current PLP.

The NIT according to the third embodiment of the present invention is similar to the NIT according to the second embodiment of the present invention, which is described above with reference to FIG. 52. However, unlike the NIT according to the second embodiment of the present invention, the NIT according to the third embodiment of the present invention may further include a BASE_PLP_ID field.

Herein, the BASE_PLP_ID field is used for identifying the base PLP. And, the base PLP may transmit PSI/SI information of a corresponding service, such as the PMT/PAT. Additionally, the BASE_PLP_ID field may be included in a delivery_system_descriptor of the NIT.

The PMT according to the third embodiment of the present invention may include a program_number field and a PID loop. And, the PID loop may include a stream_type field and a component_id_descriptor. Herein, the component_id_descriptor may include a PLP_PROFILE field and a PLP_ID field. The contents of the program_number field and the PLP_ID field are identical to those described above with reference to FIG. 47 and FIG. 52. And, since the PLP_PROFILE field is identical to the PLP_PROFILE field included in the L1 signaling information, a detailed description of the same will be omitted for simplicity.

FIG. 56 illustrates an exemplary delivery system descriptor included in the NIT of FIG. 55.

As shown in FIG. 56, the delivery_system_descriptor according to the third embodiment of the present invention is identical to the delivery_system_descriptor according to the first embodiment of the present invention, which is shown in FIG. 50. However, unlike the delivery_system_descriptor according to the first embodiment of the present invention, the delivery_system_descriptor according to the third embodiment of the present invention may further include a BASE_PLP_ID field. Since the description of the BASE_PLP_ID field is identical to that of FIG. 55, a detailed description of the same will be omitted for simplicity.

FIG. 57 illustrates an exemplary component ID descriptor included in the PMT of FIG. 55.

As shown in FIG. 57, the component_id_descriptor, which is included in the PID loop of the PMT according to the third embodiment of the present, is identical to the component_id_descriptor according to the second embodiment of the present invention, which is shown in FIG. 52. However, the component_id_descriptor according to the third embodiment of the present invention may include a PLP_PROFILE field instead of the PLP_COMPONENT_TYPE field. Herein, since the description of the PLP_PROFILE field is identical to that of FIG. 55, a detailed description of the same will be omitted for simplicity.

Figure 58:
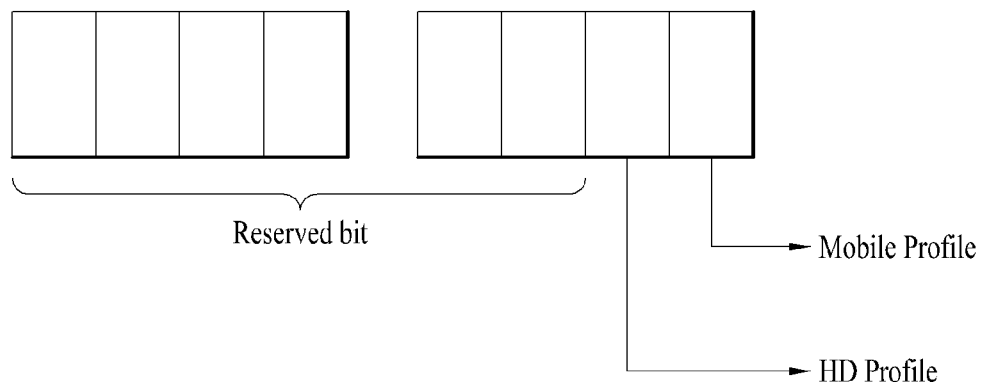
FIG. 58 illustrates an exemplary PLP_PROFILE field according to the third embodiment of the present invention.

FIG. 58 illustrates an exemplary PLP_PROFILE field according to the third embodiment of the present invention.

As shown in FIG. 58, the PLP_PROFILE field may provide information in a bit-unit selector format.

The PLP_PROFILE field may indicate information on a video component in accordance with the field value. For example, when the field value is equal to 0x00, this signifies a common profile and indicates that the video component corresponds to a component that can be received and used by any receiver. When the field value is equal to 0x01, this indicates that the video component corresponds to a component that can be used only by mobile receivers, and when the field value is equal to 0x02, this indicates that the video component corresponds to an HD profile component that can be used only by HD receivers (or fixed receivers). And, when the field value is equal to 0x03, this indicates that the component can be applied to both mobile receivers and HD receivers.

Figure 59:
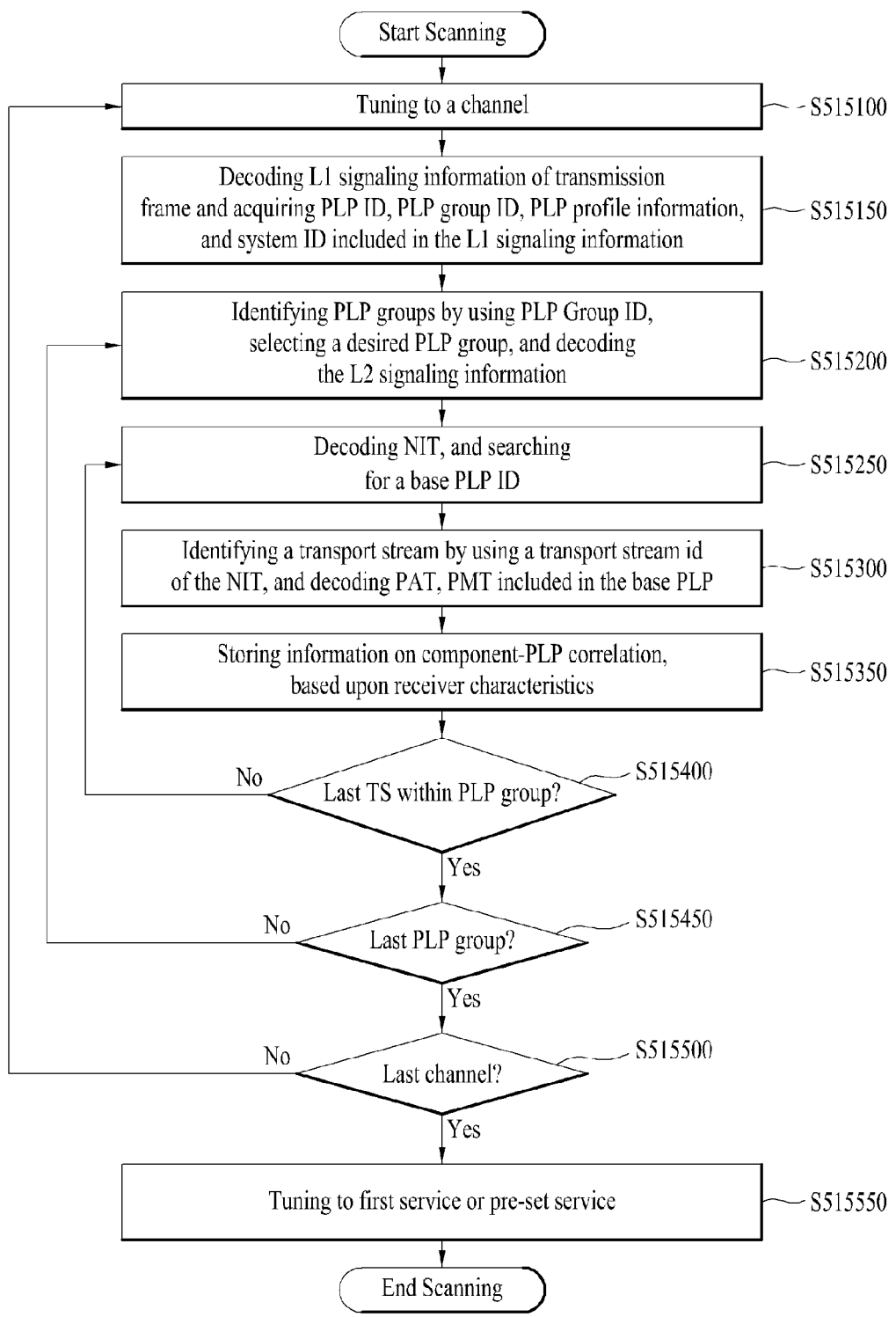
FIG. 59 illustrates a flow chart showing the process steps of a service scanning method of a receiver according to the third embodiment of the present invention.

FIG. 59 illustrates a flow chart showing the process steps of a service scanning method of the receiver according to the third embodiment of the present invention.

The receiver receives a broadcasting signal having a TS format via tuning (S515100). In this case, in order to receive a service that is wanted (or desired) by the user, diverse information that can identify the service included in the transmission frame, which is being transmitted through the channel, is required. Although this process is not shown in the drawing, the corresponding process may be performed by the tuner of the receiver and may be modified and varied in accordance with the intentions of the system designer.

The receiver decodes the L1 signaling information included in the transmission frame, so as to acquire a PLP ID, a PLP group ID, PLP component type information, PLP profile information, system ID, and so on (S515150). Thereafter, the receiver identifies the PLP groups based upon the decoded PLP group ID, so as to select a wanted (or desired) PLP group, and then decodes the L2 signaling information (S515200). Additionally, the receiver decodes the NIT included in the L2 signaling information and uses the BASE_PLP_ID field included in the NIT, so as to find and locate the base PLP of each service (S515250). Subsequently, the receiver may use the transport_stream_id field, which is included in the NIT, so as to identify the transport stream included in the PLP group and to decode the PMT included in the base PLP (S515300). The receiver may use the PLP_PROFILE field, which is included in a component ID descriptor field of the decoded PMT, so as to verify which receiver may use the component of the broadcast service, which is being transmitted to the current PLP in accordance with the receiver characteristic, such as mobile receiver, HD receiver, and so on. Accordingly, by using the PLP_ID field, the receiver may selectively decode the PLP that is requested to be decoded.

Thereafter, the receiver may store the information related to the correlation between the component and the PLP, based upon the receiver characteristic (S515350). The information related to the correlation between the component and the PLP may include the PID information of the PMT and the PLP_id included in the component_ID_descriptor.

Subsequently, the receiver may determine whether or not the current TS corresponds to the last TS within the PLP group (S515400).

When it is determined that the current TS does not correspond to the last TS, the receiver may return to the process step S515250, so as to parse the NIT and to acquire the base PLP by using the BASE_PLP_ID field. Alternatively, when it is determined that the current TS corresponds to the last TS, the receiver may determine whether or not the current PLP group corresponds to the last PLP group (S515450).

When it is determined that the selected PLP group does not correspond to the last PLP group, the receiver may return to the process step S515200, so as to select the next PLP group and to decode a base PLP. Alternatively, when it is determined that the selected PLP group corresponds to the last PLP group, the receiver may determine whether or not the current channel corresponds to the last channel (S515500).

Thereafter, when it is determined that the current channel does not correspond to the last channel, the receiver may return to the process step S515100, so as to tune to the next channel. And, alternatively, when it is determined that the current channel corresponds to the last channel, the receiver may tune to a first service or a pre-set service (S515550).

If the broadcasting signal receiving device has the same structure as FIG. 27 or FIG. 47, as described above, the decoding of the PLPs including the L1 signaling information, the L2 signaling information, the PLPs transmitting the PSI/SI, and the PLPs including components may be performed by at least one of the frame demapper, the BICM decoder, and the output processor. If the broadcasting signal receiving device has the same structure as FIG. 35, the decoding of the PLPs including the L1 signaling information, the L2 signaling information, the PLPs transmitting the PSI/SI, and the PLPs transmitting components may be performed by at least one of the frame demapper, the PLP deinterleaving and demodulator module, the L1 decoder, the BBF decoder, and the null packet reconfigurating module. Also, the scanning process may be performed by a separate controller.

Figure 60:
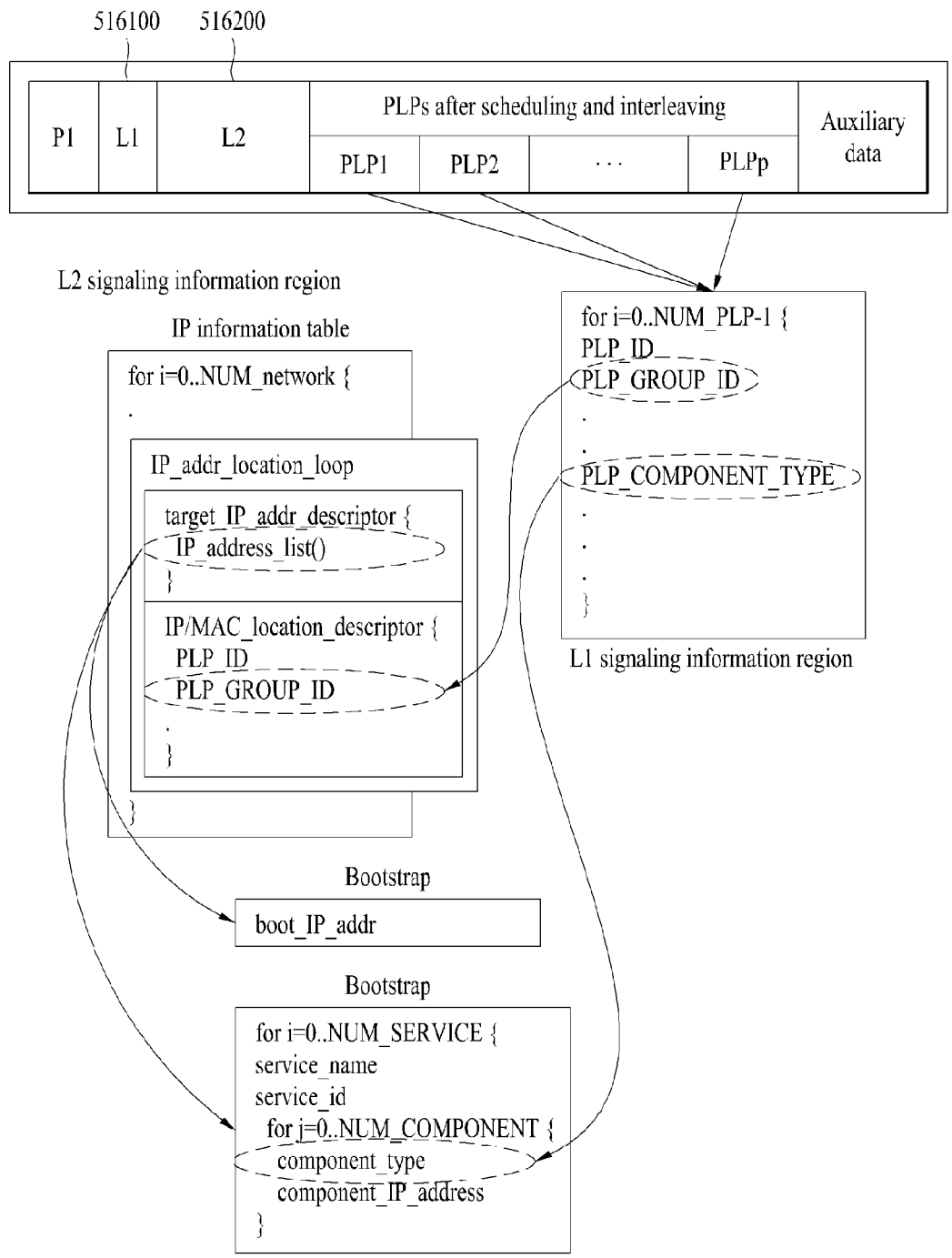
FIG. 60 illustrates a conceptual diagram of a correlation between a service and a PLP group according to a fourth embodiment of the present invention.
Figure 62:
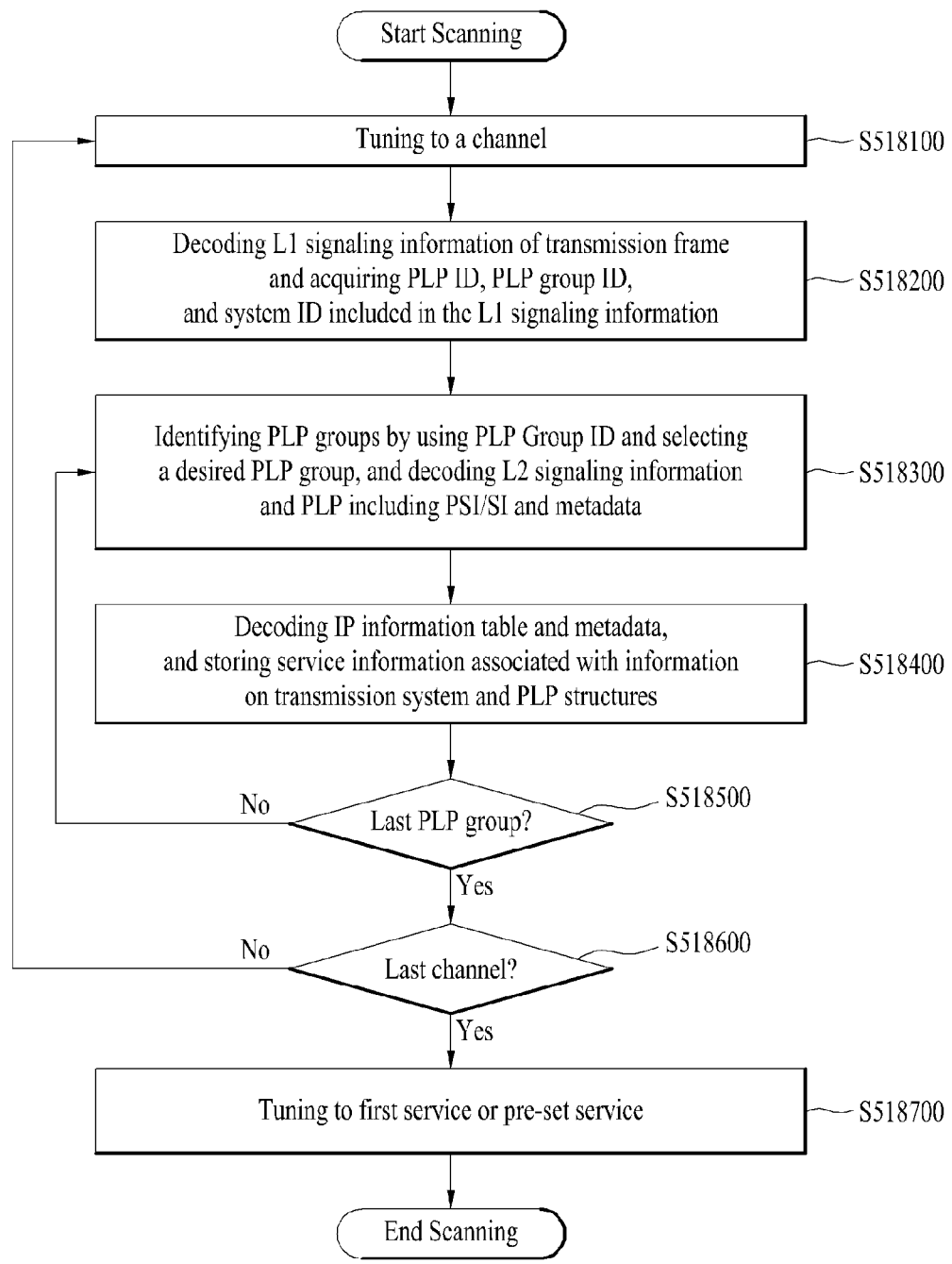
FIG. 62 illustrates a flow chart showing the process steps of a service scanning method of a receiver according to the fourth embodiment of the present invention.

Fourth Embodiment (FIG. 60 to FIG. 62)

FIG. 60 illustrates a conceptual diagram of a correlation between a service according to the fourth embodiment of the present invention and a PLP group.

In case of transmitting a broadcast signal of a IP format, the fourth embodiment of the present invention corresponds to a signaling method for recovering a transport stream by acquiring a service IP address and information on a component type and information on a component address, which are included in a PLP, and by merging multiple PLPs being included in the same PLP group.

As shown in FIG. 60, the L1 signaling information region 516100 according to the fourth embodiment of the present invention may include information related to each of the multiple PLPs, i.e., a PLP_GROUP ID field, a PLP_ID field, and so on. Also, the L2 signaling information region 516200 may include an IP information table, and the IP information table may include a IP_address_list( ) field and a descriptor. The IP_address_list( ) field may include IP address information for receiving a Bootstrap, and the descriptor may include the same PLP_GROUP_ID field and PLP_ID field that are included in the L1 signaling information region 516100. Since the IP_address_list( ) field and the descriptor form a pair, by using this pair, the receiver may be capable of knowing which PLP group is correlated to a specific IP stream. Thereafter, the receiver may use the IP_address_list( ) field, so as to receive Bootstrap information. Herein, the bootstrap information includes a boot_IP_address field. And, by using the boot_IP_address field, the receiver may acquire an IP address that can receiver (or acquire) a service guide information or broadcast content guide information.

Subsequently, by using the received bootstrap information, the receiver may receiver service guide information, such as ESG (Electronic Service Guide)/BCG (Broadcast Contents Guide). The service guide information or broadcast contents guide information may be transmitted through an interactive channel and may be received through an IP stream, which is included in a specific PLP. This may vary depending upon the intentions of the system designer. The receiver may use the service_id field, the component_type field, and the component_IP_address field, which are included in the ESG/BCG, so as to decode a desired (or wanted) service and service components.

Eventually, by using the component_IP_address included in the ESG/BCG, or by using the boot_IP_address field of the bootstrap, the receiver may acquire an IP address for each service and service components. And, by using the IP_address_list( ) field and the PLP_GROUP_ID field of the IP information table, the receiver may be capable of knowing which IP stream/packet is correlated to the PLP group. Thereafter, the receiver may merge the service components that are included in a PLP having the same PLP_GROUP_ID field included in the L1 signaling information region 516100, so as to recover a service.

Hereinafter, the L1 signaling information, the IP information table, a bootstrap, and an ESG/BCG will be described in detail.

The L1 signaling information according to the fourth embodiment of the present invention may include the same fields included in the L1 signaling information, which is described in FIG. 46 to FIG. 48. And, the receiver may use the PLP_COMPONENT_TYPE field so as to determine whether or not the L1 signaling information is matched with the component_type field included in the ESG/BCG.

The IP information table according to the fourth embodiment of the present invention corresponds to a table include IP-related information, i.e., information on an IP address and so on. Herein, the receiver may be capable of knowing how the IP stream is being transmitted from the IP information table through the transport stream.

The IP information table may include an IP_addr_location loop, and the IP_addr_location loop may include a target_IP_add_descriptor( ) and an IP/MAC_location_descriptor.

The target_IP_add_descriptor( ) may include an IP_address_list( ) field, and the IP_address_list( ) field may include information related to the IP address. According to the embodiment of the present invention, the present invention includes an IP address/port field. Depending upon the number of ports, a plurality of the IP address/port fields may be included. The IP/MAC_location_descriptor may also be referred to as an IP/MAC_location_information field, which may be used for connecting the PLP_COMPONENT_TYPE field included in the L1 signaling information to the IP stream. The IP/MAC_location_descriptor may include the same PLP_ID field and PLP_GROUP_ID field as the PLP_ID field and the PLP_GROUP_ID field, which are included in the L1 signaling information.

Hereinafter, each field included in the bootstrap and ESG/BCG shown in FIG. 60 will be described in detail.

Herein, the Bootstrap may include a boot_IP_addr field, and the boot_IP_addr field may identify a booting address of the IP.

The ESG/BCG may include a NUM_SERVICE loop. Herein, the NUM_SERVICE loop may include a respective service_name field, service_id field, and a NUM_COMPONENT loop for each of the multiple services.

The service_name field may be used for indicating the name of each service, and the service_id field may be used for identifying each service.

The NUM_COMPONENT loop corresponds to a loop include information on the multiple components, which are included in a service. Herein, the NUM_COMPONENT loop may include a component_type field and a component_IP_address field.

The component_type field may be used for identifying component types of the service. And, examples of the components according to the present invention may include a video component of the base layer, a video component of the enhancement layer, audio components, data components, and so on. Also, the component_type field may be matched with the PLP_COMPONENT_TYPE field, which is included in the L1 signaling information.

The component_IP_address field may identify the IP address of each component.

FIG. 61 illustrates an exemplary IP/MAC_location_descriptor according to the fourth embodiment of the present invention.

As shown in FIG. 61, the IP/MAC_location_descriptor according to the fourth embodiment of the present invention may include the same fields as the component_id_descriptor field according to the second embodiment of the present invention, which is described above with reference to FIG. 53. Herein, however, the IP/MAC_location_descriptor according to the fourth embodiment of the present invention may include a PLP_GROUP_ID field instead of the PLP_COMPONENT_TYPE field. Since the description of each field is identical to that of FIG. 47 and FIG. 53, detailed description of the same will be omitted for simplicity.

FIG. 62 illustrates a flow chart showing the process steps of a service scanning method of the receiver according to the fourth embodiment of the present invention.

The receiver tunes to receive an IP type broadcast signal (S518100). In this case, in order to receive a service desired by the user, the receiver requires information on the service included in the transmission frame, which is being transmitted through the respective channel. Although this process step is not shown in the drawing, this process step may be performed by the tuner of the receiver and may be modified or varied in accordance with the intentions of the system designer.

Then, the receiver may decode the L1 signaling information included in the transmission frame, so as to acquire a PLP ID and a PLP Group ID (S518200). Thereafter, the receiver may identify the PLP groups by using the decoded PLP group ID so as to select a desired PLP group, and the receiver may then decode the L2 signaling information and the PLP including the PSI/SI and metadata (S518300).

The receiver may decode the IP information table included in the decoded L2 signaling information, and the receiver may also decode the metadata included in the PLP (S518400). Additionally, the receiver may acquire service information associated with information on the transmitting system and PLP structures, thereby being capable of storing the acquired service information (S518400). The service information according to the present invention may include a service IP address, a component IP address, and so on. Subsequently, the receiver may determine whether or not the currently selected PLP group corresponds to the last PLP group (S518500).

Based upon the determined result, when it is determined that the selected PLP group does not correspond to the last PLP group, the receiver may return to the process step S518300, so as to select the next PLP group. Alternatively, when it is determined that the selected PLP group corresponds to the last PLP group, the receiver may determine whether or not the current channel corresponds to the last channel (S518600).

Then, based upon the determined result, when it is determined that the current channel does not correspond to the last channel, the receiver may return to the process step S518100, so as to tune to the next channel. And, alternatively, when it is determined that the current channel corresponds to the last channel, the receiver may use the stored service information so as to tune to a first service or a pre-set service (S518700).

If the broadcasting signal receiving device has the same structure as FIG. 27 or FIG. 47, as described above, the decoding of the PLPs including the L1 signaling information, the L2 signaling information, the PLPs transmitting the PSI/SI and metadata, and the PLPs including components may be performed by at least one of the frame demapper, the BICM decoder, and the output processor. If the broadcasting signal receiving device has the same structure as FIG. 36, the decoding of the PLPs including the L1 signaling information, the L2 signaling information, the PLPs transmitting the PSI/SI, and the PLPs transmitting components may be performed by at least one of the frame demapper, the PLP deinterleaving and demodulator module, the L1 decoder, the BBF decoder, and the null packet reconfigurating module. Also, the scanning process may be performed by a separate controller.

Figure 63:
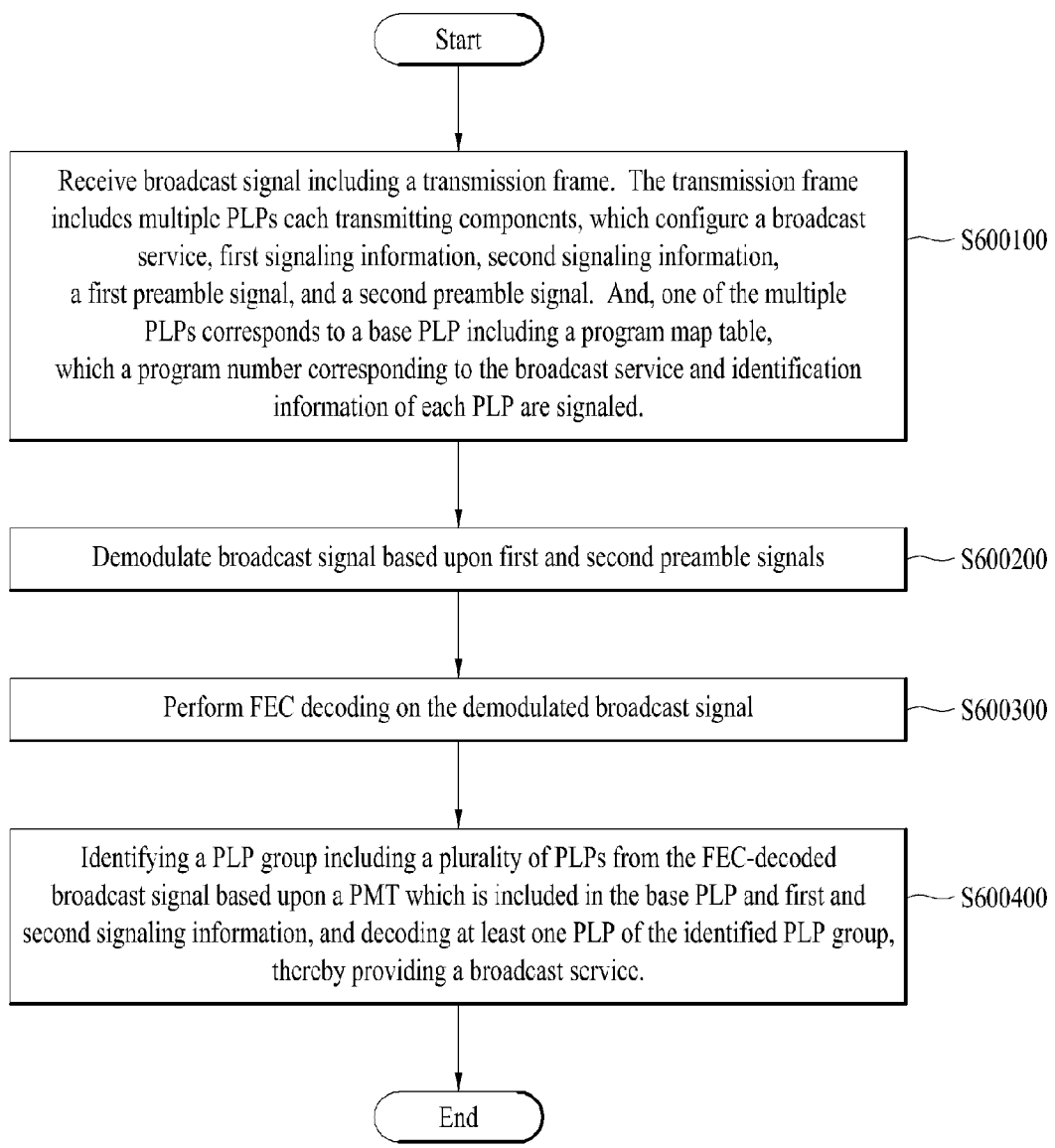
FIG. 63 illustrates a flow chart showing a method for receiving a broadcasting signal according to an embodiment of the present invention.

FIG. 63 illustrates a flow chart showing a method for receiving a broadcasting signal according to an embodiment of the present invention. First of all, a broadcasting signal is received (S600100). At this point, according to the embodiment of the present invention, the received broadcasting signal includes a transmission frame, and the transmission frame includes a plurality of PLPs transmitting components configuring a broadcasting service, first and second signaling information having signaling information of the plurality of PLPs signaled thereto, a first preamble signal having a preamble format signaled thereto, and a second preamble signal having pilot pattern information signaled thereto. Additionally, according to the embodiment of the present invention, one of the plurality of PLPs corresponds to a base PLP, which includes a program number corresponding to the broadcasting service and program map table information having identification information of each PLP signaled thereto. The reception of the broadcasting signal is performed by the tuner.

Herein, according to the embodiment of the present invention, the first preamble signal corresponds to the P1 signaling information, and the second preamble signal corresponds to the AP1 signaling information.

Additionally, according to the embodiment of the present invention, the first signaling information includes PLP group identification information (PLP GROUP ID) for identifying a PLP group including the plurality of PLPs, and a PLP identification information (PLP ID) for identifying each PLP, and the second signaling information includes base PLP identification information (BASE PLP ID) for identifying the base PLP, and service identification information (SERVICE ID) for identifying the broadcasting service. Herein, according to the embodiment of the present invention, the base PLP identification information is included in the NIT of the second signaling information, and the service identification information is included in the SDT of the second signaling information.

When the broadcasting signal is received in step S600100, the received broadcasting signal is demodulated based upon first and second preamble signals, which are included in the transmission frame of the received broadcasting signal (S600200). Then, FEC decoding is performed on the demodulated broadcasting signal (S600300). Thereafter, based upon the PMT and the first and second signaling information, which are included in the base PLP, a PLP group including a plurality of PLPs is identified from the FEC decoded broadcasting signal, and at least one PLP of the identified PLP group is decoded, so as to provide the broadcasting service (S600400).

According to an embodiment of the present invention, in step S600400, the PLP group including the plurality of PLP is identified, and each PLP included in the identified PLP group is identified, by using the PLP group identification information and the identification information of each PLP는 , which are included in the first signaling information. Also, according to the embodiment of the present invention, the base PLP and the broadcasting service are identified by using the base PLP identification information and the service identification information, which are both included in the second signaling information. Moreover, according to the embodiment of the present invention, packet identifiers of the TSs included in the decoded PLP are acquired by using a program number included in the PMT, which is acquired from the base PLP, PLP identification information for identifying each PLP, component type information indicating the type of the component included in each PLP type, and so on. Herein, according to the embodiment of the present invention, the demodulation process is performed by the OFDM demodulator, the FEC decoding process is performed by the FEC decoder of the BICM decoder, and the decoding process of the PLP is performed by at least one of the frame demapper, the BICM decoder, and the output processor.

The present invention will not be limited only to the above-described exemplary embodiments presented herein. And, therefore, as it is indicated in the scope of the appended claims, it will be apparent to those skilled in the art that various modifications and variations can be made in the present invention, and that such modifications and variations cover the scope of the present invention.

[Mode for Carrying out the Present Invention]

As described above, the present invention is described with respect to the best mode for carrying out the present invention.

[Industrial Applicability]

As described above, the present invention may be fully (or entirely) or partially applied to digital broadcasting systems.

What is claimed is:

1. A method for receiving broadcast signals, the method comprising:
receiving the broadcast signals;
demodulating the received broadcast signals by an OFDM (Orthogonal Frequency Division Multiplex) scheme;
parsing at least one signal frame from the demodulated broadcast signals,
wherein each signal frame includes a preamble and a plurality of PLPs (Physical Layer Pipes),
wherein the preamble located at the beginning of the each signaling frame includes signaling information for each PLP, and
wherein each PLP carries at least one broadcast service or at least one broadcast service component and a randomly chosen PLP of the plurality of PLPs is a base PLP;
decoding the signaling information,
wherein the signaling information includes PLP ID information for identifying each PLP and PLP GROUP information for identifying a PLP group related to corresponding PLPs; and decoding data carried in each PLP in the parsed at least one signal frame based on the decoded signaling information, wherein the base PLP carries service signaling data for corresponding PLPs, and wherein the signaling information includes identification information for identifying the randomly chosen PLP.

2. The method of claim 1, wherein the decoding data carried in each PLP further includes:

identifying a PLP and a PLP group using the PLP information and the PLP GROUP information; and identifying the randomly chosen PLP using the identification information.

3. The method of claim 1, wherein the decoding data carried in each PLP further includes:

time deinterleaving the data carried in each PLP;

Multiple-Input Multiple-Output (MIMO) processing the time deinterleaved data;

Quadrature Amplitude Modulation (QAM) demapping the MIMO processed data; and

Low Density Parity Check (LDPC) decoding the demapped data.

4. The method of claim 1, wherein the at least one signal frame is multiplexed with signal frames for different type services in the broadcast signals.

5. An apparatus for receiving broadcast signals, the apparatus comprising:

a receiver to receive the broadcast signals;

a demodulator to demodulate the received broadcast signals by an OFDM (Orthogonal Frequency Division Multiplex) scheme;

a frame parser configured to parse at least one signal frame from the demodulated broadcast signals, wherein each signal frame includes a preamble and a plurality of PLPs (Physical Layer Pipes), wherein the preamble located at the beginning of the each signaling frame includes signaling information for each PLP, and wherein the each PLP carries at least one broadcast service or at least one broadcast service component and a randomly chosen PLP of the plurality of PLPs is a base PLP;

a first decoder to decode the signaling information, wherein the signaling information includes PLP ID information for identifying each PLP and PLP GROUP information for identifying a PLP group related to corresponding PLPs; and a second decoder to decode data carried in each PLP in the parsed at least one signal frame based on the decoded signaling information, wherein the base PLP carries service signaling data for corresponding PLPs, and wherein the signaling information includes identification information for identifying the randomly chosen PLP.

6. The apparatus of claim 5, wherein the second decoder further identifies a PLP and a PLP group using the PLP information and the PLP GROUP information and identifies the randomly chosen PLP using the identification information.

7. The apparatus of claim 5, wherein the second decoder data carried in each PLP further includes:

a time deinterleaver to time deinterleave the data carried in each PLP;

a Multiple-Input Multiple-Output (MIMO) processor to MIMO process the time deinterleaved data;

a demapper to Quadrature Amplitude Modulation (QAM) demap the MIMO processed data; and a Low Density Parity Check (LDPC) decoder to LDPC decode the demapped data.

8. The apparatus of claim 5, wherein the at least one signal frame is multiplexed with signal frames for different type services in the broadcast signals.

9. A method for transmitting broadcast signals, the method comprising:

encoding PLP (Physical Layer Pipes) data carried in each of a plurality of PLPs, wherein each PLP carries at least one broadcast service or at least one broadcast service component and a randomly chosen PLP of the plurality of PLPs is a base PLP;

encoding signaling information for the PLPs, wherein the signaling information includes PLP ID information for identifying each PLP and PLP GROUP information for identifying a PLP group related to corresponding PLPs;

building at least one signal frame including the encoded signaling information and the encoded PLP data, wherein the at least one signal frame includes a preamble located at the beginning of the each signaling frame including the encoded signaling information and PLP symbols including the encoded PLP data;

modulating the at least one signal frame by an OFDM (Orthogonal Frequency Division Multiplex) scheme; and transmitting the broadcast signals including the modulated signal frame, wherein the base PLP carries service signaling data for corresponding PLPs, and wherein the signaling information includes identification information for identifying the randomly chosen PLP.

10. The method of claim 9, wherein the encoding PLP data further includes:

Low Density Parity Check (LDPC) encoding the PLP data;

mapping the encoded PLP data onto constellations;

Multiple-Input Multiple-Output (MIMO) processing the mapped PLP data; and time interleaving the MIMO processed PLP data.

11. The method of claim 9, wherein the at least one signal frame is multiplexed with signal frames for different type services in the broadcast signals.

12. An apparatus for transmitting broadcast signals, the apparatus comprising:

a first encoder to encode PLP (Physical Layer Pipes) data carried in each of a plurality of PLPs, wherein each PLP carries at least one broadcast service or at least one broadcast service component and a randomly chosen PLP of the plurality of PLPs is a base PLP;

a second encoder to encode signaling information for the PLPs, wherein the signaling information includes PLP ID information for identifying each PLP and PLP GROUP information for identifying a PLP group related to corresponding PLPs;

a frame builder to build at least one signal frame includes the encoded signaling information and the encoded PLP data, wherein the at least one signal frame includes a preamble located at the beginning of the each signaling frame including the encoded signaling information and PLP symbols including the encoded PLP data;

a modulator to modulate the at least one signal frame by an OFDM (Orthogonal Frequency Division Multiplex) scheme; and a transmitter to transmit the broadcast signals including the modulated signal frame, wherein the base PLP carries service signaling data for corresponding PLPs, and wherein the signaling information includes identification information for identifying the randomly chosen PLP.

13. The apparatus of claim 12, wherein the first encoder further includes:
   a Low Density Parity Check (LDPC) encoder to LDPC encode the PLP data;
   a mapper to map the encoded PLP data onto constellations;
   a Multiple-Input Multiple-Output (MIMO) processor to MIMO process the mapped PLP data; and
   a time interleaver to time interleave the MIMO processed PLP data.

14. The apparatus of claim 12, wherein the at least one signal frame is multiplexed with signal frames for different type services in the broadcast signals.

* * * * *